(12) United States Patent
Fukuyo et al.

(10) Patent No.: US 7,615,721 B2
(45) Date of Patent: Nov. 10, 2009

(54) LASER PROCESSING METHOD AND LASER PROCESSING APPARATUS

(75) Inventors: Fumitsugu Fukuyo, Hamamatsu (JP); Kenshi Fukumitsu, Hamamatsu (JP); Naoki Uchiyama, Hamamatsu (JP); Toshimitsu Wakuda, Hamamatsu (JP); Kazuhiro Atsumi, Hamamatsu (JP); Kenichi Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 47 days.

(21) Appl. No.: 11/250,404

(22) Filed: Oct. 17, 2005

(65) Prior Publication Data

US 2006/0040473 A1 Feb. 23, 2006

Related U.S. Application Data

(63) Continuation of application No. 10/385,696, filed on Mar. 12, 2003, now Pat. No. 6,992,026, which is a continuation-in-part of application No. PCT/JP01/07954, filed on Sep. 13, 2001.

(30) Foreign Application Priority Data

Sep. 13, 2000 (JP) ............................ P2000-278306

(51) Int. Cl.
*B23K 26/00* (2006.01)
*H01L 21/78* (2006.01)

(52) U.S. Cl. ............................. 219/121.61; 219/121.69; 219/121.76; 438/7; 438/463; 438/795; 438/797; 257/E21.599

(58) Field of Classification Search ............ 219/121.61, 219/121.62, 121.65–121.72, 121.76, 121.77, 219/121.85; 438/113, 463, 7, 795, 797, E21.599; 264/400
See application file for complete search history.

(56) References Cited

U.S. PATENT DOCUMENTS 3,448,510 A * 6/1969 Johnson et al. ............... 29/413

(Continued)

FOREIGN PATENT DOCUMENTS

DE 196 46 332 A1 5/1998

(Continued)

OTHER PUBLICATIONS

T. Yajima et al., *New Version Laser Handbook*, published by Asakura Shoten, Jun. 15, 1989, pp. 666-669.

(Continued)

*Primary Examiner*—Samuel M Heinrich
(74) *Attorney, Agent, or Firm*—Drinker Biddle & Reath LLP

(57) ABSTRACT

A laser beam machining method and a laser beam machining device capable of cutting a work without producing a fusing and a cracking out of a predetermined cutting line on the surface of the work, wherein a pulse laser beam is radiated on the predetermined cut line on the surface of the work under the conditions causing a multiple photon absorption and with a condensed point aligned to the inside of the work, and a modified area is formed inside the work along the predetermined determined cut line by moving the condensed point along the predetermined cut line, whereby the work can be cut with a rather small force by cracking the work along the predetermined cut line starting from the modified area and, because the pulse laser beam radiated is not almost absorbed onto the surface of the work, the surface is not fused even if the modified area is formed.

12 Claims, 65 Drawing Sheets

U.S. PATENT DOCUMENTS

| | | | |
|---|---|---|---|
| 3,610,871 A | 10/1971 | Lumley | 219/121 |
| 3,626,141 A | 12/1971 | Daly | |
| 3,629,545 A | 12/1971 | Graham et al. | |
| 3,790,051 A | 2/1974 | Moore | |
| 3,790,744 A * | 2/1974 | Bowen | 219/121.69 |
| 3,824,678 A * | 7/1974 | Harris et al. | 438/461 |
| 3,970,819 A | 7/1976 | Gates et al. | |
| 4,242,152 A | 12/1980 | Stone | |
| 4,306,351 A | 12/1981 | Ohsaka et al. | |
| 4,475,027 A | 10/1984 | Pressley | |
| 4,531,060 A | 7/1985 | Suwa et al. | |
| 4,562,333 A | 12/1985 | Taub et al. | 219/121 |
| 4,650,619 A | 3/1987 | Watanabe | |
| 4,682,003 A * | 7/1987 | Minakawa et al. | 219/121.72 |
| 4,769,310 A | 9/1988 | Gugger et al. | |
| 4,814,575 A * | 3/1989 | Petitbon | 219/121.64 |
| 4,899,126 A | 2/1990 | Yamada | |
| 4,914,815 A | 4/1990 | Takada et al. | |
| 4,981,525 A * | 1/1991 | Kiyama et al. | 136/244 |
| 5,211,805 A | 5/1993 | Srinivasan | 156/643 |
| 5,230,184 A | 7/1993 | Bukhman | |
| 5,251,003 A | 10/1993 | Vigouroux et al. | 356/152 |
| 5,254,149 A * | 10/1993 | Hashemi et al. | 65/29.18 |
| 5,254,833 A | 10/1993 | Okiyama | 219/121.68 |
| 5,304,357 A | 4/1994 | Sato et al. | |
| 5,382,770 A | 1/1995 | Black et al. | |
| 5,543,365 A * | 8/1996 | Wills et al. | 438/462 |
| 5,580,473 A * | 12/1996 | Shinohara et al. | 219/121.69 |
| 5,609,284 A | 3/1997 | Kondratenko | |
| 5,622,540 A | 4/1997 | Stevens | |
| 5,637,244 A | 6/1997 | Erokhin | 219/121.69 |
| 5,641,416 A | 6/1997 | Chadha | 219/121.69 |
| 5,656,186 A | 8/1997 | Mourou et al. | 219/121.69 |
| 5,776,220 A | 7/1998 | Allaire et al. | 65/112 |
| 5,795,795 A * | 8/1998 | Kousai et al. | 438/166 |
| 5,814,532 A * | 9/1998 | Ichihara | 438/33 |
| 5,826,772 A | 10/1998 | Ariglio et al. | 225/2 |
| 5,841,543 A | 11/1998 | Guldi et al. | |
| 5,925,271 A | 7/1999 | Pollack et al. | |
| 5,968,382 A | 10/1999 | Matsumoto et al. | 219/121.72 |
| 5,976,392 A | 11/1999 | Chen | 216/16 |
| 6,031,201 A | 2/2000 | Amako et al. | |
| 6,055,829 A | 5/2000 | Witzmann et al. | 65/105 |
| 6,121,118 A | 9/2000 | Jin et al. | 438/460 |
| 6,127,005 A | 10/2000 | Lehman et al. | |
| 6,175,096 B1 | 1/2001 | Nielson | 219/121.72 |
| 6,181,728 B1 | 1/2001 | Cordingley et al. | |
| 6,187,088 B1 * | 2/2001 | Okumura | 117/8 |
| 6,211,488 B1 | 4/2001 | Hoekstra et al. | 219/121.72 |
| 6,252,197 B1 | 6/2001 | Hoekstra et al. | 219/121.84 |
| 6,257,224 B1 | 7/2001 | Yoshino et al. | 125/13.01 |
| 6,259,058 B1 | 7/2001 | Hoekstra | 219/121.75 |
| 6,285,002 B1 | 9/2001 | Ngoi et al. | |
| 6,322,958 B1 | 11/2001 | Hayashi | 430/495 |
| 6,325,855 B1 | 12/2001 | Sillmon et al. | |
| 6,376,797 B1 | 4/2002 | Piwczyk et al. | |
| 6,407,363 B2 * | 6/2002 | Dunsky et al. | 219/121.71 |
| 6,420,678 B1 | 7/2002 | Hoekstra | |
| 6,489,588 B1 | 12/2002 | Hoekstra et al. | 219/121.67 |
| 6,566,683 B1 * | 5/2003 | Ogawa et al. | 257/53 |
| 6,770,544 B2 | 8/2004 | Sawada | |
| 6,908,784 B1 | 6/2005 | Farnworth et al. | |
| 6,992,026 B2 | 1/2006 | Fukuyo et al. | 438/797 |
| 7,396,742 B2 | 7/2008 | Fukuyo et al. | |
| 2001/0029673 A1 * | 10/2001 | Brown et al. | 30/293 |
| 2001/0035401 A1 | 11/2001 | Manor | |
| 2001/0046112 A1 | 11/2001 | Herchen | |
| 2002/0006765 A1 | 1/2002 | Michel et al. | 451/28 |
| 2002/0096994 A1 | 7/2002 | Iwafuchi et al. | |
| 2002/0115235 A1 | 8/2002 | Sawada | |
| 2002/0158288 A1 | 10/2002 | Yamazaki et al. | |
| 2002/0170896 A1 | 11/2002 | Choo et al. | 219/121.72 |
| 2003/0010275 A1 | 1/2003 | Radojevic et al. | |
| 2003/0024909 A1 | 2/2003 | Hoekstra et al. | 219/121.69 |
| 2004/0002199 A1 | 1/2004 | Fukuyo et al. | 438/460 |
| 2005/0173387 A1 | 8/2005 | Fukuyo et al. | |
| 2005/0181581 A1 | 8/2005 | Fukuyo et al. | 438/463 |
| 2005/0184037 A1 | 8/2005 | Fukuyo et al. | |
| 2005/0189330 A1 | 9/2005 | Fukuyo et al. | |
| 2005/0194364 A1 | 9/2005 | Fukuyo et al. | |
| 2005/0202596 A1 | 9/2005 | Fukuyo et al. | |
| 2005/0272223 A1 | 12/2005 | Fujii et al. | |
| 2006/0011593 A1 | 1/2006 | Fukuyo et al. | |
| 2006/0121697 A1 | 6/2006 | Fujii et al. | |
| 2006/0148212 A1 | 7/2006 | Fukuyo et al. | |
| 2006/0160331 A1 | 7/2006 | Fukuyo et al. | 438/463 |
| 2008/0090382 A1 | 4/2008 | Fujii et al. | |

FOREIGN PATENT DOCUMENTS

| | | |
|---|---|---|
| EP | 0 863 231 | 9/1998 |
| EP | 1 026 735 | 8/2000 |
| EP | 1 498 216 A1 | 1/2005 |
| EP | 1 580 800 A1 | 9/2005 |
| JP | 46-24989 | 7/1971 |
| JP | 53033050 A * | 3/1978 |
| JP | 356076522 A * | 6/1981 |
| JP | 358036939 A * | 3/1983 |
| JP | 358057767 A * | 4/1983 |
| JP | 358171783 A * | 10/1983 |
| JP | 59-130438 | 7/1984 |
| JP | 59-141233 | 8/1984 |
| JP | 60-055640 | 3/1985 |
| JP | 60-144985 | 7/1985 |
| JP | 360167351 A * | 8/1985 |
| JP | 61-112345 | 5/1986 |
| JP | 361096439 A * | 5/1986 |
| JP | 61-121453 | 6/1986 |
| JP | 361220339 A * | 9/1986 |
| JP | 62-004341 | 1/1987 |
| JP | 64-038209 | 2/1989 |
| JP | 401112130 A * | 4/1989 |
| JP | 1-225509 | 9/1989 |
| JP | 1-225510 | 9/1989 |
| JP | 03-234043 | 11/1991 |
| JP | 3-276662 | 12/1991 |
| JP | 04-029352 | 1/1992 |
| JP | 04-111800 | 4/1992 |
| JP | 04-188847 | 7/1992 |
| JP | 4-300084 | 10/1992 |
| JP | 04-356942 | 10/1992 |
| JP | 05-335726 | 12/1993 |
| JP | 06-188310 | 7/1994 |
| JP | 07-037840 | 2/1995 |
| JP | 07-040336 | 2/1995 |
| JP | 07-263382 | 10/1995 |
| JP | 407308791 A * | 11/1995 |
| JP | 408148692 A * | 6/1996 |
| JP | 08-197271 | 8/1996 |
| JP | 08-264488 | 10/1996 |
| JP | 09-017756 | 1/1997 |
| JP | 09-017831 | 1/1997 |
| JP | 9-260310 | 10/1997 |
| JP | 09-263734 | 10/1997 |
| JP | 10-071483 | 3/1998 |
| JP | 10-163780 | 6/1998 |
| JP | 10-214997 | 8/1998 |
| JP | 10-233373 | 9/1998 |
| JP | 10-305420 | 11/1998 |
| JP | 410321908 A * | 12/1998 |
| JP | 11-071124 | 3/1999 |
| JP | 11-121517 | 4/1999 |
| JP | 11-138896 | 5/1999 |
| JP | 11-156564 | 6/1999 |

| | | |
|---|---|---|
| JP | 11-162889 | 6/1999 |
| JP | 11-163097 | 6/1999 |
| JP | 11-163403 | 6/1999 |
| JP | 411156564 A * | 6/1999 |
| JP | 411160667 A * | 6/1999 |
| JP | 11-177137 | 7/1999 |
| JP | 411177176 A * | 7/1999 |
| JP | 11-221684 | 8/1999 |
| JP | 11-267861 | 10/1999 |
| JP | 2000-015467 | 1/2000 |
| JP | 2000-042764 | 2/2000 |
| JP | 2000-104040 | 4/2000 |
| JP | 2000-124537 | 4/2000 |
| JP | 2000-158156 | 6/2000 |
| JP | 2000-195828 | 7/2000 |
| JP | 2000-210785 | 8/2000 |
| JP | 2000-216114 | 8/2000 |
| JP | 2000-219528 | 8/2000 |
| JP | 2000-237885 | 9/2000 |
| JP | 2000-237886 | 9/2000 |
| JP | 2001-127015 | 5/2001 |
| JP | 2001-196282 | 7/2001 |
| JP | 2001-250798 | 9/2001 |
| JP | 2001-326194 | 11/2001 |
| JP | 2001-345252 | 12/2001 |
| JP | 2002-050589 | 2/2002 |
| JP | 2002-158276 | 5/2002 |
| JP | 2002-192367 | 7/2002 |
| JP | 2002-192368 | 7/2002 |
| JP | 2002-192369 | 7/2002 |
| JP | 2002-192370 | 7/2002 |
| JP | 2002-192371 | 7/2002 |
| JP | 2002-205180 | 7/2002 |
| JP | 2002-205181 | 7/2002 |
| JP | 2002-224878 | 8/2002 |
| JP | 2002-226796 | 8/2002 |
| JP | 2003-001458 | 1/2003 |
| JP | 2003-39184 | 2/2003 |
| JP | 2003-334812 | 11/2003 |
| JP | 2003-338467 | 11/2003 |
| JP | 2005-001001 | 1/2005 |
| JP | 2005-047290 | 2/2005 |
| JP | 2005-159378 | 6/2005 |
| JP | 2005-159379 | 6/2005 |
| JP | 2005-313237 | 11/2005 |
| JP | 2006-128723 | 5/2006 |
| JP | 2006-135355 | 5/2006 |
| KR | 2001-017690 | 3/2001 |
| TW | 165354 | 8/1991 |
| TW | 192484 | 10/1992 |
| TW | 219906 | 2/1994 |
| TW | 415036 | 12/2000 |
| WO | WO 01/90709 | 11/2001 |
| WO | WO 02/07927 | 1/2002 |
| WO | WO 02/22301 | 3/2002 |
| WO | WO 03/076118 | 9/2003 |
| WO | WO 2004/082006 | 9/2004 |

OTHER PUBLICATIONS

*Tooling Machine Series, Laser Machining*, published by Taiga Shuppan, Inc., Sep. 10, 1990, pp. 91-96.
*Electronic Material*, No. 9, on 2002, published by Kogyo Chousakai, pp. 17-21 (with full English translation).
F. Fukuyo et al., "Stealth Dicing Technology for Ultra Thin Wafer", presented at 2003 ICEP (International Conference on Electronics Packaging), Apr. 16-18, 2003, Tokyo, Japan.
K. Hayashi, "Inner Glass Marking by Harmonics of Solid-state Laser," Proceedings of 45th Laser Materials Processing Conference, Dec. 1998, pp. 23-28.
T. Sano et al., "Evaluation of Processing Characteristics of Silicon With Picosecond Pulse Laser," Preprints of the National Meeting of Japan Welding Society, No. 66, Apr. 2000, pp. 72-73.
K. Miura et al., "Formation of Photo-induced Structures in Glasses with Femtosecond Laser," Proceedings of 42nd Laser Materials Processing Conference, Nov. 1997, pp. 105-111.
T. Miyazaki, "Laser Beam Machining Technology," published by Sangyo-Tosho Inc. on May 31, 1991, First Edition, pp. 9-10.
Katsumi Midorigaoka; "Recent Progress of Femtosecond Lasers and Their Applications to Material Processing"; Dec. 31, 1998; pp. 29-38; ISBN: 4-947684-21-6, including English Language Abstract.
Journal of Japan Laser Processing Society, vol. 12, No. 1, Feb. 2005, pp. 15-23 (w/English language translation).
Proceedings of the 63rd Laser Materials Processing Conference, May 2005, pp. 115-123.
A. Ishii et al., CO2 Laser Processing Technology, Nikkan Kogyo Publishing Production, Dec. 21, 1992, pp. 63-65 (with partial English translation).
Journal of the Japan Society of Griding Engineers, vol. 47, No. 5, May 2003, pp. 229-231 (including English language translation).
The 6th International Symposium on Laser Precision Microfabrication, Apr. 2005.

\* cited by examiner

Fig.69

| SET | | SIZE($\mu$m) |
|---|---|---|
| POWER DENSITY(W/cm²) | NUMERICAL APERTURE | |
| $1.24 \times 10^{11}$ | 0.55 | 120 |
| $1.49 \times 10^{11}$ | 0.55 | 150 |
| $1.19 \times 10^{11}$ | 0.8 | 30 |
| $1.49 \times 10^{11}$ | 0.8 | 60 |

Fig.70

| NUMERICAL APERTURE | SIZE($\mu$m) |
|---|---|
| 0.55 | 150 |
| 0.8 | 60 |

Fig.71

| POWER DENSITY(W/cm²) | SIZE($\mu$m) |
|---|---|
| $1.19 \times 10^{11}$ | 30 |
| $1.49 \times 10^{11}$ | 60 |
| $1.79 \times 10^{11}$ | 80 |
| $2.98 \times 10^{11}$ | 120 |
| $5.96 \times 10^{11}$ | 180 |

LASER PROCESSING METHOD AND LASER PROCESSING APPARATUS

CROSS-REFERENCE TO RELATED APPLICATION

This application is a continuation application of application Ser. No. 10/385,696 filed on Mar. 12, 2003 now U.S. Pat. No. 6,992,026, which is incorporated by reference herein in its entirety, and which is a continuation-in-part application of PCT Application No. PCT/JP01/07954 filed on Sep. 13, 2001, designating U.S.A.

BACKGROUND OF THE INVENTION

1. Field of the Invention

The present invention relates to laser processing methods and laser processing apparatus used for cutting objects to be processed such as semiconductor material substrates, piezoelectric material substrates, and glass substrates.

2. Related Background Art

One of laser applications is cutting. A optical cutting process effected by laser is as follows: For embodiment, a part to be cut in an object to be processed such as a semiconductor wafer or glass substrate is irradiated with laser light having a wavelength absorbed by the object, so that melting upon heating proceeds due to the laser light absorption from the surface to rear face of the object to be processed at the part to be cut, whereby the object to be processed is cut. However, this method also melts surroundings of the region to become the cutting part in the surface of the object to be cut. Therefore, in the case where the object to be processed is a semiconductor wafer, semiconductor devices located near the above-mentioned region among those formed in the surface of the semiconductor wafer might melt. In the specification, "wafer shape" means a shape similar to a semiconductor wafer made of silicon of which thickness is about 100 μm, for example, a thin circular shape having a orientation flat therein.

Known as embodiments of methods which can prevent the surface of the object to be processed from melting are laser-based cutting methods disclosed in Japanese Patent Application Laid-Open No. 2000-219528 and Japanese Patent Application Laid-Open No. 2000-15467. In the cutting methods of these publications, the part to be cut in the object to be processed is heated with laser light, and then the object is cooled, so as to generate a thermal shock in the part to be cut in the object, whereby the object is cut.

When the thermal shock generated in the object to be processed is large in the cutting methods of the above-mentioned publications, unnecessary fractures such as those deviating from lines along which the object is intended to be cut or those extending to a part not irradiated with laser may occur. Therefore, these cutting methods cannot achieve precision cutting. When the object to be processed is a semiconductor wafer, a glass substrate formed with a liquid crystal display device, or a glass substrate formed with an electrode pattern in particular, semiconductor chips, liquid crystal display devices, or electrode patterns may be damaged due to the unnecessary fractures. Also, average input energy is so high in these cutting methods that the thermal damage imparted to the semiconductor chip and the like is large.

SUMMARY OF THE INVENTION

It is an object of the present invention to provide laser processing methods and laser processing apparatus which generate no unnecessary fractures in the surface of an object to be processed and do not melt the surface.

The laser processing method in accordance with an aspect of the present invention comprises a step of irradiating an object to be processed with laser light with a light-converging point located therewithin, so as to form a modified region caused by multiphoton absorption within the object along a cutting line along which the object should be cut. If there is a certain start region in the part to be cut in the object to be processed, the object to be processed can be broken by a relatively small force so as to be cut. In the laser processing method in accordance with this aspect of the present invention, the object to be processed is broken along the line along which the object is intended to be cut using the modified region as the starting point, whereby the object can be cut. Hence, the object to be processed can be cut with a relatively small force, whereby the object can be cut without generating unnecessary fractures deviating from the line along which the object is intended to be cut in the surface of the object.

The laser processing method in accordance with this aspect of the present invention locally generates multiphoton absorption within the object to be processed, thereby forming a modified region. Therefore, laser light is hardly absorbed by the surface of the object to be processed, whereby the surface of the object will not melt. Here, the light-converging point refers to the position where the laser light is converged. The line along which the object is intended to be cut may be a line actually drawn on the surface or inside of the object to be cut or a virtual line.

The laser processing method in accordance with an aspect the present invention comprises a step of irradiating an object to be processed with laser light with a light-converging point located therewithin under a condition with a peak power density of at least $1 \times 10^8$ (W/cm$^2$) and a pulse width of 1 μs or less at the light-converging point, so as to form a modified region caused by multiphoton absorption within the object along a line along which the object is intended to be cut in the object.

The laser processing method in accordance with this aspect of the present invention irradiates an object to be processed with laser light with a light-converging point located therewithin under a condition with a peak power density of at least $1 \times 10^8$ (W/cm$^2$) and a pulse width of 1 μs or less at the light-converging point. Therefore, a phenomenon known as optical damage caused by multiphoton absorption occurs within the object to be processed. This optical damage induces thermal distortion within the object to be processed, thereby forming a crack region within the object to be processed. The crack region is an embodiment of the above-mentioned modified region, whereby the laser processing method in accordance with this aspect of the present invention enables laser processing without generating melt or unnecessary fractures deviating from the line along which the object is intended to be cut in the surface of the object. An embodiment of the object to be processed in this laser processing method is a member including glass. Here, the peak power density refers to the electric field intensity of pulse laser light at the light-converging point.

The laser processing method in accordance with an aspect the present invention comprises a step of irradiating an object to be processed with laser light with a light-converging point located therewithin under a condition with a peak power density of at least $1 \times 10^8$ (W/cm$^2$) and a pulse width of 1 μs or less at the light-converging point, so as to form a modified region including a molten processed region within the object along a line along which the object is intended to be cut in the object.

The laser processing method in accordance with this aspect of the present invention irradiates an object to be processed with laser light with a light-converging point located therewithin under a condition with a peak power density of at least $1\times10^8$ (W/cm$^2$) and a pulse width of 1 µs or less at the light-converging point. Therefore, the inside of the object to be processed is locally heated by multiphoton absorption. This heating forms a molten processed region within the object to be processed. The molten processed region is an embodiment of the above-mentioned modified region, whereby the laser processing method in accordance with this aspect of the present invention enables laser processing without generating melt or unnecessary fractures deviating from the line along which the object is intended to be cut in the surface of the object. An embodiment of the object to be processed in this laser processing method is a member including a semiconductor material.

The laser processing method in accordance with an aspect of the present invention comprises a step of irradiating an object to be processed with laser light with a light-converging point located therewithin under a condition with a peak power density of at least $1\times10^8$ (W/cm$^2$) and a pulse width of 1 ns or less at the light-converging point, so as to form a modified region including a refractive index change region which is a region with a changed refractive index within the object along a line along which the object is intended to be cut in the object.

The laser processing method in accordance with this aspect of the present invention irradiates an object to be processed with laser light with a light-converging point located therewithin under a condition with a peak power density of at least $1\times10^8$ (W/cm$^2$) and a pulse width of 1 ns or less at the light-converging point. When multiphoton absorption is generated within the object to be processed with a very short pulse width as in this aspect of the present invention, the energy caused by multiphoton absorption is not transformed into thermal energy, so that a permanent structural change such as ionic valence change, crystallization, or polarization orientation is induced within the object, whereby a refractive index change region is formed. This refractive index change region is an embodiment of the above-mentioned modified region, whereby the laser processing method in accordance with this aspect of the present invention enables laser processing without generating melt or unnecessary fractures deviating from the line along which the object is intended to be cut in the surface of the object. An embodiment of the object to be processed in this laser processing method is a member including glass.

Modes employable in the foregoing laser processing methods in accordance with the present invention are as follows: Laser light emitted from a laser light source can include pulse laser light. The pulse laser light can concentrate the energy of laser spatially and temporally, whereby even a single laser light source allows the electric field intensity (peak power density) at the light-converging point of laser light to have such a magnitude that multiphoton absorption can occur.

Irradiating the object to be processed with a light-converging point located therewithin can encompass a case where laser light emitted from one laser light source is converged and then the object is irradiated with thus converged laser light with a light-converging point located therewithin, for embodiment. This converges laser light, thereby allowing the electric field intensity of laser light at the light-converging point to have such a magnitude that multiphoton absorption can occur.

Irradiating the object to be processed with a light-converging point located therewithin can encompass a case where the object to be processed is irradiated with respective laser light beams emitted from a plurality of laser light sources from directions different from each other with a light-converging point located therewithin. Since a plurality of laser light sources are used, this allows the electric field intensity of laser light at the light-converging point to have such a magnitude that multiphoton absorption can occur. Hence, even continuous wave laser light having an instantaneous power lower than that of pulse laser light can form a modified region. The respective laser light beams emitted from a plurality of laser light sources may enter the object to be processed from the surface thereof. A plurality of laser light sources may include a laser light source for emitting laser light entering the object to be processed from the surface thereof, and a laser light source for emitting laser light entering the object to be processed from the rear face thereof. A plurality of laser light sources may include a light source section in which laser light sources are arranged in an array along a line along which the object is intended to be cut. This can form a plurality of light-converging points along the line along which the object is intended to be cut at the same time, thus being able to improve the processing speed.

The modified region is formed by moving the object to be processed relative to the light-converging point of laser light located within the object. Here, the above-mentioned relative movement forms the modified region within the object to be processed along a line along which the object is intended to be cut on the surface of the object.

The method may further comprise a cutting step of cutting the object to be processed along the line along which the object is intended to be cut. When the object to be processed cannot be cut in the modified region forming step, the cutting step cuts the object. The cutting step breaks the object to be processed using the modified region as a starting point, thus being able to cut the object with a relatively small force. This can cut the object to be processed without generating unnecessary fractures deviating from the line along which the object is intended to be cut in the surface of the object.

Embodiments of the object to be processed are members including glass, piezoelectric material, and semiconductor material. Another embodiment of the object to be processed is a member transparent to laser light emitted. This laser processing method is also applicable to an object to be processed having a surface formed with an electronic device or electrode pattern. The electronic device refers to a semiconductor device, a display device such as liquid crystal, a piezoelectric device, or the like.

The laser processing method in accordance with an aspect of the present invention comprises a step of irradiating a semiconductor material with laser light with a light-converging point located therewithin under a condition with a peak power density of at least $1\times10^8$ (W/cm$^2$) and a pulse width of 1 µs or less at the light-converging point, so as to form a modified region within the semiconductor material along a line along which the object is intended to be cut in the semiconductor material. The laser processing method in accordance with an aspect of the present invention comprises a step of irradiating a piezoelectric material with laser light with a light-converging point located therewithin under a condition with a peak power density of at least $1\times10^8$ (W/cm$^2$) and a pulse width of 1 µs or less at the light-converging point, so as to form a modified region within the piezoelectric material along a line along which the object is intended to be cut in the piezoelectric material. These methods enable laser cutting without generating melt or unnecessary fractures deviating from the line along which the object is intended to be cut in the surface of the object to be processed for the same reason as that in the laser processing methods in accordance with the foregoing aspects of the present invention.

In the laser processing method in accordance with an aspect of the present invention, the object to be processed may have a surface formed with a plurality of circuit sections, while a light-converging point of laser light is located in the inside of the object to be processed facing a gap formed between adjacent circuit sections in the plurality of circuit sections. This can reliably cut the object to be processed at the position of the gap formed between adjacent circuit sections.

The laser processing method in accordance with an aspect of the present invention can converge laser light at an angle by which a plurality of circuit sections are not irradiated with the laser light. This can prevent the laser light from entering the circuit sections and protect the circuit sections against the laser light.

The laser processing method in accordance with an aspect the present invention comprises a step of irradiating a semiconductor material with laser light with a light-converging point located within the semiconductor material, so as to form a molten processed region only within the semiconductor material along a line along which the object is intended to be cut in the semiconductor material. The laser processing method in accordance with this aspect of the present invention enables laser processing without generating unnecessary fractures in the surface of the object to be processed and without melting the surface due to the same reasons as mentioned above. The molten processed region may be caused by multiphoton absorption or other reasons.

The laser processing method in accordance with an aspect of the present invention comprises a step of irradiating an object to be processed with laser light such that a light-converging point of laser light elliptically polarized with an ellipticity of other than 1 is located within the object to be processed while the major axis of an ellipse indicative of the elliptical polarization of the laser light extends along a line along which the object is intended to be cut, so as to form a modified region caused by multiphoton absorption along the line along which the object is intended to be cut within the object to be processed.

The laser processing method in accordance with this aspect of the present invention forms a modified region by irradiating the object to be processed with laser light such that the major axis of an ellipse indicative of the elliptical polarization of laser light extends along the line along which the object is intended to be cut in the object to be processed. The inventor has found that, when elliptically polarized laser light is used, the forming of a modified region is accelerated in the major axis direction of an ellipse indicative of the elliptical polarization (i.e., the direction in which the deviation in polarization is strong). Therefore, when a modified region is formed by irradiating the object to be processed with laser light such that the major axis direction of the ellipse indicative of the elliptical polarization extends along the line along which the object is intended to be cut in the object to be processed, the modified region extending along the line along which the object is intended to be cut can be formed efficiently. Therefore, the laser processing method in accordance with this aspect of the present invention can improve the processing speed of the object to be processed.

Also, the laser processing method in accordance with the present invention restrains the modified region from being formed except in the direction extending along the line along which the object is intended to be cut, thus making it possible to cut the object to be processed precisely along the line along which the object is intended to be cut.

Here, the ellipticity refers to half the length of the minor axis/half the length of major axis of the ellipse. As the ellipticity of laser light is smaller, the forming of modified region is accelerated in the direction extending along the line along which the object is intended to be cut but suppressed in the other directions. The ellipticity can be determined in view of the thickness, material, and the like of the object to be processed. Linear polarization is elliptical polarization with an ellipticity of zero.

The laser processing method in accordance with an aspect of the present invention comprises a step of irradiating an object to be processed with laser light such that a light-converging point of laser light elliptically polarized with an ellipticity of other than 1 is located within the object to be processed while the major axis of an ellipse indicative of the elliptical polarization of the laser light extends along a line along which the object is intended to be cut under a condition with a peak power density of at least $1\times10^8$ (W/cm$^2$) and a pulse width of 1 µs or less at the light-converging point, so as to form a modified region including a crack region along the line along which the object is intended to be cut within the object to be processed.

The laser processing method in accordance with this aspect of the present invention irradiates the object to be processed with laser light such that the major axis of the ellipse indicative of the elliptical polarization of laser light extends along the line along which the object is intended to be cut in the object to be processed, thus making it possible to form the modified region efficiently and cut the object precisely along the line along which the object is intended to be cut as in the laser processing method in accordance with the above-mentioned aspect of the present invention.

The laser processing method in accordance with an aspect of the present invention comprises a step of irradiating an object to be processed with laser light such that a light-converging point of laser light elliptically polarized with an ellipticity of other than 1 is located within the object to be processed while the major axis of an ellipse indicative of the elliptical polarization of the laser light extends along the line along which the object is intended to be cut under a condition with a peak power density of at least $1\times10^8$ (W/cm$^2$) and a pulse width of 1 µs or less at the light-converging point, so as to form a modified region including a molten processed region along the line along which the object is intended to be cut within the object to be processed.

The laser processing method in accordance with this aspect of the present invention irradiates the object to be processed with laser light such that the major axis of the ellipse indicative of the elliptical polarization of laser light extends along the line along which the object is intended to be cut in the object to be processed, thus making it possible to form the modified region efficiently and cut the object precisely along the line along which the object is intended to be cut as in the laser processing method in accordance with the above-mentioned aspect of the present invention.

The laser processing method in accordance with an aspect of the present invention comprises a step of irradiating an object to be processed with laser light such that a light-converging point of laser light elliptically polarized with an ellipticity of other than 1 is located within the object to be processed while the major axis of an ellipse indicative of the elliptical polarization of the laser light extends along a line along which the object is intended to be cut under a condition with a peak power density of at least $1\times10^8$ (W/cm$^2$) and a pulse width of 1 ns or less at the light-converging point, so as to form a modified region including a refractive index change region which is a region with a changed refractive index within the object along a line along which the object is intended to be cut in the object.

The laser processing method in accordance with this aspect of the present invention irradiates the object to be processed with laser light such that the major axis of the ellipse indicative of the elliptical polarization of laser light extends along the line along which the object is intended to be cut in the object to be processed, thus making it possible to form the modified region efficiently and cut the object precisely along the line along which the object is intended to be cut as in the laser processing method in accordance with the above-mentioned aspect of the present invention.

Modes employable in the laser processing methods in accordance with the foregoing aspects of the present invention are as follows:

Laser light having elliptical polarization with an ellipticity of zero can be used. Linearly polarized light is obtained when the ellipticity is zero. Linearly polarized light can maximize the size of the modified region extending along the line along which the object is intended to be cut and minimize the sizes in the other directions. The ellipticity of elliptically polarized light can be adjusted by the angle of direction of a quarter-wave plate. When a quarter-wave plate is used, the ellipticity can be adjusted by changing the angle of direction alone.

After the step of forming the modified region, the object to be processed may be irradiated with laser light while the polarization of laser light is rotated by about 90° by a half-wave plate. Also, after the step of forming the modified region, the object to be processed may be irradiated with laser light while the object to be processed is rotated by about 90° about the thickness direction of the object to be processed. These can form another modified region extending in a direction along the surface of the object to be processed and intersecting the former modified region. Therefore, for embodiment, respective modified regions extending along lines along which the object is intended to be cut in X- and Y-axis directions can be formed efficiently.

The laser processing method in accordance with an aspect of the present invention comprises a step of irradiating an object to be processed with laser light such that a light-converging point of laser light elliptically polarized with an ellipticity of other than 1 is located within the object to be processed while the major axis of an ellipse indicative of the elliptical polarization of the laser light extends along a line along which the object is intended to be cut, so as to cut the object to be processed along the line along which the object is intended to be cut.

The laser processing method in accordance with this aspect of the present invention irradiates the object to be processed with laser light such that the major axis of the ellipse indicative of the elliptical polarization of laser light extends along the line along which the object is intended to be cut in the object to be processed. Therefore, the object to be processed can be cut along the line along which the object is intended to be cut. The laser processing method in accordance with this aspect of the present invention can cut the object to be processed by making the object absorb laser light so as to melt the object upon heating. Also, the laser processing method in accordance with this aspect of the present invention may generate multiphoton absorption by irradiating the object to be processed with laser light, thereby forming a modified region within the object, and cut the object while using the modified region as a starting point.

The laser processing apparatus in accordance with an aspect of the present invention comprises a laser light source for emitting pulse laser light having a pulse width of 1 µs or less; ellipticity adjusting means for making the pulse laser light emitted from the laser light source attain elliptical polarization with an ellipticity of other than 1; major axis adjusting means for making a major axis of an ellipse indicative of the elliptical polarization of the pulse laser light adjusted by the ellipticity adjusting means extend along a line along which the object is intended to be cut in an object to be processed; light-converging means for converging the pulse laser light adjusted by the major axis adjusting means such that the pulse laser light attains a peak power density of at least $1 \times 10^8$ (W/cm$^2$) at a light-converging point; means for locating the light-converging point of the pulse laser light converged by the light-converging point within the object to be processed; and moving means for relatively moving the light-converging point of pulse laser light along the line along which the object is intended to be cut.

The laser processing apparatus in accordance with this aspect of the present invention enables laser cutting without generating melt or unnecessary fractures deviating from the line along which the object is intended to be cut in the surface of the object to be processed for the same reason as that in the laser processing methods in accordance with the above-mentioned aspects of the present invention. Also, it irradiates the object to be processed with laser light such that the major axis of the ellipse indicative of the elliptical polarization of laser light extends along the line along which the object is intended to be cut in the object to be processed, thus making it possible to form the modified region efficiently and cut the object precisely along the line along which the object is intended to be cut with the laser processing methods in accordance with the above-mentioned aspects of the present invention.

Modes employable in the laser processing apparatus in accordance with the present invention are as follows:

It may comprise 90° rotation adjusting means adapted to rotate the polarization of the pulse laser light adjusted by the ellipticity adjusting means by about 90°. Also, it may comprise rotating means for rotating a table for mounting the object to be processed by about 90° about a thickness direction of the object. These can make the major axis of the ellipse indicative of the elliptical polarization of pulse laser light extend along another line along which the object is intended to be cut which extends in a direction along a surface of the object to be processed while extending in a direction intersecting along the former line along which the object is intended to be cut. Therefore, for embodiment, respective modified regions extending along lines along which the object is intended to be cut in X- and Y-axis directions can be formed efficiently.

The laser processing apparatus in accordance with an aspect of the present invention comprises a laser light source for emitting pulse laser light having a pulse width of 1 µs or less and linear polarization; linear polarization adjusting means for making the direction of linear polarization of the pulse laser light emitted from the laser light source align with a line along which the object is intended to be cut in an object to be processed; light-converging means for converging the pulse laser light adjusted by the linear polarization adjusting means such that the pulse laser light attains a peak power density of at least $1 \times 10^8$ (W/cm$^2$) at a light-converging point; means for locating the light-converging point of the pulse laser light converged by the light-converging point within the object to be processed; and moving means for relatively moving the light-converging point of pulse laser light along the line along which the object is intended to be cut.

The laser processing apparatus in accordance with this aspect of the present invention enables laser cutting without generating melt or unnecessary fractures deviating from the line along which the object is intended to be cut in the surface of the object to be processed for the same reason as that in the laser processing methods in accordance with the above-mentioned aspects of the present invention. Also, as with the laser processing methods in accordance with the above-mentioned aspects of the present invention, the laser processing apparatus in accordance with this aspect of the present invention makes it possible to form the modified region efficiently and cut the object precisely along the line along which the object is intended to be cut.

(3) The laser processing apparatus in accordance with an aspect of the present invention comprises a laser light source for emitting pulse laser light having a pulse width of 1 μs or less; power adjusting means for adjusting the magnitude of power of the pulse laser light emitted from the laser light source according to an input of the magnitude of power of pulse laser light; light-converging means for converging the pulse laser light adjusted by the linear polarization adjusting means such that the pulse laser light attains a peak power density of at least $1 \times 10^8$ (W/cm$^2$) at a light-converging point; means for locating the light-converging point of the pulse laser light converged by the light-converging means within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; the laser processing apparatus further comprising correlation storing means having stored therein a correlation between the magnitude of power of pulse laser adjusted by the power adjusting means and the size of modified spot; size selecting means for choosing, according to an inputted magnitude of power of pulse laser light, a size of the modified spot formed at this magnitude of power from the correlation storing means; and size display means for displaying the size of modified spot chosen by the size selecting means.

The inventor has found that the modified spot can be controlled so as to become smaller and larger when the power of pulse laser light is made lower and higher, respectively. The modified spot is a modified part formed by one pulse of pulse laser light, whereas an assembly of modified spots forms a modified region. Control of the modified spot size affects cutting of the object to be processed. Namely, the accuracy in cutting the object to be processed along the line along which the object is intended to be cut and the flatness of the cross section deteriorate when the modified spot is too large. When the modified spot is too small for the object to be processed having a large thickness, on the other hand, the object is hard to cut. The laser processing apparatus in accordance with this aspect of the present invention can control the size of modified spot by adjusting the magnitude of power of pulse laser light. Therefore, it can cut the object to be processed precisely along the line along which the object is intended to be cut, and can obtain a flat cross section.

The laser processing apparatus in accordance with this aspect of the present invention also comprises correlation storing means having stored therein a correlation between the magnitude of power of pulse laser adjusted by the power adjusting means and the size of modified spot. According to an inputted magnitude of power of pulse laser light, the size of modified spot formed at this magnitude of power is chosen from the correlation storing means, and thus chosen size of modified spot is displayed. Therefore, the size of modified spot formed at the magnitude of power of pulse laser light fed into the laser processing apparatus can be seen before laser processing.

The laser processing apparatus in accordance with an aspect of the present invention comprises a laser light source for emitting pulse laser light having a pulse width of 1 μs or less; a light-converging lens for converging the pulse laser light emitted from the laser light source such that the pulse laser light attains a peak power density of at least $1 \times 10^8$ (W/cm$^2$) at a light-converging point; numerical aperture adjusting means for adjusting the size of numerical aperture of an optical system including the light-converging lens according to an inputted size of numerical aperture; means for locating the light-converging point of the pulse laser light converged by the light-converging lens within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; the laser processing apparatus further comprising correlation storing means having stored therein a correlation between the size of numerical aperture adjusted by the power adjusting means and the size of modified spot; size selecting means for choosing, according to an inputted magnitude of power of pulse laser light, a size of the modified spot formed at this size of numerical aperture from the correlation storing means; and size display means for displaying the size of modified spot chosen by the size selecting means.

The inventor has found that the modified spot can be controlled so as to become smaller and larger when the numerical aperture of the optical system including the light-converging lens is made greater and smaller, respectively. Thus, the laser processing apparatus in accordance with this aspect of the present invention can control the size of modified spot by adjusting the size of numerical aperture of the optical system including the light-converging lens.

The laser processing apparatus in accordance with this aspect of the present invention also comprises correlation storing means having stored therein a correlation between the size of numerical aperture and the size of modified spot. According to an inputted size of numerical aperture, the size of modified spot formed at this magnitude of power is chosen from the correlation storing means, and thus chosen size of modified spot is displayed. Therefore, the size of modified spot formed at the size of numerical aperture fed into the laser processing apparatus can be seen before laser processing.

The laser processing apparatus in accordance with an aspect of the present invention comprises a laser light source for emitting pulse laser light having a pulse width of 1 μs or less; and lens selecting means including a plurality of light-converging lenses for converging the pulse laser light emitted from the laser light source such that the pulse laser light attains a peak power density of at least $1 \times 10^8$ (W/cm$^2$) at a light-converging point, the lens selecting means being adapted to select among a plurality of light-converging lenses, a plurality of optical systems including the light-converging lenses having respective numerical apertures different from each other; means for locating the light-converging point of the pulse laser light converged by a light-converging lens chosen by the lens selecting means within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; the laser processing apparatus further comprising correlation storing means having stored therein a correlation between sizes of numerical apertures of a plurality of optical systems including the light-converging lenses and the size of modified spot; size selecting means for choosing, according to a size of numerical aperture of an optical system including a chosen light-converging lens, a size of the modified spot formed at this size of numerical aperture from the correlation storing means; and size display means for displaying the size of modified spot chosen by the size selecting means.

The laser processing apparatus in accordance with the present invention can control the size of modified spot. Also, the size of modified spot formed at the size of numerical aperture of the optical system including the chosen light-converging lens can be seen before laser processing.

The laser processing apparatus in accordance with an aspect of the present invention comprises a laser light source for emitting pulse laser light having a pulse width of 1 µs or less; power adjusting means for adjusting the magnitude of power of pulse laser light emitted from the laser light source according to an inputted magnitude of power of pulse laser light; a light-converging lens for converging the pulse laser light emitted from the laser light source such that the pulse laser light attains a peak power density of at least $1 \times 10^8$ (W/cm$^2$) at a light-converging point; numerical aperture adjusting means for adjusting the size of numerical aperture of an optical system including the light-converging lens according to an inputted size of numerical aperture; means for locating the light-converging point of the pulse laser light converged by the light-converging lens within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; the laser processing apparatus further comprising correlation storing means having stored therein a correlation between a set of the magnitude of power of pulse laser light adjusted by the power adjusting means and the size of numerical aperture adjusted by the numerical aperture adjusting means and the size of modified spot; size selecting means for choosing, according to an inputted magnitude of power of pulse laser light and an inputted size of numerical aperture, a size of the modified spot formed at thus inputted magnitude and size; and size display means for displaying the size of modified spot chosen by the size selecting means.

The laser processing apparatus in accordance with this aspect of the present invention can combine power adjustment with numerical aperture adjustment, thus being able to increase the number of kinds of controllable dimensions of modified spots. Also, for the same reason as that of the laser processing apparatus in accordance with the present invention, the size of modified spot can be seen before laser processing.

The laser processing apparatus in accordance with an aspect of the present invention comprises a laser light source for emitting pulse laser light having a pulse width of 1 µs or less; power adjusting means for adjusting the magnitude of power of pulse laser light emitted from the laser light source according to an inputted magnitude of power of pulse laser light; lens selecting means including a plurality of light-converging lenses for converging the pulse laser light emitted from the laser light source such that the pulse laser light attains a peak power density of at least $1 \times 10^8$ (W/cm$^2$) at a light-converging point, the lens selecting means being adapted to select among a plurality of light-converging lenses, a plurality of optical systems including the light-converging lenses having respective numerical apertures different from each other; means for locating the light-converging point of the pulse laser light converged by a light-converging lens chosen by the lens selecting means within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; the laser processing apparatus further comprising correlation storing means having stored therein a correlation between a set of the magnitude of power of pulse laser light adjusted by the power adjusting means and sizes of numerical apertures of a plurality of optical systems including the light-converging lenses and the size of modified spot; size selecting means for choosing, according to an inputted magnitude of power of pulse laser light and an inputted size of numerical aperture, a size of the modified spot formed at thus inputted magnitude and size; and size display means for displaying the size of modified spot chosen by the size selecting means.

For the same reason as that of the laser processing apparatus in accordance with the above-mentioned aspect of the present invention, the laser processing apparatus in accordance with this aspect of the present invention can increase the number of kinds of controllable dimensions of modified spots and can see the size of modified spots before laser processing.

The laser processing apparatus explained in the foregoing may comprise image preparing means for preparing an image of modified spot having the size selected by the size selecting means, and image display means for displaying the image prepared by the image preparing means. This allows the formed modified spot to be grasped visually before laser processing.

The laser processing apparatus in accordance with an aspect of the present invention comprises a laser light source for emitting pulse laser light having a pulse width of 1 µs or less; power adjusting means for adjusting the magnitude of power of pulse laser light emitted from the laser light source; light-converging means for converging the pulse laser light emitted from the laser light source such that the pulse laser light attains a peak power density of at least $1 \times 10^8$ (W/cm$^2$) at a light-converging point; means for locating the light-converging point of the pulse laser light converged by the light-converging means within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; the laser processing apparatus further comprising correlation storing means having stored therein a correlation between the magnitude of power of pulse laser light adjusted by the power adjusting means and the size of modified spot; power selecting means for choosing, according to an inputted size of modified spot, a magnitude of power of pulse laser light adapted to form this size from the correlation storing means; the power adjusting means adjusting the magnitude of power of pulse laser light emitted from the laser light source such that the magnitude of power chosen by the power selecting means is attained.

The laser processing apparatus in accordance with this aspect of the present invention comprises correlation storing means having stored therein the magnitude of power of pulse laser light and the size of modified spot. According to an inputted size of the modified spot, the magnitude of power of pulse laser light adapted to form this size is chosen from the correlation storing means. The power adjusting means adjusts the magnitude of power of pulse laser light emitted from the laser light source so as to make it become the magnitude of power chosen by the power selecting means. Therefore, a modified spot having a desirable size can be formed.

The laser processing apparatus in accordance with an aspect of the present invention comprises a laser light source for emitting pulse laser light having a pulse width of 1 µs or less; a light-converging lens for converging the pulse laser light emitted from the laser light source such that the pulse laser light attains a peak power density of at least $1 \times 10^8$ (W/cm$^2$) at a light-converging point; numerical aperture adjusting means for adjusting the size of numerical aperture of an optical system including the light-converging lens according to an inputted size of numerical aperture; means for locating the light-converging point of the pulse laser light converged by the light-converging lens within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; the laser processing apparatus further comprising correlation storing means having stored therein a correlation between the size of numerical aperture adjusted by the numerical aperture adjusting means and the size of modified spot; and numerical aperture selecting means for choosing, according to an inputted size of modified spot, the size of numerical aperture adapted to form thus inputted size; the numerical aperture adjusting means adjusting the size of numerical aperture of the optical system including the light-converging lens such that the size of numerical aperture chosen by the numerical aperture selecting means is attained.

The laser processing apparatus in accordance with this aspect of the present invention comprises correlation storing means having stored therein the size of numerical aperture and the size of modified spot. According to an inputted size of modified spot, the size of numerical aperture adapted to form thus inputted size is chosen from the correlation storing means. The numerical aperture adjusting means adjusts the size of numerical aperture of the optical system including the light-converging lens such that the size of numerical aperture chosen by the numerical aperture selecting means is attained. Therefore, modified spots having a desirable size can be formed.

The laser processing apparatus in accordance with an aspect of the present invention comprises a laser light source for emitting pulse laser light having a pulse width of 1 µs or less; lens selecting means including a plurality of light-converging lenses for converging the pulse laser light emitted from the laser light source such that the pulse laser light attains a peak power density of at least $1 \times 10^8$ (W/cm$^2$) at a light-converging point, the lens selecting means being adapted to select among a plurality of light-converging lenses, a plurality of optical systems including the light-converging lenses having respective numerical apertures different from each other; means for locating the light-converging point of the pulse laser light converged by a light-converging lens chosen by the lens selecting means within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; the laser processing apparatus further comprising correlation storing means having stored therein a correlation between sizes of numerical apertures of a plurality of light-converging lenses and the size of modified spot; and numerical aperture selecting means for choosing, according to an inputted size of modified spot, a size of numerical aperture adapted to form thus inputted size; the lens selecting means selecting among a plurality of light-converging lenses such that the size of numerical aperture chosen by the numerical aperture selecting means is attained.

According to an inputted size of modified spot, the laser processing apparatus in accordance with this aspect of the present invention chooses the size of numerical aperture adapted to form thus inputted size. The lens selecting means selects among a plurality of light-converging lenses such that the size of numerical aperture chosen by the numerical aperture selecting means is attained. Therefore, modified spots having a desirable spots can be formed.

The laser processing apparatus in accordance with an aspect of the present invention comprises a laser light source for emitting pulse laser light having a pulse width of 1 µs or less; power adjusting means for adjusting the magnitude of power of pulse laser light emitted from the laser light source; a light-converging lens for converging the pulse laser light emitted from the laser light source such that the pulse laser light attains a peak power density of at least $1 \times 10^8$ (W/cm$^2$) at a light-converging point; numerical aperture adjusting means for adjusting the size of numerical aperture of an optical system including the light-converging lens; means for locating the light-converging point of the pulse laser light converged by the light-converging lens within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; the laser processing apparatus further comprising correlation storing means having stored therein a correlation between a set of the magnitude of power of pulse laser light adjusted by the power adjusting means and the size of numerical aperture adjusted by the numerical aperture adjusting means and the size of modified spot; and set selecting means for choosing, according to an inputted size of modified spot, a set of the magnitude of power and size of numerical aperture adapted to form this size; the power adjusting means and numerical aperture adjusting means adjusting the magnitude of power of pulse laser light emitted from the laser light source and the size of numerical aperture of the optical system including the light-converging lens such that the magnitude of power and size of numerical aperture chosen by the set selecting means are attained.

According to an inputted size of modified spot, the laser processing apparatus in accordance with this aspect of the present invention chooses a combination of the magnitude of power and size of numerical aperture adapted to form thus inputted size from the correlation storing means. Then, it adjusts the magnitude of power of pulse laser light and the size of numerical aperture of the optical system including the light-converging lens so as to attain the chosen magnitude of power and size of numerical aperture. Therefore, modified spots having a desirable size can be formed. Also, since the magnitude of power and the size of numerical aperture are combined together, the number of kinds of controllable dimensions of modified spots can be increased.

The laser processing apparatus in accordance with an aspect of the present invention comprises a laser light source for emitting pulse laser light having a pulse width of 1 μs or less; power adjusting means for adjusting the magnitude of power of pulse laser light emitted from the laser light source; lens selecting means including a plurality of light-converging lenses for converging the pulse laser light emitted from the laser light source such that the pulse laser light attains a peak power density of at least $1 \times 10^8$ (W/cm$^2$) at a light-converging point, the lens selecting means being adapted to select among a plurality of light-converging lenses, a plurality of optical systems including the light-converging lenses having respective numerical apertures different from each other; means for locating the light-converging point of the pulse laser light converged by a light-converging lens chosen by the lens selecting means within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; the laser processing apparatus further comprising correlation storing means having stored therein a correlation between a set of the magnitude of power of pulse laser light adjusted by the power adjusting means and sizes of numerical apertures of a plurality of optical systems including the light-converging lenses and the size of modified spot; and set selecting means for choosing, according to an inputted size of modified spot, a set of the magnitude of power and size of numerical aperture adapted to form thus inputted size from the correlation storing means; the power adjusting means and lens selecting means adjusting the magnitude of power of pulse laser light emitted from the laser light source and selecting among a plurality of light-converging lenses so as to attain the power and size of numerical aperture chosen by the set selecting means.

According to an inputted size of modified spot, the laser processing apparatus in accordance with this aspect of the present invention chooses a combination of the magnitude of power and size of numerical aperture adapted to form thus inputted size from the correlation storing means. It adjusts the magnitude of power of pulse laser light emitted from the laser light source and selects among a plurality of light-converging lenses so as to attain the chosen magnitude of power and size of numerical aperture, respectively. Therefore, modified spots having a desirable size can be formed. Also, since the magnitude of power and the size of numerical aperture are combined together, the number of kinds of controllable dimensions of modified spots can be increased.

The laser processing apparatus in accordance with this aspect of the present invention may further comprise display means for displaying the magnitude of power chosen by the power selecting means, display means for displaying the size of numerical aperture chosen by the numerical aperture selecting means, and display means for displaying the magnitude of power and size of numerical aperture of the set chosen by the set selecting means. This makes it possible to see the power and numerical aperture when the laser processing apparatus operates according to an inputted size of modified spot.

The laser processing apparatus can form a plurality of modified spots along a line along which the object is intended to be cut within the object to be processed. These modified spots define a modified region. The modified region includes at least one of a crack region where a crack is generated within the object to be processed, a molten processed region which is melted within the object to be processed, and a refractive index change region where refractive index is changed within the object to be processed.

An embodiment of modes of power adjusting means is one including at least one of an ND filter and a polarization filter. In another mode, the laser light source includes a pumping laser whereas the laser processing apparatus comprises driving current controlling means for controlling the driving current of the pumping laser. These can adjust the magnitude of power of pulse laser light. An embodiment of modes of numerical aperture adjusting means includes at least one of a beam expander and an iris diaphragm.

The laser processing method in accordance with an aspect of the present invention comprises a first step of irradiating an object to be processed with pulse laser light while locating a light-converging point of the pulse laser light within the object, so as to form a first modified region caused by multiphoton absorption within the object along a first line along which the object is intended to be cut in the object; and a second step of irradiating the object with pulse laser light while making the pulse laser light attain a power higher or lower than that in the first step and locating the light-converging point of the pulse laser light within the object, so as to form a second modified region caused by multiphoton absorption within the object along a second line along which the object is intended to be cut in the object.

The laser processing method in accordance with an aspect of the present invention comprises a first step of irradiating an object to be processed with pulse laser light while locating a light-converging point of the pulse laser light within the object, so as to form a first modified region caused by multiphoton absorption within the object along a first line along which the object is intended to be cut in the object; and a second step of irradiating the object with pulse laser light while making an optical system including a light-converging lens for converging the pulse laser light attain a numerical aperture greater or smaller than that in the first step and locating the light-converging point of the pulse laser light within the object, so as to form a second modified region caused by multiphoton absorption within the object along a second line along which the object is intended to be cut in the object.

When respective directions which are easy to cut and hard to cut exist due to the crystal orientation, for embodiment, the laser processing methods in accordance with these aspects of the present invention decreases the size of modified spot constituting a modified region formed in the easy-to-cut direction and increases the size of modified spot constituting another modified region formed in the hard-to-cut direction. This can attain a flat cross section in the easy-to-cut direction and enables cutting in the hard-to-cut direction as well.

The laser processing apparatus in accordance with an aspect of the present invention comprises a laser light source for emitting pulse laser light having a pulse width of 1 μs or less; frequency adjusting means for adjusting the magnitude of a repetition frequency of the pulse laser light emitted from the laser light source according to an inputted magnitude of frequency; light-converging means for converging the pulse laser light emitted from the laser light source such that the pulse laser light attains a peak power density of at least $1 \times 10^8$ (W/cm$^2$) at a light-converging point; means for locating the light-converging point of the pulse laser light converged by the light-converging means within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; and wherein a plurality of modified spots are formed along the line along which the object is intended to be cut within the object to be processed by irradiating the object to be processed with a plurality of pulses of pulse laser light while locating the light-converging point within the object and relatively moving the light-converging point along the line along which the object is intended to be cut; the laser processing apparatus further comprising distance calculating means for calculating a distance between modified spots adjacent each other according to an inputted magnitude of frequency; and distance display means for displaying the distance calculated by the distance calculating means.

The inventor has found that, when the light-converging point of pulse laser light has a fixed relative moving speed, the distance between a modified part (referred to as modified spot) formed by one pulse of pulse laser light and a modified spot formed by the next one pulse of laser light can be made greater by lowering the repetition frequency. It has been found that, by contrast, the distance can be made shorter by increasing the repetition frequency of pulse laser light. In the present specification, this distance is expressed as the distance or pitch between adjacent modified spots.

Therefore, the distance between the adjacent modified spots can be controlled by carrying out adjustment for increasing or decreasing the repetition frequency of pulse laser light. Changing the distance according to the kind, thickness, and the like of the object to be processed enables cutting in conformity to the object to be processed. Forming a plurality of modified spots along a line along which the object is intended to be cut within the object to be processed defines a modified region.

The laser processing apparatus in accordance with this aspect of the present invention calculates the distance between adjacent modified spots according to the inputted magnitude of frequency, and displays thus calculated distance. Therefore, with respect to modified spots formed according to the magnitude of frequency fed into the laser processing apparatus, the distance between adjacent spots can be seen before laser processing.

The laser processing apparatus in accordance with an aspect of the present invention comprises a laser light source for emitting pulse laser light having a pulse width of 1 μs or less; light-converging means for converging the pulse laser light emitted from the laser light source such that the pulse laser light attains a peak power density of at least $1\times10^8$ (W/cm$^2$) at a light-converging point; means for locating the light-converging point of the pulse laser light converged by the light-converging means within an object to be processed; moving means for relatively moving the light-converging point of pulse laser light along a line along which the object is intended to be cut in the object to be processed; and speed adjusting means for adjusting the magnitude of relative moving speed of the light-converging point of pulse laser light caused by the moving means according to an inputted magnitude of speed; wherein one modified spot is formed within the object to be processed by irradiating the object to be processed with one pulse of pulse laser light while locating the light-converging point within the object; and wherein a plurality of modified spots are formed along the line along which the object is intended to be cut within the object to be processed by irradiating the object to be processed with a plurality of pulses of pulse laser light while locating the light-converging point within the object and relatively moving the light-converging point along the line along which the object is intended to be cut; the laser processing apparatus further comprising distance calculating means for calculating a distance between modified spots adjacent each other according to an inputted magnitude of speed; and distance display means for displaying the distance calculated by the distance calculating means.

The inventor has found that, when the light-converging point of pulse laser light has a fixed relative moving speed, the distance between adjacent modified spots can be made shorter and longer by decreasing and increasing the relative moving speed of the light-converging point of pulse laser light, respectively. Therefore, the distance between adjacent modified spots can be controlled by increasing or decreasing the relative moving speed of the light-converging point of pulse laser light. As a consequence, a cutting process suitable for an object to be processed is possible by changing the distance according to the kind, thickness, and the like of the object to be processed. The relative movement of the light-converging point of pulse laser light may be achieved by moving the object to be processed while fixing the light-converging point of pulse laser light, by moving the light-converging point of pulse laser light while fixing the object to be processed, or by moving both.

The laser processing apparatus in accordance with this aspect of the present invention calculates the distance between adjacent modified spots according to the inputted magnitude of speed, and displays thus calculated distance. Therefore, with respect to modified spots formed according to the magnitude of speed fed into the laser processing apparatus, the distance between adjacent spots can be seen before laser processing.

The laser processing apparatus in accordance with an aspect of the present invention comprises a laser light source for emitting pulse laser light having a pulse width of 1 μs or less; frequency adjusting means for adjusting the magnitude of a repetition frequency of the pulse laser light emitted from the laser light source according to an inputted magnitude of frequency; light-converging means for converging the pulse laser light emitted from the laser light source such that the pulse laser light attains a peak power density of at least $1\times10^8$ (W/cm$^2$) at a light-converging point; means for locating the light-converging point of the pulse laser light converged by the light-converging means within an object to be processed; moving means for relatively moving the light-converging point of pulse laser light along a line along which the object is intended to be cut in the object to be processed; and speed adjusting means for adjusting the magnitude of relative moving speed of the light-converging point of pulse laser light caused by the moving means according to an inputted magnitude of speed; wherein one modified spot is formed within the object to be processed by irradiating the object to be processed with one pulse of pulse laser light while locating the light-converging point within the object; and wherein a plurality of modified spots are formed along the line along which the object is intended to be cut within the object to be processed by irradiating the object to be processed with a plurality of pulses of pulse laser light while locating the light-converging point within the object and relatively moving the light-converging point along the line along which the object is intended to be cut; the laser processing apparatus further comprising distance calculating means for calculating a distance between modified spots adjacent each other according to inputted magnitudes of frequency and speed; and distance display means for displaying the distance calculated by the distance calculating means.

The laser processing apparatus in accordance with this aspect of the present invention adjusts both the magnitude of a repetition frequency of pulse laser light and the magnitude of relative moving speed of the light-converging point, thereby being able to control the distance between adjacent modified spots. Combining these adjustments makes it possible to increase the number of kinds of controllable dimensions concerning the distance. Also, the laser processing apparatus in accordance with this aspect of the present invention allows the distance between adjacent modified spots to be seen before laser processing.

These laser processing apparatus may further comprise size storing means having stored therein the size of a modified spot formed by the laser processing apparatus; image preparing means for preparing an image of a plurality of modified spots formed along a line along which the object is intended to be cut according to the size stored in the size storing means and the distance calculated by the distance calculating means; and image display means for displaying the image prepared by the image preparing means. This allows a plurality of modified spots, i.e., modified region, to be grasped visually before laser processing.

The laser processing apparatus in accordance with an aspect of the present invention comprises a laser light source for emitting pulse laser light having a pulse width of 1 µs or less; frequency adjusting means for adjusting the magnitude of a repetition frequency of the pulse laser light emitted from the laser light source according to an inputted magnitude of frequency; light-converging means for converging the pulse laser light emitted from the laser light source such that the pulse laser light attains a peak power density of at least $1 \times 10^8$ (W/cm$^2$) at a light-converging point; means for locating the light-converging point of the pulse laser light converged by the light-converging means within an object to be processed; and moving means for relatively moving the light-converging point of pulse laser light along a line along which the object is intended to be cut in the object to be processed; wherein one modified spot is formed within the object to be processed by irradiating the object to be processed with one pulse of pulse laser light while locating the light-converging point within the object; and wherein a plurality of modified spots are formed along the line along which the object is intended to be cut within the object to be processed by irradiating the object to be processed with a plurality of pulses of pulse laser light while locating the light-converging point within the object and relatively moving the light-converging point along the line along which the object is intended to be cut; the laser processing apparatus further comprising frequency calculating means for calculating, according to an inputted magnitude of distance between modified spots adjacent each other, the magnitude of repetition frequency of the pulse laser light emitted from the laser light source so as to attain thus inputted magnitude of distance between the modified spots adjacent each other; the frequency adjusting means adjusting the magnitude of repetition frequency of the pulse laser light emitted from the laser light source such that the magnitude of frequency calculated by the frequency calculating means is attained.

According to an inputted magnitude of distance between adjacent modified spots, the laser processing apparatus in accordance with this aspect of the present invention calculates the magnitude of a repetition frequency of the pulse laser light emitted from the laser light source such that this magnitude of distance is attained between the adjacent modified spots. The frequency adjusting means adjusts the magnitude of repetition frequency of the pulse laser light emitted from the laser light source such that the magnitude of frequency calculated by the frequency calculating means is attained. Therefore, a desirable magnitude of distance can be attained between adjacent modified spots.

The laser processing apparatus in accordance with this aspect of the present invention may further comprise frequency display means for displaying the magnitude of frequency calculated by the frequency calculating means. When operating the laser processing apparatus according to the inputted magnitude of distance between adjacent modified spots, this allows the frequency to be seen before laser processing.

The laser processing apparatus in accordance with an aspect of the present invention comprises a laser light source for emitting pulse laser light having a pulse width of 1 µs or less; light-converging means for converging the pulse laser light emitted from the laser light source such that the pulse laser light attains a peak power density of at least $1 \times 10^8$ (W/cm$^2$) at a light-converging point; means for locating the light-converging point of the pulse laser light converged by the light-converging means within an object to be processed; moving means for relatively moving the light-converging point of pulse laser light along a line along which the object is intended to be cut in the object to be processed; and speed adjusting means for adjusting the magnitude of relative moving speed of the light-converging point caused by the moving means; wherein one modified spot is formed within the object to be processed by irradiating the object to be processed with one pulse of pulse laser light while locating the light-converging point within the object; and wherein a plurality of modified spots are formed along the line along which the object is intended to be cut within the object to be processed by irradiating the object to be processed with a plurality of pulses of pulse laser light while locating the light-converging point within the object and relatively moving the light-converging point along the line along which the object is intended to be cut; the laser processing apparatus further comprising speed calculating means for calculating, according to an inputted magnitude of distance between modified spots adjacent each other, the magnitude of relative moving speed of the pulse laser light so as to attain thus inputted magnitude of distance between the modified spots adjacent each other; the speed adjusting means adjusting the magnitude of relative moving speed of the light-converging point of pulse laser light caused by the moving means such that the magnitude of relative moving speed calculated by the speed calculating means is attained.

According to an inputted magnitude of distance between adjacent modified spots, the laser processing apparatus in accordance with this aspect of the present invention calculates the magnitude of relative moving speed of the light-converging point of pulse laser light caused by the moving means. The speed adjusting means adjusts the magnitude of relative moving speed of the light-converging point of pulse laser light caused by the moving means such that the magnitude of relative moving speed calculated by the frequency calculating means is attained. Therefore, a desirable magnitude of distance can be attained between adjacent modified spots.

The laser processing apparatus in accordance with this aspect of the present invention may further comprise speed display means for displaying the magnitude of relative moving speed calculated by the speed calculating means. When operating the laser processing apparatus according to the inputted magnitude of distance between adjacent modified spots, this allows the relative moving speed to be seen before laser processing.

The laser processing apparatus in accordance with an aspect of the present invention comprises a laser light source for emitting pulse laser light having a pulse width of 1 µs or less; frequency adjusting means for adjusting the magnitude of a repetition frequency of the pulse laser light emitted from the laser light source; light-converging means for converging the pulse laser light emitted from the laser light source such that the pulse laser light attains a peak power density of at least $1\times10^8$ (W/cm$^2$) at a light-converging point; means for locating the light-converging point of the pulse laser light converged by the light-converging means within an object to be processed; moving means for relatively moving the light-converging point of pulse laser light along a line along which the object is intended to be cut in the object to be processed; and speed adjusting means for adjusting the magnitude of relative moving speed of the light-converging point caused by the moving means; wherein one modified spot is formed within the object to be processed by irradiating the object to be processed with one pulse of pulse laser light while locating the light-converging point within the object; and wherein a plurality of modified spots are formed along the line along which the object is intended to be cut within the object to be processed by irradiating the object to be processed with a plurality of pulses of pulse laser light while locating the light-converging point within the object and relatively moving the light-converging point along the line along which the object is intended to be cut; the laser processing apparatus further comprising combination calculating means for calculating, according to an inputted magnitude of distance between modified spots adjacent each other, a combination of the magnitude of repetition frequency of the pulse laser light emitted from the laser light source and the magnitude of relative moving speed of the light-converging point of pulse laser light caused by the moving means so as to attain thus inputted magnitude of distance between the modified spots adjacent each other; the frequency adjusting means adjusting the magnitude of repetition frequency of the pulse laser light emitted from the laser light source such that the magnitude of frequency calculated by the combination calculating means is attained; the speed adjusting means adjusting the magnitude of relative moving speed of the light-converging point of pulse laser light caused by the moving means such that the magnitude of relative moving speed calculated by the combination calculating means is attained.

The laser processing apparatus in accordance with this aspect of the present invention calculates, according to an inputted magnitude of distance between adjacent modified spots, a combination of the magnitude of repetition frequency of pulse laser light and the relative moving speed of the light-converging point of pulse laser light such that thus inputted magnitude of distance is attained between the adjacent modified spots. The frequency adjusting means and speed adjusting means adjust the magnitude of repetition frequency and the magnitude of relative moving speed of the light-converging point of pulse laser light so as to attain the values of calculated combination. Therefore, a desirable magnitude of distance can be attained between adjacent modified spots.

The laser processing apparatus in accordance with the present invention may comprise display means for displaying the magnitude of frequency and magnitude of relative moving speed calculated by the combination calculating means. When operating the laser processing apparatus according to the inputted magnitude of distance between adjacent modified spots, this allows the combination of frequency and relative moving speed to be seen before laser processing.

The laser processing apparatus in accordance with all the foregoing aspects of the present invention can form a plurality of modified spots along a line along which the object is intended to be cut within the object to be processed. These modified spots define a modified region. The modified region includes at least one of a crack region where a crack is generated within the object to be processed, a molten processed region which is melted within the object to be processed, and a refractive index change region where refractive index is changed within the object to be processed.

The laser processing apparatus in accordance with all the foregoing aspects of the present invention can adjust the distance between adjacent modified spots, thereby being able to form a modified region continuously or discontinuously along a line along which the object is intended to be cut. Forming the modified region continuously makes it easier to cut the object to be processed while using the modified region as compared with the case where it is not formed continuously. When the modified region is formed discontinuously, the modified region is discontinuous along the line along which the object is intended to be cut, whereby the part of the line along which the object is intended to be cut keeps a strength to a certain extent.

The laser processing method in accordance with an aspect of the present invention comprises a step of irradiating an object to be processed with laser light while locating a light-converging point of laser light within the object to be processed, so as to form a modified region caused by multiphoton absorption within the object along a line along which the object is intended to be cut in the object, and changing the position of the light-converging point of laser light in the direction of incidence of the laser light irradiating the object to be processed with respect to the object to be processed, so as to form a plurality of modified regions aligning with each other along the direction of incidence.

By changing the position of the light-converging point of laser light irradiating the object to be processed in the direction of incidence with respect to the object to be processed, the laser processing method in accordance with this aspect of the present invention forms a plurality of modified regions aligning with each other along the direction of incidence. This can increase the number of positions to become starting points when cutting the object to be processed. Therefore, the object to be processed can be cut even in the case where the object to be processed has a relatively large thickness and the like. Embodiments of the direction of incidence include the thickness direction of the object to be processed and directions orthogonal to the thickness direction.

The laser processing method in accordance with an aspect of the present invention comprises a step of irradiating an object to be processed with laser light while locating a light-converging point of laser light within the object to be processed, so as to form a modified region within the object along a line along which the object is intended to be cut in the object, and changing the position of the light-converging point of laser light in the direction of incidence of the laser light irradiating the object to be processed with respect to the object to be processed, so as to form a plurality of modified regions aligning with each other along the direction of incidence. The laser processing method in accordance with an aspect of the present invention comprises a step of irradiating an object to be processed with laser light while locating a light-converging point of laser light within the object to be processed under a condition with a peak power density of at least $1\times10^6$ (W/cm$^2$) and a pulse width of 1 µs or less at the light-converging point, so as to form a modified region within the object to be processed along a line along which the object is intended to be cut in the object, and changing the position of the light-converging point of laser light in the direction of incidence of the laser light irradiating the object to be processed with respect to the object to be processed, so as to form a plurality of modified regions aligning with each other along the direction of incidence.

For the same reason as that in the laser processing methods in accordance with the foregoing aspects of the present invention, the laser processing methods in accordance with these aspects of the present invention enable laser cutting without generating melt or unnecessary fractures deviating from the line along which the object is intended to be cut in the surface of the object to be processed, and can increase the number of positions to become starting points when cutting the object to be processed. The modified region may be caused by multiphoton absorption or other reasons.

The laser processing methods in accordance with these aspects of the present invention include the following modes:

A plurality of modified regions may be formed successively from the side farther from an entrance face of the object to be processed on which laser light irradiating the object to be processed is incident. This can form a plurality of modified regions while in a state where no modified region exists between the entrance face and the light-converging point of laser light. Therefore, the laser light will not be scattered by modified regions which have already been formed, whereby each modified region can be formed uniformly.

The modified region includes at least one of a crack region where a crack is generated within the object to be processed, a molten processed region which is melted within the object to be processed, and a refractive index change region where refractive index is changed within the object to be processed.

The laser processing method in accordance with an aspect of the present invention comprises a step of irradiating an object to be processed with laser light while locating a light-converging point of laser light within the object to be processed through a light entrance face of the laser light with respect to the object to be processed and locating the light-converging point at a position closer to or farther from the entrance face than is a half thickness position in the thickness direction of the object to be processed, so as to form a modified region within the object along a line along which the object is intended to be cut in the object.

In the laser processing method in accordance with the present invention, the modified region is formed on the entrance face (e.g., surface) and on the side of the face (e.g., rear face) opposing the entrance face within the object to be processed within the object to be processed when the light-converging point of laser light is located at a position closer to and farther from the entrance face than is a half thickness position in the thickness direction, respectively. When a fracture extending along a line along which the object is intended to be cut is generated on the surface or rear face of an object to be processed, the object can be cut easily. The laser processing method in accordance with this aspect of the present invention can form a modified region on the surface or rear face side within the object to be processed. This can make it easier to form the surface or rear face with a fracture extending along the line along which the object is intended to be cut, whereby the object to be processed can be cut easily. As a result, the laser processing method in accordance with this aspect of the present invention enables efficient cutting.

The laser processing method in accordance with this aspect of the present invention may be configured such that the entrance face is formed with at least one of an electronic device and an electrode pattern, whereas the light-converging point of laser light irradiating the object to be processed is located at a position closer to the entrance face than is the half thickness position in the thickness direction. The laser processing method in accordance with this aspect of the present invention grows a crack from the modified region toward the entrance face (e.g., surface) and its opposing face (e.g., rear face), thereby cutting the object to be processed. When the modified region is formed on the entrance face side, the distance between the modified region and the entrance face is relatively short, so that the deviation in the growth direction of crack can be made smaller. Therefore, when the entrance face of the object to be processed is formed with an electronic device or an electrode pattern, cutting is possible without damaging the electronic device or the like. The electronic device refers to a semiconductor device, a display device such as liquid crystal, a piezoelectric device, or the like.

The laser processing method in accordance with an aspect of the present invention comprises a first step of irradiating an object to be processed with pulse laser light while locating a light-converging point of the pulse laser light within the object, so as to form a first modified region caused by multiphoton absorption within the object along a first line along which the object is intended to be cut in the object; and a second step of irradiating, after the first step, the object with pulse laser light while locating the light-converging point of laser light at a position different from the light-converging point of laser light in the first step in the thickness direction of the object to be processed within the object, so as to form a second modified region caused by multiphoton absorption extending along a second line along which the object is intended to be cut and three-dimensionally crossing the first modified region within the object.

In a cutting process in which cross-sections of an object to be processed cross each other, a modified region and another modified region are not superposed on each other at a location to become the crossing position between the cross sections in the laser processing method in accordance with this aspect of the present invention, whereby the cutting precision at the crossing position can be prevented from deteriorating. This enables cutting with a high precision.

The laser processing method in accordance with this aspect of the present invention can form the second modified region closer to the entrance face of the object to be processed with respect to the laser light than is the first modified region. This keeps the laser light irradiated at the time of forming the second modified region at the location to become the crossing position from being scattered by the first modified region, whereby the second modified region can be formed uniformly.

The laser processing methods in accordance with the foregoing aspects of the present invention explained in the foregoing have the following modes:

When the object to be processed is irradiated with laser light under a condition with a peak power density of at least $1 \times 10^8$ (W/cm$^2$) and a pulse width of 1 µs or less at the light-converging point, a modified region including a crack region can be formed within the object to be processed. This generates a phenomenon of an optical damage caused by multiphoton absorption within the object to be processed. This optical damage induces a thermal distortion within the object to be processed, thereby forming a crack region within the object to be processed. This crack region is an embodiment of the above-mentioned modified region. An embodiment of the object to be processed in this laser processing method is a member including glass. The peak power density refers to the electric field intensity of pulse laser light at the light-converging point.

When the object to be processed is irradiated with laser light under a condition with a peak power density of at least $1 \times 10^8$ (W/cm$^2$) and a pulse width of 1 µs or less at the light-converging point, a modified region including a molten processed region can be formed within the object to be processed. Here, the inside of the object to be processed is locally heated by multiphoton absorption. This heating forms a molten processed region within the object to be processed. This molten processed region is an embodiment of the above-mentioned modified region. An embodiment of the object to be processed in this laser processing method is a member including a semiconductor material.

When the object to be processed is irradiated with laser light under a condition with a peak power density of at least $1\times10^8$ (W/cm$^2$) and a pulse width of 1 ns or less at the light-converging point, a modified region including a refractive index change region which is a region with a changed refractive index can also be formed within the object to be processed. When multiphoton absorption is generated within the object to be processed with a very short pulse width as such, the energy caused by multiphoton absorption is not transformed into thermal energy, so that a permanent structural change such as ionic valence change, crystallization, or polarization orientation is induced within the object, whereby a refractive index change region is formed. This refractive index change region is an embodiment of the above-mentioned modified region. An embodiment of the object to be processed in this laser processing method is a member including glass.

Adjustment of the position of the light-converging point of laser light irradiating the object to be processed in the thickness direction can include a first calculating step of defining a desirable position in the thickness direction of the light-converging point of laser light irradiating the object to be processed as a distance from the entrance face to the inside and dividing the distance by the refractive index of the object to be processed with respect to the laser light irradiating the object, so as to calculate data of a first relative movement amount of the object in the thickness direction; a second calculating step of calculating data of a second relative movement amount of the object in the thickness direction required for positioning the light-converging point of laser light irradiating the object to be processed at the entrance face; a first moving step of relatively moving the object in the thickness direction according to the data of second relative movement amount; and a second moving step of relatively moving the object in the thickness direction according to the data of first relative movement amount after the first moving step. This adjusts the position of the light-converging point of laser light in the thickness direction of the object to be processed at a predetermined position within the object. Namely, with reference to the entrance face, the product of the relative movement amount of the object to be processed in the thickness direction of the object and the refractive index of the object with respect to the laser light irradiating the object becomes the distance from the entrance face to the light-converging point of laser light. Therefore, when the object to be processed is moved by the relative movement amount obtained by dividing the distance from the entrance to the inside of the object by the above-mentioned refractive index, the light-converging point of laser light can be aligned with a desirable position in the thickness direction of the object.

The laser processing apparatus in accordance with an aspect of the present invention comprises a laser light source for emitting pulse laser light having a pulse width of 1 μs or less; light-converging means for converging the pulse laser light emitted from the laser light source such that the pulse laser light attains a peak power density of at least $1\times10^8$ (W/cm$^2$) at a light-converging point; first moving means for relatively moving the light-converging point converged by the light-converging means along a line along which the object is intended to be cut in an object to be processed; storing means for storing data of a first relative movement amount of the object to be processed in the thickness direction for locating the light-converging position of pulse laser light converged by the light-converging means at a desirable position within the object to be processed, the data of first relative movement amount being obtained by defining the desirable position as a distance from the entrance face where the pulse laser light emitted from the laser light source enters the object to be processed to the inside thereof and dividing the distance by the refractive index of the object to be processed with respect to the pulse laser light emitted from the laser light source; calculating means for calculating data of a second relative movement amount of the object to be processed in the thickness direction required for locating the light-converging point of the pulse laser light converged by the light-converging means at the entrance face; and second moving means for relatively moving the object to be processed in the thickness direction according to the data of first relative movement amount stored by the storage means and the data of second relative movement amount calculated by the calculating means.

The laser processing apparatus in accordance with an aspect of the present invention comprises a laser light source for emitting pulse laser light having a pulse width of 1 μs or less; light-converging means for converging the pulse laser light emitted from the laser light source such that the pulse laser light attains a peak power density of at least $1\times10^8$ (W/cm$^2$) at a light-converging point; means for locating the light-converging point of the pulse laser light emitted from the laser light source within an object to be processed; means for adjusting the position of the pulse laser light converged by the light-converging means within the thickness of the object to be processed; and moving means for relatively moving the light-converging point of pulse laser light along a line along which the object is intended to be cut in the object to be processed.

For the same reason as that in the laser processing methods in accordance with the above-mentioned aspects of the present invention, the laser processing apparatus in accordance with these aspects of the present invention enable laser processing without generating melt or unnecessary fractures deviating from the line along which the object is intended to be cut in the surface of the object to be processed, and laser processing in which the position of the light-converging point of pulse laser light is regulated in the thickness direction of the object to be processed within the object.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific embodiments, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 69 is a view showing an embodiment of table of a correlation storing section included in the overall controller of the laser processing apparatus in accordance with the fifth embodiment of the embodiment;

FIG. 70 is a view showing another embodiment of the table of the correlation storing section included in the overall controller of the laser processing apparatus in accordance with the fifth embodiment of the embodiment;

FIG. 71 is a view showing still another embodiment of the table of the correlation storing section included in the overall controller of the laser processing apparatus in accordance with the fifth embodiment of the embodiment;

DETAILED DESCRIPTION OF THE PREFERRED EMBODIMENT

In the following, a preferred embodiment of the present invention will be explained with reference to the drawings. The laser processing method and laser processing apparatus of an embodiment in accordance with the present invention is embodiment form a modified region by multiphoton absorption. The multiphoton absorption is a phenomenon occurring when the intensity of laser light is made very high. First, the multiphoton absorption will be explained in brief.

A material becomes optically transparent when the energy $h\nu$ of a photon is lower than the band gap $E_G$ of absorption of the material. Therefore, the condition under which absorption occurs in the material is $h\nu > E_G$. Even when optically transparent, however, absorption occurs in the material under the condition of $nh\nu > E_G$ ($n=2, 3, 4, \ldots$) when the intensity of laser light is made very high. This phenomenon is known as multiphoton absorption. In the case of pulse wave, the intensity of laser light is determined by the peak power density (W/cm$^2$) of laser light at the light-converging point, whereas the multiphoton absorption occurs under the condition with a peak power density of at least $1 \times 10^8$ (W/cm$^2$), for embodiment. The peak power density is determined by (energy of laser light at the light-converging point per pulse)/(beam spot cross-sectional area of laser light×pulse width). In the case of a continuous wave, the intensity of laser light is determined by the electric field intensity (W/cm$^2$) of laser light at the light-converging point.

Figure 1:
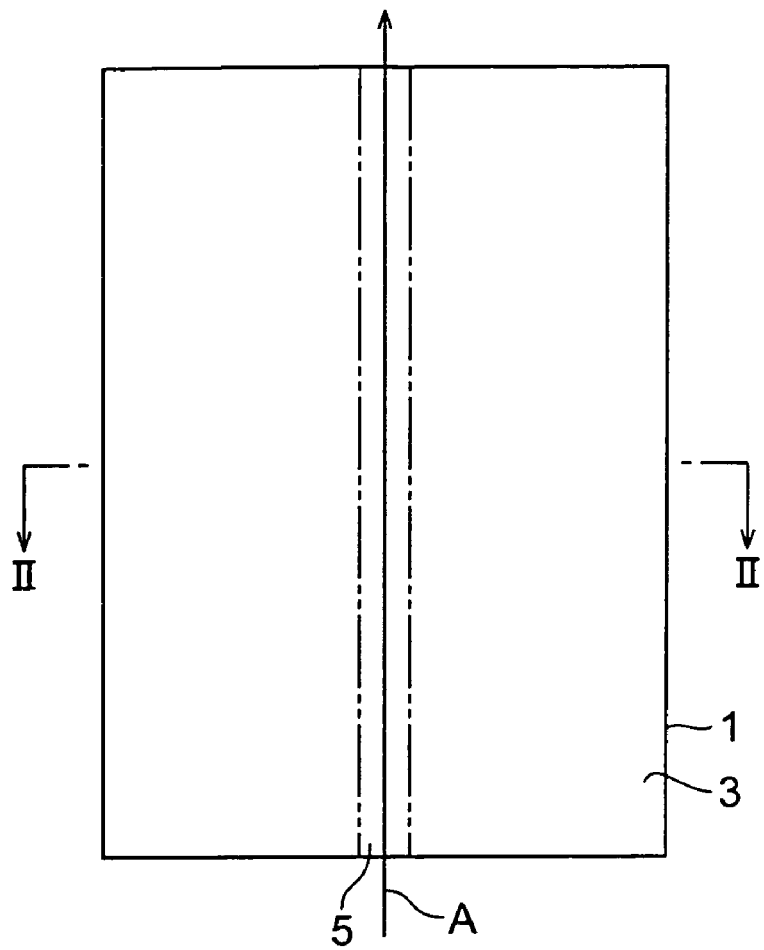
FIG. 1 is a plan view of an object to be processed during laser processing by the laser processing method in accordance with an embodiment.
Figure 2:
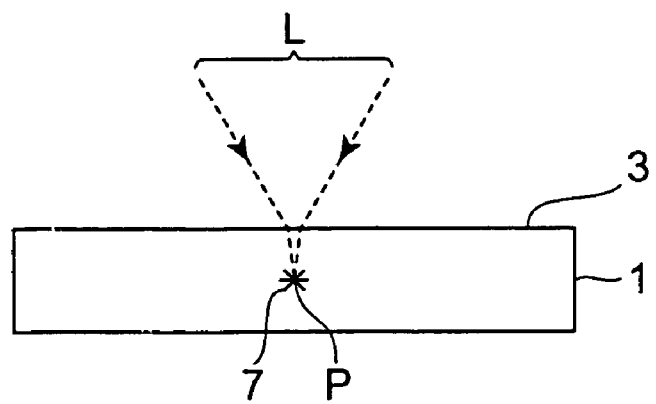
FIG. 2 is a sectional view of the object to be processed shown in FIG. 1 taken along the line II-II.
Figure 3:
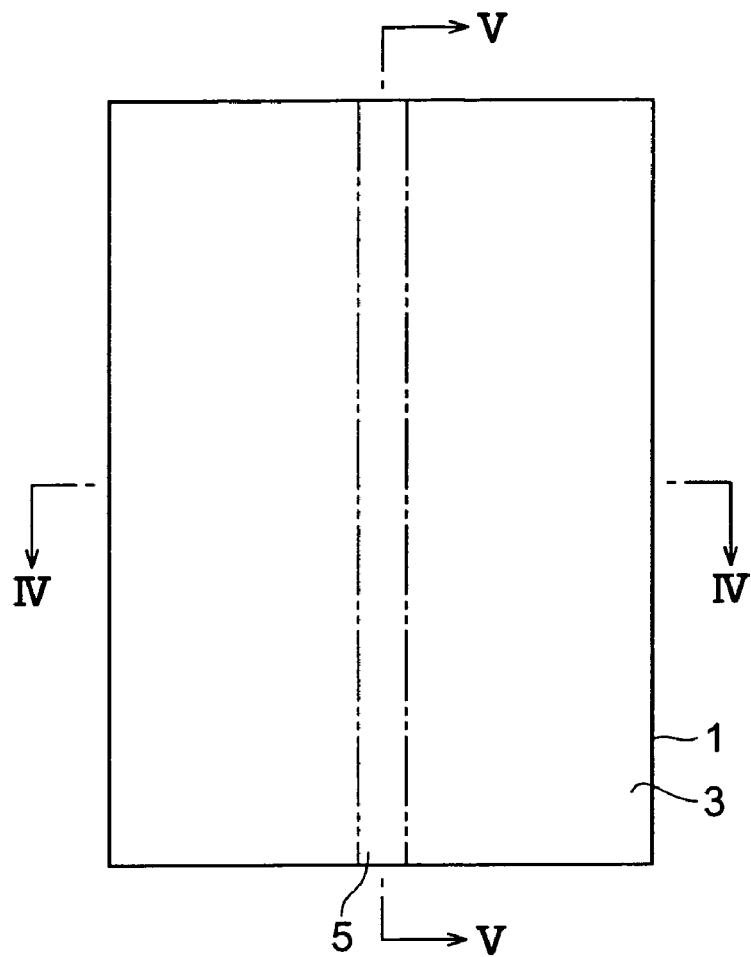
FIG. 3 is a plan view of the object to be processed after laser processing effected by the laser processing method in accordance with the embodiment.
Figure 4:
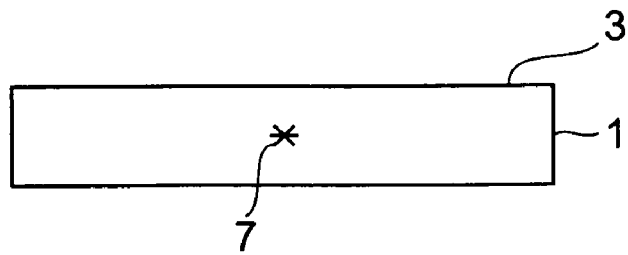
FIG. 4 is a sectional view of the object to be processed shown in FIG. 3 taken along the line IV-IV.
Figure 5:
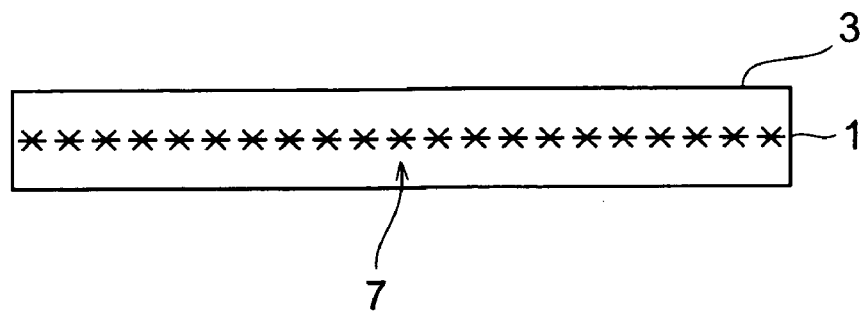
FIG. 5 is a sectional view of the object to be processed shown in FIG. 3 taken along the line V-V.
Figure 6:
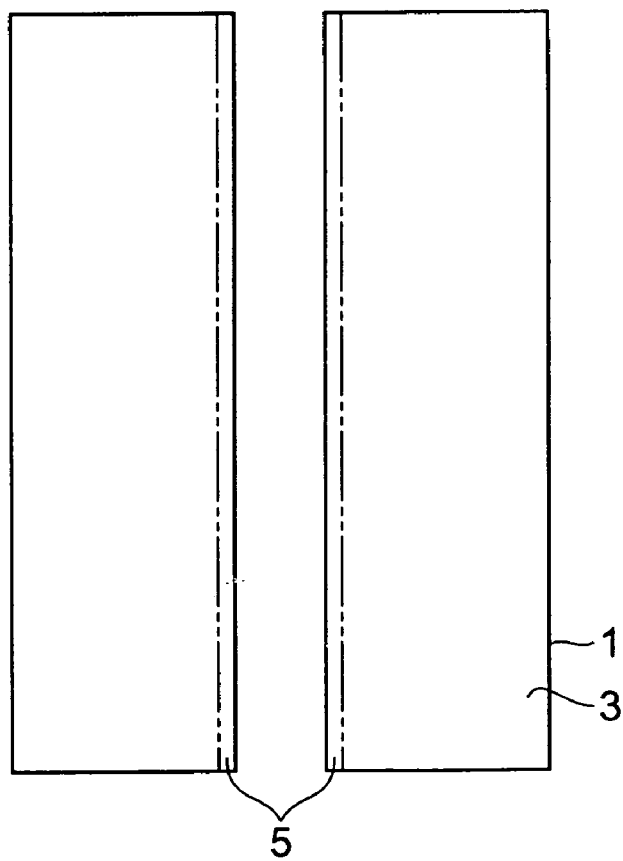
FIG. 6 is a plan view of the object to be processed cut by the laser processing method in accordance with the embodiment.

The principle of laser processing in accordance with the embodiment utilizing such multiphoton absorption will now be explained with reference to FIGS. 1 to 6. FIG. 1 is a plan view of an object to be processed 1 during laser processing. FIG. 2 is a sectional view of the object 1 shown in FIG. 1 taken along the line II-II. FIG. 3 is a plan view of the object 1 after laser processing. FIG. 4 is a sectional view of the object 1 shown in FIG. 3 taken along the line IV-IV. FIG. 5 is a sectional view of the object 1 shown in FIG. 3 taken along the line V-V. FIG. 6 is a plan view of the cut object 1.

As shown in FIGS. 1 and 2, the object 1 has a surface 3 with a line 5 along which the object is intended to be cut. The line 5 along which the object is intended to be cut is a linearly extending virtual line. In the laser processing of an embodiment in accordance with the present invention, the object 1 is irradiated with laser light L while locating a light-converging point P within the object 1 under a condition generating multiphoton absorption, so as to form a modified region 7. The light-converging point refers to a location at which the laser light L is converged.

By relatively moving the laser light L along the line 5 along which the object is intended to be cut (i.e., along the direction of arrow A), the light-converging point P is moved along the line 5 along which the object is intended to be cut. This forms the modified region 7 along the line 5 along which the object is intended to be cut only within the object 1 as shown in FIGS. 3 to 5. In the laser processing method in accordance with the embodiment, the modified region 7 is not formed by heating the object 1 due to the absorption of laser light L therein. The laser light L is transmitted through the object 1, so as to generate multiphoton absorption therewithin, thereby forming the modified region 7. Therefore, the laser light L is hardly absorbed at the surface 3 of the object 1, whereby the surface 3 of the object 1 will not melt.

If a starting point exists in a part to be cut when cutting the object 1, the object 1 will break from the starting point, whereby the object 1 can be cut with a relatively small force as shown in FIG. 6. Hence, the object 1 can be cut without generating unnecessary fractures in the surface 3 of the object 1.

The following two cases seem to exist in the cutting of the object to be processed using the modified region as a starting point. The first case is where, after the modified region is formed, an artificial force is applied to the object, whereby the object breaks while using the modified region as a starting point, and thus is cut. This is cutting in the case where the object to be processed has a large thickness, for embodiment. Applying an artificial force includes, for embodiment, applying a bending stress or shearing stress to the object along the line along which the object is intended to be cut in the object to be processed or imparting a temperature difference to the object so as to generate a thermal stress. Another case is where a modified region is formed, so that the object naturally breaks in the cross-sectional direction (thickness direction) of the object while using the modified region as a starting point, whereby the object is cut. This can be achieved by a single modified region when the thickness of the object is small, and by a plurality of modified regions formed in the thickness direction when the thickness of the object to be processed is large. Breaking and cutting can be carried out with favorable control even in this naturally breaking case, since breaks will not reach the part formed with no modified region on the surface in the part to be cut, so that only the part formed with the modified region can be broken and cut. Such a breaking and cutting method with favorable controllability is quite effective, since semiconductor wafers such as silicon wafers have recently been prone to decrease their thickness.

The modified region formed by multiphoton absorption in the embodiment includes the following (1) to (3):

(1) Case Where the Modified Region is a Crack Region Including One or a Plurality of Cracks An object to be processed (e.g., glass or a piezoelectric material made of $LiTaO_3$) is irradiated with laser light while the light-converging point is located therewithin under a condition with a peak power density of at least $1\times10^{8}$ $^{(W/cm2)}$ and a pulse width of 1 µs or less at the light-converging point. This magnitude of pulse width is a condition under which a crack region can be formed only within the object to be processed while generating multiphoton absorption without causing unnecessary damages to the surface of the object. This generates a phenomenon of optical damage caused by multiphoton absorption within the object to be processed. This optical damage induces thermal distortion within the object to be processed, thereby forming a crack region therewithin. The upper limit of electric field intensity is $1\times10^{12}$ (W/cm$^2$), for embodiment. The pulse width is preferably 1 ns to 200 ns, for embodiment. The forming of a crack region caused by multiphoton absorption is described, for embodiment, in "Internal Marking of Glass Substrate by Solid-state Laser Harmonics", *Proceedings of 45th Laser Materials Processing Conference* (December 1998), pp. 23-28.

The inventor determined relationships between the electric field intensity and the magnitude of crack by an experiment. Conditions for the experiment are as follows:
(A) Object to be processed: Pyrex glass (having a thickness of 700 µm)
(B) Laser
Light source: semiconductor laser pumping Nd:YAG laser
Wavelength: 1064 nm
Laser light spot cross-sectional area: $3.14\times10^{-8}$ cm$^2$
Oscillation mode: Q-switch pulse
Repetition frequency: 100 kHz
Pulse width: 30 ns
Output: output<1 mJ/pulse
Laser light quality: $TEM_{00}$
Polarization characteristic: linear polarization
(C) Light-converging lens
Transmittance with respect to laser light wavelength: 60%
(D) Moving speed of a mounting table mounting the object to be processed: 100 mm/sec The laser light quality of $TEM_{00}$ indicates that the light convergence is so high that light can be converged up to about the wavelength of laser light.

Figure 7:
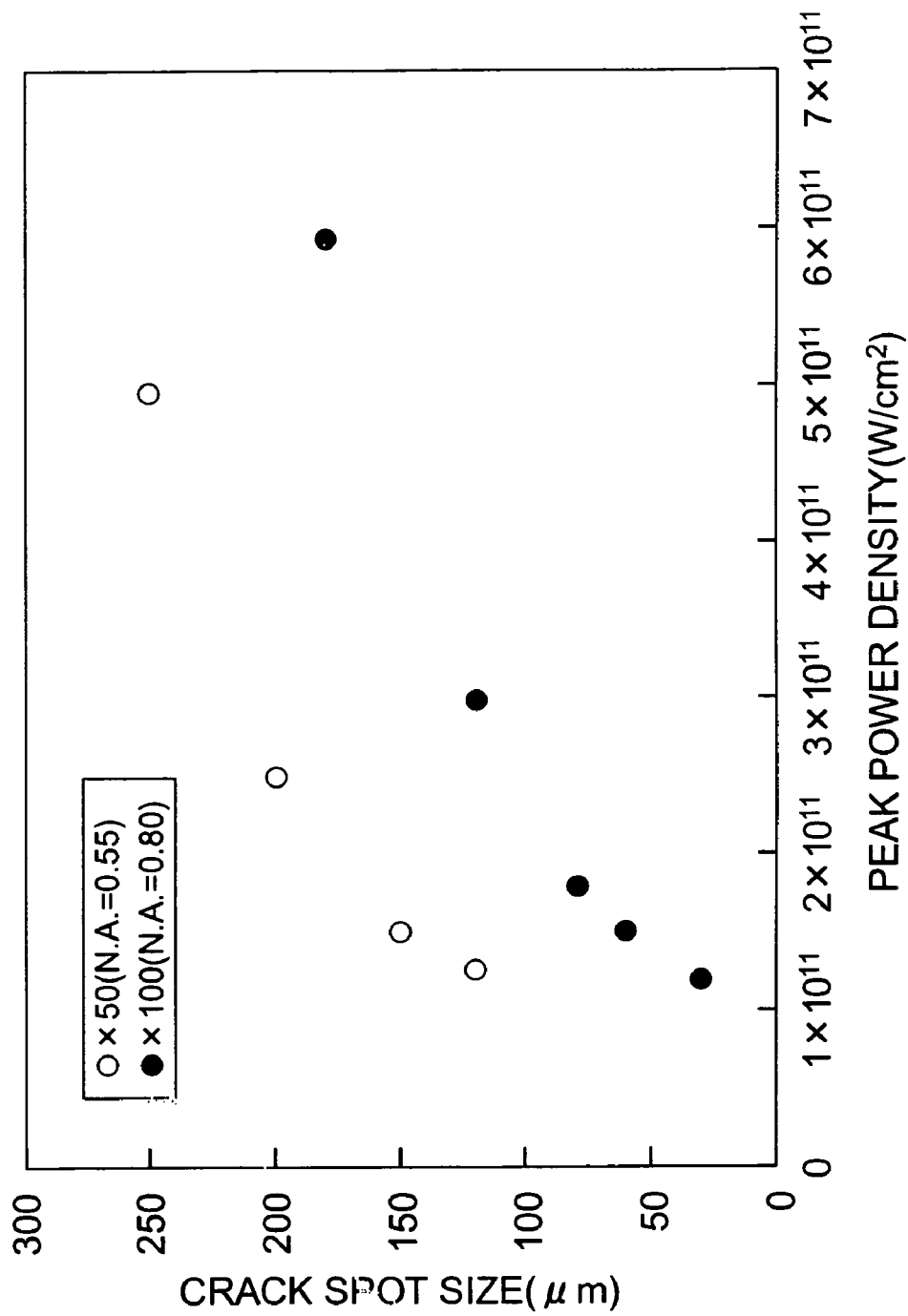
FIG. 7 is a graph showing relationships between the electric field intensity and the magnitude of crack in the laser processing method in accordance with the embodiment.

FIG. 7 is a graph showing the results of the above-mentioned experiment. The abscissa indicates peak power density. Since laser light is pulse laser light, its electric field intensity is represented by the peak power density. The ordinate indicates the size of a crack part (crack spot) formed within the object to be processed by one pulse of laser light. An assembly of crack spots forms a crack region. The size of a crack spot refers to that of the part of dimensions of the crack spot yielding the maximum length. The data indicated by black circles in the graph refers to a case where the light-converging glass (C) has a magnification of ×100 and a numerical aperture (NA) of 0.80. On the other hand, the data indicated by white circles in the graph refers to a case where the light-converging glass (C) has a magnification of ×50 and a numerical aperture (NA) of 0.55. It is seen that crack spots begin to occur within the object to be processed when the peak power density reaches $10^{11}$ (W/cm$^2$), and become greater as the peak power density increases.

Figure 8:
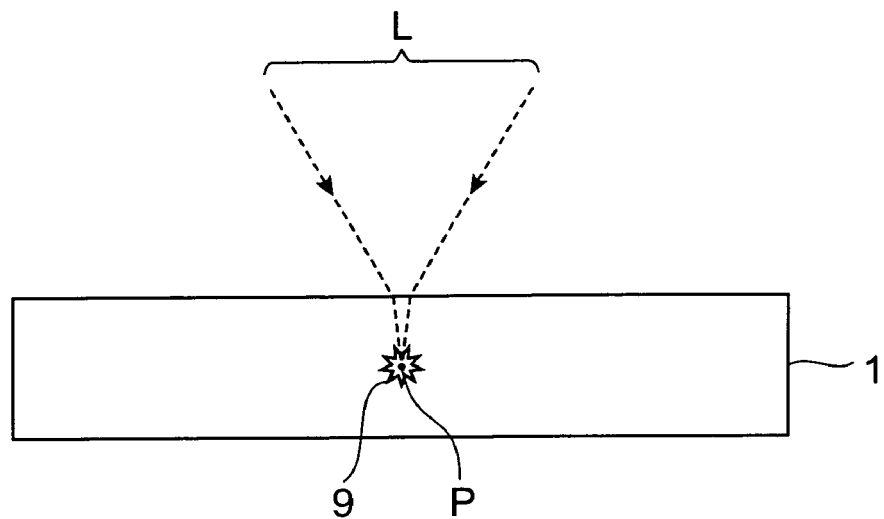
FIG. 8 is a sectional view of the object to be processed in a first step of the laser processing method in accordance with the embodiment.
Figure 9:
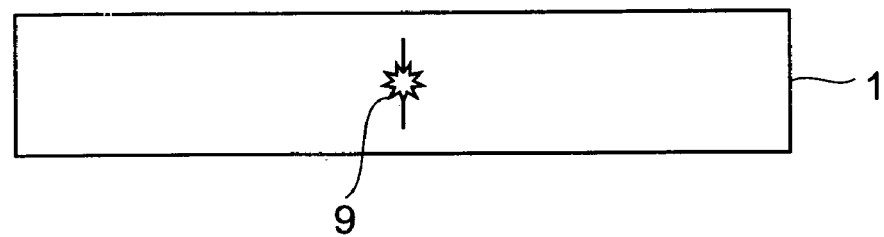
FIG. 9 is a sectional view of the object to be processed in a second step of the laser processing method in accordance with the embodiment.
Figure 10:
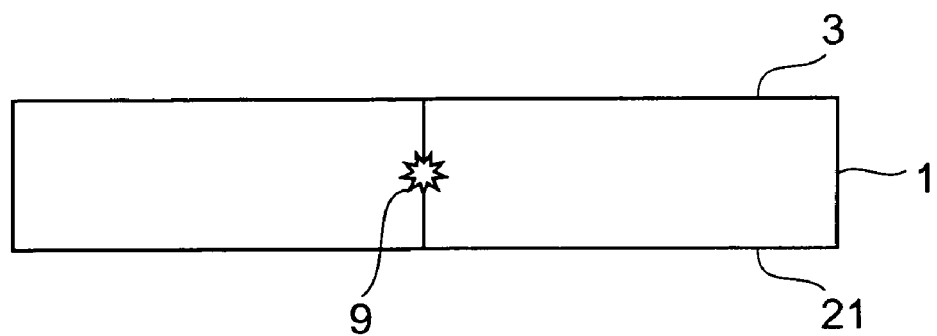
FIG. 10 is a sectional view of the object to be processed in a third step of the laser processing method in accordance with the embodiment.
Figure 11:
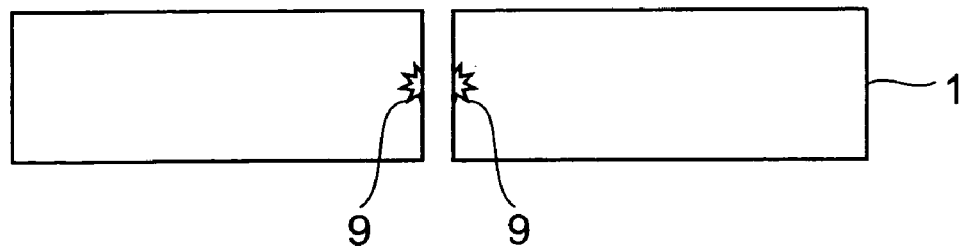
FIG. 11 is a sectional view of the object to be processed in a fourth step of the laser processing method in accordance with the embodiment.

A mechanism by which the object to be processed is cut upon formation of a crack region in the laser processing in accordance with the embodiment will now be explained with reference to FIGS. 8 to 11. As shown in FIG. 8, the object to be processed 1 is irradiated with laser light L while locating the light-converging point P within the object 1 under a condition where multiphoton absorption occurs, so as to form a crack region 9 therewithin. The crack region 9 is a region including one or a plurality of cracks. As shown in FIG. 9, the crack further grows while using the crack region 9 as a starting point. As shown in FIG. 10, the crack reaches the surface 3 and rear face 21 of the object 1. As shown in FIG. 11, the object 1 breaks, so as to be cut. The crack reaching the surface and rear face of the object to be processed may grow naturally or grow as a force is applied to the object.

(2) Case Where the Modified Region is a Molten Processed Region

An object to be processed (e.g., a semiconductor material such as silicon) is irradiated with laser light while the light-converging point is located therewithin under a condition with a peak power density of at least $1\times10^{8}$ (W/cm$^2$) and a pulse width of 1 µs or less at the light-converging point. As a consequence, the inside of the object to be processed is locally heated by multiphoton absorption. This heating forms a molten processed region within the object to be processed.

The molten processed region refers to at least one of a region once melted and then re-solidified, a region in a melted state, and a region in the process of re-solidifying from its melted state. The molten processed region may also be defined as a phase-changed region or a region having changed its crystal structure. The molten processed region may also be regarded as a region in which a certain structure has changed into another structure in monocrystal, amorphous, and polycrystal structures. Namely, it refers to a region in which a monocrystal structure has changed into an amorphous structure, a region in which a monocrystal structure has changed into a polycrystal structure, and a region in which a monocrystal structure has changed into a structure including an amorphous structure and a polycrystal structure, for embodiment. When the object to be processed is a silicon monocrystal structure, the molten processed region is an amorphous silicon structure, for embodiment. The upper limit of electric field intensity is $1\times10^{12}$ (W/cm$^2$), for embodiment. The pulse width is preferably 1 ns to 200 ns, for embodiment.

Figure 12:
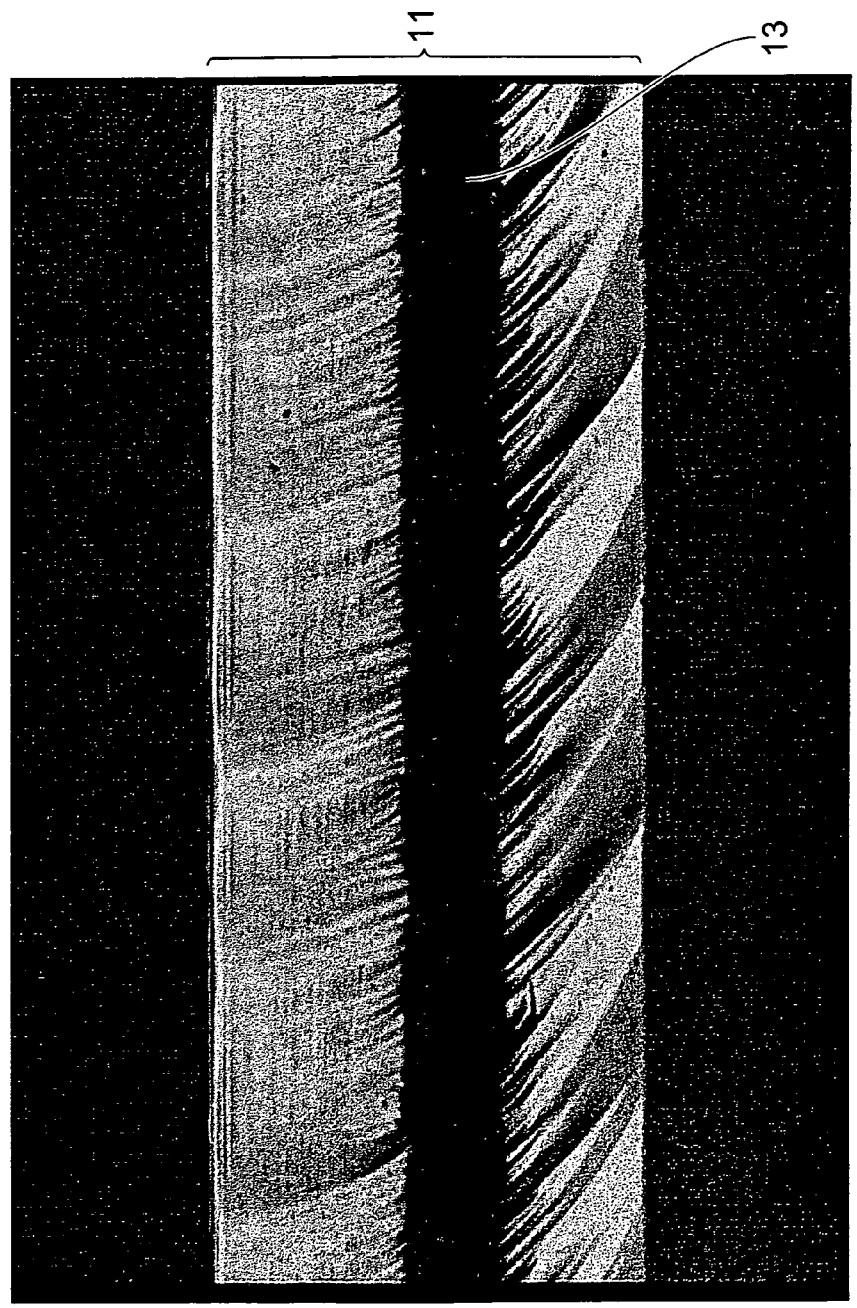
FIG. 12 is a view shoring a photograph of a cross section in a part of a silicon wafer cut by the laser processing method in accordance with the embodiment.

By an experiment, the inventor has verified that a molten processed region is formed within a silicon wafer. Conditions for the experiment is as follows:
(A) Object to be processed: silicon wafer (having a thickness of 350 µm and an outer diameter of 4 inches)
(B) Laser
Light source: semiconductor laser pumping Nd:YAG laser
Wavelength: 1064 nm
Laser light spot cross-sectional area: $3.14\times10^8$ cm$^2$
Oscillation mode: Q-switch pulse
Repetition frequency: 100 kHz
Pulse width: 30 ns
Output: 20 µJ/pulse
Laser light quality: TEM$_{00}$
Polarization characteristic: linear polarization
(C) Light-converging lens
Magnification: ×50
NA: 0.55
Transmittance with respect to laser light wavelength: 60%
(D) Moving speed of a mounting table mounting the object to be processed: 100 mm/sec FIG. 12 is a view showing a photograph of a cross section in a part of a silicon wafer cut by laser processing under the above-mentioned conditions. A molten processed region 13 is formed within a silicon wafer 11. The size of the molten processed region formed under the above-mentioned conditions is about 100 µm in the thickness direction.

Figure 13:
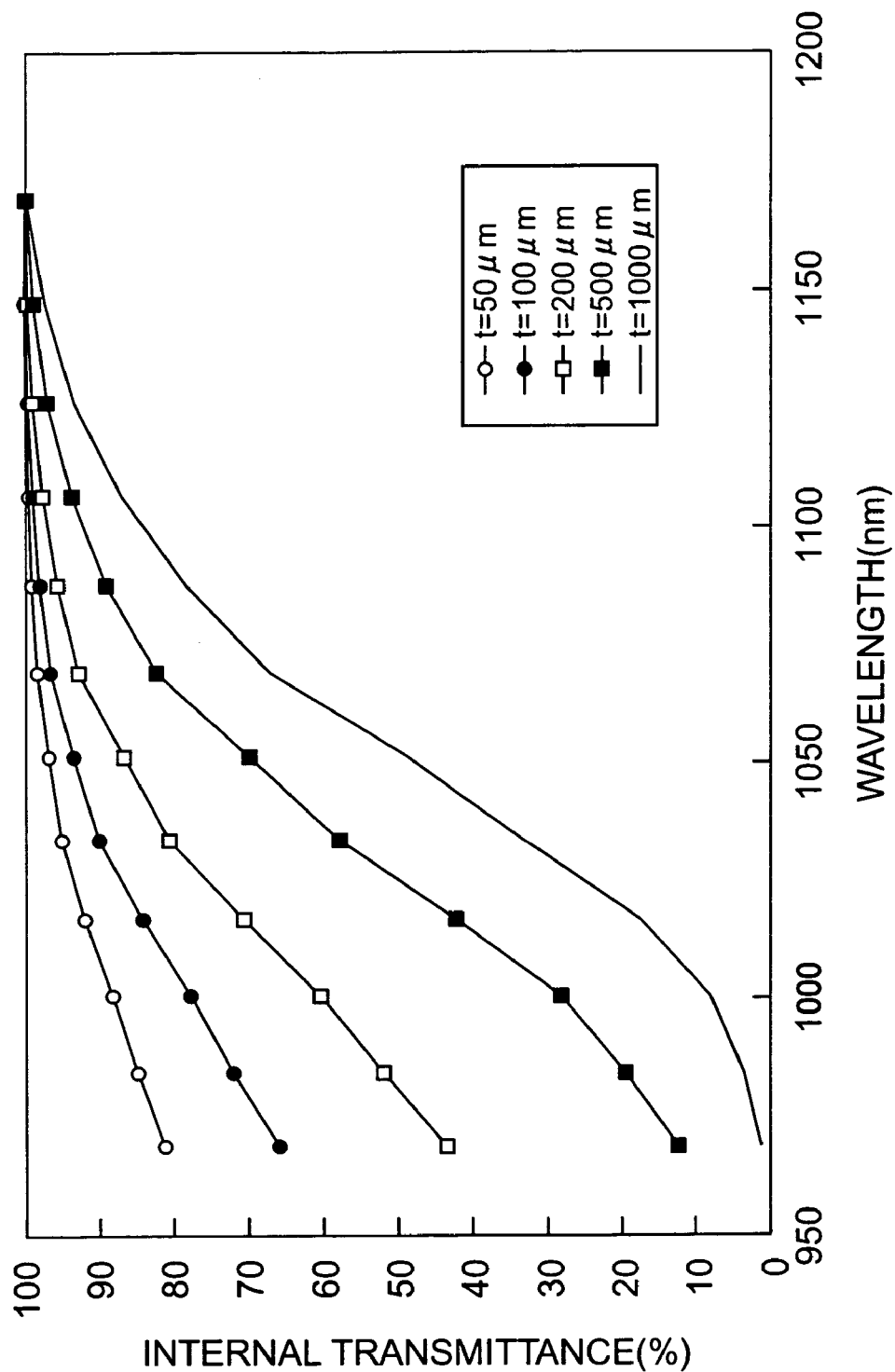
FIG. 13 is a graph showing relationships between the laser light wavelength and the transmittance within a silicon substrate in the laser processing method in accordance with the embodiment.

The forming of the molten processed region 13 by multiphoton absorption will be explained. FIG. 13 is a graph showing relationships between the wavelength of laser light and the transmittance within the silicon substrate. Here, respective reflecting components on the surface and rear face sides of the silicon substrate are eliminated, whereby only the transmittance therewithin is represented. The above-mentioned relationships are shown in the cases where the thickness t of the silicon substrate is 50 µm, 100 µm, 200 µm, 500 µm, and 1000 µm, respectively.

For embodiment, it is seen that laser light transmits through the silicon substrate by at least 80% at 1064 nm, which is the wavelength of Nd:YAG laser, when the silicon substrate has a thickness of 500 µm or less. Since the silicon wafer 11 shown in FIG. 12 has a thickness of 350 µm, the molten processed region caused by multiphoton absorption is formed near the center of the silicon wafer, i.e., at a part separated from the surface by 175 µm. The transmittance in this case is 90% or greater with reference to a silicon wafer having a thickness of 200 µm, whereby the laser light is absorbed within the silicon wafer 11 only slightly and is substantially transmitted therethrough. This means that the molten processed region is not formed by laser light absorption within the silicon wafer 11 (i.e., not formed upon usual heating with laser light), but by multiphoton absorption. The forming of a molten processed region by multiphoton absorption is described, for embodiment, in "Processing Characteristic evaluation of Silicon by Picosecond Pulse Laser", *Preprints of the National Meeting of Japan Welding Society*, No. 66 (April 2000), pp. 72-73.

Here, a fracture is generated in the cross-sectional direction while using the molten processed region as a starting point, whereby the silicon wafer is cut when the fracture reaches the surface and rear face of the silicon wafer. The fracture reaching the surface and rear face of the object to be processed may grow naturally or grow as a force is applied to the object. The fracture naturally grows from the molten processed region to the surface and rear face of the silicon wafer in one of the cases where the fracture grows from a region once melted and then re-solidified, where the fracture grows from a region in a melted state, and where the fracture grows from a region in the process of re-solidifying from a melted state. In any of these cases, the molten processed region is formed only within the cross section after cutting as shown in FIG. 12. When a molten processed region is formed within the object to be processed, unnecessary fractures deviating from a line along which the object is intended to be cut are hard to occur at the time of breaking and cutting, which makes it easier to control the breaking and cutting.

(3) Case Where the Modified Region is a Refractive Index Change Region

An object to be processed (e.g., glass) is irradiated with laser light while the light-converging point is located therewithin under a condition with a peak power density of at least $1\times10^8$ (W/cm$^2$) and a pulse width of 1 ns or less at the light-converging point. When multiphoton absorption is generated within the object to be processed with a very short pulse width, the energy caused by multiphoton absorption is not transformed into thermal energy, so that a permanent structural change such as ionic valence change, crystallization, or polarization orientation is induced within the object, whereby a refractive index change region is formed. The upper limit of electric field intensity is $1\times10^{12}$ (W/cm$^2$), for embodiment. The pulse width is preferably 1 ns or less, more preferably 1 ps or less, for embodiment. The forming of a refractive index change region by multiphoton absorption is described, for embodiment, in "Formation of Photoinduced Structure within Glass by Femtosecond Laser Irradiation", *Proceedings of 42th Laser Materials Processing Conference* (November 1997), pp. 105-111.

Specific embodiments according to the present invention will now be explained.

First Embodiment

Figure 14:
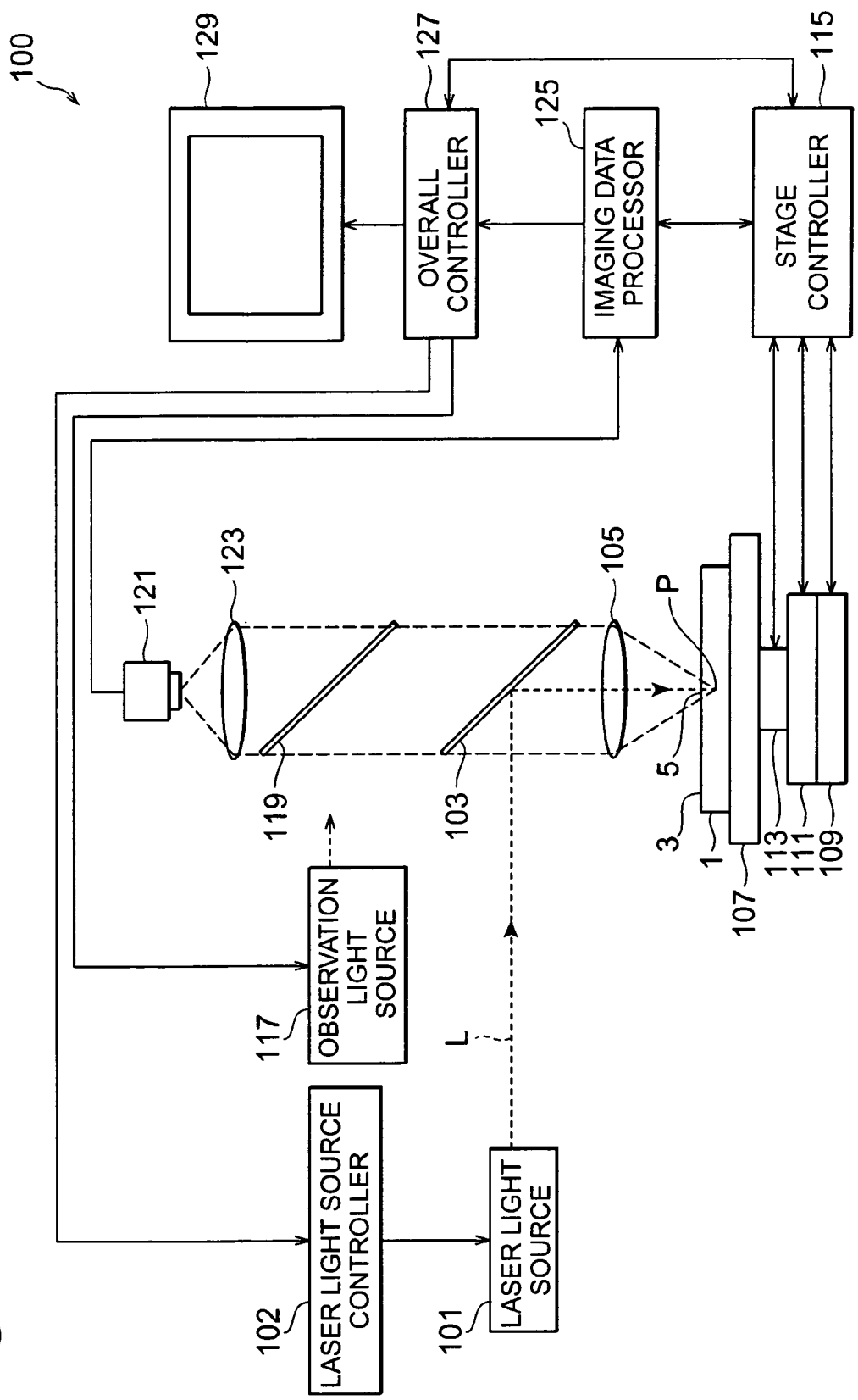
FIG. 14 is a schematic diagram of a laser processing apparatus usable in the laser processing method in accordance with a first embodiment of the embodiment.

The laser processing method in accordance with a first embodiment of the present invention will be explained. FIG. 14 is a schematic diagram of a laser processing apparatus 100 usable in this method. The laser processing apparatus 100 comprises a laser light source 101 for generating laser light L; a laser light source controller 102 for controlling the laser light source 101 so as to regulate the output and pulse width of laser light L and the like; a dichroic mirror 103, arranged so as to change the orientation of the optical axis of laser light L by 90°, having a function of reflecting the laser light L; a light-converging lens 105 for converging the laser light L reflected by the dichroic mirror 103; a mounting table 107 for mounting an object to be processed 1 irradiated with the laser light L converged by the light-converging lens 105; an X-axis stage 109 for moving the mounting table 107 in the X-axis direction; a Y-axis stage 111 for moving the mounting table 107 in the Y-axis direction orthogonal to the X-axis direction; a Z-axis stage 113 for moving the mounting table 107 in the Z-axis direction orthogonal to X- and Y-axis directions; and a stage controller 115 for controlling the movement of these three stages 109, 111, 113.

The Z-axis direction is a direction orthogonal to the surface 3 of the object to be processed 1, thus becoming the direction of focal depth of laser light L incident on the object 1. Therefore, moving the Z-axis stage 113 in the Z-axis direction can locate the light-converging point P of laser light L within the object 1. This movement of light-converging point P in X(Y)-axis direction is effected by moving the object 1 in the X(Y)-axis direction by the X(Y)-axis stage 109 (111). The X(Y)-axis stage 109 (111) is an embodiment of moving means.

The laser light source 101 is an Nd:YAG laser generating pulse laser light. Known as other kinds of laser usable as the laser light source 101 include Nd:YVO$_4$ laser, Nd:YLF laser, and titanium sapphire laser. For forming a crack region or molten processed region, Nd:YAG laser, Nd:YVO$_4$ laser, and Nd:YLF laser are used preferably. For forming a refractive index change region, titanium sapphire laser is used preferably.

Though pulse laser light is used for processing the object 1 in the first embodiment, continuous wave laser light may also be used as long as it can generate multiphoton absorption. In the present invention, laser light means to include laser beams. The light-converging lens 105 is an embodiment of light-converging means. The Z-axis stage 113 is an embodiment of means for locating the light-converging point within the object to be processed. The light-converging point of laser light can be located within the object to be processed by relatively moving the light-converging lens 105 in the Z-axis direction.

The laser processing apparatus 100 further comprises an observation light source 117 for generating a visible light beam for irradiating the object to be processed 1 mounted on the mounting table 107; and a visible light beam splitter 119 disposed on the same optical axis as that of the dichroic mirror 103 and light-converging lens 105. The dichroic mirror 103 is disposed between the beam splitter 119 and light-converging lens 105. The beam splitter 119 has a function of reflecting about a half of a visual light beam and transmitting the remaining half therethrough, and is arranged so as to change the orientation of the optical axis of the visual light beam by 90°. A half of the visible light beam generated by the observation light source 117 is reflected by the beam splitter 119, and thus reflected visible light beam is transmitted through the dichroic mirror 103 and light-converging lens 105, so as to illuminate the surface 3 of the object 1 including the line 5 along which the object is intended to be cut and the like.

The laser processing apparatus 100 further comprises an image pickup device 121 and an imaging lens 123 disposed on the same optical axis as that of the beam splitter 119, dichroic mirror 103, and light-converging lens 105. An embodiment of the image pickup device 121 is a CCD (charge-coupled device) camera. The reflected light of the visual light beam having illuminated the surface 3 including the line 5 along which the object is intended to be cut and the like is transmitted through the light-converging lens 105, dichroic mirror 103, and beam splitter 119 and forms an image by way of the imaging lens 123, whereas thus formed image is captured by the imaging device 121, so as to yield imaging data.

The laser processing apparatus 100 further comprises an imaging data processor 125 for inputting the imaging data outputted from the imaging device 121, an overall controller 127 for controlling the laser processing apparatus 100 as a whole, and a monitor 129. According to the imaging data, the imaging data processor 125 calculates foal point data for locating the focal point of the visible light generated in the observation light source 117 onto the surface 3. According to the focal point data, the stage controller 115 controls the movement of the Z-axis stage 113, so that the focal point of visible light is located on the surface 3. Hence, the imaging data processor 125 functions as an auto focus unit. Also, according to the imaging data, the imaging data processor 125 calculates image data such as an enlarged image of the surface 3. The image data is sent to the overall controller 127, subjected to various kinds of processing, and then sent to the monitor 129. As a consequence, an enlarged image or the like is displayed on the monitor 129.

Data from the stage controller 115, image data from the imaging data processor 125, and the like are fed into the overall controller 127. According to these data as well, the overall controller 127 regulates the laser light source controller 102, observation light source 117, and stage controller 115, thereby controlling the laser processing apparatus 100 as a whole. Thus, the overall controller 127 functions as a computer unit.

Figure 15:
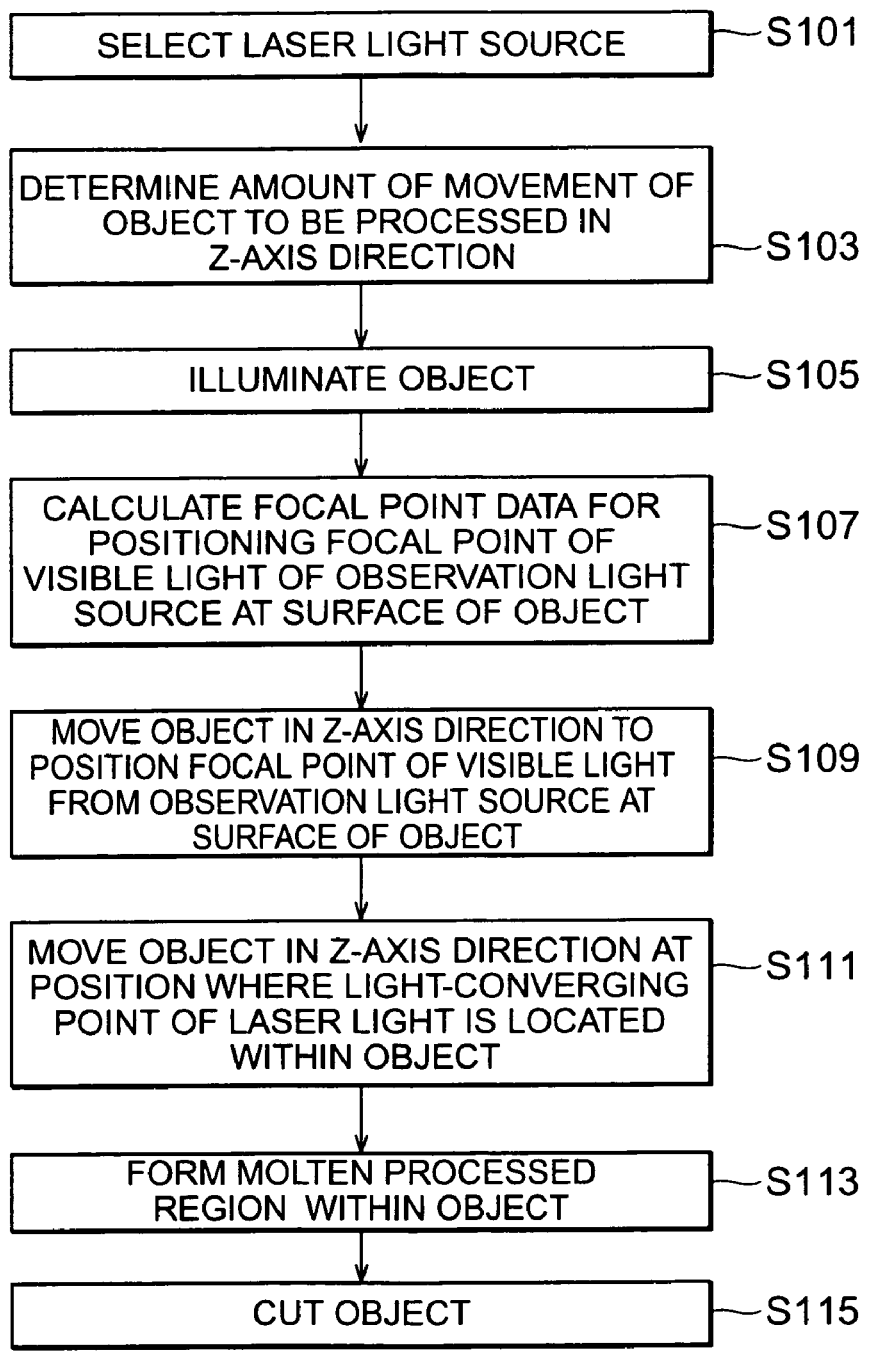
FIG. 15 is a flowchart for explaining the laser processing method in accordance with the first embodiment of the present invention.

With reference to FIGS. 14 and 15, the laser processing method in accordance with a first embodiment of the embodiment will now be explained. FIG. 15 is a flowchart for explaining this laser processing method. The object to be processed 1 is a silicon wafer.

First, a light absorption characteristic of the object 1 is determined by a spectrophotometer or the like which is not depicted. According to the results of measurement, a laser light source 101 generating laser light L having a wavelength to which the object 1 is transparent or exhibits a low absorption is chosen (S101). Next, the thickness of the object 1 is measured. According to the result of measurement of thickness and the refractive index of the object 1, the amount of movement of the object 1 in the Z-axis direction is determined (S103). This is an amount of movement of the object 1 in the Z-axis direction with reference to the light-converging point of laser light L positioned at the surface 3 of the object 1 in order for the light-converging point P of laser light L to be positioned within the object 1. This amount of movement is fed into the overall controller 127.

The object 1 is mounted on the mounting table 107 of the laser processing apparatus 100. Then, visible light is generated from the observation light source 117, so as to illuminate the object 1 (S105). The illuminated surface 3 of the object 1 including the line 5 along which the object is intended to be cut is captured by the image pickup device 121. Thus obtained imaging data is sent to the imaging data processor 125. According to the imaging data, the imaging data processor 125 calculates such focal point data that the focal point of visible light from the observation light source 117 is positioned at the surface 3 (S107).

The focal point data is sent to the stage controller 115. According to the focal point data, the stage controller 115 moves the Z-axis stage 113 in the Z-axis direction (S109) As a consequence, the focal point of visible light from the observation light source 117 is positioned at the surface 3. According to the imaging data, the imaging data processor 125 calculates enlarged image data of the surface 3 of the object including the line 5 along which the object is intended to be cut. The enlarged image data is sent to the monitor 129 by way of the overall controller 127, whereby an enlarged image of the line 5 along which the object is intended to be cut and its vicinity is displayed on the monitor 129.

Movement amount data determined at step S103 has been fed into the overall controller 127 beforehand, and is sent to the stage controller 115. According to the movement amount data, the stage controller 115 causes the Z-axis stage 113 to move the object 1 in the Z-axis direction at a position where the light-converging point P of laser light L is located within the object 1 (S111).

Next, laser light L is generated from the laser light source 101, so as to irradiate the line 5 along which the object is intended to be cut in the surface 3 of the object with the laser light L. Since the light-converging point P of laser light is positioned within the object 1, a molten processed region is formed only within the object 1. Subsequently, the X-axis stage 109 and Y-axis stage 111 are moved along the line along which the object is intended to be cut, so as to form a molten processed region along the line 5 along which the object is intended to be cut within the object 1 (S113). Then, the object 1 is bent along the line 5 along which the object is intended to be cut, and thus is cut (S115). This divides the object 1 into silicon chips.

Effects of the first embodiment will be explained. Here, the line 5 along which the object is intended to be cut is irradiated with the pulse laser light L under a condition causing multiphoton absorption while locating the light-converging point P within the object 1. Then, the X-axis stage 109 and Y-axis stage 111 are moved, so as to move the light-converging point P along the line 5 along which the object is intended to be cut. As a consequence, a modified region (e.g., crack region, molten processed region, or refractive index change region) is formed within the object 1 along the line 5 along which the object is intended to be cut. When a certain starting point exists at a part to be cut in the object to be processed, the object can be cut by breaking it with a relatively small force. Therefore, breaking the object 1 along the line 5 along which the object is intended to be cut while using a modified region as a starting point can cut the object 1 with a relatively small force. This can cut the object 1 without generating unnecessary fractures deviating from the line 5 along which the object is intended to be cut in the surface 3 of the object 1.

Also, in the first embodiment, the object 1 is irradiated with the pulse laser light L at the line 5 along which the object is intended to be cut under a condition generating multiphoton absorption in the object 1 while locating the light-converging point P within the object 1. Therefore, the pulse laser light L is transmitted through the object 1 without substantially being absorbed at the surface 3 of the object 1, whereby the surface 3 will not incur damages such as melting due to the forming of a modified region.

As explained in the foregoing, the first embodiment can cut the object 1 without generating unnecessary fractures deviating from the line 5 along which the object is intended to be cut and melt in the surface 3 of the object. Therefore, when the object is a semiconductor wafer, for embodiment, a semiconductor chip can be cut out from the semiconductor wafer without generating unnecessary fractures deviating from the line along which the object is intended to be cut and melt in the semiconductor chip. The same holds for objects to be processed whose surface is formed with electrode patterns, and those whose surface is formed with electronic devices such as piezoelectric wafers and glass substrates formed with display devices such as liquid crystals. Therefore, the first embodiment can improve the yield of products (e.g., semiconductor chips, piezoelectric device chips, and display devices such as liquid crystal) prepared by cutting the object to be processed.

Also, since the line 5 along which the object is intended to be cut in the surface 3 of the object 1 does not melt, the first embodiment can decrease the width of the line 5 along which the object is intended to be cut (the width being the interval between regions to become semiconductor chips in the case of a semiconductor wafer, for embodiment). This increases the number of products prepared from a single object to be processed 1, whereby the productivity of products can be improved.

Figure 16:
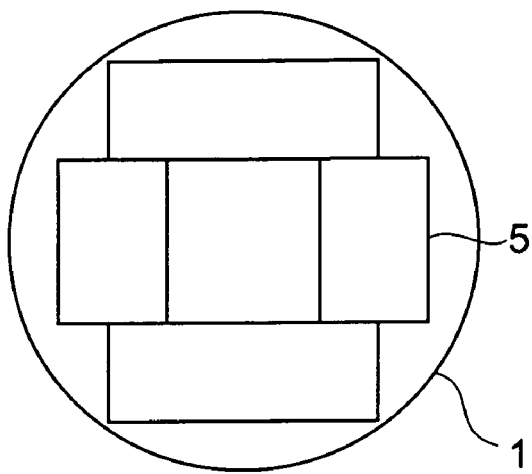
FIG. 16 is a plan view of an object to be processed for explaining a pattern which can be cut by the laser processing method in accordance with the first embodiment of the embodiment.

Since laser light is used for cutting the object 1, the first embodiment enables processing more complicated than that obtained by dicing with a diamond cutter. For embodiment, even when the line 5 along which the object is intended to be cut has a complicated form as shown in FIG. 16, the first embodiment allows cutting. These effects are similarly obtained in embodiments which will be explained later.

Figure 17:
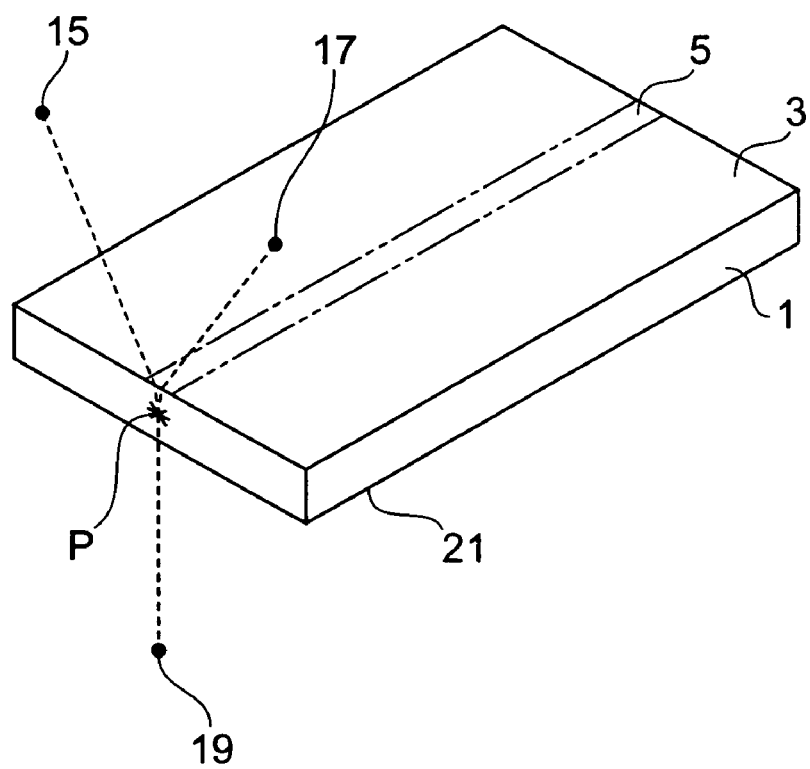
FIG. 17 is a schematic view for explaining the laser processing method in accordance with the first embodiment of the embodiment with a plurality of laser light sources.

Not only a single laser light source but also a plurality of laser light sources may be provided. For embodiment, FIG. 17 is a schematic view for explaining the laser processing method in the first embodiment of the embodiment in which a plurality of laser light sources are provided. Here, the object 1 is irradiated with three laser beams emitted from respective laser light sources 15, 17, 19 from different directions while the light-converging point P is located within the object 1. The respective laser beams from the laser light sources 15, 17 are made incident on the object 1 from the surface 3 thereof. The laser beam from the laser light source 19 is made incident on the object 1 from the rear face 21 thereof. Since a plurality of laser light sources are used, this makes it possible for the light-converging point to have an electric field intensity with such a magnitude that multiphoton absorption occurs, even when laser light is continuous wave laser light having a power lower than that of pulse laser light. For the same reason, multiphoton absorption can be generated even without a light-converging lens. Though the light-converging point P is formed by the three laser light sources 15, 17, 19, the present invention is not restricted thereto as long as a plurality of laser light sources exist therein.

Figure 18:
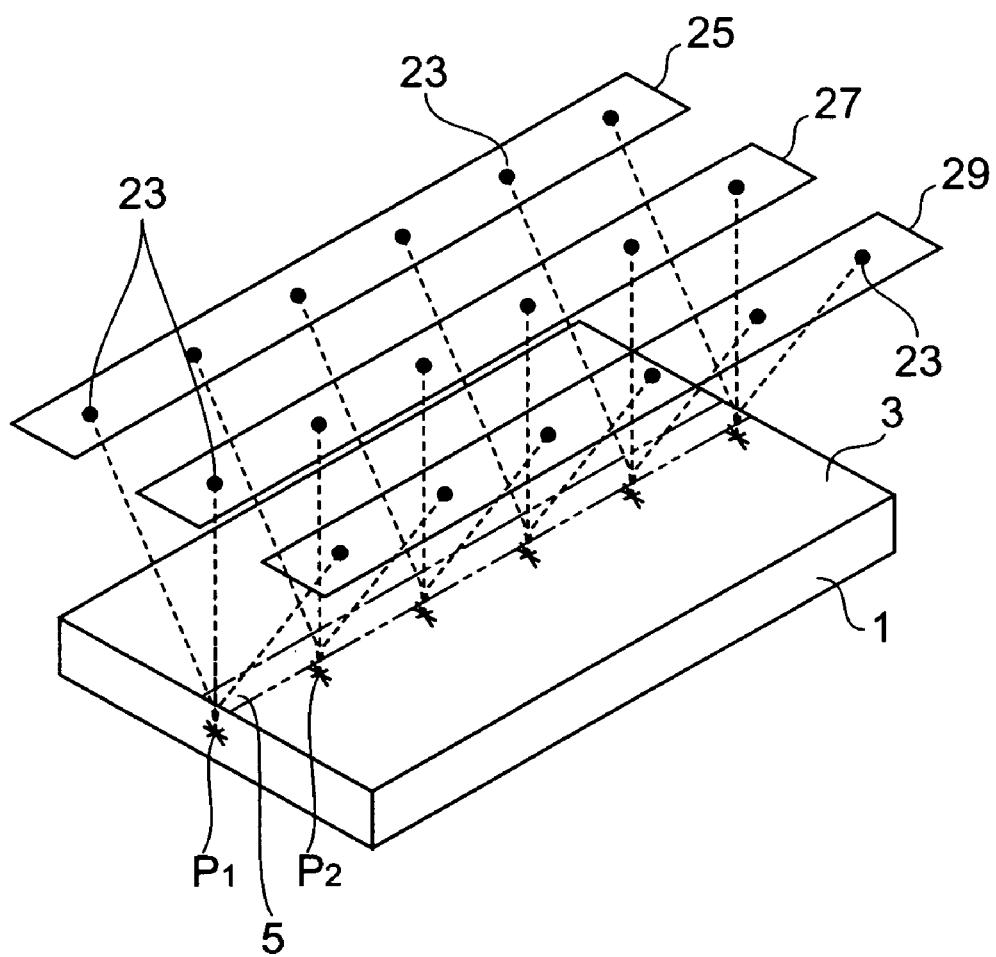
FIG. 18 is a schematic view for explaining another laser processing method in accordance with the first embodiment of the embodiment with a plurality of laser light sources.

FIG. 18 is a schematic view for explaining another laser processing method in accordance with the first embodiment of the embodiment in which a plurality of laser light sources are provided. This embodiment comprises three array light source sections 25, 27, 29 each having a plurality of laser light sources 23 aligning along the line 5 along which the object is intended to be cut. Among the array light source sections 25, 27, 29, laser beams emitted from laser light sources 23 arranged in the same row form a single light-converging point (e.g., light-converging point $P_1$). This embodiment can form a plurality of light-converging points $P_1, P_2, \ldots$ along the line 5 along which the object is intended to be cut, whereby the processing speed can be improved. Also, in this embodiment, a plurality of rows of modified regions can be formed at the same time upon laser-scanning on the surface 3 in a direction orthogonal to the line 5 along which the object is intended to be cut.

Second Embodiment

A second embodiment of the present invention will now be explained. This embodiment is directed to a cutting method and cutting apparatus for a light-transmitting material. The light-transmitting material is an embodiment of the objects to be processed. In this embodiment, a piezoelectric device wafer (substrate) having a thickness of about 400 μm made of $LiTaO_3$ is used as a light-transmitting material.

Figure 19:
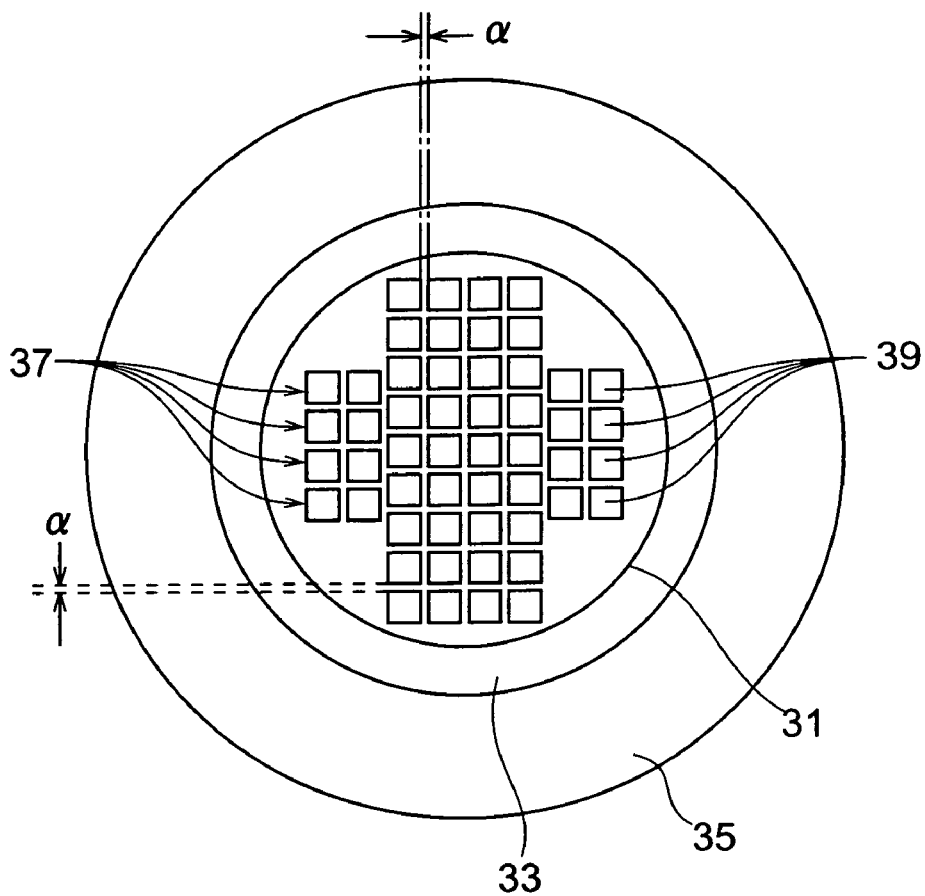
FIG. 19 is a schematic plan view showing a piezoelectric device wafer in a state held by a wafer sheet in the second embodiment of the embodiment.
Figure 20:
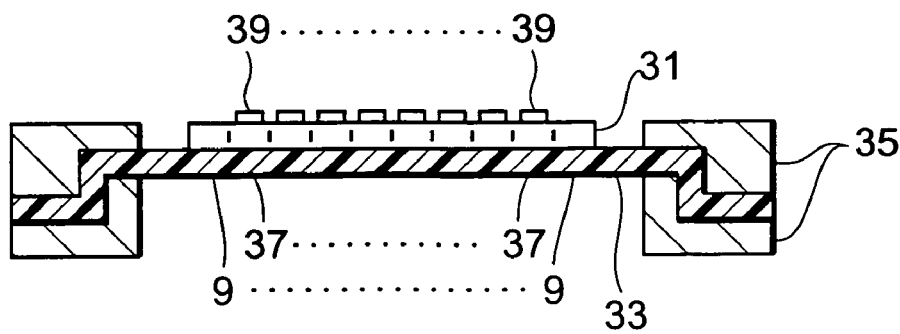
FIG. 20 is a schematic sectional view showing a piezoelectric device wafer in a state held by the wafer sheet in the second embodiment of the embodiment.

The cutting apparatus in accordance with the second embodiment is constituted by the laser processing apparatus 100 shown in FIG. 14 and the apparatus shown in FIGS. 19 and 20. The apparatus shown in FIGS. 19 and 20 will be explained. The piezoelectric device wafer 31 is held by a wafer sheet (film) 33 acting as holding means. In the wafer sheet 33, the face on the side holding the piezoelectric device wafer 31 is made of an adhesive resin tape or the like, and has an elasticity. The wafer sheet 33 is set on a mounting table 107 while being held with a sample holder 35. As shown in FIG. 19, the piezoelectric device wafer 31 includes a number of piezoelectric device chips 37 which will be cut and separated later. Each piezoelectric device chip 37 has a circuit section 39. The circuit section 39 is formed on the surface of the piezoelectric device wafer 31 for each piezoelectric device chip 37, whereas a predetermined gap a (about 80 μm) is formed between adjacent circuit sections 39. FIG. 20 shows a state where minute crack regions 9 as modified parts are formed within the piezoelectric device wafer 31.

Figure 21:
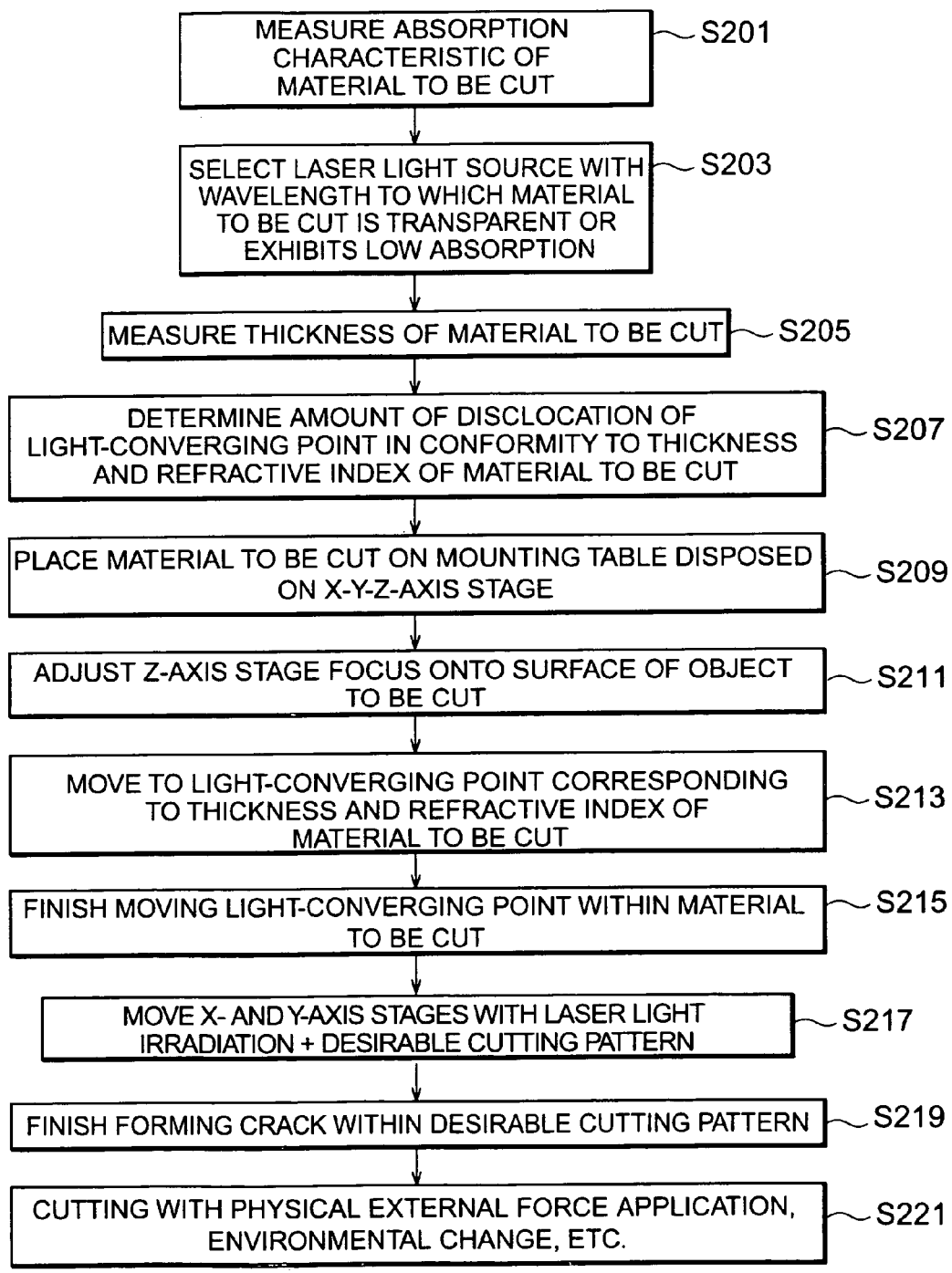
FIG. 21 is a flowchart for explaining the cutting method in accordance with the second embodiment of the embodiment.

Next, with reference to FIG. 21, the method of cutting a light-transmitting material in accordance with the second embodiment will be explained. First, a light absorption characteristic of the light-transmitting material (piezoelectric device wafer 31 made of $LiTaO_3$ in the second embodiment) to become a material to be cut is determined (S201). The light absorption characteristic can be measured by using a spectrophotometer or the like. Once the light absorption characteristic is determined, a laser light source 101 generating laser light L having a wavelength to which the material to be cut is transparent or exhibits a low absorption is chosen according to the result of determination (S203). In the second embodiment, a YAG laser of pulse wave (PW) type having a fundamental wave wavelength of 1064 nm is chosen. This YAG laser has a pulse repetition frequency of 20 Hz, a pulse width of 6 ns, and a pulse energy of 300 μJ. The spot diameter of laser light L emitted from the YAG laser is about 20 μm.

Next, the thickness of the material to be cut is measured (S205). Once the thickness of the material to be cut is measured, the amount of displacement (amount of movement) of the light-converging point of laser light L from the surface (entrance face for laser light L) of the material to be cut in the optical axis direction of laser light L is determined so as to position the light-converging point of laser light L within the material to be cut according to the result of measurement (S207). For embodiment, in conformity to the thickness and refractive index of the material to be cut, the amount of displacement (amount of movement) of the light-converging point of laser light L is set to ½ of the thickness of the material to be cut.

Figure 22:
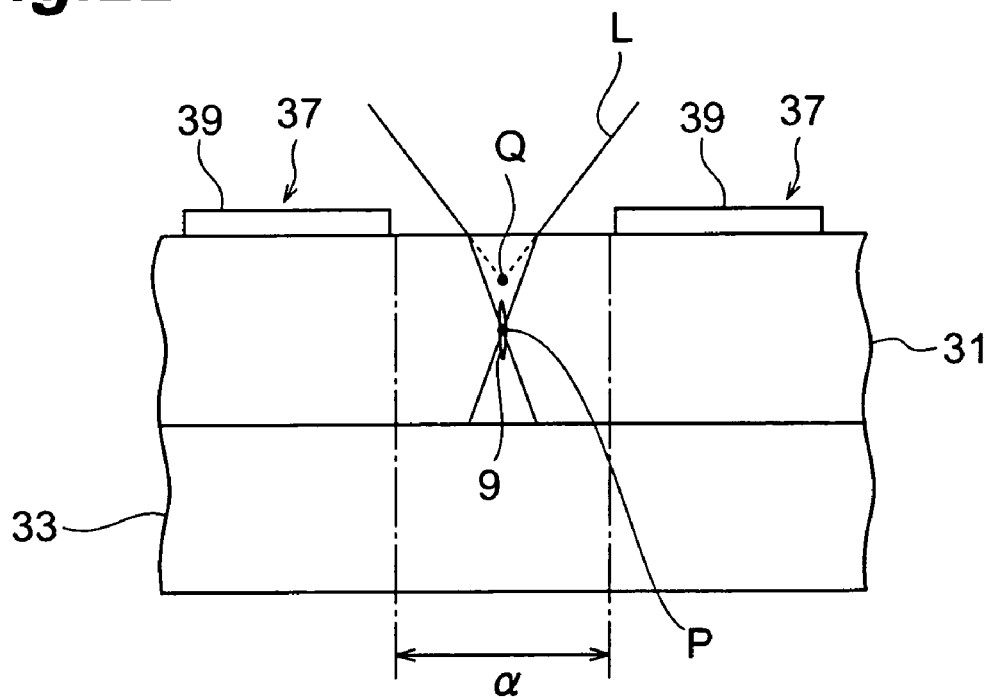
FIG. 22 is a sectional view of a light-transmitting material irradiated with laser light by the cutting method in accordance with the second embodiment of the embodiment.

As shown in FIG. 22, due to the difference between the refractive index in the atmosphere (e.g., air) surrounding the material to be cut and the refractive index of the material to be cut, the actual position of the light-converging point P of laser light is located deeper than the position of the light-converging point Q of laser light L converged by the light-converging lens 105 from the surface of the material to be cut (piezoelectric device wafer 31). Namely, the relationship of "amount of movement of Z-axis stage 113 in the optical axis direction of laser light L×refractive index of the material to be cut=actual amount of movement of light-converging point of laser light L" holds in the air. The amount of displacement (amount of movement) of the light-converging point of laser light L is set in view of the above-mentioned relationship (between the thickness and refractive index of the material to be cut). Thereafter, the material to be cut held by the wafer sheet 33 is mounted on the mounting table 107 placed on the X-Y-Z-axis stage (constituted by the X-axis stage 109, Y-axis stage 111, and Z-axis stage 113 in this embodiment) (S209). After the mounting of the material to be cut is completed, light is emitted from the observation light source 117, so as to irradiate the material to be cut with thus emitted light. Then, according to the result of imaging at the image pickup device 121, focus adjustment is carried out by moving the Z-axis stage 113 so as to position the light-converging point of laser light L onto the surface of the material to be cut (S211). Here, the surface observation image of piezoelectric device wafer 31 obtained by the observation light source 117 is captured by the image pickup device 121, whereas the imaging data processor 125 determines the moving position of the Z-axis stage 113 according to the result of imaging such that the light emitted from the observation light source 117 forms a focal point on the surface of the material to be cut, and outputs thus determined position to the stage controller 115. According to an output signal from the imaging data processor 125, the stage controller 115 controls the Z-axis stage 113 such that the moving position of the Z-axis stage 113 is located at a position for making the light emitted from the observation light source 117 form a focal point on the material to be cut, i.e., for positioning the focal point of laser light L onto the surface of the material to be cut.

After the focus adjustment of light emitted from the observation light source 117 is completed, the light-converging point of laser light L is moved to a light-converging point corresponding to the thickness and refractive index of the material to be cut (S213). Here, the overall controller 127 sends an output signal to the stage controller 115 so as to move the Z-axis stage 113 in the optical axis direction of laser light L by the amount of displacement of the light-converging point of laser light determined in conformity to the thickness and refractive index of the material to be cut, whereby the stage controller 115 having received the output signal regulates the moving position of the Z-axis stage 113. As mentioned above, the placement of the light-converging point of laser light L within the material to be cut is completed by moving the Z-axis stage 113 in the optical axis direction of laser light L by the amount of displacement of the light-converging point of laser light L determined in conformity to the thickness and refractive index of the material to be cut (S215).

After the placement of the light-converging point of laser light L within the material to be cut is completed, the material to be cut is irradiated with laser light L, and the X-axis stage 109 and the Y-axis stage 111 are moved in conformity to a desirable cutting pattern (S217). As shown in FIG. 22, the laser light L emitted from the laser light source 101 is converged by the light-converging lens 105 such that the light-converging point P is positioned within the piezoelectric device wafer 31 facing a predetermined gap (80 μm as mentioned above) formed between adjacent circuit sections 39. The above-mentioned desirable cutting pattern is set such that the gap formed between the adjacent circuit sections 39 in order to separate a plurality of piezoelectric device chips 37 from the piezoelectric device wafer 31 is irradiated with the laser light L, whereas the laser light L is irradiated while the state of irradiation of laser light L is seen through the monitor 129.

Here, as shown in FIG. 22, the laser light L irradiating the material to be cut is converged by the light-converging lens 105 by an angle at which the circuit sections 39 formed on the surface of the piezoelectric device wafer 31 (the surface on which the laser light L is incident) are not irradiated with the laser light L. Converging the laser light L by an angle at which the circuit sections 39 are not irradiated with the laser light L can prevent the laser light L from entering the circuit sections 39 and protect the circuit sections 39 against the laser light L.

When the laser light L emitted from the laser light source 101 is converged such that the light-converging point P is positioned within the piezoelectric device wafer 31 while the energy density of laser light L at the light-converging point P exceeds a threshold of optical damage or optical dielectric breakdown, minute crack regions 9 are formed only at the light-converging point P within the piezoelectric device wafer 31 acting as a material to be cut and its vicinity. Here, the surface and rear face of the material to be cut (piezoelectric device wafer 31) will not be damaged.

Figure 23:
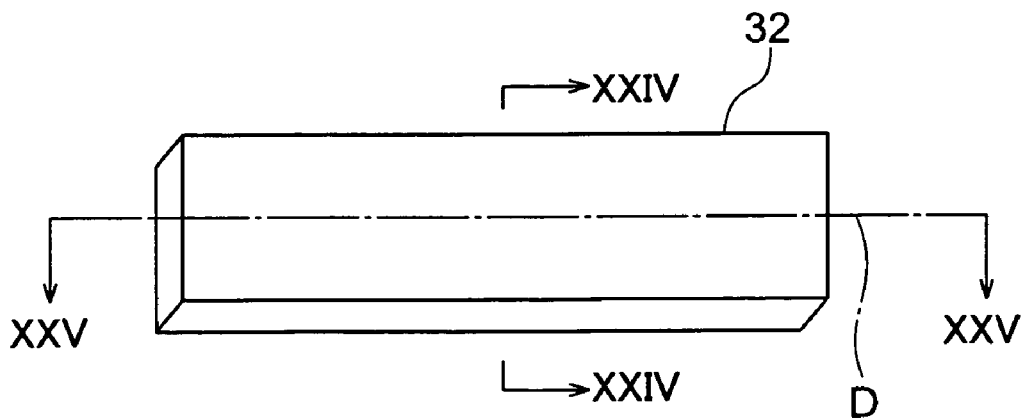
FIG. 23 is a plan view of the light-transmitting material irradiated with laser light by the cutting method in accordance with the second embodiment of the embodiment.
Figure 24:
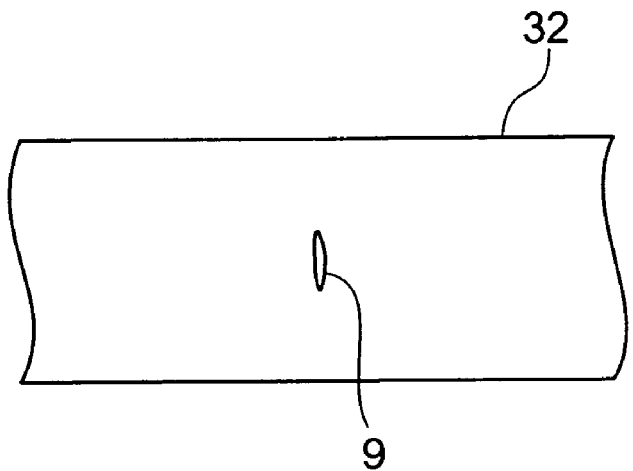
FIG. 24 is a sectional view of the light-transmitting material shown in FIG. 23 taken along the line XXIV-XXIV.
Figure 25:
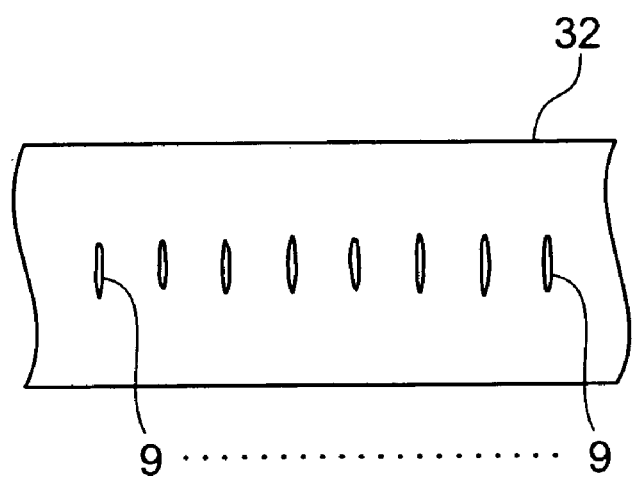
FIG. 25 is a sectional view of the light-transmitting material shown in FIG. 23 taken along the line XXV-XXV.

Now, with reference to FIGS. 23 to 27, the forming of cracks by moving the light-converging point of laser light L will be explained. The material to be cut 32 (light-transmitting material) having a substantially rectangular parallelepiped form shown in FIG. 23 is irradiated with laser light L such that the light-converging point of laser light L is positioned within the material to be cut 32, whereby minute crack regions 9 are formed only at the light-converging point within the material to be cut 32 and its vicinity as shown in FIGS. 24 and 25. The scanning of laser light L or movement of the material to be cut 32 is regulated so as to move the light-converging point of laser light L in the longitudinal direction D of material to be cut 32 intersecting the optical axis of laser light L.

Figure 26:
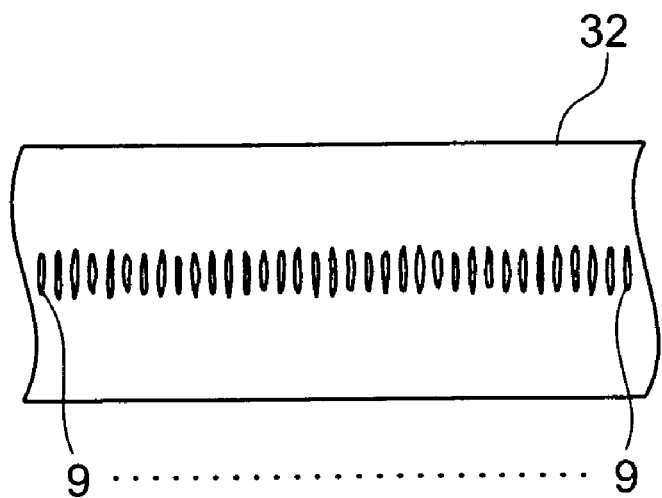
FIG. 26 is a sectional view of the light-transmitting material shown in FIG. 23 taken along the line XXV-XXV when the light-converging point moving speed is made lower.
Figure 27:
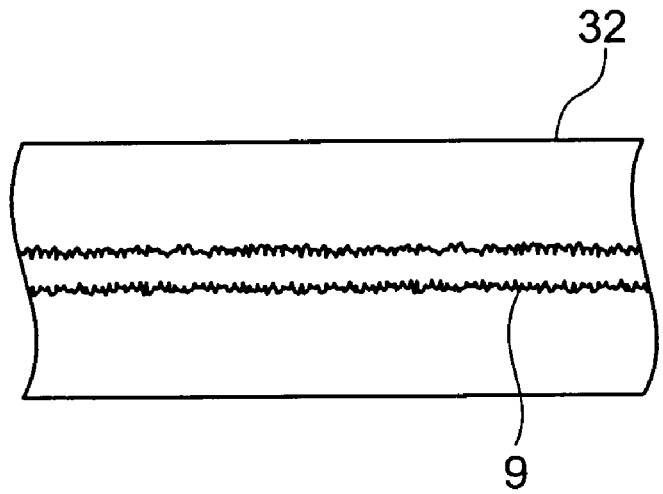
FIG. 27 is a sectional view of the light-transmitting material shown in FIG. 23 taken along the line XXV-XXV when the light-converging point moving speed is made further lower.

Since the laser light L is emitted from the laser light source 101 in a pulsating manner, a plurality of crack regions 9 are formed with a gap therebetween corresponding to the scanning speed of laser light L or the moving speed of the material to be cut 32 along the longitudinal direction D of the material to be cut 32 when the laser light L is scanned or the material to be cut 32 is moved. The scanning speed of laser light L or the moving speed of material to be cut 32 may be slowed down, so as to shorten the gap between the crack regions 9, thereby increasing the number of thus formed crack regions 9 as shown in FIG. 26. The scanning speed of laser light L or the moving speed of material to be cut may further be slowed down, so that the crack region 9 is continuously formed in the scanning direction of laser light L or the moving direction of material to be cut 32, i.e., the moving direction of the light-converging point of laser light L as shown in FIG. 27. Adjustment of the gap between the crack regions 9 (number of crack regions 9 to be formed) can also be realized by changing the relationship between the repetition frequency of laser light L and the moving speed of the material to be cut 32 (X-axis stage or Y-axis stage). Also, throughput can be improved when the repetition frequency of laser light L and the moving speed of material to be cut 32 are increased.

Once the crack regions 9 are formed along the above-mentioned desirable cutting pattern (S219), a stress is generated due to physical external force application, environmental changes, and the like within the material to be cut, the part formed with the crack regions 9 in particular, so as to grow the crack regions 9 formed only within the material to be cut (the light-converging point and its vicinity), thereby cutting the material to be cut at a position formed with the crack regions 9 (S221).

With reference to FIGS. 28 to 32, the cutting of the material to be cut upon physical external force application will be explained. First, the material to be cut (piezoelectric device wafer 31) formed with the crack regions 9 along the desirable cutting pattern is placed in a cutting apparatus while in a state held by a wafer sheet 33 grasped by the sample holder 35. The cutting apparatus has a suction chuck 34, which will be explained later, a suction pump (not depicted) connected to the suction chuck 34, a pressure needle 36 (pressing member), pressure needle driving means (not depicted) for moving the pressure needle 36, and the like. Usable as the pressure needle driving means is an actuator of electric, hydraulic, or other types. FIGS. 28 to 32 do not depict the circuit sections 39.

Figure 28:
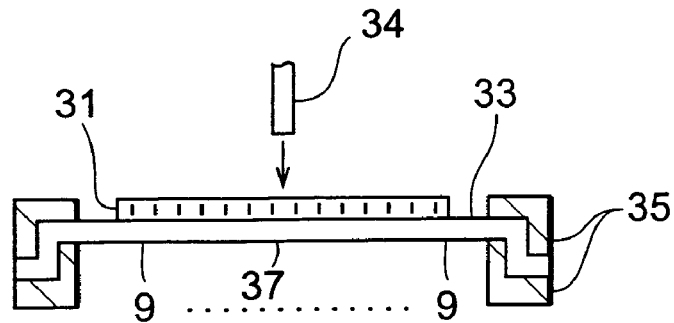
FIG. 28 is a sectional view of a piezoelectric device wafer or the like showing a first step of the cutting method in accordance with the second embodiment of the embodiment.
Figure 29:
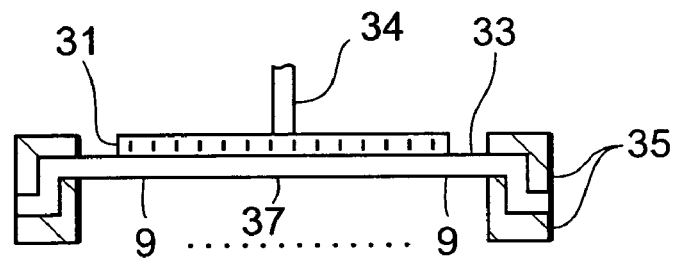
FIG. 29 is a sectional view of the piezoelectric device wafer or the like showing a second step of the cutting method in accordance with the second embodiment of the embodiment.
Figure 30:
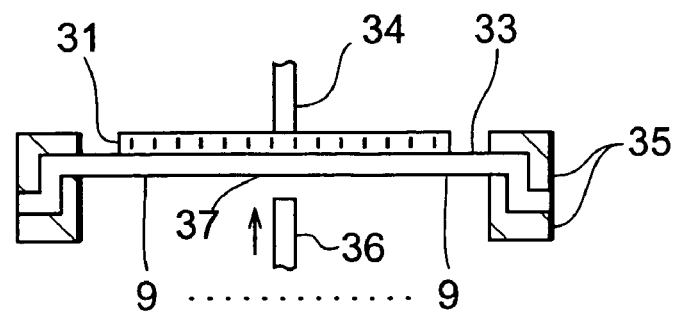
FIG. 30 is a sectional view of the piezoelectric device wafer or the like showing a third step of the cutting method in accordance with the second embodiment of the embodiment.

Once the piezoelectric device wafer 31 is placed in the cutting apparatus, the suction chuck 34 approaches the position corresponding to the piezoelectric device chip 37 to be isolated as shown in FIG. 28. A suction pump apparatus is actuated while in a state where the suction chuck 34 is located closer to or abuts against the piezoelectric device chip 37 to be isolated, whereby the suction chuck 34 attracts the piezoelectric device chip 37 (piezoelectric device wafer 31) to be isolated as shown in FIG. 29. Once the suction chuck 34 attracts the piezoelectric device chip 37 (piezoelectric device wafer 31) to be isolated, the pressure needle 36 is moved to the position corresponding to the piezoelectric device chip 37 to be isolated from the rear face of wafer sheet 33 (rear face of the surface held with the piezoelectric device wafer 31) as shown in FIG. 30.

Figure 31:
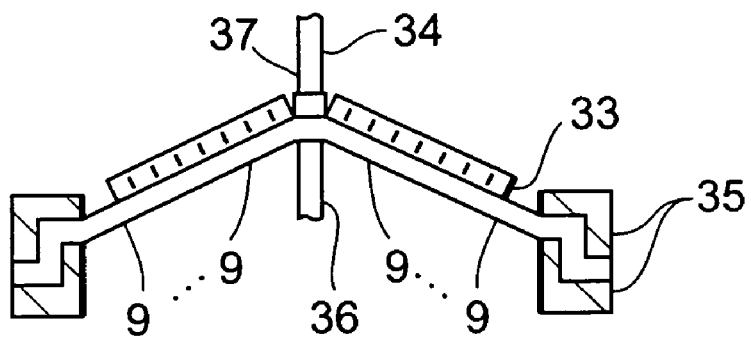
FIG. 31 is a sectional view of the piezoelectric device wafer or the like showing a fourth step of the cutting method in accordance with the second embodiment of the embodiment.

When the pressure needle 36 is further moved after abutting against the rear face of the wafer sheet 33, the wafer sheet 33 deforms, while the pressure needle 36 applies a stress to the piezoelectric device wafer 31 from the outside, whereby a stress is generated in the wafer part formed with the crack regions 9, which grows the crack regions 9. When the crack regions 9 grow to the surface and rear face of the piezoelectric device wafer 31, the piezoelectric device wafer 31 is cut at an end part of the piezoelectric device chip 37 to be isolated as shown in FIG. 31, whereby the piezoelectric device chip 37 is isolated from the piezoelectric device wafer 31. The wafer sheet 33 has an adhesiveness as mentioned above, thereby being able to prevent cut and separated piezoelectric device chips 37 from flying away.

Figure 32:
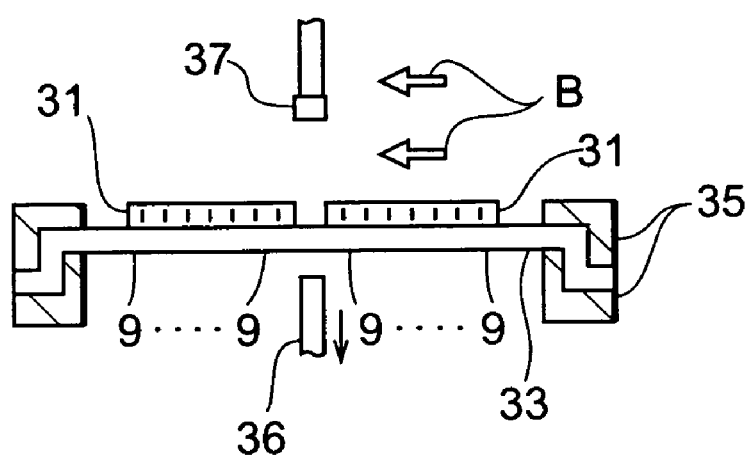
FIG. 32 is a sectional view of the piezoelectric device wafer or the like showing a fifth step of the cutting method in accordance with the second embodiment of the embodiment.

Once the piezoelectric device chip 37 is separated from the piezoelectric device wafer 31, the suction chuck 34 and pressure needle 36 are moved away from the wafer sheet 33. When the suction chuck 34 and pressure needle 36 are moved, the isolated piezoelectric device chip 37 is released from the wafer sheet 33 as shown in FIG. 32, since the former is attracted to the suction chuck 34. Here, an ion air blow apparatus, which is not depicted, is used for sending an ion air in the direction of arrows B in FIG. 32, whereby the piezoelectric device chip 37 isolated and attracted to the suction chuck 34, and the piezoelectric device wafer 31 (surface) held by the wafer sheet 32 are cleaned with the ion air. Here, a suction apparatus may be provided in place of the ion air cleaning, such that the cut and separated piezoelectric device chips 37 and piezoelectric device wafer 31 are cleaned as dust and the like are aspirated. Known as a method of cutting the material to be cut due to environmental changes is one imparting a temperature change to the material to be cut having the crack regions 9 only therewithin. When a temperature change is imparted to the material to be cut as such, a thermal distortion can occur in the material part formed with the crack regions 9, so that the crack regions grow, whereby the material to be cut can be cut.

Thus, in the second embodiment, the light-converging lens 105 converges the laser light L emitted from the laser light source 101 such that its light-converging point is positioned within the light-transmitting material (piezoelectric device wafer 31), whereby the energy density of laser light at the light-converging point exceeds the threshold of optical damage or optical dielectric breakdown, which forms the minute cracks 9 only at the light-converging point within the light-transmitting material and its vicinity. Since the light-transmitting material is cut at the positions of thus formed crack regions 9, the amount of dust emission is very small, whereby the possibility of dicing damages, chipping, cracks on the material surface, and the like occurring also becomes very low. Since the light-transmitting material is cut along the crack regions 9 formed by the optical damages or optical dielectric breakdown of the light-transmitting material, the directional stability of cutting improves, so that cutting direction can be controlled easily. Also, the dicing width can be made smaller than that attained in the dicing with a diamond cutter, whereby the number of light-transmitting materials cut out from one light-transmitting material can be increased. As a result of these, the second embodiment can cut the light-transmitting material quite easily and appropriately.

Also, a stress is generated within the material to be cut due to physical external force application, environmental changes, and the like, so as to grow the formed crack regions 9 to cut the light-transmitting material (piezoelectric device wafer 31), whereby the light-transmitting material can reliably be cut at the positions of formed crack regions 9.

Also, the pressure needle 36 is used for applying a stress to the light-transmitting material (piezoelectric device wafer 31), so as to grow the formed crack regions 9 to cut the light-transmitting material (piezoelectric device wafer 31), whereby the light-transmitting material can further reliably be cut at the positions of formed crack regions 9.

When the piezoelectric device wafer 31 (light-transmitting material) formed with a plurality of circuit sections 39 is cut and separated into individual piezoelectric device chips 37, the light-converging lens 105 converges the laser light L such that the light-converging point is positioned within the wafer part facing the gap formed between adjacent circuit sections 39, and forms the crack regions 9, whereby the piezoelectric device wafer 31 can reliably be cut at the position of the gap formed between adjacent circuit sections 39.

When the light-transmitting material (piezoelectric device wafer 31) is moved or laser light L is scanned so as to move the light-converging point in a direction intersecting the optical axis of laser light L, e.g., a direction orthogonal thereto, the crack region 9 is continuously formed along the moving direction of the light-converging point, so that the directional stability of cutting further improves, which makes it possible to control the cutting direction more easily.

Also, in the second embodiment, dust-emitting powders hardly exist, so that no lubricating/cleaning water for preventing the dust-emitting powders from flying away is necessary, whereby dry processing can be realized in the cutting step.

In the second embodiment, since the forming of a modified part (crack region 9) is realized by non-contact processing with the laser light L, problems of durability of blades, their replacement frequency, and the like in the dicing caused by diamond cutters will not occur. Also, since the forming of a modified part (crack region 9) is realized by non-contact processing with the laser light L, the second embodiment can cut the light-transmitting material along a cutting pattern which cuts out the light-transmitting material without completely cutting the same. The present invention is not limited to the above-mentioned second embodiment. For embodiment, the light-transmitting material may be a semiconductor wafer, a glass substrate, or the like without being restricted to the piezoelectric device wafer 31. Also, the laser light source 101 can appropriately be selected in conformity to an optical absorption characteristic of the light-transmitting material to be cut. Though the minute regions 9 are formed as a modified part upon irradiation with the laser light L in the second embodiment, it is not restrictive. For embodiment, using an ultra short pulse laser light source (e.g., femto second (fs) laser) can form a modified part caused by a refractive index change (higher refractive index), thus being able to cut the light-transmitting material without generating the crack regions 9 by utilizing such a mechanical characteristic change.

Though the focus adjustment of laser light L is carried out by moving the Z-axis stage 113 in the laser processing apparatus 100, it may be effected by moving the light-converging lens 105 in the optical axis direction of laser light L without being restricted thereto.

Though the X-axis stage 109 and Y-axis stage 111 are moved in conformity to a desirable cutting pattern in the laser processing apparatus 100, it is not restrictive, whereby the laser light L may be scanned in conformity to a desirable cutting pattern.

Though the piezoelectric device wafer 31 is cut by the pressure needle 36 after being attracted to the suction chuck 34, it is not restrictive, whereby the piezoelectric device wafer 31 may be cut by the pressure needle 36, and then the cut and isolated piezoelectric device chip 37 may be attracted to the suction chuck 34. Here, when the piezoelectric device wafer 31 is cut by the pressure needle 36 after the piezoelectric device wafer 31 is attracted to the suction chuck 34, the surface of the cut and isolated piezoelectric device chip 37 is covered with the suction chuck 34, which can prevent dust and the like from adhering to the surface of the piezoelectric device chip 37.

Also, when an image pickup device 121 for infrared rays is used, focus adjustment can be carried out by utilizing reflected light of laser light L. In this case, it is necessary that a half mirror be used instead of the dichroic mirror 103, while disposing an optical device between the half mirror and the laser light source 101, which suppresses the return light to the laser light source 101. Here, it is preferred that the output of laser light L emitted from the laser light source 101 at the time of focus adjustment be set to an energy level lower than that of the output for forming cracks, such that the laser light L for carrying out focus adjustment does not damage the material to be cut.

Characteristic features of the present invention will now be explained from the viewpoints of the second embodiment.

The method of cutting a light-transmitting material in accordance with an aspect of the present invention comprises a modified part forming step of converging laser light emitted from a laser light source such that its light-converging point is positioned within the light-transmitting material, so as to form a modified part only at the light-converging point within the light-transmitting material and its vicinity; and a cutting step of cutting the light-transmitting material at the position of thus formed modified part.

In the method of cutting a light-transmitting material in accordance with this aspect of the present invention, the laser light is converged such that the light-converging point of laser light is positioned within the light-transmitting material in the modified part forming step, whereby the modified part is formed only at the light-converging point within the light-transmitting material and its vicinity. In the cutting step, the light-transmitting material is cut at the position of thus formed modified part, so that the amount of dust emission is very small, whereby the possibility of dicing damages, chipping, cracks on the material surface, and the like occurring also becomes very low. Since the light-transmitting material is cut at the position of thus formed modified part, the directional stability of cutting improves, so that cutting direction can be controlled easily. Also, the dicing width can be made smaller than that attained in the dicing with a diamond cutter, whereby the number of light-transmitting materials cut out from one light-transmitting material can be increased. As a result of these, the present invention can cut the light-transmitting material quite easily and appropriately.

Also, in the method of cutting a light-transmitting material in accordance with this aspect of the present invention, dust-emitting powders hardly exist, so that no lubricating/cleaning water for preventing the dust-emitting powders from flying away is necessary, whereby dry processing can be realized in the cutting step.

In the method of cutting a light-transmitting material in accordance with this aspect of the present invention, since the forming of a modified part is realized by non-contact processing with laser light, problems of durability of blades, their replacement frequency, and the like in the dicing caused by diamond cutters will not occur. Also, since the forming of a modified part is realized by non-contact processing with the laser light, the method of cutting a light-transmitting material in accordance with this aspect of the present invention can cut the light-transmitting material along a cutting pattern which cuts out the light-transmitting material without completely cutting the same.

Preferably, the light-transmitting material is formed with a plurality of circuit sections, whereas laser light is converged such that the light-converging point is positioned within the light-transmitting material part facing the gap formed between adjacent circuit sections in the modified part forming step, so as to form the modified part. With such a configuration, the light-transmitting material can reliably be cut at the position of the gap formed between adjacent circuit sections.

When irradiating the light-transmitting material with laser light in the modified part forming step, it is preferred that the laser light be converged by an angle at which the circuit sections are not irradiated with the laser light. Converging the laser light by an angle at which the circuit sections are not irradiated with the laser light when irradiating the light-transmitting material with the laser light in the modified part forming step as such can prevent the laser light from entering the circuit sections and protect the circuit sections against the laser light.

Preferably, in the modified part forming step, the light-converging point is moved in a direction intersecting the optical axis of laser light, so as to form a modified part continuously along the moving direction of the light-converging point. When the light-converging point is moved in a direction intersecting the optical axis of laser light in the modified part forming step as such, so as to form the modified part continuously along the moving direction of the light-converging point, the directional stability of cutting further improves, which makes it further easier to control the cutting direction.

The method of cutting a light-transmitting material in accordance with an aspect of the present invention comprises a crack forming step of converging laser light emitted from a laser light source such that its light-converging point is positioned within the light-transmitting material, so as to form a crack only at the light-converging point within the light-transmitting material and its vicinity; and a cutting step of cutting the light-transmitting material at the position of thus formed crack.

In the method of cutting a light-transmitting material in accordance with this aspect of the present invention, laser light is converged such that the light-converging point of laser light is positioned within the light-transmitting material, so that the energy density of laser light at the light-converging point exceeds a threshold of optical damage or optical dielectric breakdown of the light-transmitting material, whereby a crack is formed only at the light-converging point within the light-transmitting material and its vicinity. In the cutting step, the light-transmitting material is cut at the position of thus formed crack, so that the amount of dust emission is very small, whereby the possibility of dicing damages, chipping, cracks on the material surface, and the like occurring also becomes very low. Since the light-transmitting material is cut at the position of the crack formed by an optical damage or optical dielectric breakdown, the directional stability of cutting improves, so that cutting direction can be controlled easily. Also, the dicing width can be made smaller than that attained in the dicing with a diamond cutter, whereby the number of light-transmitting materials cut out from one light-transmitting material can be increased. As a result of these, the present invention can cut the light-transmitting material quite easily and appropriately.

Also, in the method of cutting a light-transmitting material in accordance with this aspect of the present invention, dust-emitting powders hardly exist, so that no lubricating/cleaning water for preventing the dust-emitting powders from flying away is necessary, whereby dry processing can be realized in the cutting step.

In the method of cutting a light-transmitting material in accordance with this aspect of the present invention, since the forming of a crack is realized by non-contact processing with laser light, problems of durability of blades, their replacement frequency, and the like in the dicing caused by diamond cutters will not occur. Also, since the forming of a crack is realized by non-contact processing with the laser light, the method of cutting a light-transmitting material in accordance with this aspect of the present invention can cut the light-transmitting material along a cutting pattern which cuts out the light-transmitting material without completely cutting the same.

Preferably, in the cutting step, the light-transmitting material is cut by growing the formed crack. Cutting the light-transmitting material by growing the formed crack in the cutting step as such can reliably cut the light-transmitting material at the position of the formed crack.

Preferably, in the cutting step, a stress is applied to the light-transmitting material by using a pressing member, so as to grow a crack, thereby cutting the light-transmitting material. When a stress is applied to the light-transmitting material in the cutting step by using a pressing member as such, so as to grow a crack, thereby cutting the light-transmitting material, the light-transmitting material can further reliably be cut at the position of the crack.

The apparatus for cutting a light-transmitting material in accordance with an aspect of the present invention comprises a laser light source; holding means for holding the light-transmitting material; an optical device for converging the laser light emitted from the laser light source such that a light-converging point thereof is positioned within the light-transmitting material; and cutting means for cutting the light-transmitting material at the position of a modified part formed only at the light-converging point of laser light within the light-transmitting material and its vicinity.

In the apparatus for cutting a light-transmitting material in accordance with this aspect of the present invention, the optical device converges laser light such that the light-converging point of laser light is positioned within the light-transmitting material, whereby a modified part is formed only at the light-converging point within the light-transmitting material and its vicinity. Then, the cutting means cuts the light-transmitting material at the position of the modified part formed only at the light-converging point within the light-transmitting material and its vicinity, whereby the light-transmitting material is reliably cut along thus formed modified part. As a consequence, the amount of dust emission is very small, whereas the possibility of dicing damages, chipping, cracks on the material surface, and the like occurring also becomes very low. Also, since the light-transmitting material is cut along the modified part, the directional stability of cutting improves, whereby the cutting direction can be controlled easily. Also, the dicing width can be made smaller than that attained in the dicing with a diamond cutter, whereby the number of light-transmitting materials cut out from one light-transmitting material can be increased. As a result of these, the present invention can cut the light-transmitting material quite easily and appropriately.

Also, in the apparatus for cutting a light-transmitting material in accordance with this aspect of the present invention, dust-emitting powders hardly exist, so that no lubricating/cleaning water for preventing the dust-emitting powders from flying away is necessary, whereby dry processing can be realized in the cutting step.

In the apparatus for cutting a light-transmitting material in accordance with this aspect of the present invention, since the modified part is formed by non-contact processing with laser light, problems of durability of blades, their replacement frequency, and the like in the dicing caused by diamond cutters will not occur as in the conventional techniques. Also, since the modified part is formed by non-contact processing with the laser light as mentioned above, the apparatus for cutting a light-transmitting material in accordance with this aspect of the present invention can cut the light-transmitting material along a cutting pattern which cuts out the light-transmitting material without completely cutting the same.

The apparatus for cutting a light-transmitting material in accordance with an aspect of the present invention comprises a laser light source; holding means for holding the light-transmitting material; an optical device for converging laser light emitted from the laser light source such that a light-converging point thereof is positioned within the light-transmitting material; and cutting means for cutting the light-transmitting material by growing a crack formed only at the light-converging point of laser light within the light-transmitting material and its vicinity.

In the apparatus for cutting a light-transmitting material in accordance with this aspect of the present invention, the optical device converges laser light such that the light-converging point of laser light is positioned within the light-transmitting material, so that the energy density of laser light at the light-converging point exceeds a threshold of optical damage or optical dielectric breakdown of the light-transmitting material, whereby a crack is formed only at the light-converging point within the light-transmitting material and its vicinity. Then, the cutting means cuts the light-transmitting material by growing the crack formed only at the light-converging point within the light-transmitting material and its vicinity, whereby the light-transmitting material is reliably cut along the crack formed by an optical damage or optical dielectric breakdown of the light-transmitting material. As a consequence, the amount of dust emission is very small, whereas the possibility of dicing damages, chipping, cracks on the material surface, and the like occurring also becomes very low. Since the light-transmitting material is cut along the crack, the directional stability of cutting improves, so that cutting direction can be controlled easily. Also, the dicing width can be made smaller than that attained in the dicing with a diamond cutter, whereby the number of light-transmitting materials cut out from one light-transmitting material can be increased. As a result of these, the present invention can cut the light-transmitting material quite easily and appropriately.

Also, in the apparatus for cutting a light-transmitting material in accordance with this aspect of the present invention, dust-emitting powders hardly exist, so that no lubricating/cleaning water for preventing the dust-emitting powders from flying away is necessary, whereby dry processing can be realized in the cutting step.

In the apparatus for cutting a light-transmitting material in accordance with this aspect of the present invention, since the crack is formed by non-contact processing with laser light, problems of durability of blades, their replacement frequency, and the like in the dicing caused by diamond cutters will not occur as in the conventional techniques. Also, since the crack is formed by non-contact processing with the laser light as mentioned above, the method of cutting a light-transmitting material in accordance with this aspect of the present invention can cut the light-transmitting material along a cutting pattern which cuts out the light-transmitting material without completely cutting the same.

Preferably, the cutting means has a pressing member for applying a stress to the light-transmitting material. When the cutting means has a pressing member for applying a stress to the light-transmitting material as such, a stress can be applied to the light-transmitting material by using the pressing member, so as to grow a crack, whereby the light-transmitting material can further reliably be cut at the position of the crack formed.

Preferably, the light-transmitting material is one whose surface is formed with a plurality of circuit sections, whereas the optical device converges the laser light such that the light-converging point is positioned within the light-transmitting material part facing the gap formed between adjacent circuit sections. With such a configuration, the light-transmitting material can reliably be cut at the position of the gap formed between adjacent circuit sections.

Preferably, the optical device converges laser light by an angle at which the circuit sections are not irradiated with the laser light. When the optical device converges the laser light by an angle at which the circuit sections are not irradiated with the laser light as such, it can prevent the laser light from entering the circuit sections and protect the circuit sections against the laser light.

Preferably, the apparatus further comprises light-converging point moving means for moving the light-converging point in a direction intersecting the optical axis of laser light. When the apparatus further comprises light-converging point moving means for moving the light-converging point in a direction intersecting the optical axis of laser light as such, a crack can continuously be formed along the moving direction of the light-converging point, so that the directional stability of cutting further improves, whereby the direction of cutting can be controlled further easily.

Third Embodiment

A third embodiment of the present invention will be explained. In the third embodiment and a fourth embodiment which will be explained later, an object to be processed is irradiated with laser light such that the direction of linear polarization of linearly polarized laser light extends along a line along which the object is intended to be cut in the object to be processed, whereby a modified region is formed in the object to be processed. As a consequence, in the modified spot formed with a single pulse of shot (i.e., a single pulse of laser irradiation), the size in the direction extending along the line along which the object is intended to be cut can be made relatively large when the laser light is pulse laser light. The inventor has confirmed it by an experiment. Conditions for the experiment are as follows:

(A) Object to be processed: Pyrex glass wafer (having a thickness of 700 μm and an outer diameter of 4 inches)
(B) Laser
  Light source: semiconductor laser pumping Nd:YAG laser
  Wavelength: 1064 nm
  Laser light spot cross-sectional area: $3.14 \times 10^{-8}$ cm$^2$
  Oscillation mode: Q-switch pulse
  Repetition frequency: 100 kHz
  Pulse width: 30 ns
  Output: output<1 mJ/pulse
  Laser light quality: TEM$_{00}$
  Polarization characteristic: linear polarization
(C) Light-converging lens
  Magnification: ×50
  NA: 0.55
  Transmittance with respect to laser light wavelength: 60%
(D) Moving speed of a mounting table mounting the object to be processed: 100 mm/sec Each of Samples 1, 2, which was an object to be processed, was exposed to a single pulse shot of pulse laser light while the light-converging point is located within the object to be processed, whereby a crack region caused by multiphoton absorption is formed within the object to be processed. Sample 1 was irradiated with linearly polarized pulse laser light, whereas Sample 2 was irradiated with circularly polarized pulse laser light.

Figure 33:
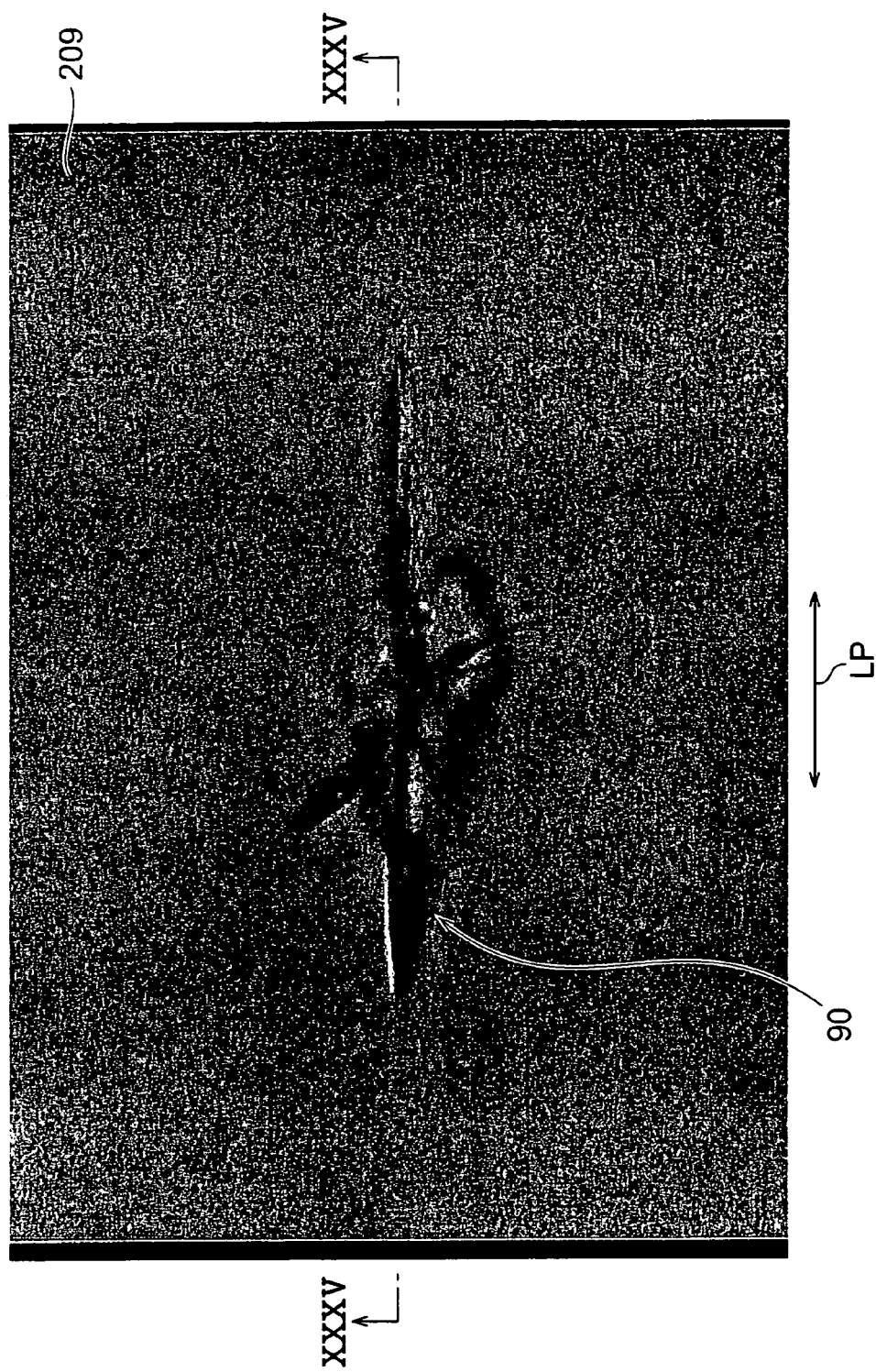
FIG. 33 is a view showing a photograph of a plane of a sample within which a crack region is formed upon irradiation with linearly polarized pulse laser light.
Figure 34:
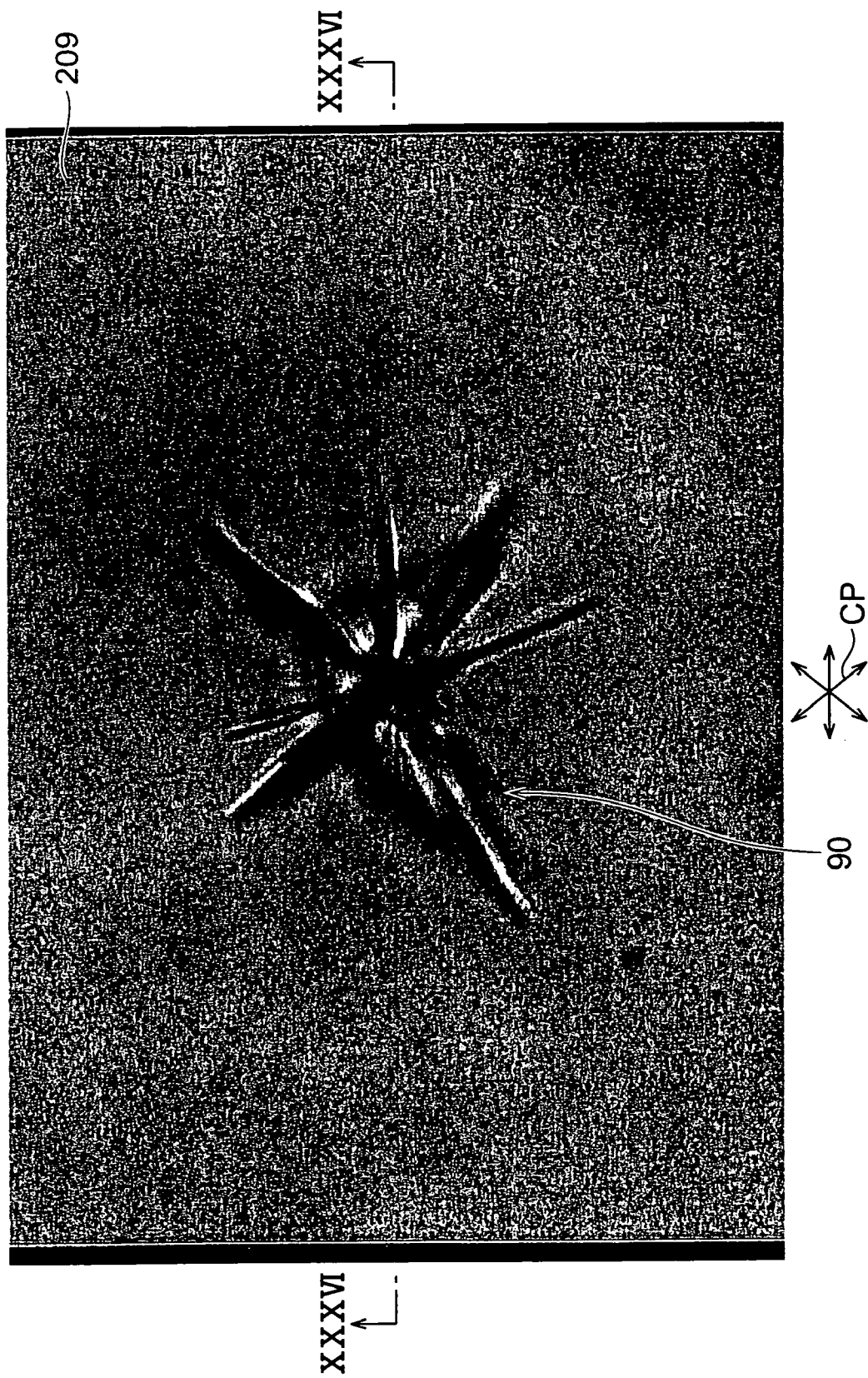
FIG. 34 is a view showing a photograph of a plane of a sample within which a crack region is formed upon irradiation with circularly polarized pulse laser light.
Figure 35:
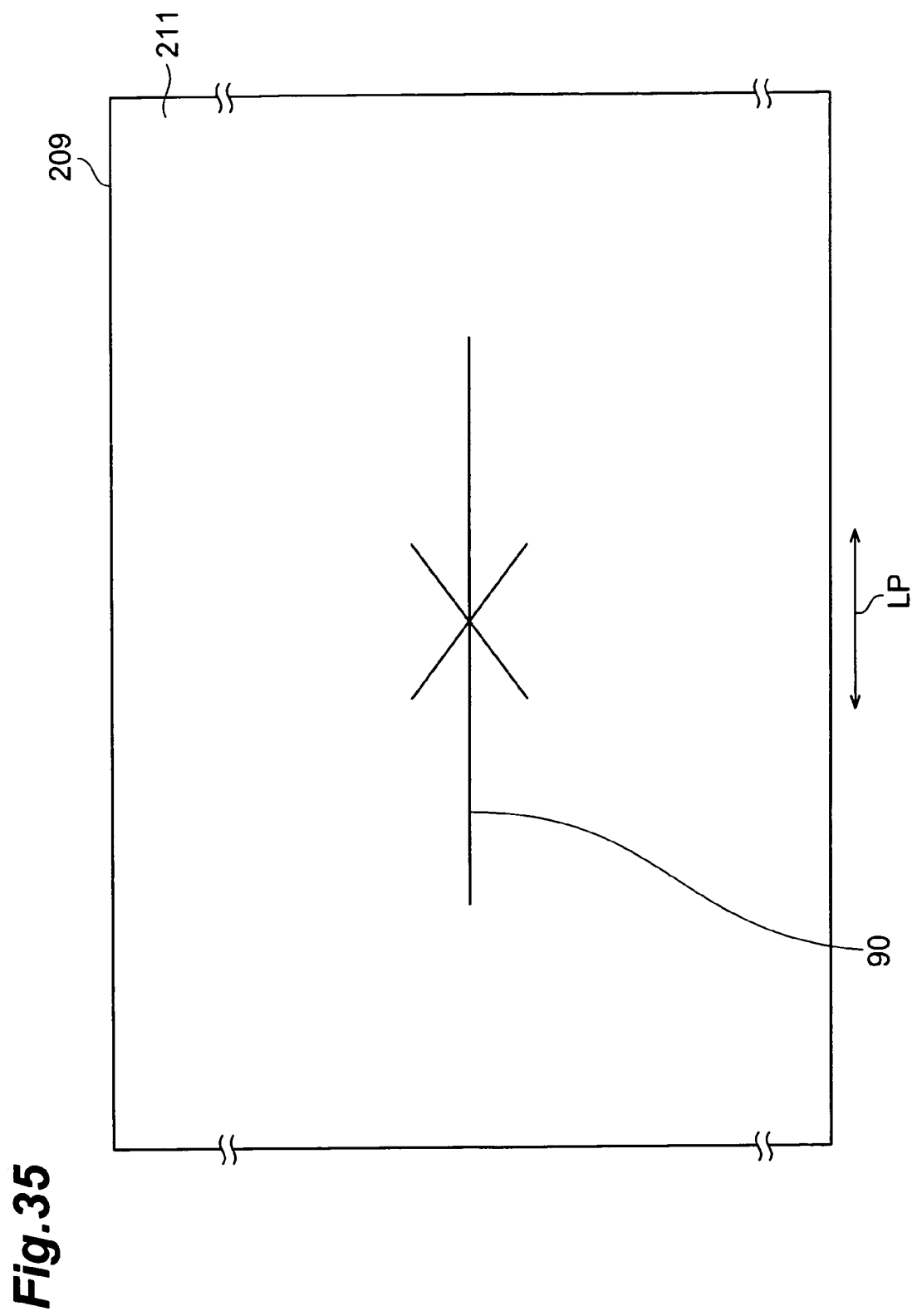
FIG. 35 is a sectional view of the sample shown in FIG. 33 taken along the line XXXV-XXXV.
Figure 36:
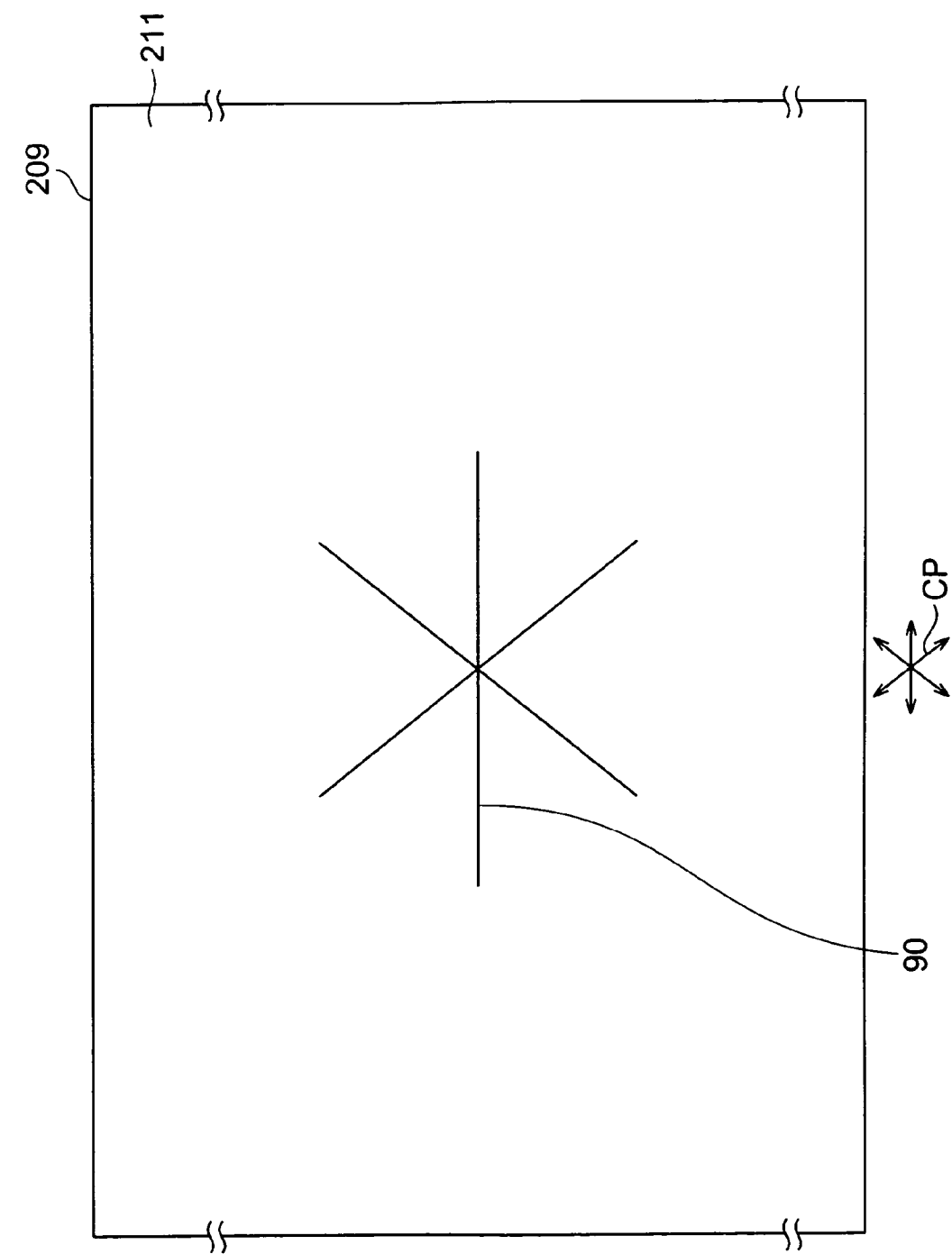
FIG. 36 is a sectional view of the sample shown in FIG. 34 taken along the line XXXVI-XXXVI.

FIG. 33 is a view showing a photograph of Sample 1 in plan, whereas FIG. 34 is a view showing a photograph of Sample 2 in plan. These planes are an entrance face 209 of pulse laser light. Letters LP and CP schematically indicate linear polarization and circular polarization, respectively. FIG. 35 is a view schematically showing a cross section of Sample 1 shown in FIG. 33 taken along the line XXXV-XXXV. FIG. 36 is a view schematically showing a cross section of Sample 1 shown in FIG. 34 taken along the line XXXVI-XXXVI. A crack spot 90 is formed within a glass wafer 211 which is the object to be processed.

In the case where pulse laser light is linearly polarized light, as shown in FIG. 35, the size of crack spot 90 formed by a single pulse shot is relatively large in the direction aligning with the direction of linear polarization. This indicates that the forming of the crack spot 90 is accelerated in this direction. When the pulse laser light is circularly polarized light, by contrast, the size of the crack spot 90 formed by a single pulse shot will not become greater in any specific direction as shown in FIG. 36. The size of the crack spot 90 in the direction yielding the maximum length is greater in Sample 1 than in Sample 2.

Figure 37:
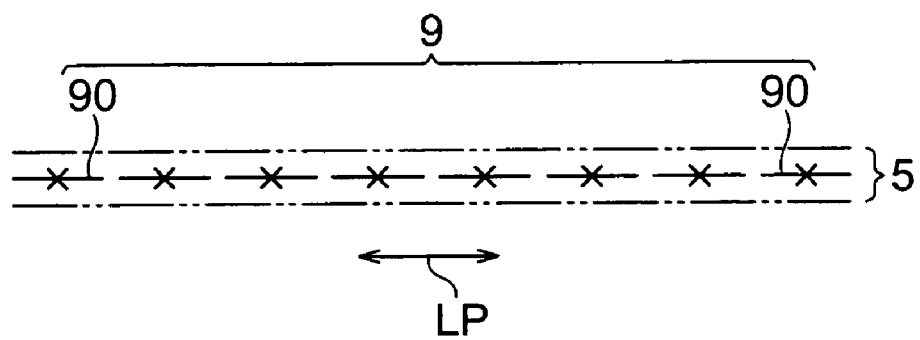
FIG. 37 is a plan view of the part of object to be processed extending along a line along which the object is intended to be cut, in which a crack region is formed by the laser processing method in accordance with a third embodiment of the embodiment.
Figure 38:
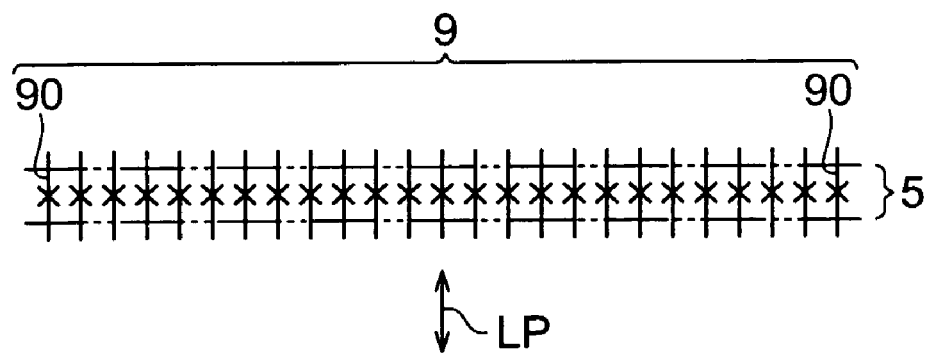
FIG. 38 is a plan view of the part of object to be processed extending along a line along which the object is intended to be cut, in which a crack region is formed by a comparative laser processing method.

The fact that a crack region extending along a line along which the object is intended to be cut can be formed efficiently will be explained from these results of experiment. FIGS. 37 and 38 are plan views of crack regions each formed along a line along which the object is intended to be cut in an object to be processed. A number of crack spots 90, each formed by a single pulse shot, are formed along a line 5 along which the object is intended to be cut, whereby a crack region 9 extending along the line 5 along which the object is intended to be cut is formed. FIG. 37 shows the crack region 9 formed upon irradiation with pulse laser light such that the direction of linear polarization of pulse laser light aligns with the line 5 along which the object is intended to be cut. The forming of crack spots 9 is accelerated along the direction of the line 5 along which the object is intended to be cut, whereby their size is relatively large in this direction. Therefore, the crack region 9 extending along the line 5 along which the object is intended to be cut can be formed by a smaller number of shots. On the other hand, FIG. 38 shows the crack region 9 formed upon irradiation with pulse laser light such that the direction of linear polarization of pulse laser light is orthogonal to the line 5 along which the object is intended to be cut. Since the size of crack spot 90 in the direction of the line 5 along which the object is intended to be cut is relatively small, the number of shots required for forming the crack region 9 becomes greater than that in the case of FIG. 37. Therefore, the method of forming a crack region in accordance with this embodiment shown in FIG. 37 can form the crack region more efficiently than the method shown in FIG. 38 does.

Also, since pulse laser light is irradiated while the direction of linear polarization of pulse laser light is orthogonal to the line 5 along which the object is intended to be cut, the forming of the crack spot 90 formed at the shot is accelerated in the width direction of the line 5 along which the object is intended to be cut. Therefore, when the crack spot 90 extends in the width direction of the line 5 along which the object is intended to be cut too much, the object to be processed cannot precisely be cut along the line 5 along which the object is intended to be cut. By contrast, the crack spot 90 formed at the shot does not extend much in directions other than the direction aligning with the line 5 along which the object is intended to be cut in the method in accordance with this embodiment shown in FIG. 37, whereby the object to be processed can be cut precisely.

Figure 39:
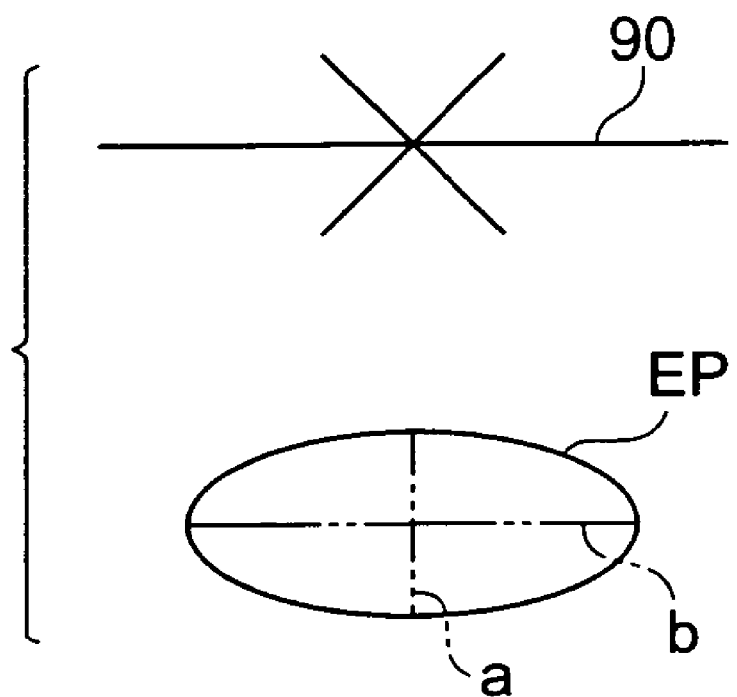
FIG. 39 is a view showing elliptically polarized laser light in accordance with the third embodiment of the embodiment, and a crack region formed thereby.

Though making the size in a predetermined direction relatively large among the sizes of a modified region has been explained in the case of linear polarization, the same holds in elliptical polarization as well. Namely, as shown in FIG. 39, the forming of the crack spot 90 is accelerated in the direction of major axis b of an ellipse representing elliptical polarization EP of laser light, whereby the crack spot 90 having a relatively large size along this direction can be formed. Hence, when a crack region is formed such that the major axis of an ellipse indicative of the elliptical polarization of laser elliptically polarized with an ellipticity of other than 1 aligns with a line along which the object is intended to be cut in the object to be processed, effects similar to those in the case of linear polarization occur. Here, the ellipticity is half the length of minor axis a/half the length of major axis b. As the ellipticity is smaller, the size of the crack spot 90 along the direction of major axis b becomes greater. Linearly polarized light is elliptically polarized light with an ellipticity of zero. Circularly polarized light is obtained when the ellipticity is 1, which cannot make the size of the crack region relatively large in a predetermined direction. Therefore, this embodiment does not encompass the case where the ellipticity is 1.

Though making the size in a predetermined direction relatively large among the sizes of a modified region has been explained in the case of a crack region, the same holds in molten processed regions and refractive index change regions as well. Also, though pulse laser light is explained, the same holds in continuous wave laser light as well. The foregoing also hold in a fourth embodiment which will be explained later.

Figure 40:
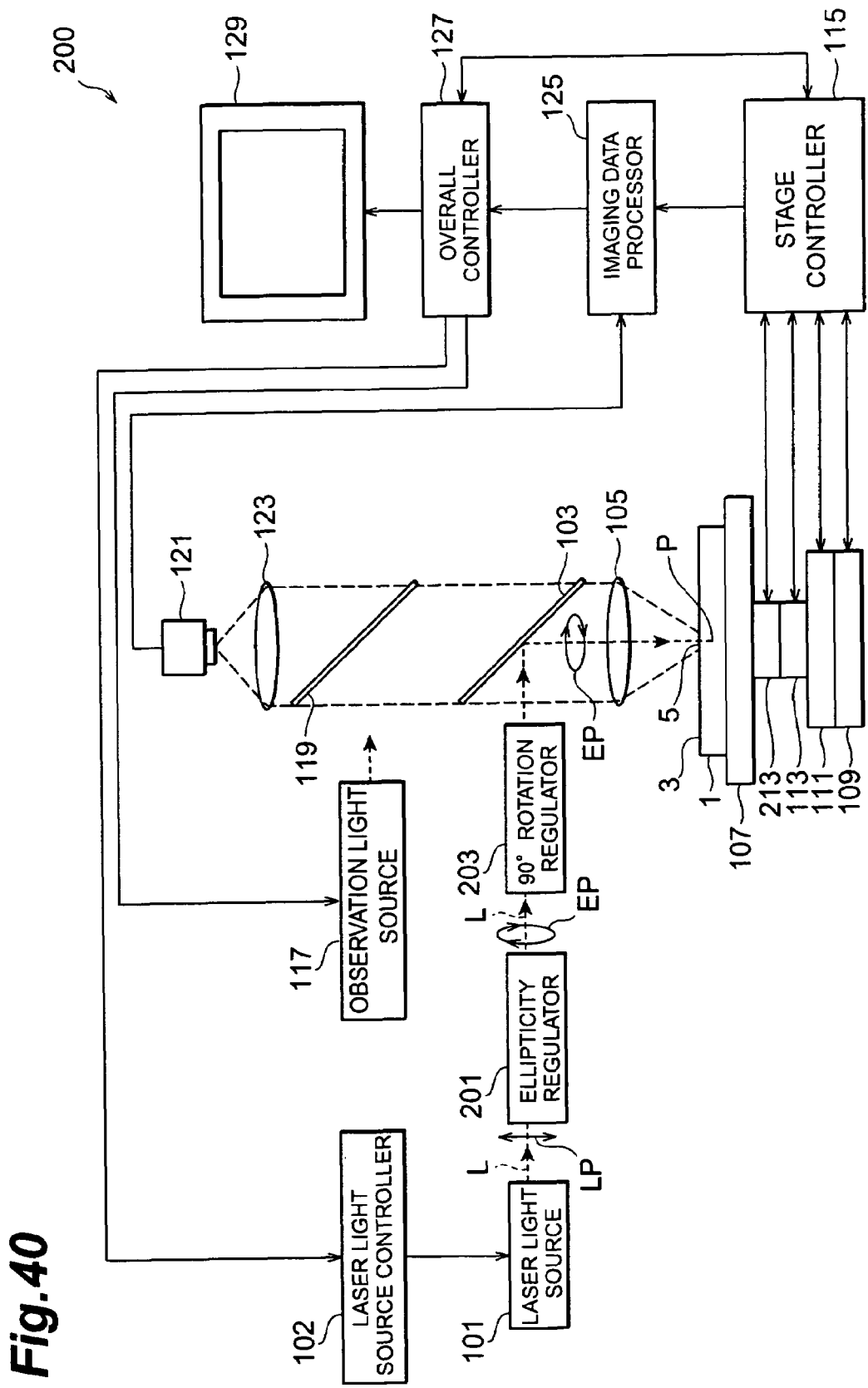
FIG. 40 is a schematic diagram of the laser processing apparatus in accordance with the third embodiment of the embodiment.

The laser processing apparatus in accordance with the third embodiment of the present invention will now be explained. FIG. 40 is a schematic diagram of this laser processing apparatus. The laser processing apparatus 200 will be explained mainly in terms of its differences from the laser processing apparatus 100 in accordance with the first embodiment shown in FIG. 14. The laser processing apparatus 200 comprises an ellipticity regulator 201 for adjusting the ellipticity of polarization of laser light L emitted from a laser light source 101, and a 90° rotation regulator 203 for adjusting the rotation of polarization of the laser light L emitted from the ellipticity regulator 201 by about 90°.

Figure 41:
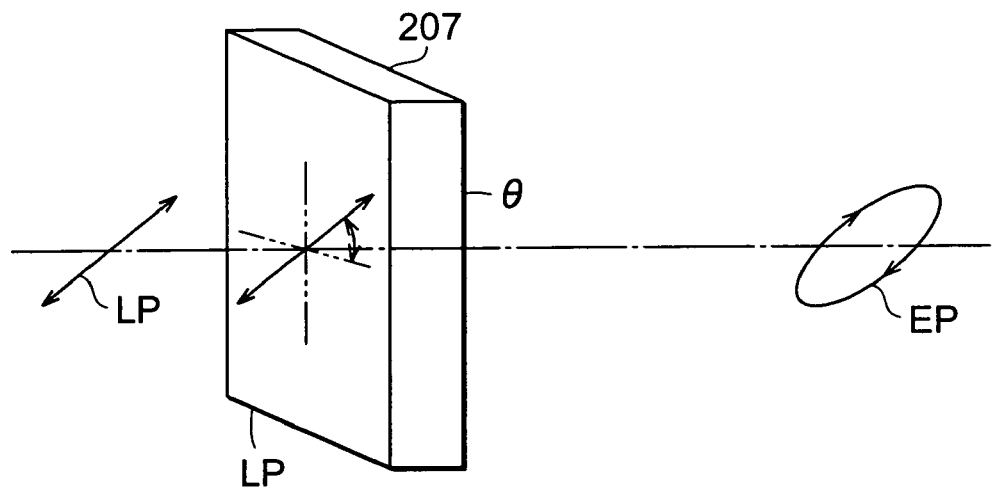
FIG. 41 is a perspective view of a quarter-wave plate included in an ellipticity regulator in accordance with the third embodiment of the embodiment.

The ellipticity regulator 201 includes a quarter wave plate 207 shown in FIG. 41. The quarter wave plate 207 can adjust the ellipticity of elliptically polarized light by changing the angle of direction θ. Namely, when light with linear polarization LP is made incident on the quarter wave plate 207, the transmitted light attains elliptical polarization EP with a predetermined ellipticity. The angle of direction is an angle formed between the major axis of the ellipse and the X axis. As mentioned above, a number other than 1 is employed as the ellipticity in this embodiment. The ellipticity regulator 201 can make the polarization of laser light L become elliptically polarized light EP having a desirable ellipticity. The ellipticity is adjusted in view of the thickness and material of the object to be processed 1, and the like.

When irradiating the object to be processed 1 with laser light L having linear polarization LP, the laser light L emitted from the laser light source 101 is linearly polarized light LP, whereby the ellipticity regulator 201 adjusts the angle of direction θ of the quarter wave plate 207 such that the laser light L passes through the quarter wave plate while being the linearly polarized light LP. Also, the laser light source 101 emits linearly polarized laser light L, whereby the ellipticity regulator 201 is unnecessary when only laser light of linear polarization LP is utilized for irradiating the object to be processed with laser.

Figure 42:
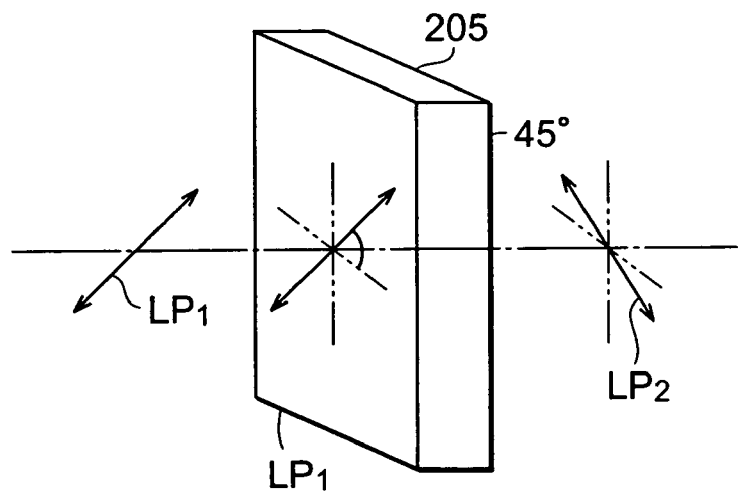
FIG. 42 is a perspective view of a half-wave plate included in a 90° rotation regulator part in accordance with the third embodiment of the embodiment.

The 90° rotation regulator 203 includes a half wave plate 205 as shown in FIG. 42. The half wave plate 205 is a wavelength plate for making polarization orthogonal to linearly polarized incident light. Namely, when linearly polarized light $LP_1$ with an angle of direction of 45° is incident on the half wave plate 205, for embodiment, transmitted light becomes linearly polarized light $LP_2$ rotated by 90° with respect to the incident light $LP_1$. When rotating the polarization of laser light L emitted from the ellipticity regulator 201 by 90°, the 90° rotation regulator 203 operates so as to place the half wave plate 205 onto the optical axis of laser light L. When not rotating the polarization of laser light L emitted from the ellipticity regulator 201, the 90° rotation regulator 203 operates so as to place the half wave plate 205 outside the optical path of laser light L (i.e., at a site where the laser light L does not pass through the half wave plate 205).

The dichroic mirror 103 is disposed such that the laser light L whose rotation of polarization is regulated by 90° or not by the 90° rotation regulator 203 is incident thereon and that the direction of optical axis of laser light L is changed by 90°. The laser processing apparatus 200 comprises a θ-axis stage 213 for rotating the X-Y plane of the mounting table 107 about the thickness direction of the object to be processed 1. The stage controller 115 regulates not only the movement of stages 109, 111, 113, but also the movement of stage 213.

Figure 43:
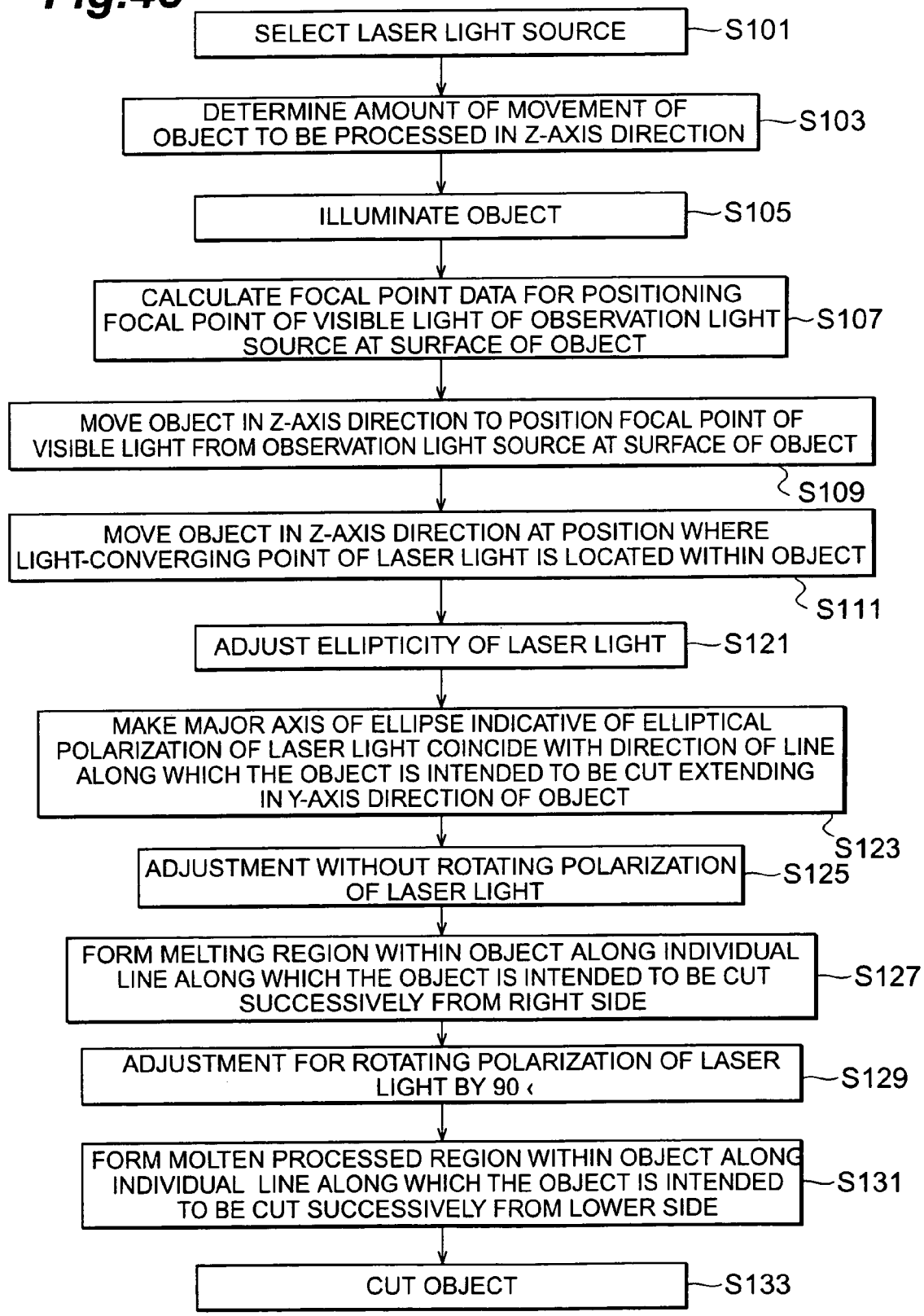
FIG. 43 is a flowchart for explaining the laser processing method in accordance with the third embodiment of the embodiment.

With reference to FIGS. 40 and 43, the laser processing method in accordance with the third embodiment of the present invention will now be explained. FIG. 43 is a flowchart for explaining this laser processing method. The object to be processed 1 is a silicon wafer. Steps S101 to S111 are the same as those of the first embodiment shown in FIG. 15.

The ellipticity regulator 201 adjusts the ellipticity of laser light L having linear polarization LP emitted from the laser light source 101 (S121). The laser light L having elliptical polarization EP with a desirable ellipticity can be obtained when the angle of direction θ of the quarter wave plate is changed in the ellipticity regulator 201.

First, for processing the object to be processed 1 along the Y-axis direction, the major axis of an ellipse indicative of the elliptical polarization EP of laser light L is adjusted so as to coincide with the direction of the line 5 along which the object is intended to be cut extending in the Y-axis direction of the object to be processed 1 (S123). This is achieved by rotating the θ-axis stage 213. Therefore, the θ-axis stage 213 functions as major axis adjusting means or linear polarization adjusting means.

For processing the object 1 along the Y-axis direction, the 90° rotation regulator 203 carries out adjustment which does not rotate the polarization of laser light L (S125). Namely, it operates so as to place the half wave plate to the outside of the optical path of laser light L.

Figure 44:
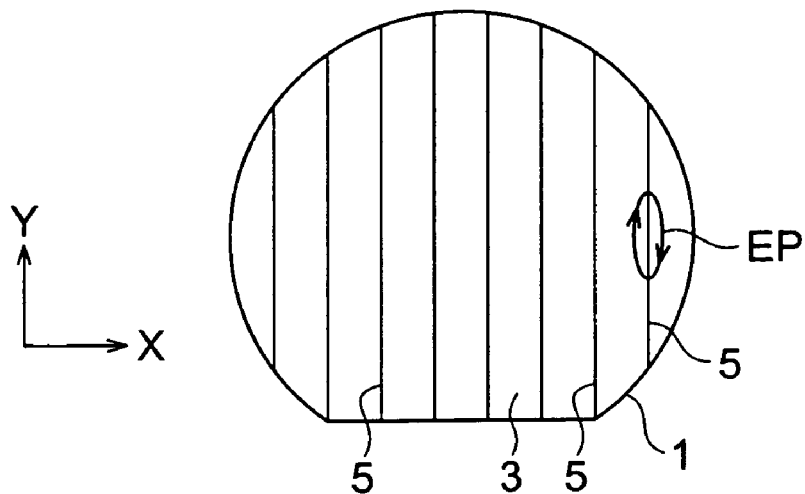
FIG. 44 is a plan view of a silicon wafer irradiated with elliptically polarized laser light by the laser processing method in accordance with the third embodiment of the embodiment.

The laser light source 101 generates laser light L, whereas the line 5 along which the object is intended to be cut extending in the Y-axis direction in the surface 3 of the object to be processed 1 is irradiated with the laser light L. FIG. 44 is a plan view of the object 1. The object 1 is irradiated with the laser light L such that the major axis indicative of the ellipse of elliptical polarization EP of laser light extends along the rightmost line 5 along which the object is intended to be cut in the object 1. Since the light-converging point P of laser light L is positioned within the object 1, molten processed regions are formed only within the object 1. The Y-axis stage 111 is moved along the line 5 along which the object is intended to be cut, so as to form a molten processed region within the object to be processed 1 along the line 5 along which the object is intended to be cut.

Figure 45:
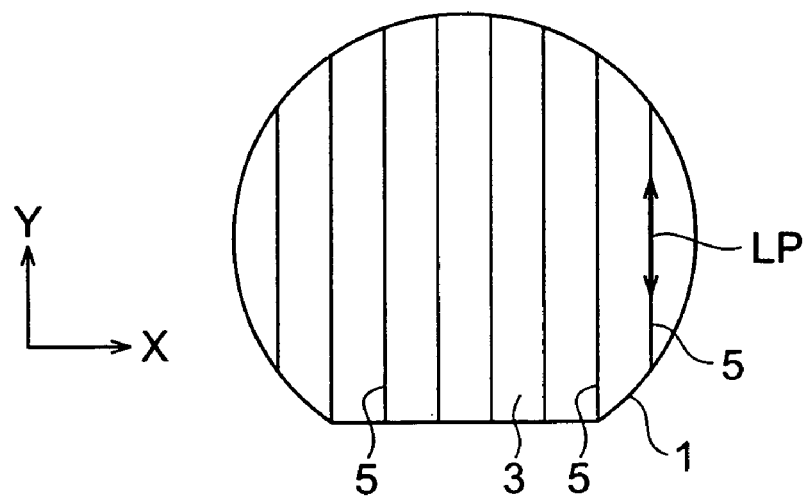
FIG. 45 is a plan view of a silicon wafer irradiated with linearly polarized laser light by the laser processing method in accordance with the third embodiment of the embodiment.

Then, the X-axis stage 109 is moved, so as to irradiate the neighboring line 5 along which the object is intended to be cut with laser light L, and a molten processed region is formed within the object 1 along the neighboring line 5 along which the object is intended to be cut in a manner similar to that mentioned above. By repeating this, a molten processed region is formed within the object 1 along the lines along which the object is intended to be cut successively from the right side (S127). FIG. 45 shows the case where the object 1 is irradiated with the laser light L having linear polarization. Namely, the object 1 is irradiated with laser light such that the direction of linear polarization LP of laser light extends along the line 5 along which the object is intended to be cut in the object 1.

Next, the 90° rotation regulator 203 operates so as to place the half wave plate 205 (FIG. 42) onto the optical axis of laser light L. This carries out adjustment for rotating the polarization of laser light emitted from the ellipticity regulator 219 by 90° (S219).

Figure 46:
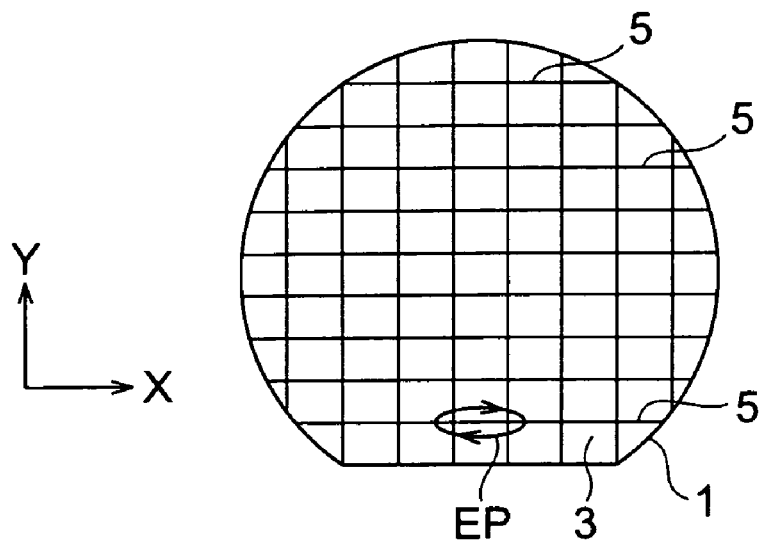
FIG. 46 is a plan view of a silicon wafer in which the silicon wafer shown in FIG. 44 is irradiated with elliptically polarized laser light by the laser processing method in accordance with the third embodiment of the embodiment.

Subsequently, the laser light 101 generates laser light L, whereas the line along which the object is intended to be cut extending in the X-axis direction of the surface 3 of the object 1 is irradiated with the laser light L. FIG. 46 is a plan view of the object 1. The object 1 is irradiated with the laser light L such that the direction of the major axis of an ellipse indicative of the elliptical polarization EP of laser light L extends along the lowest line 5 along which the object is intended to be cut extending in the X-axis direction of the object 1. Since the light-converging point P of laser light L is positioned within the object 1, molten processed regions are formed only within the object 1. The X-axis stage 109 is moved along the line 5 along which the object is intended to be cut, so as to form a molten processed region within the object 1 extending along the line 5 along which the object is intended to be cut.

Figure 47:
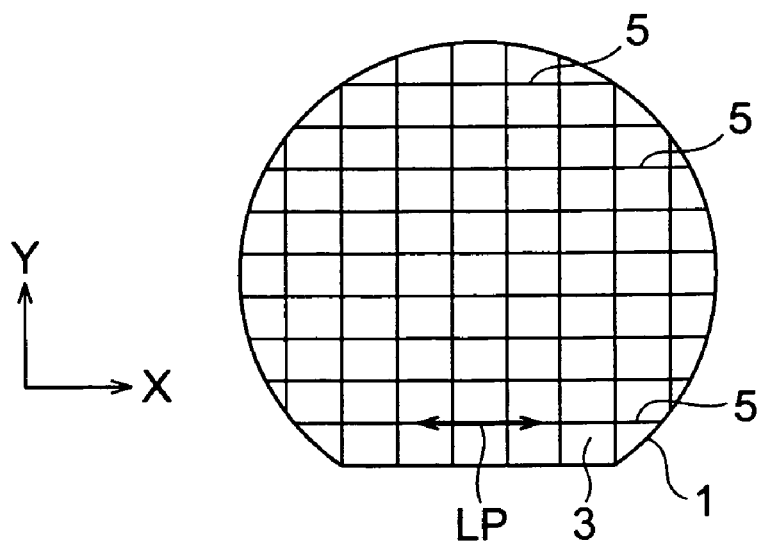
FIG. 47 is a plan view of a silicon wafer in which the silicon wafer shown in FIG. 45 is irradiated with linearly polarized laser light by the laser processing method in accordance with the third embodiment of the embodiment.

Then, the Y-axis stage is moved, such that the immediately upper line 5 along which the object is intended to be cut is irradiated with the laser light L, whereby a molten processed region is formed within the object 1 along the line 5 along which the object is intended to be cut in a manner similar to that mentioned above. By repeating this, respective molten processed regions are formed within the object 1 along the individual lines along which the object is intended to be cut successively from the lower side (S131) FIG. 47 shows the case where the object 1 is irradiated with the laser light L having linear polarization LP.

Then, the object 1 is bent along the lines along which the object is intended to be cut 5, whereby the object 1 is cut (S133). This divides the object 1 into silicon chips.

Effects of the third embodiment will be explained. According to the third embodiment, the object 1 is irradiated with pulse laser light L such that the direction of the major axis of an ellipse indicative of the elliptical polarization EP of pulse laser light L extends along the line 5 along which the object is intended to be cut as shown in FIGS. 44 and 46. As a consequence, the size of crack spots in the direction of line 5 along which the object is intended to be cut becomes relatively large, whereby crack regions extending along lines along which the object is intended to be cut can be formed by a smaller number of shots. The third embodiment can efficiently form crack regions as such, thus being able to improve the processing speed of the object 1. Also, the crack spot formed at the shot does not extend in directions other than the direction aligning with the line 5 along which the object is intended to be cut, whereby the object 1 can be cut precisely along the line 5 along which the object is intended to be cut. These results are similar to those of the fourth embodiment which will be explained later.

Fourth Embodiment

Figure 48:
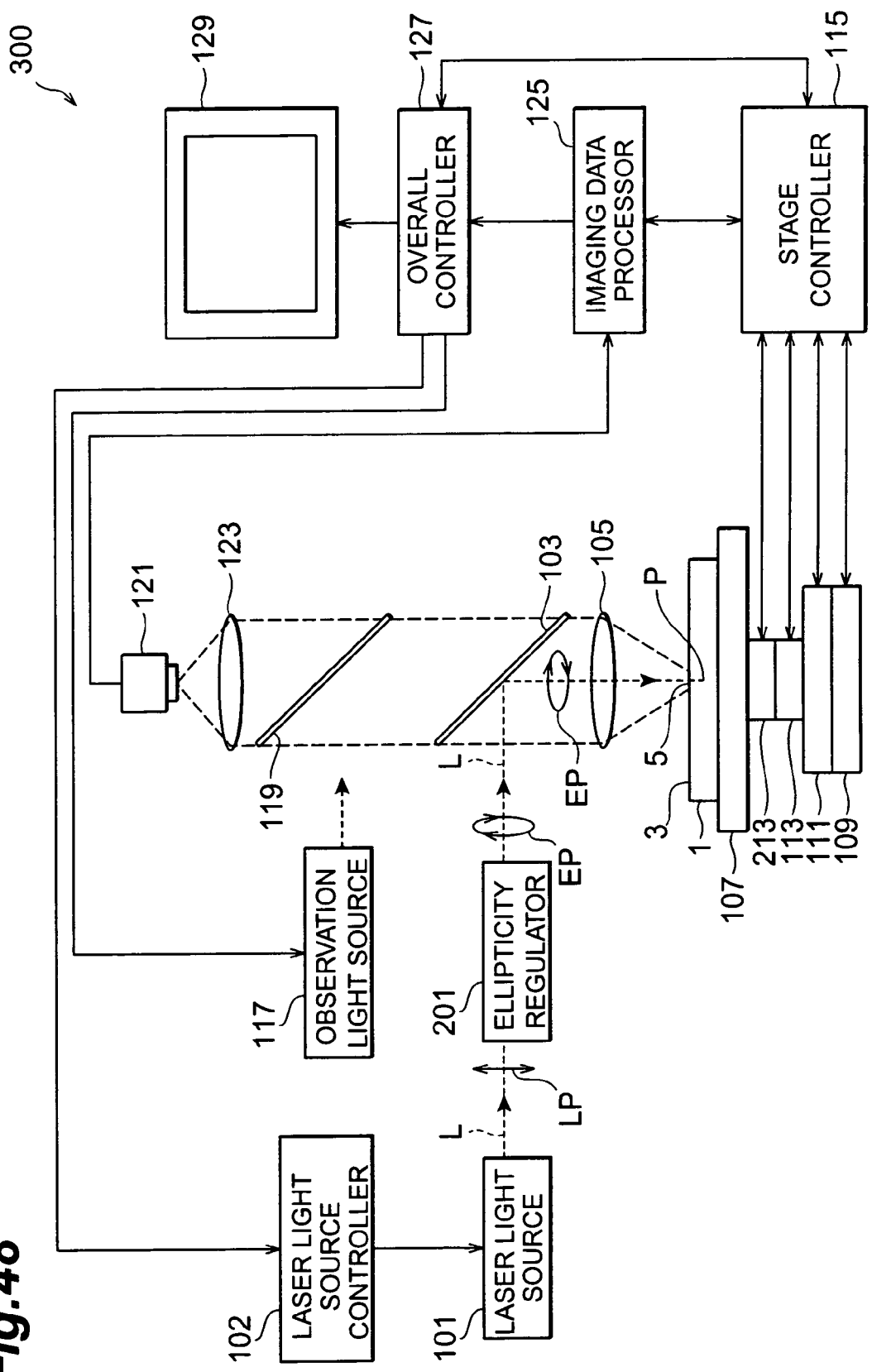
FIG. 48 is a schematic diagram of the laser processing apparatus in accordance with a fourth embodiment of the embodiment.

The fourth embodiment of the present invention will be explained mainly in terms of its differences from the third embodiment. FIG. 48 is a schematic diagram of this laser processing apparatus 300. Among the constituents of the laser processing apparatus 300, those identical to constituents of the laser processing apparatus 200 in accordance with the third embodiment shown in FIG. 40 will be referred to with numerals identical thereto without repeating their overlapping explanations.

The laser processing apparatus 300 is not equipped with the 90° rotation regulator 203 of the third embodiment. A θ-axis stage 213 can rotate the X-Y plane of a mounting table 107 about the thickness direction of the object to be processed 1. This makes the polarization of laser light L emitted from the ellipticity regulator 201 relatively rotate by 90°.

The laser processing method in accordance with the fourth embodiment of the present invention will be explained. Operations of step S101 to step S123 in the laser processing method in accordance with the third embodiment shown in FIG. 43 are carried out in the fourth embodiment as well. The operation of subsequent step S125 is not carried out, since the fourth embodiment is not equipped with the 90° rotation regulator 203.

Figure 49:
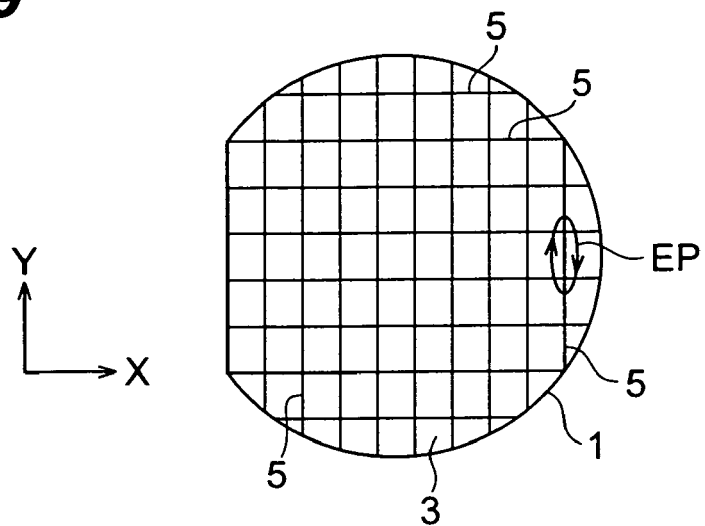
FIG. 49 is a plan view of a silicon wafer in which the silicon wafer shown in FIG. 44 is irradiated with elliptically polarized laser light by the laser processing method in accordance with the fourth embodiment of the embodiment.

After step S123, the operation of step S127 is carried out. The operations carried out so far process the object 1 as shown in FIG. 44 in a manner similar to that in the third embodiment. Thereafter, the stage controller 115 regulates the θ-axis stage 213 so as to rotate it by 90°. The rotation of the θ-axis stage 213 rotates the object 1 by 90° in the X-Y plane. Consequently, as shown in FIG. 49, the major axis of elliptical polarization EP can be caused to align with a line along which the object is intended to be cut intersecting the line 5 along which the object is intended to be cut having already completed the modified region forming step.

Then, like step S127, the object 1 is irradiated with the laser light, whereby molten processed regions are formed within the object to be processed 1 along line 5 along which the object is intended to be cut successively from the right side. Finally, as with step S133, the object 1 is cut, whereby the object 1 is divided into silicon chips.

The third and fourth embodiments of the present invention explained in the foregoing relate to the forming of modified regions by multiphoton absorption. However, the present invention may cut the object to be processed by irradiating it with laser light while locating its light-converging point within the object so as to make the major axis direction of an ellipse indicative of elliptical polarization extend along a line along which the object is intended to be cut in the object without forming modified regions caused by multiphoton absorption. This can also cut the object along the line along which the object is intended to be cut efficiently.

Fifth Embodiment

In a fifth embodiment of the present invention and sixth and seventh embodiments thereof, which will be explained later, sizes of modified spots are controlled by regulating the magnitude of power of pulse laser light and the size of numerical aperture of an optical system including a light-converging lens. The modified spot refers to a modified part formed by a single pulse shot of pulse laser light (i.e., one pulse laser irradiation), whereas an assembly of modified spots forms a modified region. The necessity to control the sizes of modified spots will be explained with respect to crack spots by way of embodiment.

Figure 50:
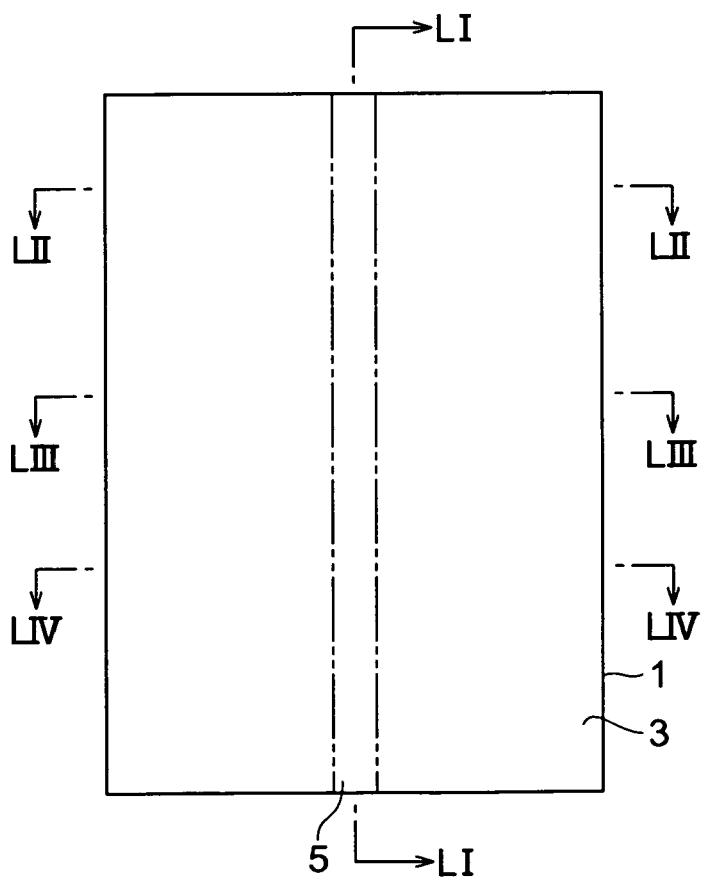
FIG. 50 is a plan view of the object to be processed in the case where a crack spot is formed relatively large by using the laser processing method in accordance with a fifth embodiment of the embodiment.
Figure 51:
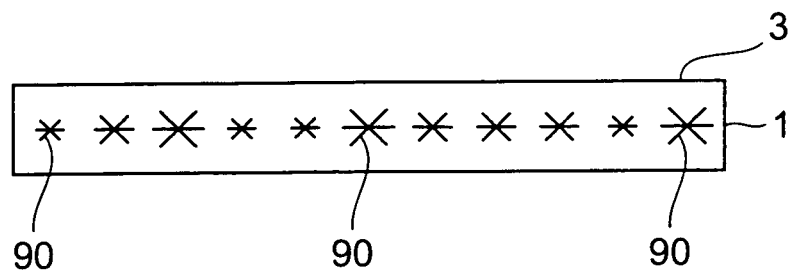
FIG. 51 is a sectional view taken along LI-LI on the line along which the object is intended to be cut shown in FIG. 50.
Figure 52:
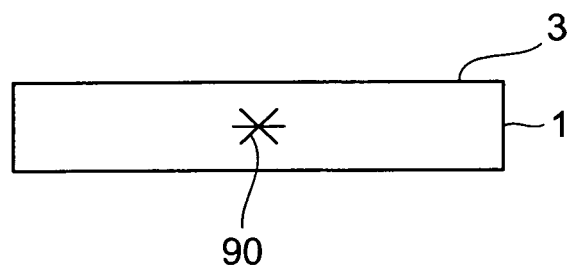
FIG. 52 is a sectional view taken along LII-LII orthogonal to the line along which the object is intended to be cut shown in FIG. 50.
Figure 53:
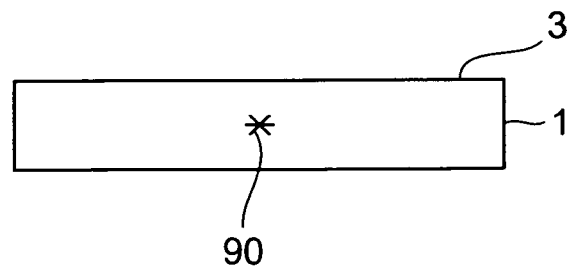
FIG. 53 is a sectional view taken along LIII-LIII orthogonal to the line along which the object is intended to be cut shown in FIG. 50.
Figure 54:
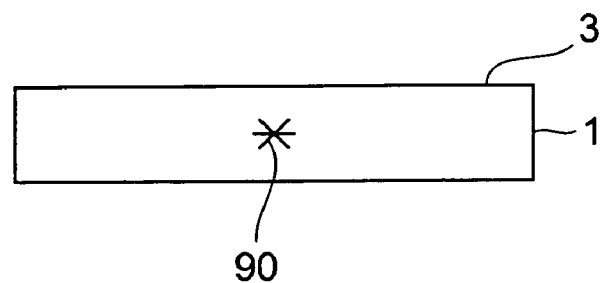
FIG. 54 is a sectional view taken along LIV-LIV orthogonal to the line along which the object is intended to be cut shown in FIG. 50.
Figure 55:
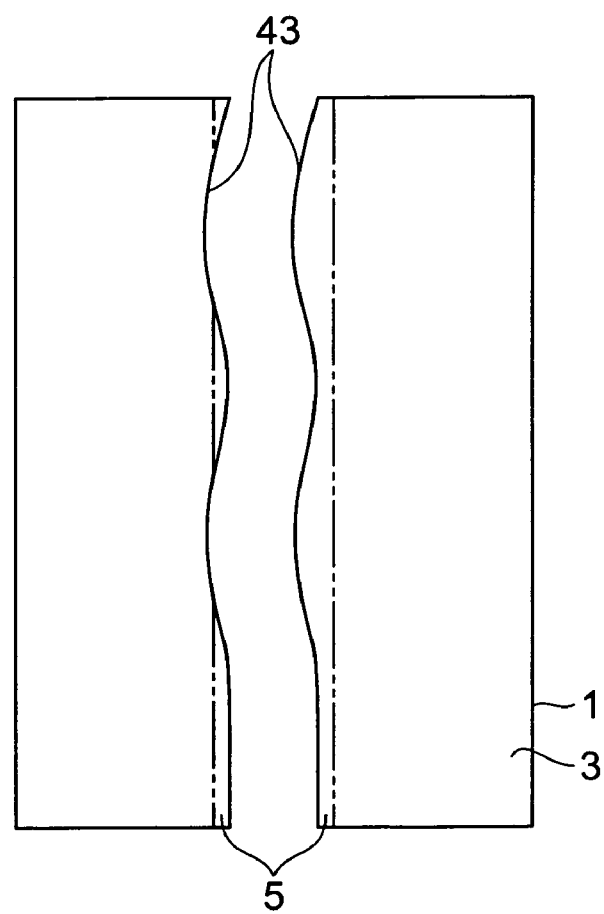
FIG. 55 is a plan view of the object to be processed shown in FIG. 50 cut along the line along which the object is intended to be cut.
Figure 56:
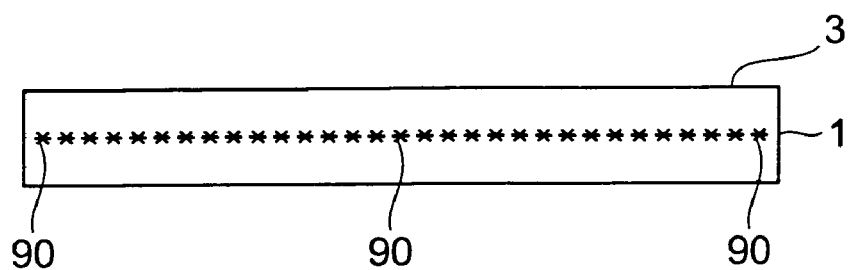
FIG. 56 is a sectional view of the object to be processed taken along the line along which the object is intended to be cut in the case where a crack spot is formed relatively small by using the laser processing method in accordance with the fifth embodiment of the embodiment.
Figure 57:
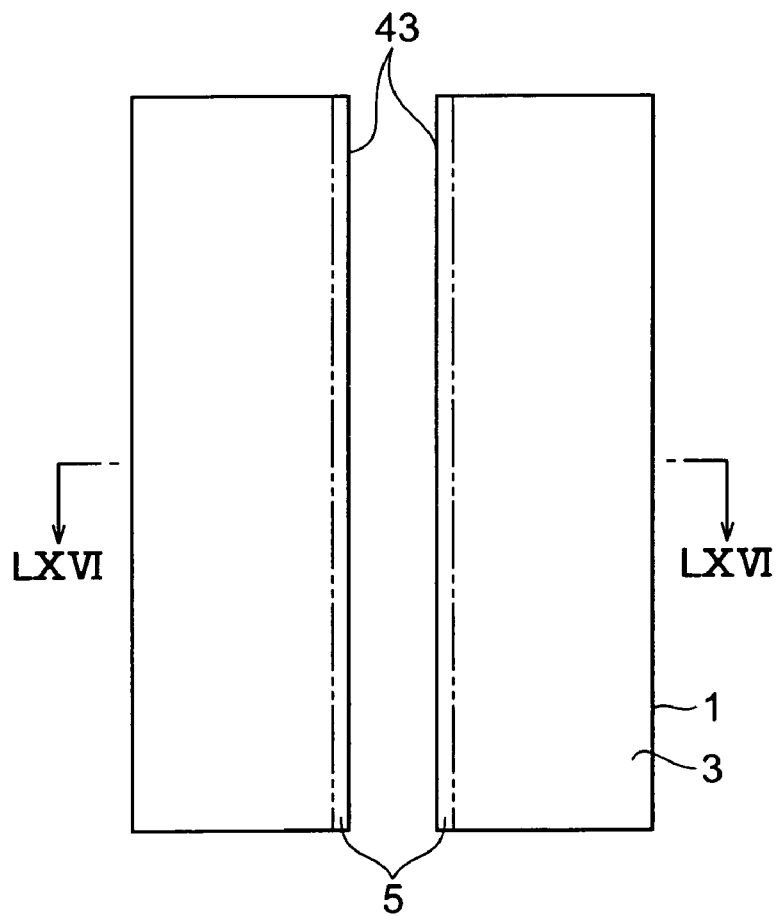
FIG. 57 is a plan view of the object to be processed shown in FIG. 56 cut along the line along which the object is intended to be cut.

When a crack spot is too large, the accuracy of cutting an object to be cut along a line along which the object is intended to be cut decreases, and the flatness of the cross section deteriorates. This will be explained with reference to FIGS. 50 to 55. FIG. 50 is a plan view of an object to be processed 1 in the case where crack spots are formed relatively large by using the laser processing method in accordance with this embodiment. FIG. 51 is a sectional view taken along LI-LI on the line 5 along which the object is intended to be cut in FIG. 50. FIGS. 52, 53, and 54 are sectional views taken along lines LII-LII, LIII-LIII, and LIV-LIV orthogonal to the line 5 along which the object is intended to be cut in FIG. 50, respectively. As can be seen from these drawings, the deviation in sizes of crack spots 9 becomes greater when the crack spots 90 are too large. Therefore, as shown in FIG. 55, the accuracy of cutting the object 1 along the line 5 along which the object is intended to be cut becomes lower. Also, irregularities of cross sections 43 in the object 1 become so large that the flatness of the cross section 43 deteriorates. When crack spots 90 are formed relatively small (e.g., 20 µm or less) by using the laser processing apparatus in accordance with this embodiment, by contrast, crack spots 90 can be formed uniformly and can be restrained from widening in directions deviating from that of the line along which the object is intended to be cut as shown in FIG. 56. Therefore, as shown in FIG. 57, the accuracy of cutting the object 1 along the line 5 along which the object is intended to be cut and the flatness of cross sections 43 can be improved as shown in FIG. 57.

When crack spots are too large as such, precise cutting along a line along which the object is intended to be cut and cutting for yielding a flat cross section cannot be carried out. If crack spots are extremely small with respect to an object to be processed having a large thickness, however, the object will be hard to cut.

The fact that this embodiment can control sizes of crack spots will be explained. As shown in FIG. 7, when the peak power density is the same, the size of a crack spot in the case where the light-converging lens has a magnification of ×10 and an NA of 0.8 is smaller than that of a crack spot in the case where the light-converging lens has a magnification of ×50 and an NA of 0.55. The peak power density is proportional to the energy of laser light per pulse, i.e., the power of pulse laser light, as explained above, whereby the same peak power density means the same laser light power. When the laser light power is the same while the beam spot cross-sectional area is the same, sizes of crack spots can be regulated so as to become smaller (greater) as the numerical aperture of a light-converging lens is greater (smaller)

Also, even when the numerical aperture of the light-converging lens is the same, sizes of crack spots can be regulated so as to become smaller and larger when the laser light power (peak power density) is made lower and higher, respectively.

Therefore, as can be seen from the graph shown in FIG. 7, sizes of crack spots can be regulated so as to become smaller when the numerical aperture of a light-converging lens is made greater or the laser light power is made lower. On the contrary, sizes of crack spots can be regulated so as to become greater when the numerical aperture of a light-converging lens is made smaller or when the laser light power is made higher.

Figure 58:
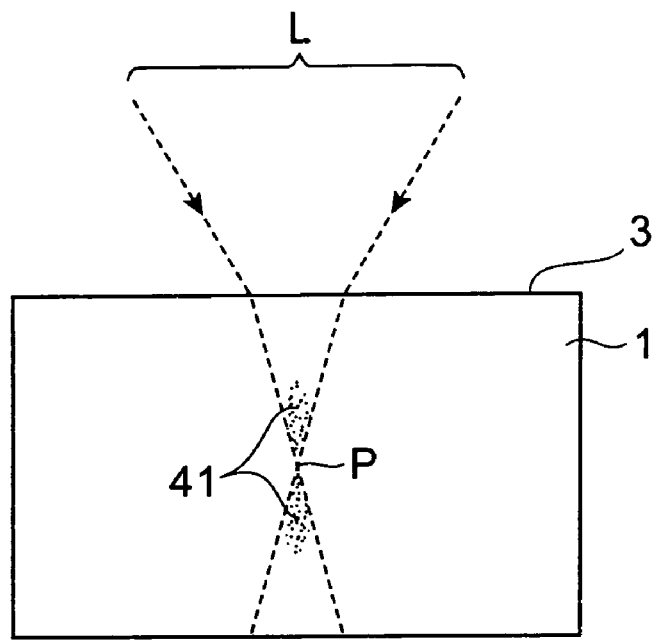
FIG. 58 is a sectional view of the object to be processed showing a state where pulse laser light is converged within the object by using a light-converging lens having a predetermined numerical aperture.
Figure 59:
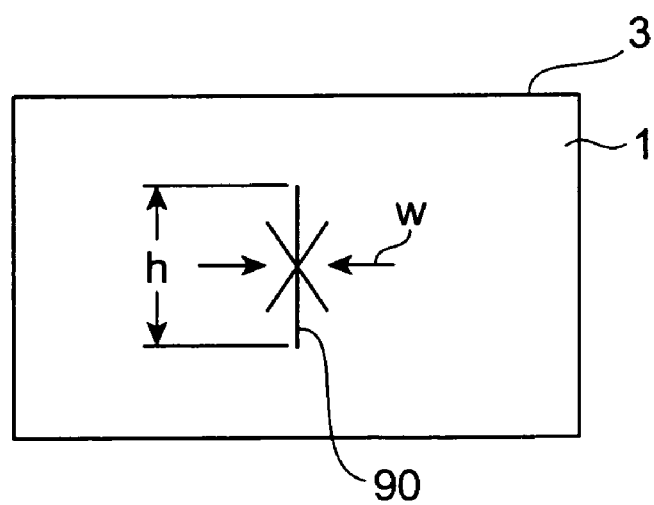
FIG. 59 is a sectional view of the object to be processed including a crack spot formed due to the multiphoton absorption caused by irradiation with laser light shown in FIG. 58.
Figure 60:
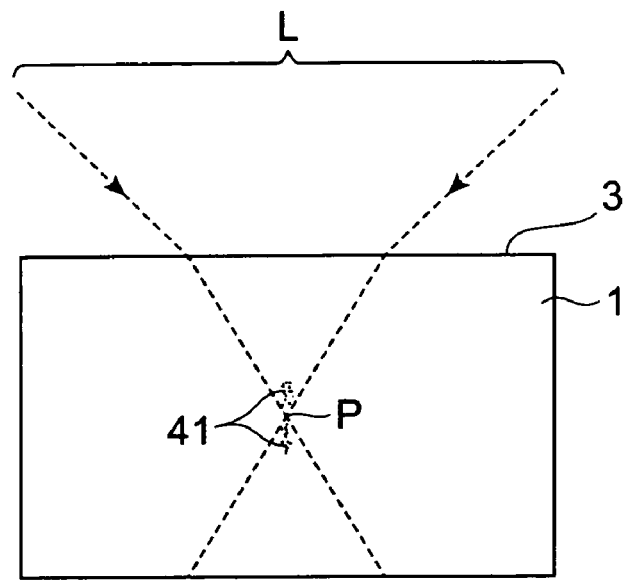
FIG. 60 is a sectional view of the object to be processed in the case where a light-converging lens having a numerical aperture greater than that of the embodiment shown in FIG. 58 is used.
Figure 61:
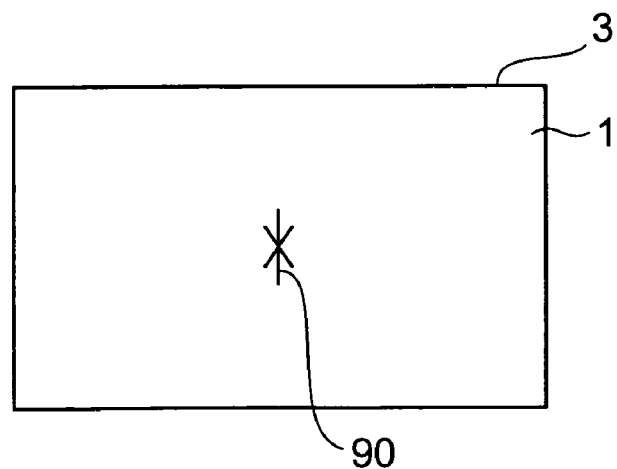
FIG. 61 is a sectional view of the object to be processed including a crack spot formed due to the multiphoton absorption caused by irradiation with laser light shown in FIG. 60.

The crack spot size control will further be explained with reference to the drawings. The embodiment shown in FIG. 58 is a sectional view of an object to be processed 1 within which pulse laser light L is converged by use of a light-converging lens having a predetermined numerical aperture. Regions 41 are those having yielded an electric field intensity at a threshold for causing multiphoton absorption or higher by this laser irradiation. FIG. 59 is a sectional view of a crack spot 90 formed due to the multiphoton absorption caused by irradiation with the laser light L. On the other hand, the embodiment shown in FIG. 60 is a sectional view of an object to be processed 1 within which pulse laser light L is converged by use of a light-converging lens having a numerical aperture greater than that in the embodiment shown in FIG. 58. FIG. 61 is a sectional view of a crack spot 90 formed due to the multiphoton absorption caused by irradiation with the laser light L. The height h of crack spot 90 depends on the size of regions 41 in the thickness direction of the object 1, whereas the width w of crack spot 90 depends on the size of regions 41 in a direction orthogonal to the thickness direction of the object 1. Namely, when these sizes of regions 41 are made smaller and greater, the height h and width w of crack spot 90 can be made smaller and greater, respectively. As can be seen when FIGS. 59 and 61 are compared with each other, in the case where the laser light power is the same, the sizes of height h and width w of crack spot 90 can be regulated so as to become smaller (greater) when the numerical aperture of a light-converging lens is made greater (smaller).

Figure 62:
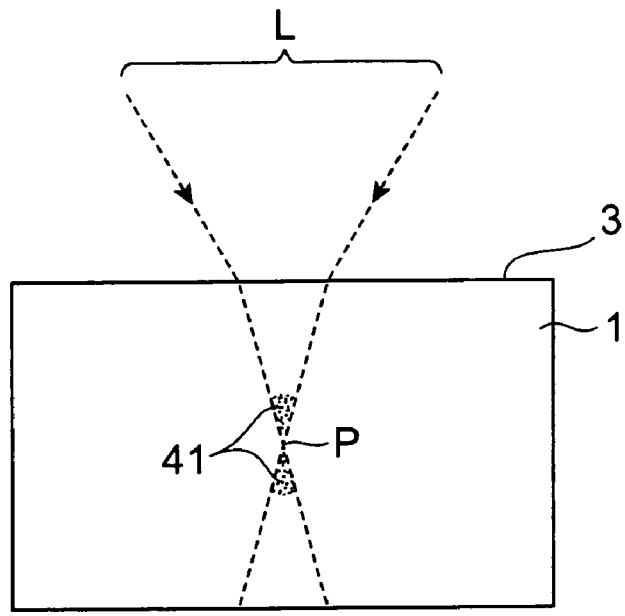
FIG. 62 is a sectional view of the object to be processed in the case where pulse laser light having a power lower than that of the embodiment shown in FIG. 58 is used.
Figure 63:
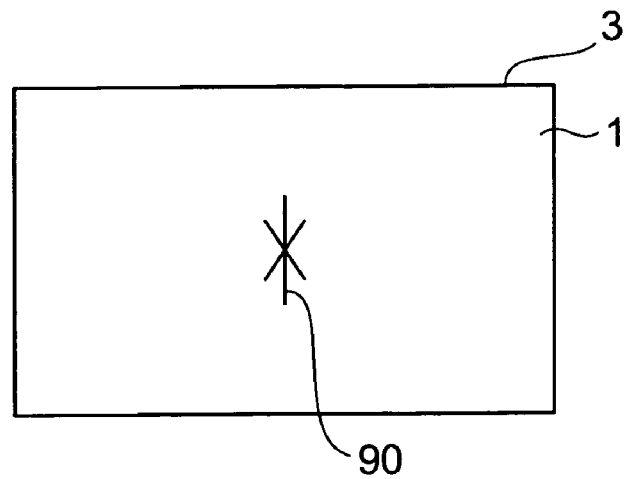
FIG. 63 is a sectional view of the object to be processed including a crack spot formed due to the multiphoton absorption caused by irradiation with laser light shown in FIG. 62.

The embodiment shown in FIG. 62 is a sectional view of an object to be processed 1 within which pulse laser light L having a power lower than that in the embodiment shown in FIG. 58 is converged. In the embodiment shown in FIG. 62, since the laser light power is made lower, the area of regions 41 is smaller than that of regions 41 shown in FIG. 58. FIG. 63 is a sectional view of a crack spot 90 formed due to the multiphoton absorption caused by irradiation with the laser light L. As can be seen when FIGS. 59 and 63 are compared with each other, in the case where the numerical aperture of the light-converging lens is the same, the sizes of height h and width w of crack spot 90 can be regulated so as to become smaller (greater) when the laser light power is made lower (higher).

Figure 64:
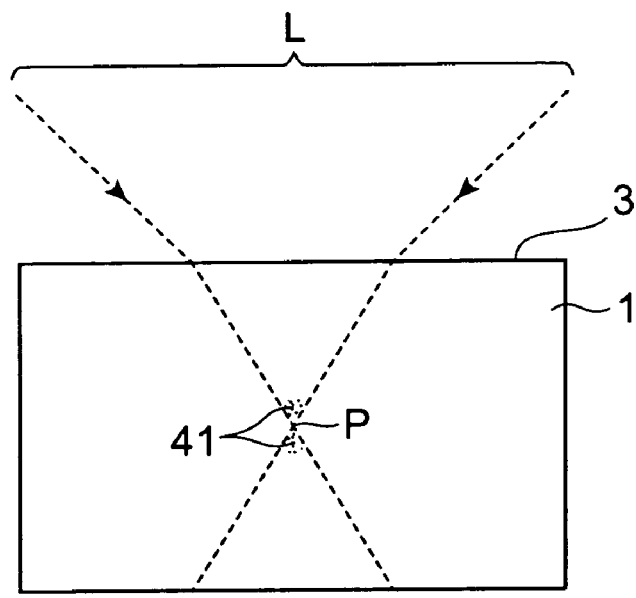
FIG. 64 is a sectional view of the object to be processed in the case where pulse laser light having a power lower than that of the embodiment shown in FIG. 60 is used.
Figure 65:
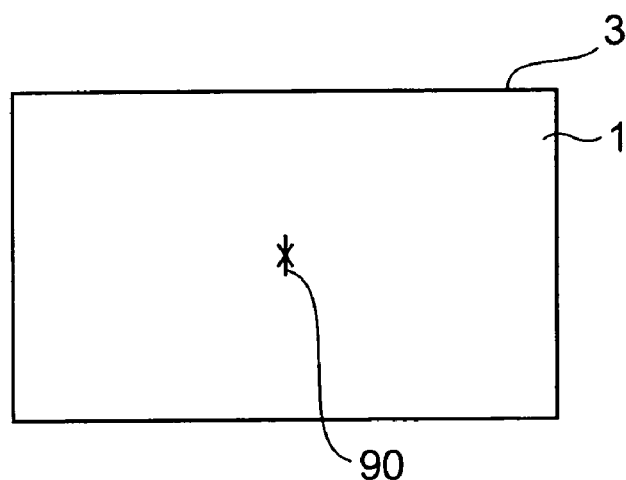
FIG. 65 is a sectional view of the object to be processed including a crack spot formed due to the multiphoton absorption caused by irradiation with laser light shown in FIG. 64.

The embodiment shown in FIG. 64 is a sectional view of an object to be processed 1 within which pulse laser light L having a power lower than that in the embodiment shown in FIG. 60 is converged. FIG. 65 is a sectional view of a crack spot 90 formed due to the multiphoton absorption caused by irradiation with the laser light L. As can be seen when FIGS. 59 and 65 are compared with each other, the sizes of height h and width w of crack spot 90 can be regulated so as to become smaller (greater) when the numerical aperture of the light-converging lens is made greater (smaller) while the laser light power is made lower (higher).

Meanwhile, the regions 41 indicative of those yielding an electric field intensity at a threshold for electric field intensity capable of forming a crack spot or higher are restricted to the light-converging point P and its vicinity due to the following reason: Since a laser light source with a high beam quality is utilized, this embodiment achieves a high convergence of laser light and can converge light up to about the wavelength of laser light. As a consequence, the beam profile of this laser light attains a Gaussian distribution, whereby the electric field intensity is distributed so as to become the highest at the center of the beam and gradually lowers as the distance from the center increases. The laser light is basically converged in the state of a Gaussian distribution in the process of being converged by a light-converging lens in practice as well. Therefore, the regions 41 are restricted to the light-converging point P and its vicinity.

As in the foregoing, this embodiment can control sizes of crack spots. Sizes of crack spots are determined in view of a requirement for a degree of precise cutting, a requirement for a degree of flatness in cross sections, and the magnitude of thickness of the object to be processed. Sizes of crack spots can be determined in view of the material of an object to be processed as well. This embodiment can control sizes of modified spots, thus making it possible to carry out precise cutting along a line along which the object is intended to be cut and yield a favorable flatness in cross sections by making modified spots smaller for objects to be processed having a relatively small thickness. Also, by making modified spots greater, it enables cutting of objects to be processed having a relatively large thickness.

Figure 66:
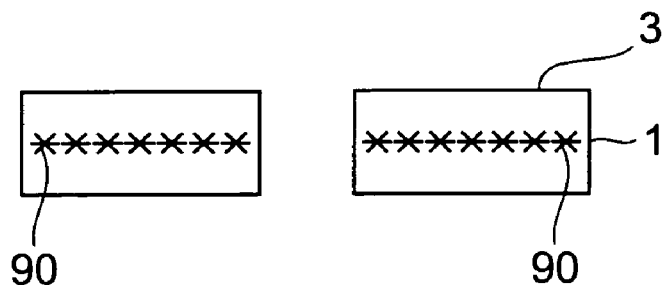
FIG. 66 is a sectional view taken along LXVI-LXVI orthogonal to the line along which the object is intended to be cut shown in FIG. 57.

There are cases where an object to be processed has respective directions easy and hard to cut due to the crystal orientation of the object, for embodiment. When cutting such an object, the size of crack spots 90 formed in the easy-to-cut direction is made greater as shown in FIGS. 56 and 57, for embodiment. When the direction of a line along which the object is intended to be cut orthogonal to the line 5 along which the object is intended to be cut is a hard-to-cut direction, on the other hand, the size of crack spots 90 formed in this direction is made greater as shown in FIGS. 57 and 66. Here, FIG. 66 is a sectional view of the object 1 shown in FIG. 57 taken along LXVI-LXVI. Hence, a flat cross section can be obtained in the easy-to-cut direction, while cutting is possible in the hard-to-cut direction as well.

Though the fact that sizes of modified spots are controllable has been explained in the case of crack spots, the same holds in melting spots and refractive index change spots. For embodiment, the power of pulse laser light can be expressed by energy per pulse (J), or average output (W) which is a value obtained by multiplying the energy per pulse by the frequency of laser light. The foregoing holds in sixth and seventh embodiments which will be explained later.

Figure 67:
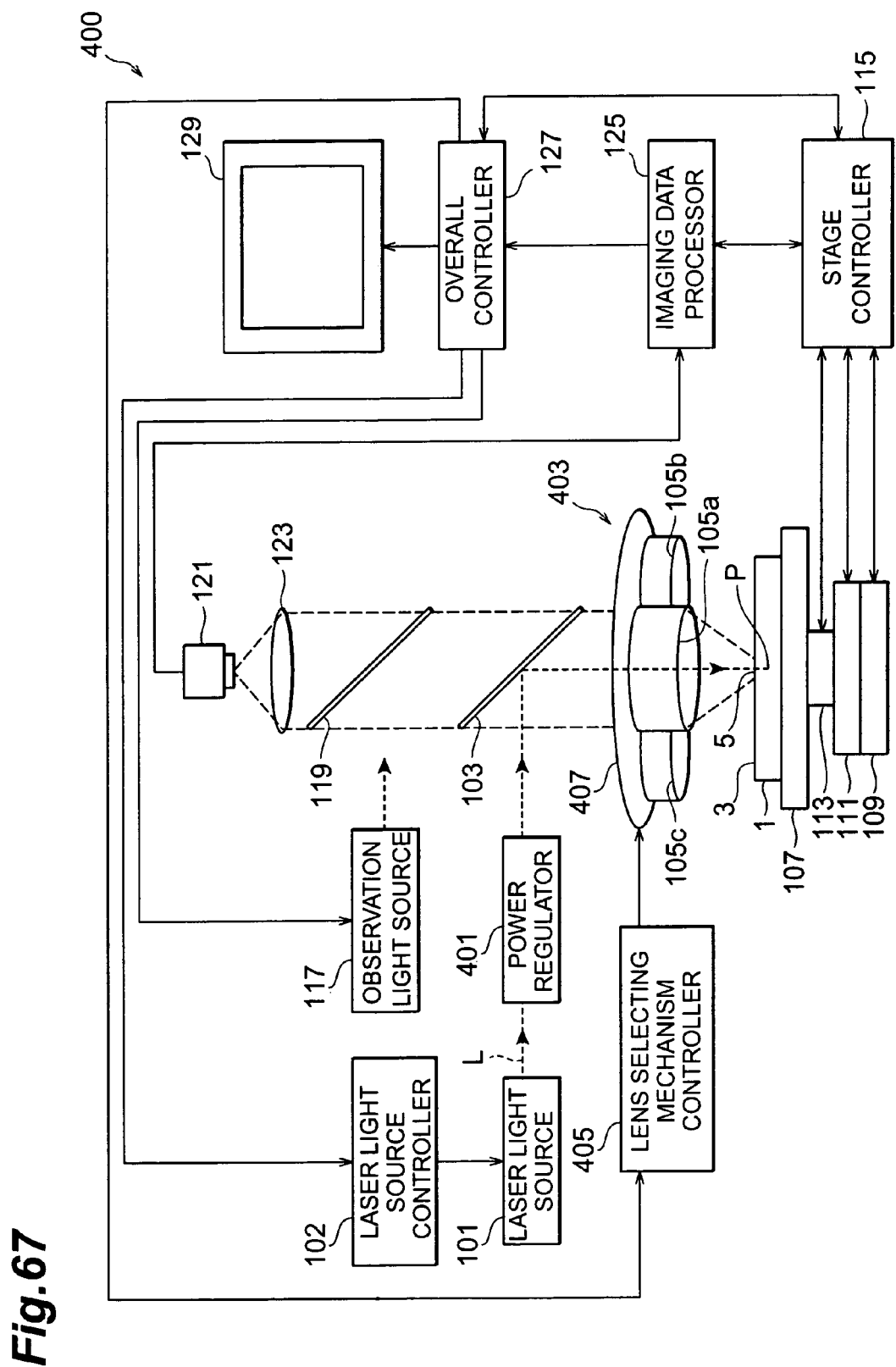
FIG. 67 is a schematic diagram showing the laser processing apparatus in accordance with the fifth embodiment of the embodiment.

The laser processing apparatus in accordance with the fifth embodiment of the present invention will be explained. FIG. 67 is a schematic diagram of this laser processing apparatus 400. The laser processing apparatus 400 will be explained mainly in terms of its differences from the laser processing apparatus 100 in accordance with the first embodiment shown in FIG. 14.

The laser processing apparatus 400 comprises a power regulator 401 for adjusting the power of laser light L emitted from a laser light source 101. The power regulator 401 comprises, for embodiment, a plurality of ND (neutral density) filters, and a mechanism for moving the individual ND filters to positions perpendicular to the optical axis of the laser light L and to the outside of the optical path of laser light L. An ND filter is a filter which reduces the intensity of light without changing the relative spectral distribution of energy. A plurality of ND filters have respective extinction factors different from each other. By using one of a plurality of ND filters or combining some of them, the power regulator 401 adjusts the power of laser light L emitted from the laser light source 101. Here, a plurality of ND filters may have the same extinction factor, and the power regulator 401 may change the number of ND filters to be moved to positions perpendicular to the optical axis of laser light L, so as to adjust the power of laser light L emitted from the laser light source 101.

The power regulator 401 may comprise a polarization filter disposed perpendicular to the optical axis of linearly polarized laser light L, and a mechanism for rotating the polarization filter about the optical axis of laser light L by a desirable angle. Rotating the polarization filter about the optical axis by a desirable angle in the power regulator 401 adjusts the power of laser light L emitted from the laser light source 101.

Here, the driving current for a pumping semiconductor laser in the laser light source 101 can be regulated by a laser light source controller 102 which is an embodiment of driving current control means, so as to regulate the power of laser light L emitted from the laser light source 101. Therefore, the power of laser light L can be adjusted by at least one of the power regulator 401 and laser light source controller 102. If the size of a modified region can attain a desirable value due to the adjustment of power of laser light L by the laser light source controller 102 alone, the power regulator 401 is unnecessary. The power adjustment explained in the foregoing is effected when an operator of the laser processing apparatus inputs the magnitude of power into an overall controller 127, which will be explained later, by using a keyboard or the like.

The laser processing apparatus 400 further comprises a dichroic mirror 103 disposed such that the laser light L whose power is adjusted by the power regulator 401 is incident thereon whereas the orientation of the optical axis of laser light L is changed by 90°; a lens selecting mechanism 403 including a plurality of light-converging lenses for converging the laser light L reflected by the dichroic mirror 103; and a lens selecting mechanism controller 405 for controlling the lens selecting mechanism 403.

The lens selecting mechanism 403 comprises light-converging lenses 105a, 105b, 105c, and a support plate 407 for supporting them. The numerical apertures of respective optical systems including the light-converging lenses 105a, 105b, 105c differ from each other. According to a signal from the lens selecting mechanism controller 405, the lens selecting mechanism 403 rotates the support plate 407, thereby causing a desirable light-converging lens among the light-converging lenses 105a, 105b, 105c to be placed onto the optical axis of laser light L. Namely, the lens selecting mechanism 403 is of revolver type.

The number of light-converging lenses attached to the lens selecting mechanism 403 is not restricted to 3 but may be other numbers. When the operator of the laser processing apparatus inputs a size of numerical aperture or an instruction for choosing one of the light-converging lenses 105a, 105b, 105c into the overall controller 127, which will be explained later, by using a keyboard or the like, the light-converging lens is chosen, namely, the numerical aperture is chosen.

Mounted on the mounting table 107 of the laser processing apparatus 400 is an object to be processed 1 irradiated with the laser light L converged by one of the light-converging lenses 105a to 105c which is disposed on the optical axis of laser light L.

The overall controller 127 is electrically connected to the power regulator 401. FIG. 67 does not depict it. When the magnitude of power is fed into the overall controller 127, the latter controls the power regulator 401, thereby adjusting the power.

Figure 68:
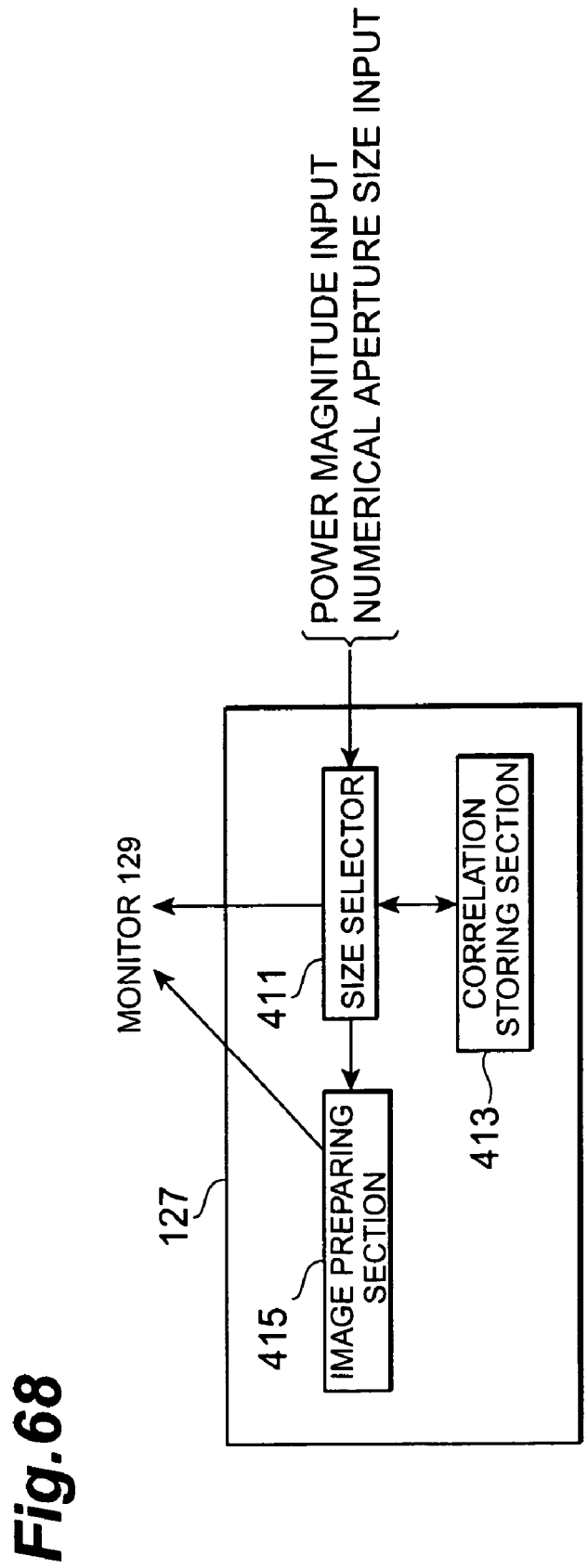
FIG. 68 is a block diagram showing a part of an embodiment of overall controller provided in the laser processing apparatus in accordance with the fifth embodiment of the embodiment.

FIG. 68 is a block diagram showing a part of an embodiment of the overall controller 127. The overall controller 127 comprises a size selector 411, a correlation storing section 413, and an image preparing section 415. The operator of the laser processing apparatus inputs the magnitude of power of pulse laser light or the size of numerical aperture of the optical system including the light-converging lens to the size selector 411 by using a keyboard or the like. In this embodiment, the input may choose one of the light-converging lenses 105a, 105b, 105c instead of the numerical aperture size being directly inputted. In this case, the respective numerical apertures of the light-converging lenses 105a, 105b, 105c are registered in the overall controller 127 beforehand, and data of the numerical aperture of the optical system including the chosen light-converging lens is automatically fed into the size selector 411.

The correlation storing section 413 has stored the correlation between the set of pulse laser power magnitude and numerical aperture size and the size of modified spot beforehand. FIG. 69 is an embodiment of table showing this correlation. In this embodiment, respective numerical apertures of the optical systems including the light-converging lenses 105a, 105b, 105c are registered in the column for numerical aperture. In the column for power, magnitudes of power attained by the power regulator 401 are registered. In the column for size, sizes of modified spots formed by combinations of powers of their corresponding sets and numerical apertures are registered. For embodiment, the modified spot formed when the power is $1.24 \times 10^{11}$ (W/cm$^2$) while the numerical aperture is 0.55 has a size of 120 µm. The data of this correlation can be obtained by carrying out experiments explained in FIGS. 58 to 65 before laser processing, for embodiment.

When the magnitude of power and numerical aperture size are fed into the size selector 411, the latter chooses the set having their corresponding values from the correlation storing section 413, and sends data of size corresponding to this set to the monitor 129. As a consequence, the size of a modified spot formed at thus inputted magnitude of power and numerical aperture size is displayed on the monitor 129. If there is no set corresponding to these values, size data corresponding to a set having the closest values is sent to the monitor 129.

The data of size corresponding to the set chosen by the size selector 411 is sent from the size selector 411 to the image preparing section 415. According to this size data, the image preparing section 415 prepares image data of a modified spot in this size, and sends thus prepared data to the monitor 129. As a consequence, an image of the modified spot is also displayed on the monitor 129. Hence, the size and form of modified spot can be seen before laser processing.

The size of numerical aperture may be made variable while the magnitude of power is fixed. The table in this case will be as shown in FIG. 70. For embodiment, the modified spot formed when the numerical aperture is 0.55 while the power is fixed at $1.49 \times 10^{11}$ (W/cm$^2$) has a size of 150 µm. Alternatively, the magnitude of power may be made variable while the size of numerical aperture is fixed. The table in this case will be as shown in FIG. 71. For embodiment, the modified spot formed when the power is fixed at $1.19 \times 10^{11}$ (W/cm$^2$) while the numerical aperture is fixed at 0.8 has a size of 30 μm.

The laser processing method in accordance with the fifth embodiment of the present invention will now be explained with reference to FIG. 67. The object to be processed 1 is a silicon wafer. In the fifth embodiment, operations of steps S101 to S111 are carried out as in the laser processing method in accordance with the first embodiment shown in FIG. 15.

After step S111, the magnitude of power and numerical aperture size are fed into the overall controller 127 as explained above. According to the data of power inputted, the power of laser light L is adjusted by the power regulator 401. According to the data of numerical aperture inputted, the lens selecting mechanism 403 chooses a light-converging lens by way of the lens selecting mechanism controller 405, thereby adjusting the numerical aperture. These data are also fed into the size selector 411 of the overall controller 127 (FIG. 68). As a consequence, the size and form of a melting spot formed within the object 1 upon irradiation of one pulse of laser light L are displayed on the monitor 129.

Then, operations of steps S113 to S115 are carried out as in the laser processing method in accordance with the first embodiment shown in FIG. 15. This divides the object 1 into silicon chips.

Sixth Embodiment

Figure 72:
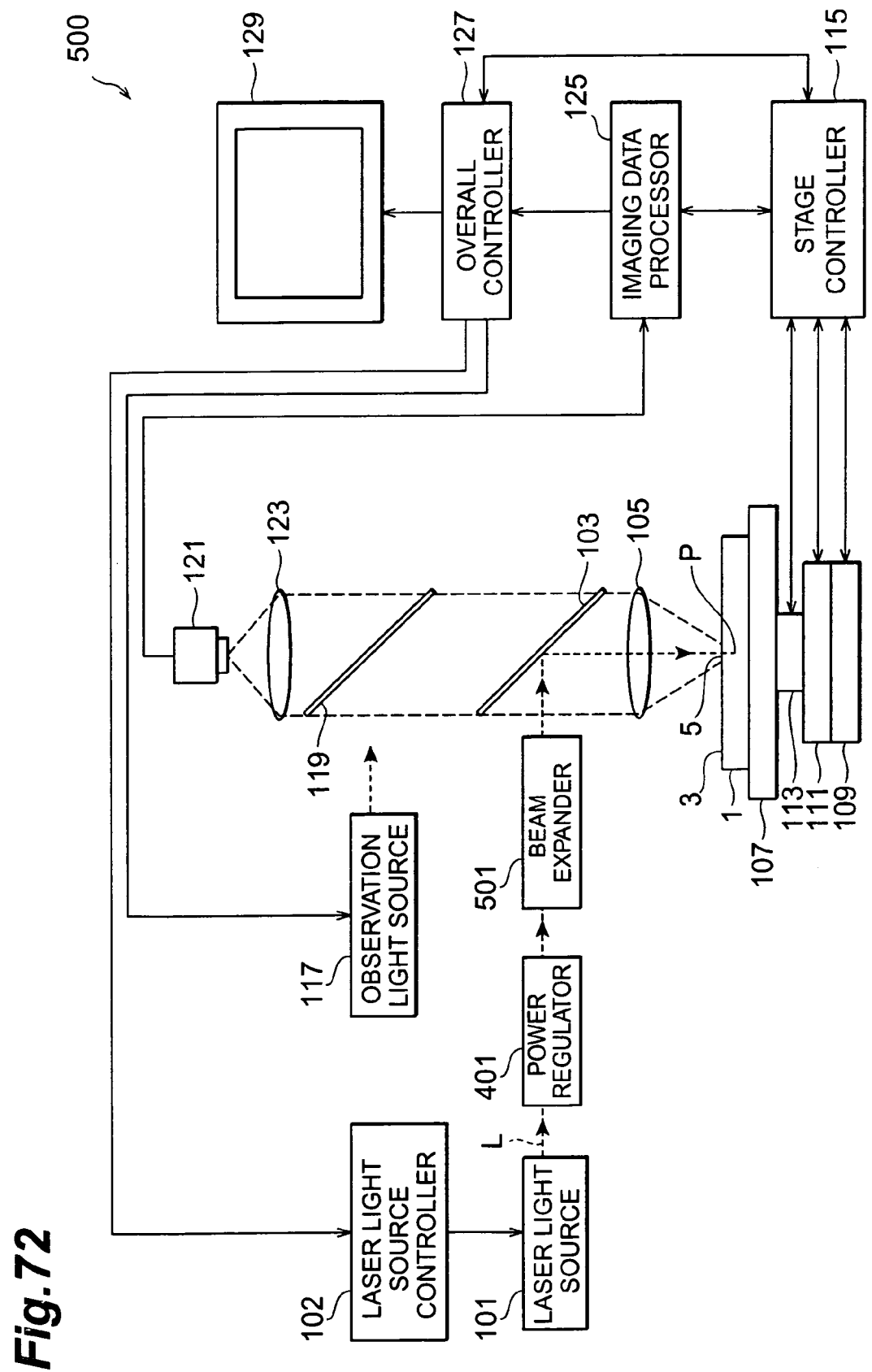
FIG. 72 is a schematic diagram of the laser processing apparatus in accordance with a sixth embodiment of the embodiment.

A sixth embodiment of the present invention will now be explained mainly in terms of its differences from the fifth embodiment. FIG. 72 is a schematic diagram of this laser processing apparatus 500. Among the constituents of the laser processing apparatus 500, those identical to constituents of the laser processing apparatus 400 in accordance with the fifth embodiment shown in FIG. 67 are referred to with numerals identical thereto without repeating their overlapping explanations.

In the laser processing apparatus 500, a beam expander 501 is disposed on the optical axis of laser light L between a power regulator 401 and a dichroic mirror 103. The beam expander 501 has a variable magnification, and is regulated by the beam expander 501 so as to increase the beam diameter of laser light L. The beam expander 501 is an embodiment of numerical aperture regulating means. The laser processing apparatus 500 is equipped with a single light-converging lens 105 instead of the lens selecting mechanism 403.

The operations of the laser processing apparatus 500 differ from those of the laser processing apparatus of the fifth embodiment in the adjustment of numerical aperture based on the magnitude of numerical aperture fed into the overall controller 127. This will be explained in the following. The overall controller 127 is electrically connected to the beam expander 501. FIG. 72 does not depict this. When the size of numerical aperture is fed into the overall controller 127, the latter carries out control for changing the magnitude of beam expander 501. This regulates the magnification of beam diameter of the laser light L incident on the light-converging lens 105. Therefore, with only one light-converging lens 105, adjustment for increasing the numerical aperture of the optical system including the light-converging lens 105 is possible. This will be explained with reference to FIGS. 73 and 74.

Figure 73:
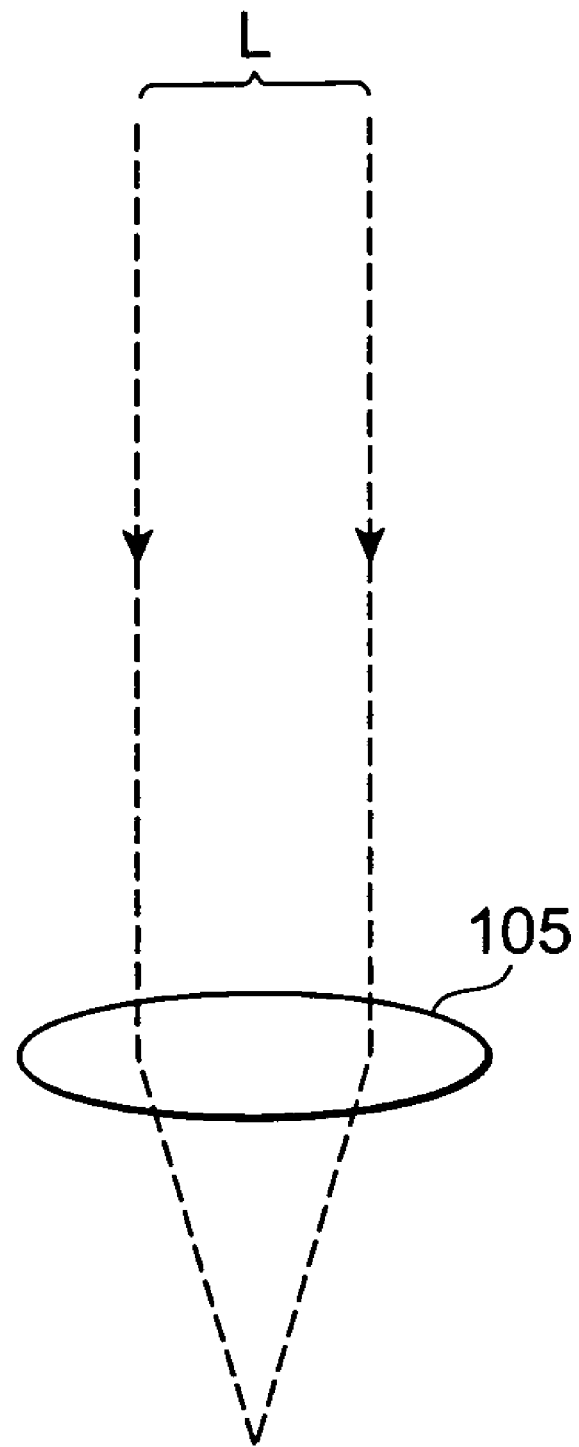
FIG. 73 is a view showing the convergence of laser light caused by a light-converging lens in the case where no beam expander is disposed.
Figure 74:
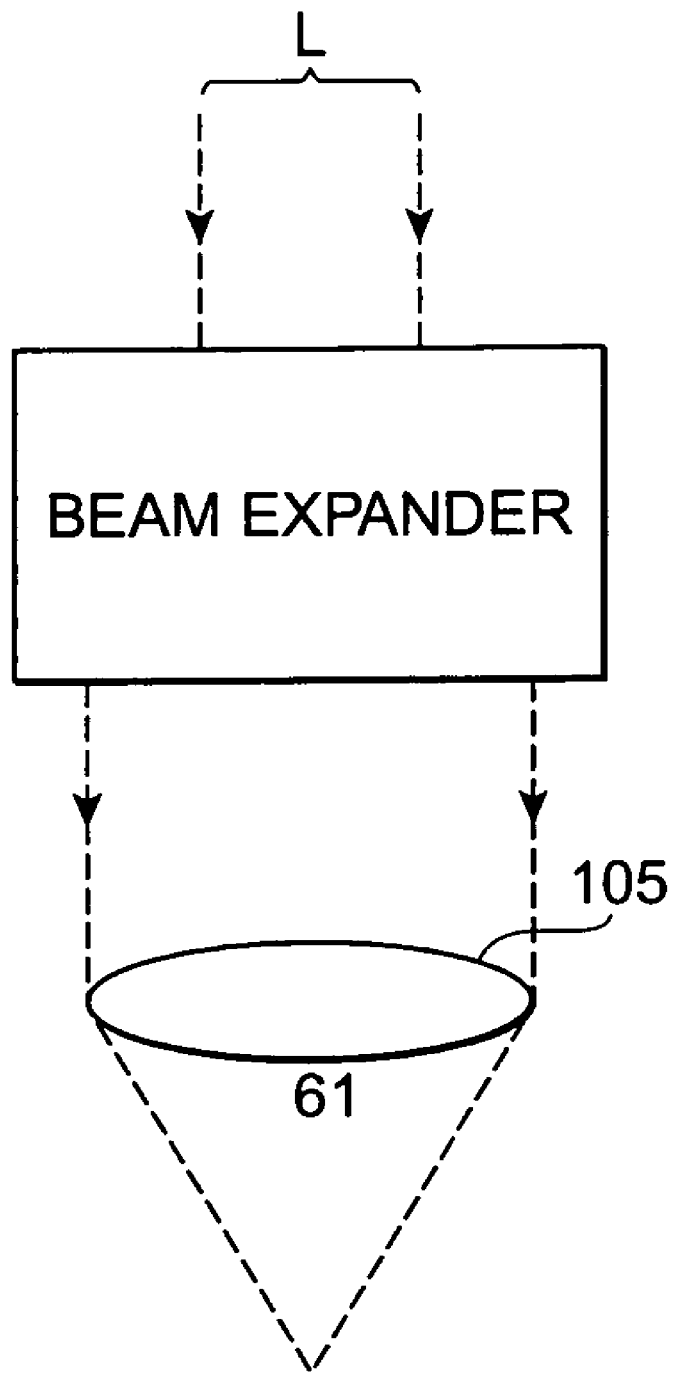
FIG. 74 is a view showing the convergence of laser light caused by the light-converging lens in the case where a beam expander is disposed.

FIG. 73 is a view showing the convergence of laser light L effected by the light-converging lens 105 when the beam expander 501 is not provided. On the other hand, FIG. 74 is a view showing the convergence of laser light L effected by the light-converging lens 105 when the beam expander 501 is provided. As can be seen when FIGS. 73 and 74 are compared with each other, the sixth embodiment can achieve adjustment so as to increase the numerical aperture with reference to the numerical aperture of the optical system including the light-converging lens 105 in the case where the beam expander 501 is not provided.

Seventh Embodiment

Figure 75:
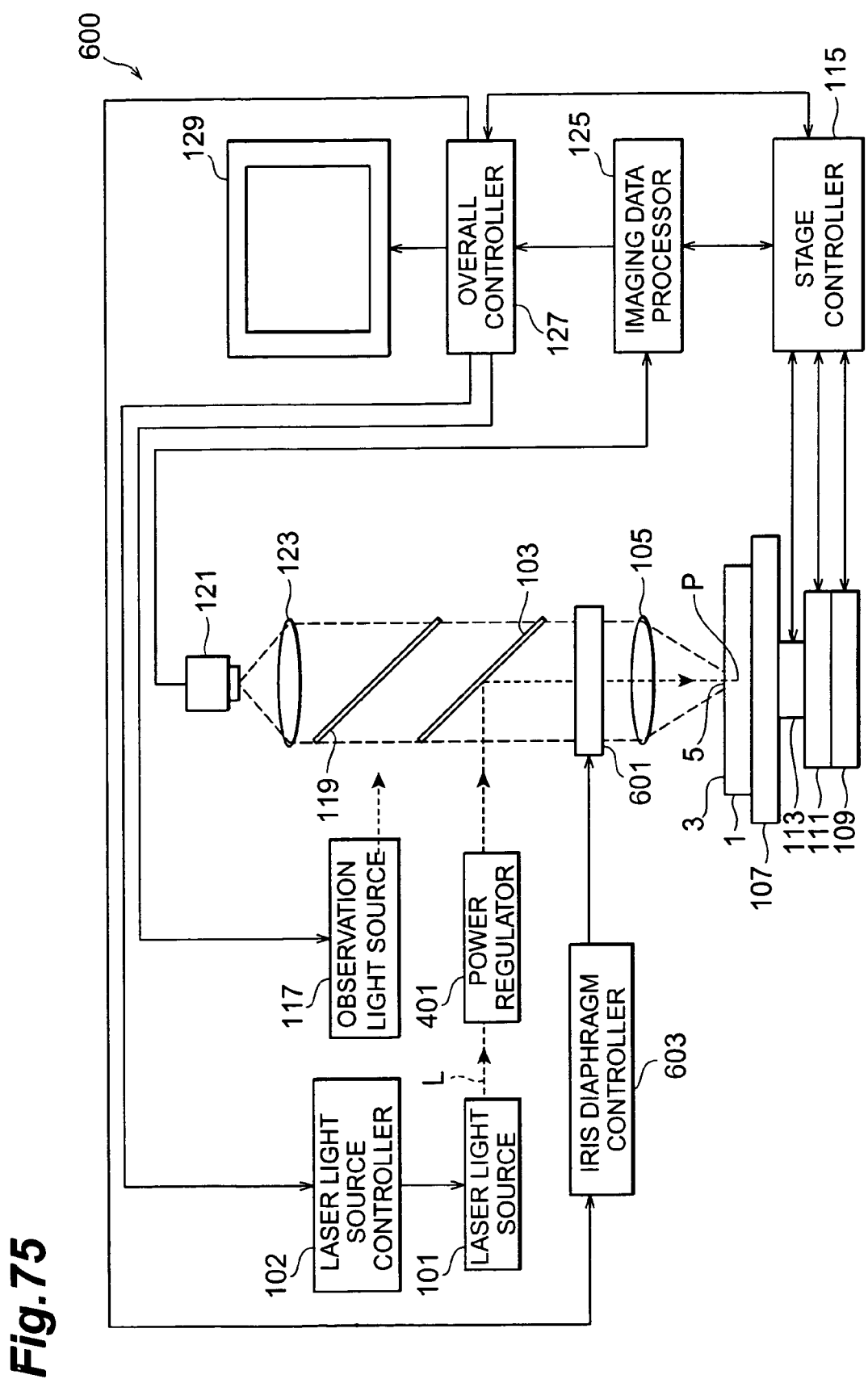
FIG. 75 is a schematic diagram of the laser processing apparatus in accordance with a seventh embodiment of the embodiment.

A seventh embodiment of the present invention will now be explained mainly in terms of its differences from the fifth and sixth embodiments. FIG. 75 is a schematic diagram of this laser processing apparatus 600. Among the constituents of the laser processing apparatus 600, those identical to constituents of the laser processing apparatus in accordance with the fifth and sixth embodiments are referred to with numerals identical thereto without repeating their overlapping explanations.

In the laser processing apparatus 600, an iris diaphragm 601 is disposed on the optical axis of laser light L instead of the beam expander 501 between a dichroic mirror 103 and a light-converging lens 105. Changing the aperture size of the iris diaphragm 601 adjusts the effective diameter of the light-converging lens 105. The iris diaphragm 601 is an embodiment of numerical aperture regulating means. The laser processing apparatus 600 further comprises an iris diaphragm controller 603 for changing the aperture size of the iris diaphragm 601. The iris diaphragm controller 603 is controlled by an overall controller 127.

The operations of the laser processing apparatus 600 differ from those of the laser processing apparatus of the fifth and sixth embodiments in the adjustment of numerical aperture based on the size of numerical aperture fed into the overall controller 127. According to the inputted size of numerical aperture, the laser processing apparatus 600 changes the size of aperture of the iris diaphragm 601, thereby carrying out adjustment for decreasing the effective diameter of the light-converging lens 105. Therefore, with only one light-converging lens 105, adjustment for decreasing the numerical aperture of the optical system including the light-converging lens 105 is possible. This will be explained with reference to FIGS. 76 and 77.

Figure 76:
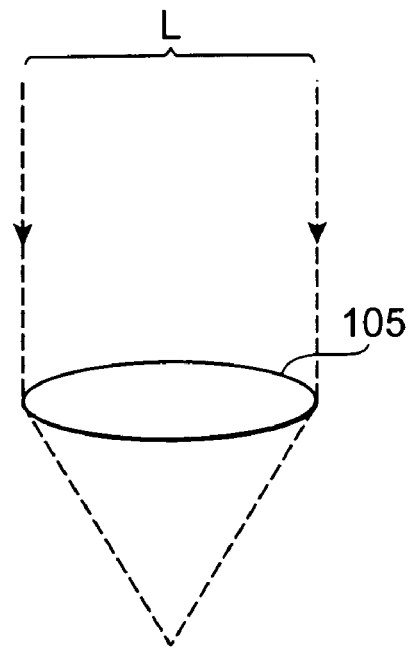
FIG. 76 is a view showing the convergence of laser light caused by the light-converging lens in the case where no iris diaphragm is disposed.
Figure 77:
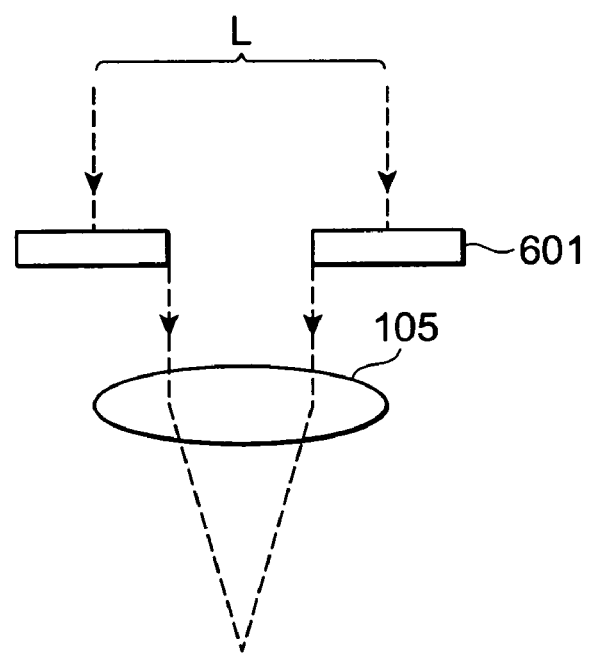
FIG. 77 is a view showing the convergence of laser light caused by the light-converging lens in the case where an iris diaphragm is disposed.

FIG. 76 is a view showing the convergence of laser light L effected by the light-converging lens 105 when no iris diaphragm is provided. On the other hand, FIG. 77 is a view showing the convergence of laser light L effected by the light-converging lens 105 when the iris diaphragm 601 is provided. As can be seen when FIGS. 76 and 77 are compared with each other, the seventh embodiment can achieve adjustment so as to increase the numerical aperture with reference to the numerical aperture of the optical system including the light-converging lens 105 in the case where the iris diaphragm is not provided.

Figure 78:
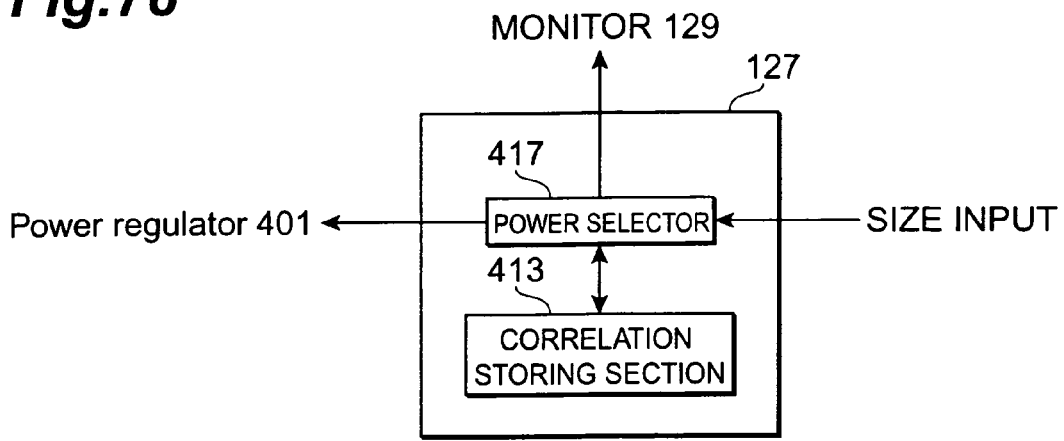
FIG. 78 is a block diagram showing an embodiment of overall controller provided in a modified embodiment of the laser processing apparatus in accordance with the embodiment.

Modified embodiments of the fifth to seventh embodiments of the present invention will now be explained. FIG. 78 is a block diagram of the overall controller 127 provided in a modified embodiment of the laser processing apparatus in accordance with this embodiment. The overall controller 127 comprises a power selector 417 and a correlation storing section 413. The correlation storing section 413 has already stored the correlation data shown in FIG. 71. An operator of the laser processing apparatus inputs a desirable size of a modified spot to the power selector 417 by a keyboard or the like. The size of modified spot is determined in view of the thickness and material of the object to be modified and the like. According to this input, the power selector 417 chooses a power corresponding to the value of size identical to thus inputted size from the correlation storing section 413, and sends it to the power regulator 401. Therefore, when the laser processing apparatus regulated to this magnitude of power is used for laser processing, a modified spot having a desirable size can be formed. The data concerning this magnitude of power is also sent to the monitor 129, whereby the magnitude of power is displayed. In this embodiment, the numerical aperture is fixed while power is variable. If no size at the value identical to that of thus inputted value is stored in the correlation storing section 413, power data corresponding to a size having the closest value is sent to the power regulator 401 and the monitor 129. This is the same in the modified embodiments explained in the following.

Figure 79:
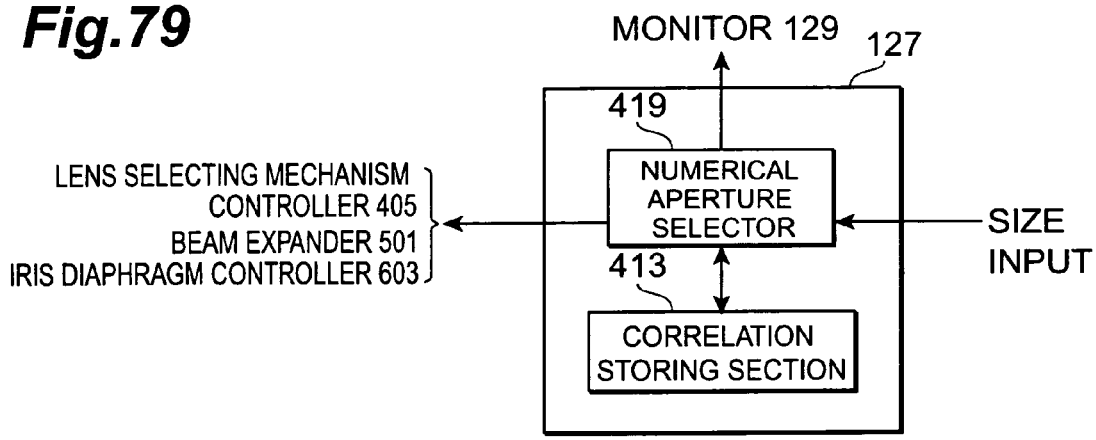
FIG. 79 is a block diagram of another embodiment of overall controller provided in the modified embodiment of the laser processing apparatus in accordance with the embodiment.

FIG. 79 is a block diagram of the overall controller 127 provided in another modified embodiment of the laser processing apparatus in accordance with this embodiment. The overall controller 127 comprises a numerical aperture selector 419 and a correlation storing section 413. It differs from the modified embodiment of FIG. 78 in that the numerical aperture is chosen instead of the power. The correlation storing section 413 has already stored the data shown in FIG. 70. An operator of the laser processing apparatus inputs a desirable size of a modified spot to the numerical aperture selector 419 by using a keyboard or the like. As a consequence, the numerical aperture selector 419 chooses a numerical aperture corresponding to a size having a value identical to that of the inputted size from the correlation storing section 413, and sends data of this numerical aperture to the lens selecting mechanism controller 405, beam expander 501, or iris diaphragm controller 603. Therefore, when the laser processing apparatus regulated to this size of numerical aperture is used for laser processing, a modified spot having a desirable size can be formed. The data concerning this numerical aperture is also sent to the monitor 129, whereby the size of numerical aperture is displayed. In this embodiment, the power is fixed while numerical aperture is variable.

Figure 80:
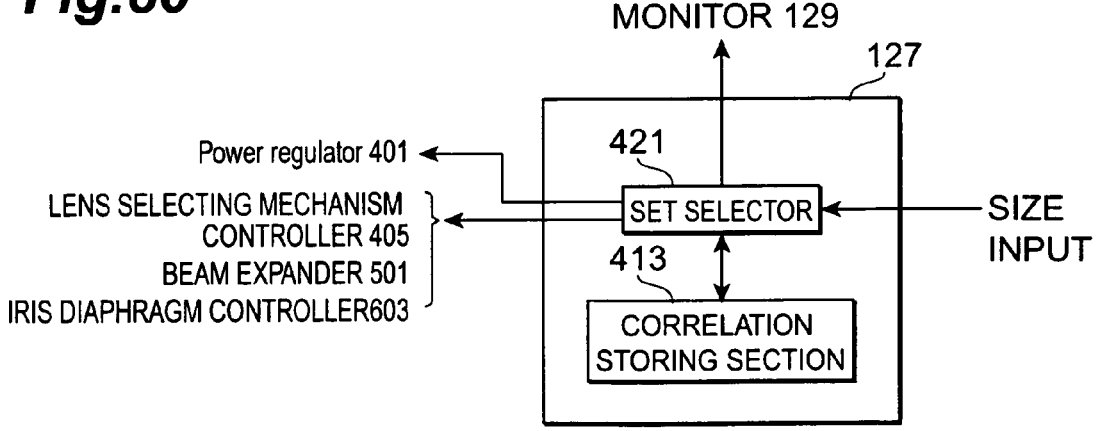
FIG. 80 is a block diagram of still another embodiment of overall controller provided in the modified embodiment of the laser processing apparatus in accordance with the embodiment.

FIG. 80 is a block diagram of the overall controller 127 provided in still another modified embodiment of the laser processing apparatus in accordance with this embodiment. The overall controller 127 comprises a set selector 421 and a correlation storing section 413. It differs from the embodiments of FIGS. 78 and 79 in that both power and numerical aperture are chosen. The correlation storing section 413 has stored the correlation between the set of power and numerical aperture and the size in FIG. 69 beforehand. An operator of the laser processing apparatus inputs a desirable size of a modified spot to the set selector 421 by using a keyboard or the like. As a consequence, the set selector 421 chooses a set of power and numerical aperture corresponding to thus inputted size from the correlation storing section 413. Data of power in thus chosen set is sent to the power regulator 401. On the other hand, data of numerical aperture in the chosen set is sent to the lens selecting mechanism controller 405, beam expander 501, or iris diaphragm controller 603. Therefore, when the laser processing apparatus regulated to the power and numerical aperture of this set is used for laser processing, a modified spot having a desirable size can be formed. The data concerning the magnitude of power and size of numerical aperture is also sent to the monitor 129, whereby the magnitude of power and size of numerical aperture is displayed.

These modified embodiments can control sizes of modified spots. Therefore, when the size of a modified spot is made smaller, the object to be processed can precisely be cut along a line along which the object is intended to be cut therein, and a flat cross section can be obtained. When the object to be cut has a large thickness, the size of modified spot can be enhanced, whereby the object can be cut.

Eighth Embodiment

An eighth embodiment of the present invention controls the distance between a modified spot formed by one pulse of laser light and a modified spot formed by the next one pulse of pulse laser light by regulating the magnitude of a repetition frequency of pulse laser light and the magnitude of relative moving speed of the light-converging point of pulse laser light. Namely, it controls the distance between adjacent modified spots. In the following explanation, the distance is assumed to be a pitch p. The control of pitch p will be explained in terms of a crack region by way of embodiment.

Let f (Hz) be the repetition frequency of pulse laser light, and v (mm/sec) be the moving speed of the X-axis stage or Y-axis stage of the object to be processed. The moving speeds of these stages are embodiments of relative moving speed of the light-converging point of pulse laser light. The crack part formed by one shot of pulse laser light is referred to as crack spot. Therefore, the number n of crack spots formed per unit length of the line 5 along which the object is intended to be cut is as follows:

$n=f/v.$

The reciprocal of the number n of crack spots formed per unit length corresponds to the pitch p:

$p=1/n.$

Hence, the pitch p can be controlled when at least one of the magnitude of repetition frequency of pulse laser light and the magnitude of relative moving speed of the light-converging point is regulated. Namely, the pitch p can be controlled so as to become smaller when the repetition frequency f (Hz) is increased or when the stage moving speed v (mm/sec) is decreased. By contrast, the pitch p can be controlled so as to become greater when the repetition frequency f (Hz) is decreased or when the stage moving speed v (mm/sec) is increased.

Figure 81:
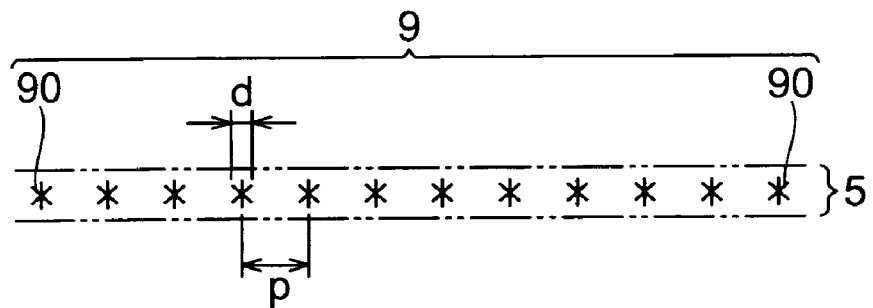
FIG. 81 is a plan view of an embodiment of the part of object to be processed extending along a line along which the object is intended to be cut, in which a crack region is formed by the laser processing method in accordance with an eighth embodiment of the embodiment.
Figure 82:
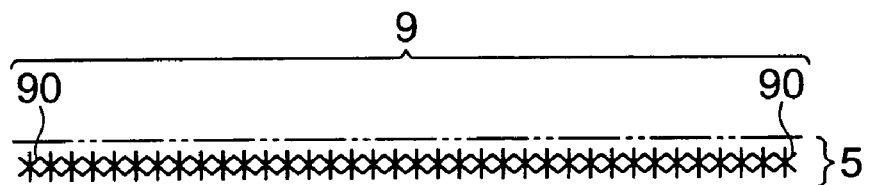
FIG. 82 is a plan view of another embodiment of the part of object to be processed extending along the line along which the object is intended to be cut, in which a crack region is formed by the laser processing method in accordance with the eighth embodiment of the embodiment.
Figure 83:
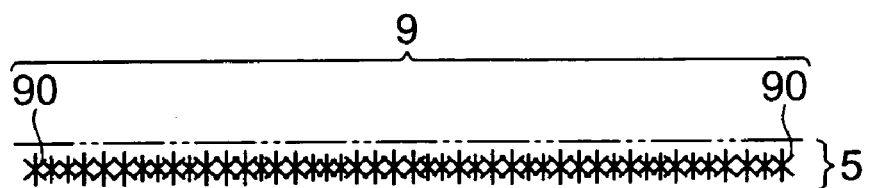
FIG. 83 is a plan view of still another embodiment of the part of object to be processed extending along the line along which the object is intended to be cut, in which a crack region is formed by the laser processing method in accordance with the eighth embodiment of the embodiment.

Meanwhile, there are three ways of relationship between the pitch p and crack spot size in the direction of line 5 along which the object is intended to be cut as shown in FIGS. 81 to 83. FIGS. 81 to 83 are plan views of an object to be processed along the line 5 along which the object is intended to be cut, which is formed with a crack region by the laser processing in accordance with this embodiment. A crack spot 90 is formed by one pulse of pulse laser light. Forming a plurality of crack spots 90 aligning each other along the line 5 along which the object is intended to be cut yields a crack region 9.

FIG. 81 shows a case where the pitch p is greater than the size d. The crack region 9 is formed discontinuously along the line 5 along which the object is intended to be cut within the object to be processed. FIG. 82 shows a case where the pitch p substantially equals the sized. The crack region 9 is formed continuously along the line 5 along which the object is intended to be cut within the object to be processed. FIG. 83 shows a case where the pitch p is smaller than the size d. The crack region 9 is formed continuously along the line 5 along which the object is intended to be cut within the object to be processed.

In FIG. 81, the crack region 9 is not continuous along the line 5 along which the object is intended to be cut, whereby the part of line 5 along which the object is intended to be cut keeps a strength to some extent. Therefore, when carrying out a step of cutting the object to be processed after laser processing, handling of the object becomes easier. In FIGS. 82 and 83, the crack region 9 is continuously formed along the line 5 along which the object is intended to be cut, which makes it easy to cut the object while using the crack region 9 as a starting point.

The pitch p is made greater than the size d in FIG. 81, and substantially equals the size d in FIG. 82, whereby regions generating multiphoton absorption upon irradiation with pulse laser light can be prevented from being superposed on crack spots 90 which have already been formed. As a result, deviations in sizes of crack spots 90 can be made smaller. Namely, the inventor has found that, when a region generating multiphoton absorption upon irradiation with pulse laser light is superposed on crack spots 90 which have already been formed, deviations in sizes of crack spots 90 formed in this region become greater. When deviations in sizes of crack spots 90 become greater, it becomes harder to cut the object along a line along which the object is intended to be cut precisely, and the flatness of cross section deteriorates. In FIGS. 81 and 82, deviations in sizes of crack spots can be made smaller, whereby the object to be processed can be cut along the line along which the object is intended to be cut precisely, while cross sections can be made flat.

As explained in the foregoing, the eighth embodiment of the present invention can control the pitch p by regulating the magnitude of repetition frequency of pulse laser light or magnitude of relative moving speed of the light-converging point of pulse laser light. This enables laser processing in conformity to the object to be processed by changing the pitch p in view of the thickness and material of the object and the like.

Though the fact that the pitch p can be controlled is explained in the case of crack spots, the same holds in melting spots and refractive index change spots. However, there are no problems even when melting spots and refractive index change spots are superposed on those which have already been formed. The relative movement of the light-converging point of pulse laser light may be realized by a case where the object to be processed is moved while the light-converging point of pulse laser light is fixed, a case where the light-converging point of pulse laser light is moved while the object is fixed, a case where the object and the light-converging point of pulse laser light are moved in directions opposite from each other, and a case where the object and the light-converging point of pulse laser light are moved in the same direction with their respective speeds different from each other.

Figure 84:
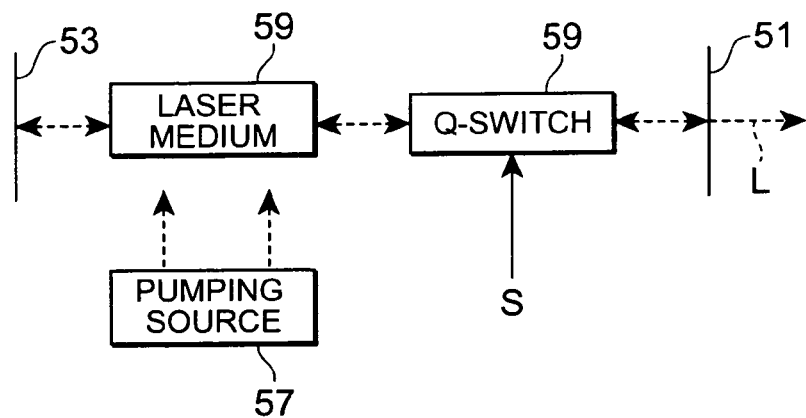
FIG. 84 is a schematic diagram of a Q-switch laser provided in a laser light source of the laser processing apparatus in accordance with the eighth embodiment of the embodiment.

With reference to FIG. 14, the laser processing apparatus in accordance with the eighth embodiment of the present invention will be explained mainly in terms of its differences from the laser processing apparatus 100 in accordance with the first embodiment shown in FIG. 14. The laser light source 101 is a Q-switch laser. FIG. 84 is a schematic diagram of the Q-switch laser provided in a laser light source 101. The Q-switch laser comprises mirrors 51, 53 which are disposed with a predetermined gap therebetween, a laser medium 55 disposed between the mirrors 51 and 53, a pumping source 57 for applying a pumping input to the laser medium 55, and a Q-switch 59 disposed between the laser medium 55 and the mirror 51. The material of the laser medium 55 is Nd:YAG, for embodiment.

A pumping input is applied from the pumping source 57 to the laser medium 55 in a state where the loss in a resonator is made high by utilizing the Q-switch 59, whereby the population inversion of the laser medium 55 is raised to a predetermined value. Thereafter, the Q-switch 59 is utilized for placing the resonator into a state with a low loss, so as to oscillate the accumulated energy instantaneously and generate pulse laser light L. A signal S (e.g., a change in a repetition frequency of an ultrasonic pulse) from a laser light source controller 102 controls the Q-switch 59 so as to make it attain a high state. Therefore, the signal S from the laser light source controller 102 can regulate the repetition frequency of pulse laser light L emitted from the laser light source 101. The laser light source controller 102 is an embodiment of frequency adjusting means. The repetition frequency is regulated when an operator of the laser processing apparatus inputs the magnitude of repetition frequency to an overall controller 127, which will be explained later, by using a keyboard or the like. The foregoing are details of the laser light source 101.

During the laser processing, the object to be processed 1 is moved in the X- or Y-axis direction, so as to form a modified region along a line along which the object is intended to be cut. Therefore, when forming a modified region in the X-axis direction, the speed of relative movement of the light-converging point of laser light can be adjusted by regulating the moving speed of the X-axis stage 109. When forming a modified region in the Y-axis direction, on the other hand, the speed of relative movement of the light-converging point of laser light can be adjusted by regulating the moving speed of the Y-axis stage 111. The adjustment of the respective moving speeds of these stages is controlled by the stage controller 115. The stage controller 115 is an embodiment of speed adjusting means. The speed is regulated when the operator of laser processing apparatus inputs the magnitude of speed to the overall controller 127, which will be explained later, by using a keyboard or the like. The speed of relative movement of the light-converging point of pulse laser light can be adjusted when, while the light-converging point P is made movable, its moving speed is regulated.

Figure 85:
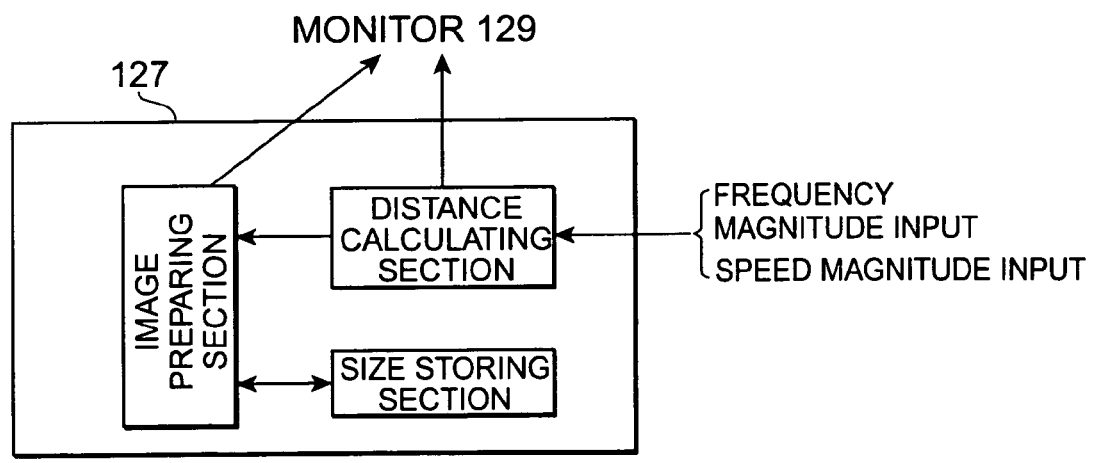
FIG. 85 is a block diagram showing a part of an embodiment of overall controller of the laser processing apparatus in accordance with the eighth embodiment of the embodiment.

The overall controller 127 of the laser processing apparatus in accordance with the eighth embodiment further adds other functions to the overall controller 127 of the laser processing apparatus in accordance with the first embodiment. FIG. 85 is a block diagram showing a part of an embodiment of the overall controller 127 of the laser processing apparatus in accordance with the eighth embodiment. The overall controller 127 comprises a distance calculating section 141, a size storing section 143, and an image preparing section 145. To the distance calculating section 141, the magnitude of repetition frequency of pulse laser light and respective magnitudes of moving speeds of the stages 109, 111 are inputted. These inputs are effected by the operator of laser processing apparatus using a keyboard or the like.

The distance calculating section 141 calculates the distance (pitch) between adjacent spots by utilizing the above-mentioned expressions ($n=f/v$, and $p=1/n$). The distance calculating section 141 sends this distance data to the monitor 129. As a consequence, the distance between modified spots formed at the inputted magnitudes of frequency and speed is displayed on the monitor 129.

The distance data is also sent to the image preparing section 145. The size storing section 143 has already stored therein sizes of modified spots formed in this laser processing apparatus. According to the distance data and the size data stored in the size storing section 143, the image preparing section 145 prepares image data of a modified region formed by the distance and size, and sends thus prepared image data to the monitor 129. As a consequence, an image of the modified region is also displayed on the monitor 129. Hence, the distance between adjacent modified spots and the form of modified region can be seen before laser processing.

Though the distance calculating section 141 calculates the distance between modified spots by utilizing the expressions ($n=f/v$, and $p=1/n$), the following procedure may also be taken. First, a table having registered the relationship between the magnitude of repetition frequency, the moving speeds of stages 109, 111, and the distance between modified spots beforehand is prepared, and the distance calculating section 141 is caused to store data of this table. When the magnitude of repetition frequency and the magnitudes of moving speeds of stages 109, 111 are fed into the distance calculating section 141, the latter reads out from the above-mentioned table the distance between modified spots in the modified spots formed under the condition of these magnitude.

Here, the magnitudes of stage moving speeds may be made variable while the magnitude of repetition frequency is fixed. On the contrary, the magnitude of repetition frequency may be made variable while the magnitudes of stage moving speeds are fixed. Also, in these cases, the above-mentioned expressions and table are used in the distance calculating section 141 for carrying out processing for causing the monitor 129 to display the distance between modified spots and an image of the modified region.

As in the foregoing, the overall controller 127 shown in FIG. 85 inputs the magnitude of repetition frequency and the stage moving speeds, thereby calculating the distance between adjacent modified spots. Alternatively, a desirable distance between adjacent modified spots may be inputted, and the magnitude of repetition frequency and magnitudes of stage moving speeds may be controlled. This procedure will be explained in the following.

Figure 86:
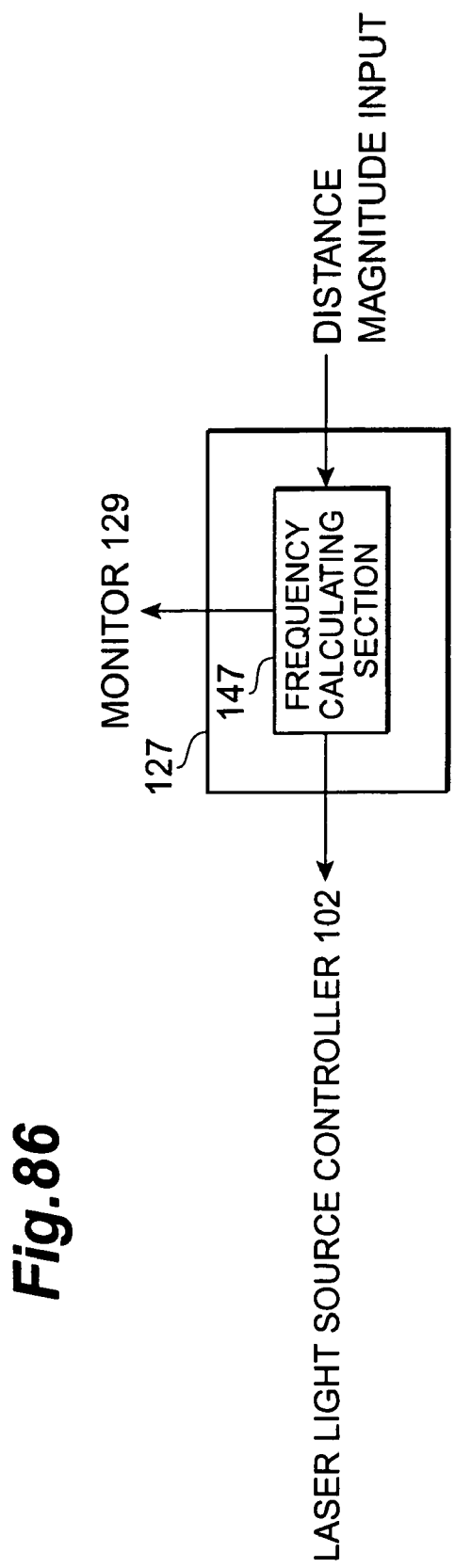
FIG. 86 is a block diagram showing a part of another embodiment of overall controller of the laser processing apparatus in accordance with the eighth embodiment of the embodiment.

FIG. 86 is a block diagram showing a part of another embodiment of the overall controller 127 provided in the eighth embodiment. The overall controller 127 comprises a frequency calculating section 147. The operator of laser processing apparatus inputs the magnitude of distance between adjacent modified spots to the frequency calculating section 147 by using a keyboard or the like. The magnitude of distance is determined in view of the thickness and material of the object to be processed and the like. Upon this input, the frequency calculating section 147 calculates a frequency for attaining this magnitude of distance according to the above-mentioned expressions and tables. In this embodiment, the stage moving speeds are fixed. The frequency calculating section 147 sends thus calculated data to the laser light source controller 102. When the object to be processed is subjected to laser processing by the laser processing apparatus regulated to this magnitude of frequency, the distance between adjacent modified spots can attain a desirable magnitude. Data of this magnitude of frequency is also sent to the monitor 129, whereby this magnitude of frequency is displayed.

Figure 87:
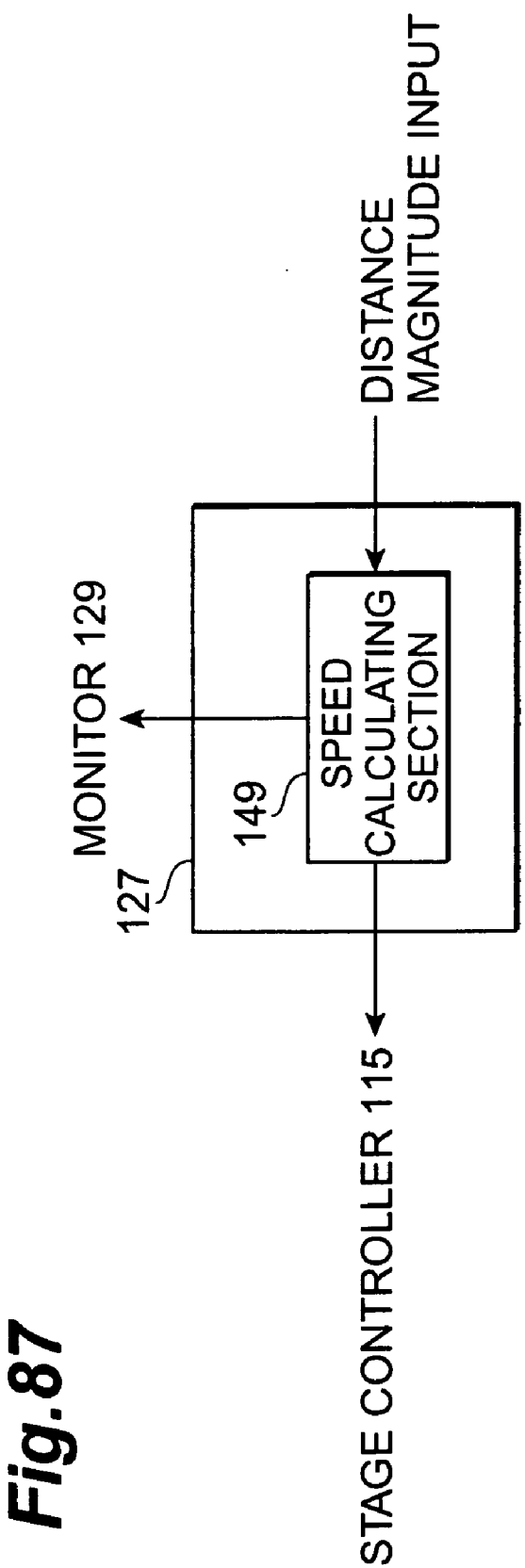
FIG. 87 is a block diagram showing a part of still another embodiment of overall controller of the laser processing apparatus in accordance with the eighth embodiment of the embodiment.

FIG. 87 is a block diagram showing a part of still another embodiment the overall controller 127 provided in the eighth embodiment. The overall controller 127 comprises a speed calculating section 149. In a manner similar to that mentioned above, the magnitude of distance between adjacent modified spots is fed into the speed calculating section 149. Upon this input, the speed calculating section 149 calculates a stage moving speed for attaining this magnitude of distance according to the above-mentioned expressions and tables. In this embodiment, the repetition frequency is fixed. The speed calculating section 149 sends thus calculated data to the stage controller 115. When the object to be processed is subjected to laser processing by the laser processing apparatus regulated to this magnitude of stage moving speed, the distance between adjacent modified spots can attain a desirable magnitude. Data of this magnitude of stage moving speed is also sent to the monitor 129, whereby this magnitude of stage moving speed is displayed.

Figure 88:
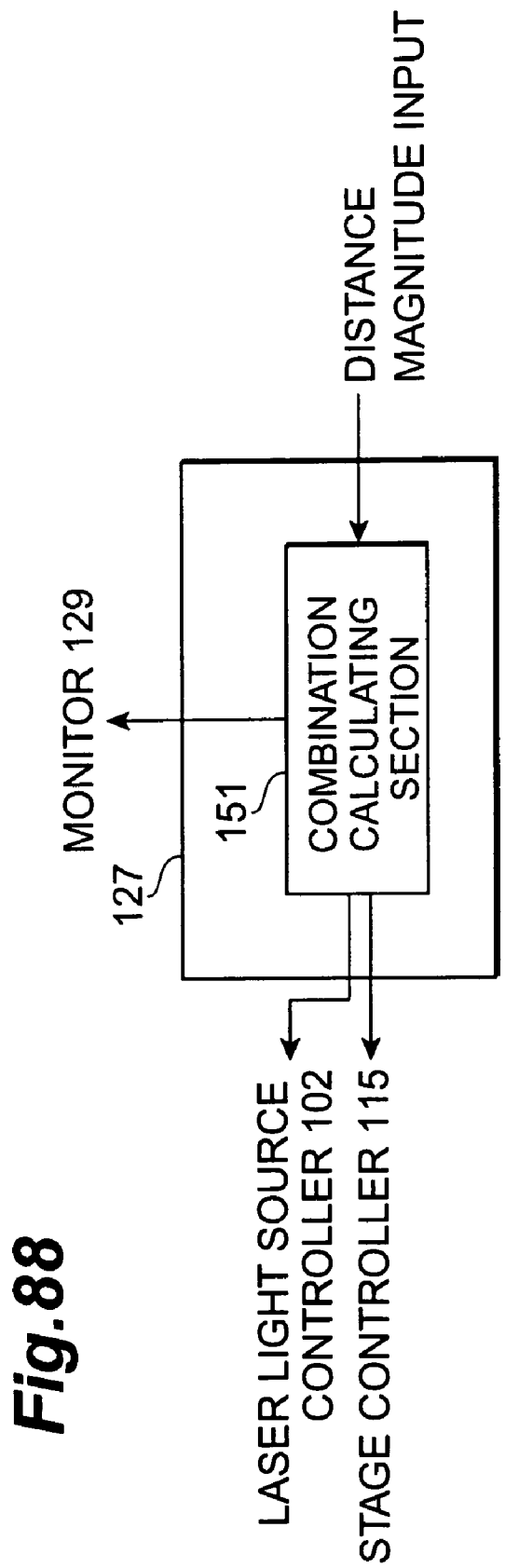
FIG. 88 is a block diagram showing a part of still another embodiment of overall controller of the laser processing apparatus in accordance with the eighth embodiment of the embodiment.

FIG. 88 is a block diagram showing a part of still another embodiment of the overall controller 127 provided in the eighth embodiment. The overall controller 127 comprises a combination calculating section 151. It differs from the cases of FIGS. 86 and 87 in that both repetition frequency and stage moving speed are calculated. In a manner similar to that mentioned above, the distance between adjacent modified spots is fed into the combination calculating section 151. According to the above-mentioned expressions and tables, the combination calculating section 151 calculates a repetition frequency and a stage moving speed for attaining this magnitude of distance.

The combination calculating section 151 sends thus calculated data to the stage controller 115. The laser light source controller 102 adjusts the laser light source 101 so as to attain the calculated magnitude of repetition frequency. The stage controller 115 adjusts the stages 109, 111 so as to attain the calculated magnitude of stage moving speed. When the object to be processed is subjected to laser processing by thus regulated laser processing apparatus, the distance between adjacent modified spots can attain a desirable magnitude. Data of thus calculated magnitude of repetition frequency and magnitude of stage moving speed are also sent to the monitor 129, whereby thus calculated values are displayed.

The laser processing method in accordance with the eighth embodiment of the present invention will now be explained. The object to be processed 1 is a silicon wafer. In the eighth embodiment, operations from steps S101 to S111 are carried out in a manner similar to that of the laser processing method in accordance with the first embodiment shown in FIG. 15.

After step S111, the distance between adjacent melting spots in the melting spots formed by one pulse of pulse laser, i.e., the magnitude of pitch p, is determined. The pitch p is determined in view of the thickness and material of the object 1 and the like. The magnitude of pitch p is fed into the overall controller 127 shown in FIG. 88.

Then, in a manner similar to that of the laser processing method in accordance with the first embodiment shown in FIG. 15, operations of step S113 to S115 are carried out. This divides the object 1 into silicon chips.

As explained in the foregoing, the eighth embodiment can control the distance between adjacent melting spots by regulating the magnitude of repetition frequency of pulse laser light, and regulating the magnitudes of moving speeds of X-axis stage 109 and Y-axis stage 111. Changing the magnitude of distance in view of the thickness and material of the object 1 and the like enables processing in conformity to the aimed purpose.

Ninth Embodiment

A ninth embodiment of the present invention changes the position of the light-converging point of laser light irradiating the object to be processed in the direction of incidence to the object, thereby forming a plurality of modified regions aligning in the direction of incidence.

Figure 89:
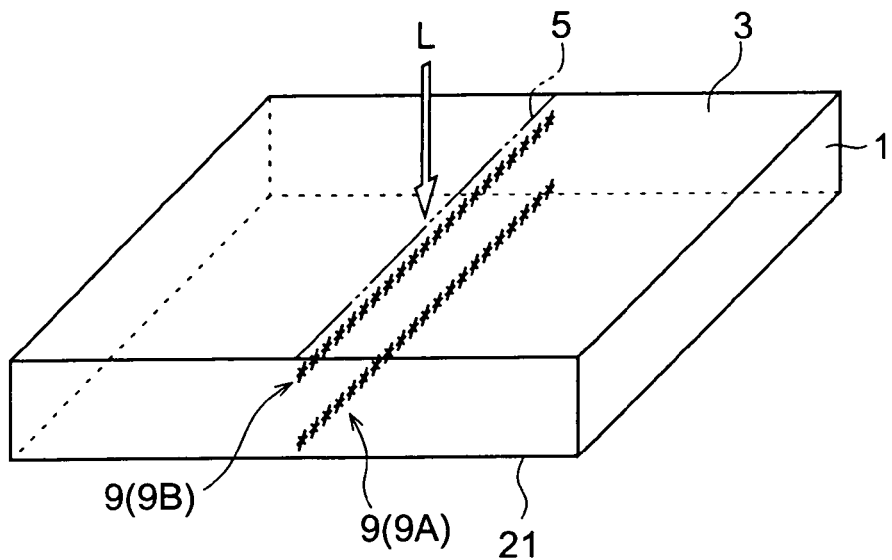
FIG. 89 is a perspective view of an embodiment of the object to be processed within which a crack region is formed by using the laser processing method in accordance with a ninth embodiment of the embodiment.

Forming a plurality of modified regions will be explained in terms of a crack region by way of embodiment. FIG. 89 is a perspective view of an object to be processed 1 formed with two crack regions 9 within the object 1 by using the laser processing method in accordance with the ninth embodiment of the present invention.

A method of forming two crack regions 9 will be explained in brief. First, the object 1 is irradiated with pulse laser light L, while the light-converging point of pulse laser light L is located within the object 1 near its rear face 21 and is moved along a line 5 along which the object is intended to be cut. This forms a crack region 9 (9A) along the line 5 along which the object is intended to be cut within the object 1 near the rear face 21. Subsequently, the object 1 is irradiated with the pulse laser light L, while the light-converging point of pulse laser light L is located within the object 1 near its surface 3 and is moved along the line 5 along which the object is intended to be cut. This forms a crack region 9 (9B) along the line 5 along which the object is intended to be cut within the object 1 near the surface 3.

Figure 90:
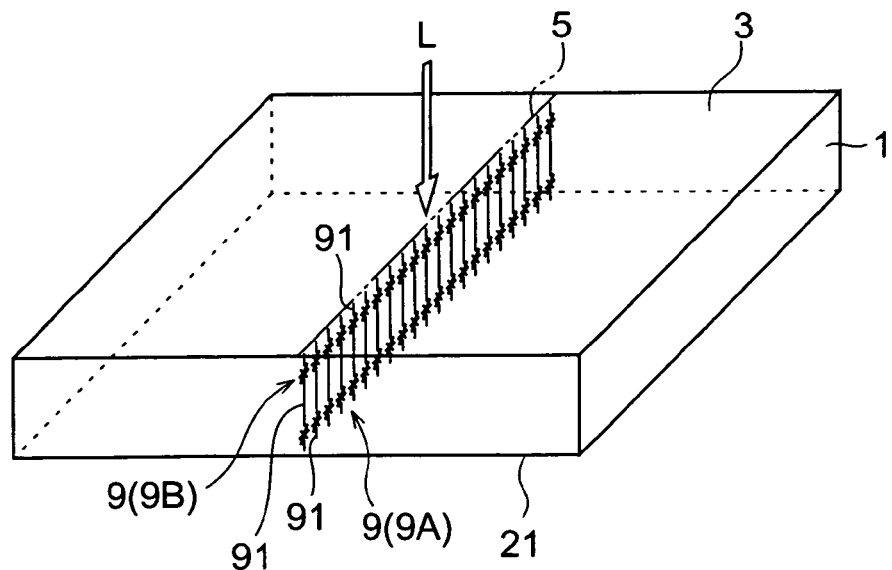
FIG. 90 is a perspective view of the object to be processed formed with a crack extending from the crack region shown in FIG. 89.

Then, as shown in FIG. 90, cracks 91 naturally grow from the crack regions 9A, 9B. Specifically, the cracks 91 naturally grow from the crack region 9A toward the rear face 21, from the crack region 9A (9B) toward the crack region 9B (9A), and from the crack region 9B toward the surface 3. This can form cracks 9 elongated in the thickness direction of the object in the surface of object 1 extending along the line 5 along which the object is intended to be cut, i.e., the surface to become a cross section. Hence, the object 1 can be cut along the line 5 along which the object is intended to be cut by artificially applying a relatively small force thereto or naturally without applying such a force.

As in the foregoing, the ninth embodiment forms a plurality of crack regions 9, thereby increasing the number of locations to become starting points when cutting the object 1. As a consequence, the ninth embodiment makes it possible to cut the object 1 even in the cases where the object 1 has a relatively large thickness, the object 1 is made of a material in which cracks 91 are hard to grow after forming the crack regions 9, and so forth.

Figure 91:
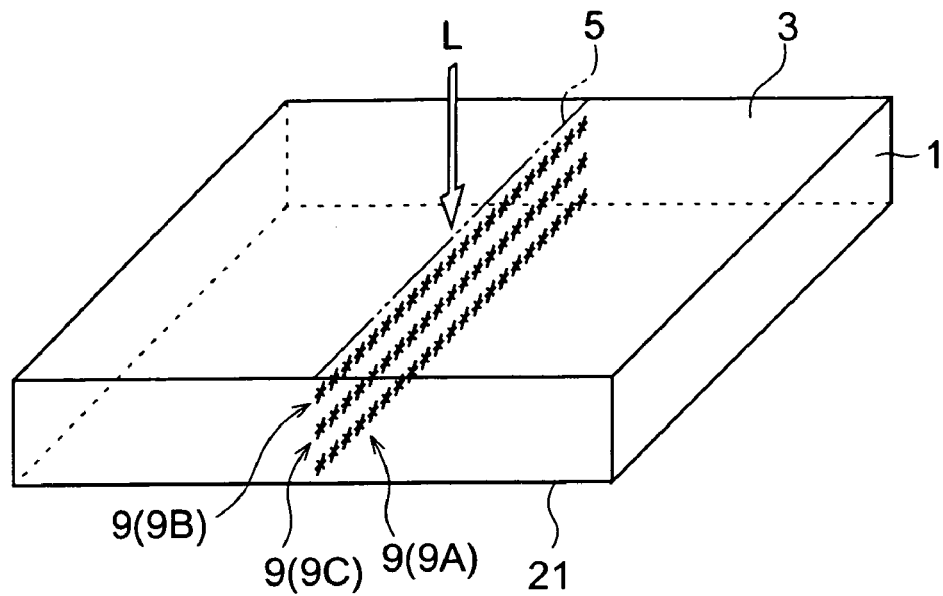
FIG. 91 is a perspective view of another embodiment of the object to be processed within which a crack region is formed by using the laser processing method in accordance with the ninth embodiment of the embodiment.
Figure 92:
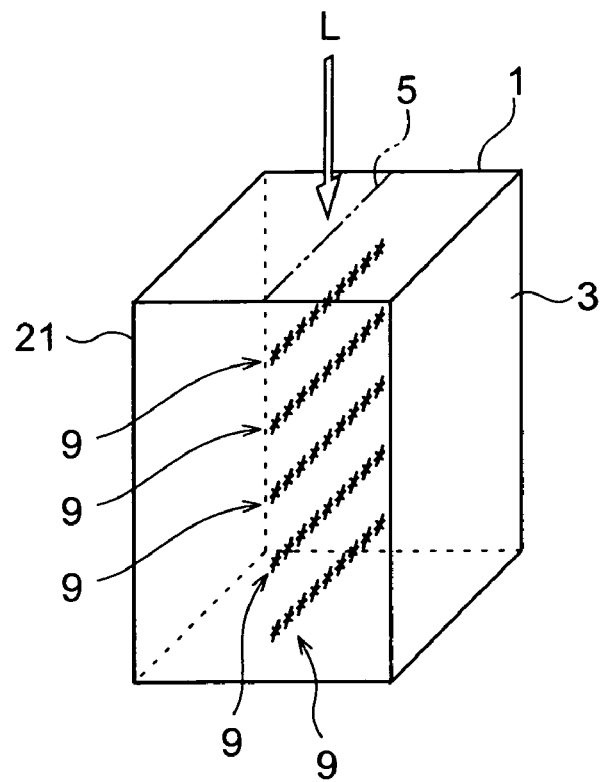
FIG. 92 is a perspective view of still another embodiment of the object to be processed within which a crack region is formed by using the laser processing method in accordance with the ninth embodiment of the embodiment.

When cutting is difficult by two crack regions 9 alone, three or more crack regions 9 are formed. For embodiment, as shown in FIG. 91, a crack region 9C is formed between the crack region 9A and crack region 9B. Cutting can also be achieved in a direction orthogonal to the thickness direction of the object 1 as long as it is the direction of incidence of laser light as shown in FIG. 92.

Preferably, in the ninth embodiment of the present invention, a plurality of crack regions 9 are successively formed from the side farther from the entrance face (e.g., surface 3) of the object to be processed on which the pulse laser light L is incident. For embodiment, in FIG. 89, the crack region 9A is formed first, and then the crack region 9B is formed. If the crack regions 9 are formed successively from the side closer to the entrance face, the pulse laser L irradiated at the time of forming the crack region 9 to be formed later will be scattered by the crack region 9 formed earlier. As a consequence, deviations occur in sizes of the crack part (crack spot) formed by one shot of pulse laser light L constituting the crack region 9 formed later. Hence, the crack region 9 formed later cannot be formed uniformly. Forming the crack regions 9 successively from the side farther from the entrance face does not generate the above-mentioned scattering, whereby the crack region 9 formed later can be formed uniformly.

However, the order of forming a plurality of crack regions 9 in the ninth embodiment of the present invention is not restricted to that mentioned above. They may be formed successively from the side closer to the entrance face of the object to be processed, or formed randomly. In the random forming, for embodiment in FIG. 91, the crack region 9C is formed first, then the crack region 9B, and finally the crack region 9A is formed by reversing the direction of incidence of laser light.

Though the forming of a plurality of modified regions is explained in the case of crack regions, the same holds in molten processed regions and refractive index change regions. Though the explanation relates to pulse laser light, the same holds for continuous wave laser light.

The laser processing apparatus in accordance with the ninth embodiment of the present invention has a configuration similar to that of the laser processing apparatus 100 in accordance with the first embodiment shown in FIG. 14. In the ninth embodiment, the position of light-converging point P in the thickness direction of the object to be processed 1 is adjusted by the Z-axis stage 113. This can adjust the light-converging point P so as to locate it at a position closer to or farther from the entrance face (surface 3) than is a half thickness position in the thickness direction of the object to be processed 1, and at a substantially half thickness position.

Figure 93:
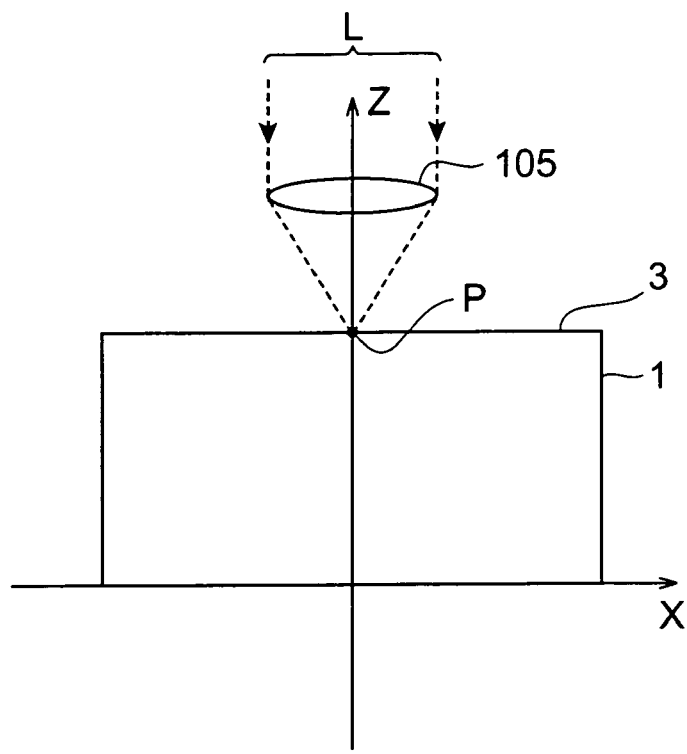
FIG. 93 is a view showing the state where a light-converging point of laser light is positioned on the surface of the object to be processed.
Figure 94:
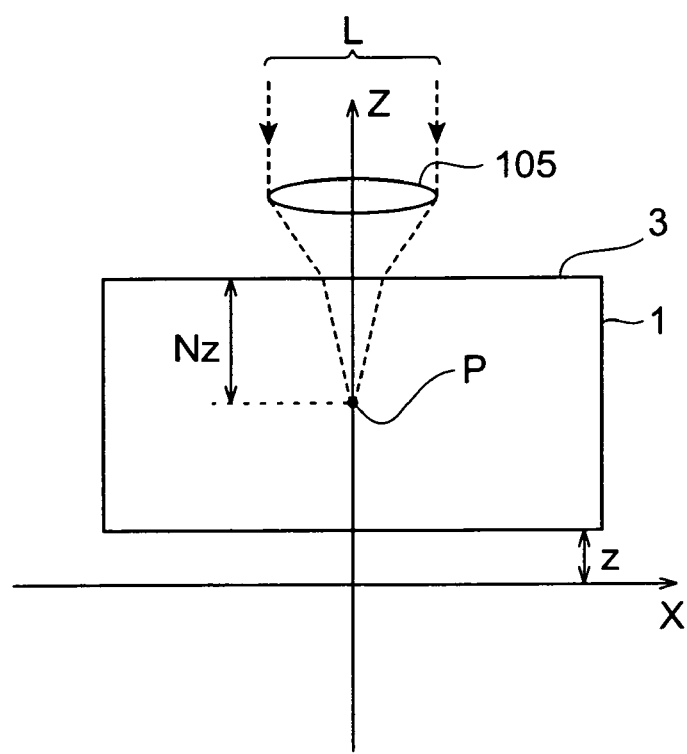
FIG. 94 is a view showing the state where a light-converging point of laser light is positioned within the object to be processed.

Here, adjustment of the position of light-converging point P in the thickness direction of the object to be processed caused by the Z-axis stage will be explained with reference to FIGS. 93 and 94. In the ninth embodiment of the present invention, the position of light-converging point of laser light in the thickness direction of the object to be processed is adjusted so as to be located at a desirable position within the object with reference to the surface (entrance face) of the object. FIG. 93 shows the state where the light-converging point P of laser light L is positioned at the surface 3 of the object 1. When the Z-axis stage is moved by z toward the light-converging lens 105, the light-converging point P moves from the surface 3 to the inside of the object 1 as shown in FIG. 94. The amount of movement of light-converging point P within the object 1 is Nz (where N is the refractive index of the object 1 with respect to the laser light L). Hence, when the Z-axis stage is moved in view of the refractive index of the object 1 with respect to the laser light L, the position of light-converging point P in the thickness direction of the object 1 can be controlled. Namely, a desirable position of the light-converging point P in the thickness direction of the object 1 is defined as the distance (Nz) from the surface 3 to the inside of the object 1. The object 1 is moved in the thickness direction by the amount of movement (z) obtained by dividing the distance (Nz) by the above-mentioned refractive index (N). This can locate the light-converging point P at the desirable position.

As explained in the first embodiment, the stage controller 115 controls the movement of the Z-axis stage 113 according to focal point data, such that the focal point of visible light is located at the surface 3. The laser processing apparatus 1 is adjusted such that the light-converging point P of laser light L is positioned at the surface 3 at the position of Z-axis stage 113 where the focal point of visible light is located at the surface 3. Data of the amount of movement (z) explained in FIGS. 93 and 94 is fed into and stored in the overall controller 127.

Figure 95:
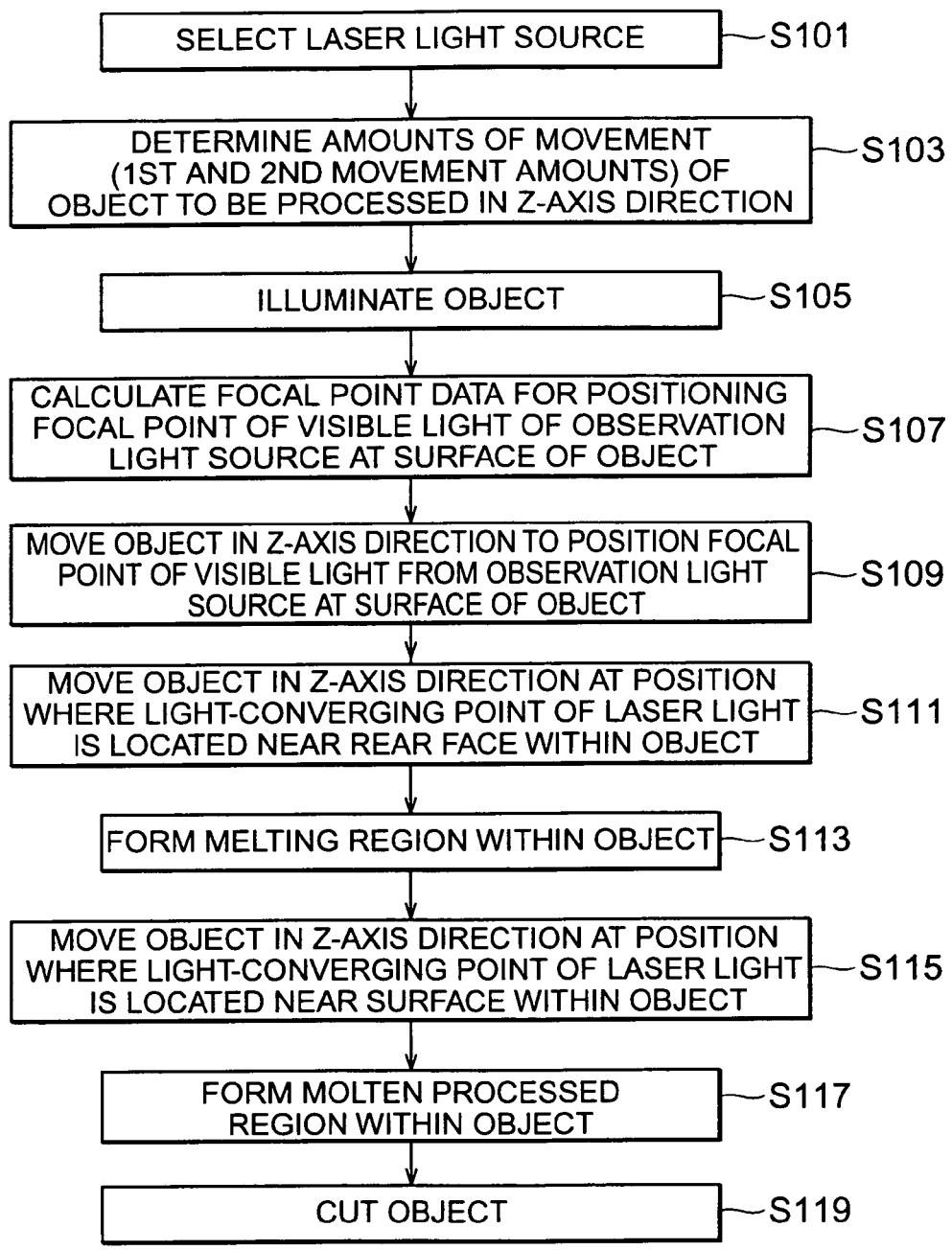
FIG. 95 is a flowchart for explaining the laser processing method in accordance with the ninth embodiment of the embodiment.

With reference to FIG. 95, the laser processing method in accordance with the ninth embodiment of the present invention will now be explained. FIG. 95 is a flowchart for explaining this laser processing method. The object to be processed 1 is a silicon wafer.

Step S101 is the same as step S101 of the first embodiment shown in FIG. 15. Subsequently, the thickness of the object 1 is measured. According to the result of measurement of thickness and the refractive index of object 1, the amount of movement (z) of object 1 in the Z-axis direction is determined (S103). This is the amount of movement of object 1 in the Z-axis direction with reference to the light-converging point of laser light L positioned at the surface 3 of object 1 in order for the light-converging point P of laser light L to be located within the object 1. Namely, the position of light-converging point P in the thickness direction of object 1 is determined. The position of light-converging point P is determined in view of the thickness and material of object 1 and the like. In this embodiment, data of a first movement amount for positioning the light-converging point P near the rear face within the object 1 and data of a second movement amount for positioning the light-converging point P near the surface 3 within the object 1 are used. A first molten processed region to be formed is formed by using the data of first movement amount. A second molten processed region to be formed is formed by using the data of second movement amount. Data of these movement amounts are fed into the overall controller 127.

Steps S105 and S107 are the same as steps S105 and S107 in the first embodiment shown in FIG. 15. The focal point data calculated by step S107 is sent to the stage controller 115. According to the focal point data, the stage controller 115 moves the Z-axis stage 113 in the Z-axis direction (S109). This positions the focal point of visible light of the observation light source 117 at the surface 3. At this point of Z-axis stage 113, the focal point P of pulse laser light L is positioned at the surface 3. Here, according to imaging data, the imaging data processor 125 calculates enlarged image data of the surface of object 1 including the line 5 along which the object is intended to be cut. The enlarged image data is sent to the monitor 129 by way of the overall controller 127, whereby an enlarged image in the vicinity of the line 5 along which the object is intended to be cut is displayed on the monitor 129.

The data of first movement amount determined by step S103 has already been inputted to the overall controller 127, and is sent to the stage controller 115. According to this data of movement amount, the stage controller 115 moves the object 1 in the Z-axis direction by using the Z-axis stage 113 to a position where the light-converging point P of laser light L is located within the object 1 (S111). This inside position is near the rear face of the object 1.

Next, as in step S113 of the first embodiment shown in FIG. 15, a molten processed region is formed within the object 1 so as to extend along the line 5 along which the object is intended to be cut (S113). The molten processed region is formed near the rear face within the object 1.

Then, according to the data of second movement amount as in step S111, the object 1 is moved in the Z-axis direction by the Z-axis stage 113 to a position where the light-converging point P of laser light L is located within the object 1 (S115). Subsequently, as in step S113, a molten processed region is formed within the object 1 (S117). In this step, the molten processed region is formed near the surface 3 within the object 1.

Finally, the object 1 is bent along the line 5 along which the object is intended to be cut, and thus is cut (S119) This divides the object 1 into silicon chips.

Effects of the ninth embodiment of the present invention will be explained. The ninth embodiment forms a plurality of modified regions aligning in the direction of incidence, thereby increasing the number of locations to become starting points when cutting the object 1. In the case where the size of object 1 in the direction of incidence of laser light is relatively large or where the object 1 is made of a material in which cracks are hard to grow from a modified region, for embodiment, the object 1 is hard to cut when only one modified region exists along the line 5 along which the object is intended to be cut. In such a case, forming a plurality of modified regions as in this embodiment can easily cut the object 1.

Tenth Embodiment

A tenth embodiment of the present invention controls the position of a modified region in the thickness direction of an object to be processed by adjusting the light-converging point of laser light in the thickness direction of the object.

Figure 96:
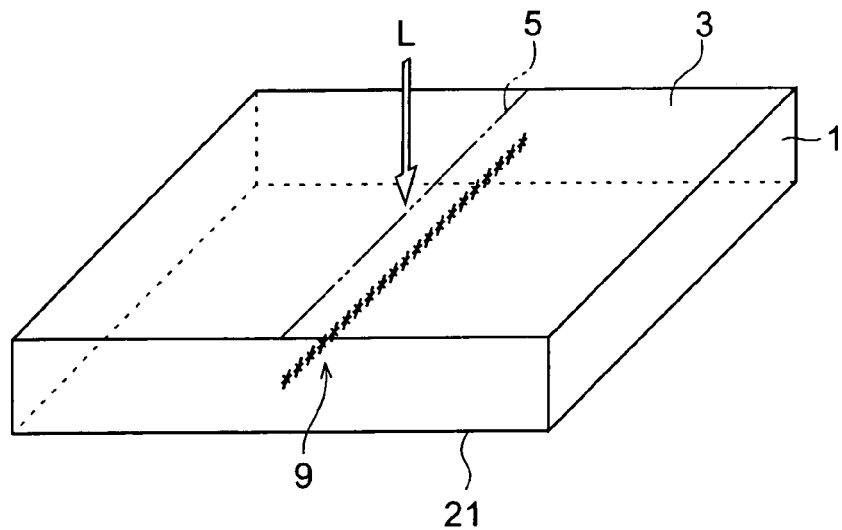
FIG. 96 is a perspective view of an embodiment of the object to be processed within which a crack region is formed by using the laser processing method in accordance with a tenth embodiment of the embodiment.

This positional control will be explained in terms of a crack region by way of embodiment. FIG. 96 is a perspective view of an object to be processed 1 in which a crack region 9 is formed within the object 1 by using the laser processing method in accordance with the tenth embodiment of the present invention. The light-converging point of pulse laser L is located within the object 1 through the surface (entrance face) 3 of the object with respect to the pulse laser light L. The light-converging point is adjusted so as to be located at a substantially half thickness position in the thickness direction of the object 1. When the object to be processed 1 is irradiated with the line 5 along which the object is intended to be cut under these conditions, a crack region 9 is formed along a line 5 along which the object is intended to be cut at a half thickness position of the object 1 and its vicinity.

Figure 97:
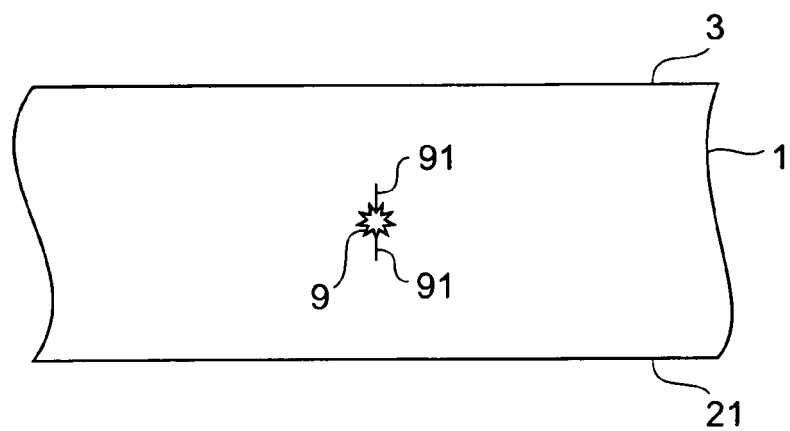
FIG. 97 is a partly sectional view of the object to be processed shown in FIG. 96.

FIG. 97 is a partly sectional view of the object 1 shown in FIG. 96. After the crack region 9 is formed, cracks 91 are naturally grown toward the surface 3 and rear face 21. When the crack region 9 is formed at the half thickness position and its vicinity in the thickness direction of the object 1, the distance between the naturally growing crack 91 and the surface 3 (rear face 21) can be made relatively long, for embodiment, in the case where the object 1 has a relatively large thickness. Therefore, a part to be cut extending along the line 5 along which the object is intended to be cut in the object 1 maintains a strength to a certain extent. Therefore, when carrying out the step of cutting the object 1 after terminating the laser processing, handling the object becomes easier.

Figure 98:
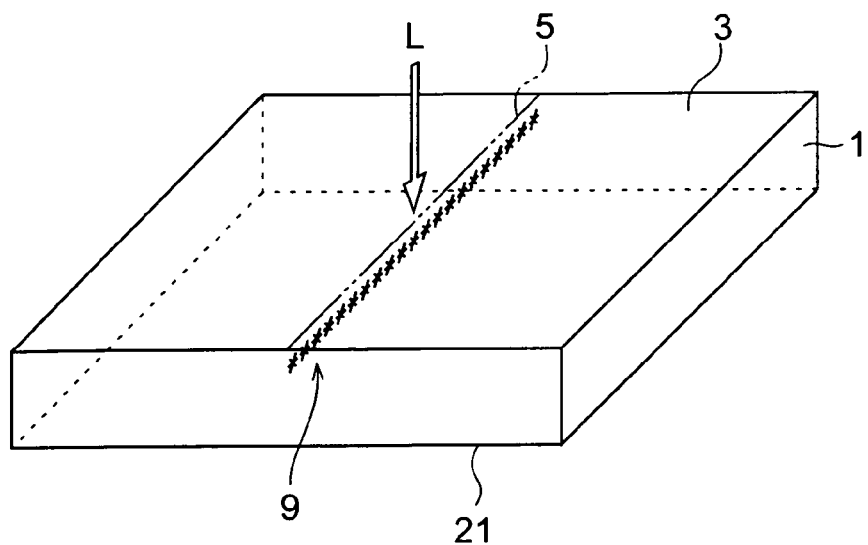
FIG. 98 is a perspective view of another embodiment of the object to be processed within which a crack region is formed by using the laser processing method in accordance with the tenth embodiment of the embodiment.
Figure 99:
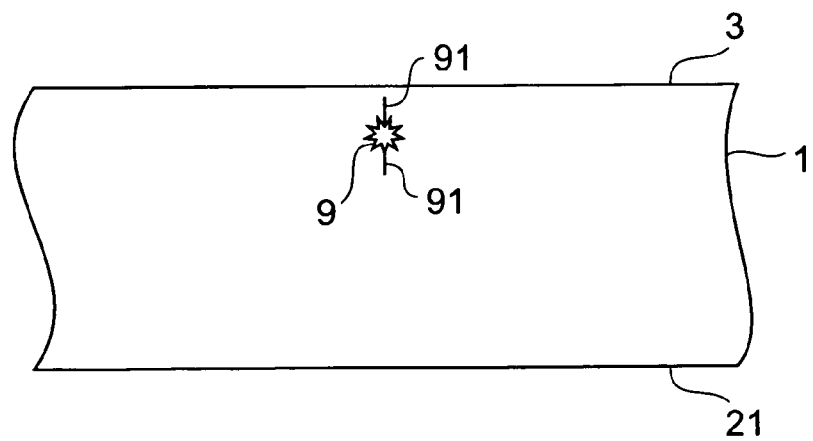
FIG. 99 is a partly sectional view of the object to be processed shown in FIG. 98.

FIG. 98 is a perspective view of an object to be processed 1 including a crack region 9 formed by using the laser processing method in accordance with the tenth embodiment of the present invention as with FIG. 96. The crack region 9 shown in FIG. 98 is formed when the light-converging point of pulse laser light L is adjusted so as to be located at a position closer to the surface (entrance face) 3 than is a half thickness position in the thickness direction of the object 1. The crack region 9 is formed on the surface 3 side within the object 1. FIG. 99 is a partly sectional view of the object 1 shown in FIG. 98. Since the crack region 9 is formed on the surface 3 side, naturally growing cracks 91 reach the surface 3 or its vicinity. Hence, fractures extending along the line 5 along which the object is intended to be cut are likely to occur in the surface 3, whereby the object 1 can be cut easily.

In the case where the surface 3 of the object 1 is formed with electronic devices and electrode patterns in particular, forming the crack region 9 near the surface 3 can prevent the electronic devices and the like from being damaged when cutting the object 1. Namely, growing cracks 91 from the crack region 9 toward the surface 3 and rear face 21 of the object 1 cuts the object 1. Cutting may be achieved by the natural growth of cracks 91 alone or by artificially growing cracks 91 in addition to the natural growth of crack 91. When the distance between the crack region 9 and the surface 3 is relatively long, the deviation in the growing direction of cracks 91 on the surface 3 side becomes greater. As a consequence, the cracks 91 may reach regions formed with electronic devices and the like, thereby damaging the electronic devices and the like. When the crack region 9 is formed near the surface 3, the distance between the crack region 9 and the surface 3 is relatively short, whereby the deviation in growing direction of cracks 91 can be made smaller. Therefore, cutting can be effected without damaging the electronic devices and the like. When the crack region 9 is formed at a location too close to the surface 3, the crack region 9 is formed at the surface 3. As a consequence, the random form of the crack region 9 itself appears at the surface 3, which causes chipping, thereby deteriorating the accuracy in breaking and cutting.

The crack region 9 can also be formed while the light-converging point of pulse laser light L is adjusted so as to be located at a position farther from the surface 3 than is a half thickness position in the thickness direction of the object 1. In this case, the crack region 9 is formed on the rear face 21 side within the object 1.

Figure 100:
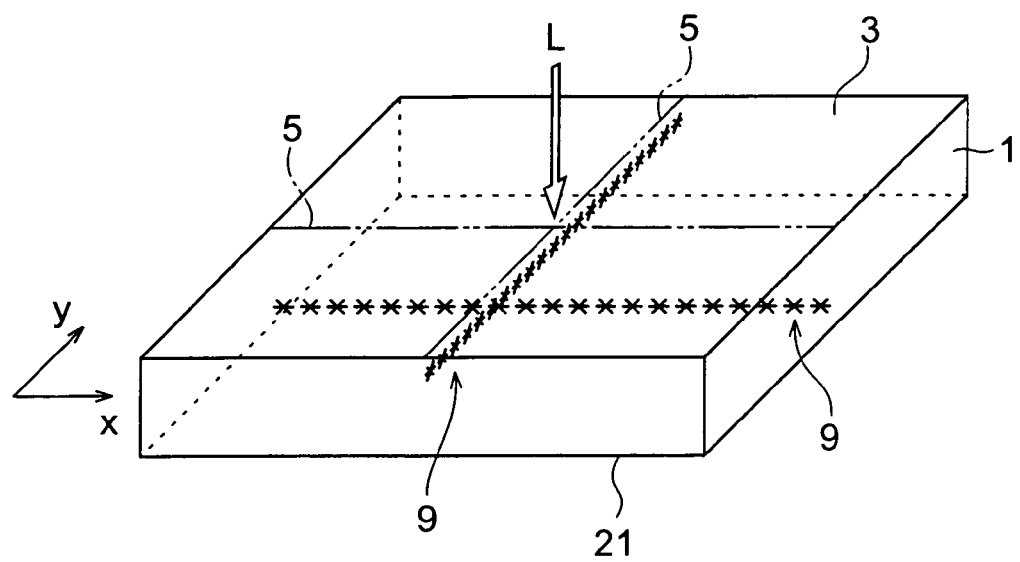
FIG. 100 is a perspective view of still another embodiment of the object to be processed within which a crack region is formed by using the laser processing method in accordance with the tenth embodiment of the embodiment.

As with FIG. 96, FIG. 100 is a perspective view of the object 1 including crack regions formed by using the laser processing method in accordance with the tenth embodiment of the present invention. The crack region 9 in the X-axis direction shown in FIG. 100 is formed when the light-converging point of pulse laser light L is adjusted so as to be located at a position farther from the surface (entrance face) 3 than is a half thickness position in the thickness direction of the object 1. The crack region 9 in the Y-axis direction is formed when the light-converging point of pulse laser light L is adjusted so as to be located at a position closer to the surface 3 than is the half thickness position in the thickness direction of the object 1. The crack region 9 in the X-axis direction and the crack region 9 in the Y-axis direction cross each other three-dimensionally.

When the object 1 is a semiconductor wafer, for embodiment, a plurality of crack regions 9 are formed in parallel in each of the X- and Y-axis directions. This forms the crack regions 9 like a lattice in the semiconductor wafer, whereas the latter is divided into individual chips while using the lattice-like crack regions as starting points. When the crack region 9 in the X-axis direction and the crack region 9 in the Y-axis direction are located at the same position in the thickness direction of the object 1, there occurs a location where the crack region 9 in the X-axis direction and the crack region 9 in the Y-axis direction intersect each other at right angles. At the location where the crack regions 9 intersect each other at right angles, they are superposed on each other, which makes it difficult for the cross section in the X-axis direction and the cross section in the Y-axis direction to intersect each other at right angles with a high accuracy. This inhibits the object 1 from being cut precisely at the intersection.

When the position of the crack region 9 in the X-axis direction and the position of the crack region 9 in the Y-axis direction differ from each other in the thickness direction of the object 1 as shown in FIG. 100, the crack region 9 in the X-axis direction and the crack region 9 in the Y-axis direction can be prevented from being superposed on each other. This enables precise cutting of the object 1.

In the crack region 9 in the X-axis direction and the crack region 9 in the Y-axis direction, the crack region 9 to be formed later is preferably formed closer to the surface (entrance face) 3 than is the crack region 9 formed earlier. If the crack region 9 to be formed later is formed closer to the rear face 21 than is the crack region 9 formed earlier, the pulse laser light L irradiated when forming the crack region 9 to be formed later is scattered by the crack region 9 formed earlier at the location where the cross section in the X-axis direction and the cross section in the Y-axis direction intersect each other at right angles. This forms deviations between the size of a part formed at a position to become the above-mentioned intersecting location and the size of a part formed at another position in the crack region 9 to be formed later. Therefore, the crack region 9 to be formed later cannot be formed uniformly.

When the crack region 9 to be formed later is formed closer to the surface 3 than is the crack region 9 formed earlier, by contrast, scattering of the pulse laser light L does not occur at a position to become the above-mentioned intersecting location, whereby the crack region 9 to be formed later can be formed uniformly.

As explained in the foregoing, the tenth embodiment of the present invention adjusts the position of light-converging point of laser light in the thickness direction of an object to be processed, thereby being able to control the position of a modified region in the thickness direction of the object. Changing the position of light-converging point in view of the thickness and material of the object to be processed and the like enables laser processing in conformity to the object.

Though the fact that the position of a modified region can be controlled is explained in the case of a crack region, the same holds in molten processed regions and refractive index change regions. Though the explanation relates to pulse laser light, the same holds for continuous wave laser light.

The laser processing apparatus in accordance with the tenth embodiment of the present invention has a configuration similar to the laser processing apparatus 100 in accordance with the first embodiment shown in FIG. 14. In the tenth embodiment, the Z-axis stage 113 adjusts the position of light-converging point P in the thickness direction of object 1. This can adjust the light-converging point P so as to locate it at a position closer to or farther from the entrance face (surface 3) than is a half thickness position in the thickness direction of the object 1 or at a substantially half thickness position, for embodiment. These adjustment operations and the placement of the light-converging point of laser light within the object can also be achieved by moving the light-converging lens 105 in the Z-axis direction. Since there are cases where the object 1 moves in the thickness direction thereof and where the light-converging lens 105 moves in the thickness direction of the object 1 in the present invention, the amount of movement of the object 1 in the thickness direction of the object 1 is defined as a first relative movement amount or a second relative movement amount.

The adjustment of light-converging point P in the thickness direction of the object to be processed caused by the Z-axis stage is the same as that in the ninth embodiment explained with reference to FIG. 93 and FIG. 94.

The imaging data processor 125 calculates focal point data for locating the focal point of visible light generated by the observation light source 117 on the surface 3 according to the imaging data in the tenth embodiment as well. According to this focal point data, the stage controller 115 controls the movement of the Z-axis stage 113, so as to locate the focal point of visible light at the surface 3. The laser processing apparatus 1 is adjusted such that the light-converging point P of laser light L is located at the surface 3 at the position of Z-axis stage 113 where the focal point of visible light is located at the surface 3. Hence, the focal point data is an embodiment of second relative movement amount of the object 1 in the thickness direction thereof required for locating the light-converging point P at the surface (entrance face) 3. The imaging data processor 125 has a function of calculating the second relative movement amount.

Data of the movement amount (z) explained with reference to FIGS. 93 and 94 is fed into and stored in the overall controller 127. Namely, the overall controller 127 has a function of storing data of the relative movement amount of the object to be processed 1 in the thickness direction of the object 1. The overall controller 127, stage controller 115, and Z-axis stage 113 adjust the position of light-converging point of pulse laser light converged by the light-converging lens within the range of thickness of the object 1.

The laser processing method in accordance with the tenth embodiment will be explained with reference to the laser processing apparatus in accordance with the first embodiment shown in FIG. 14 and the flowchart for the laser processing method in accordance with the first embodiment shown in FIG. 15. The object to be processed 1 is a silicon wafer.

Step S101 is the same as step S101 of the first embodiment shown in FIG. 15. Subsequently, as in step S103 of the first embodiment shown in FIG. 15, the thickness of object 1 is measured. According to the result of measurement of thickness and the refractive index, the amount of movement (z) in the Z-axis direction of object 1 is determined (S103). This is the amount of movement of object 1 in the Z-axis direction with reference to the light-converging point of laser light L positioned at the surface 3 of object 1 required for positioning the light-converging point P of laser light L within the object 1. Namely, the position of light-converging point P in the thickness direction of object 1 is determined. The amount of movement (z) in the Z-axis direction is one embodiment of data of relative movement of the object 1 in the thickness direction thereof. The position of light-converging point P is determined in view of the thickness and material of the object 1, effects of processing (e.g., easiness to handle and cut the object), and the like. This data of movement amount is fed into the overall controller 127.

Steps S105 and S107 are similar to steps S105 and S107 of the first embodiment shown in FIG. 15. The focal point data calculated by step S107 is data of a second movement amount in the Z-axis direction of object 1.

This focal point data is sent to the stage controller 115. According to this focal point data, the stage controller 115 moves the Z-axis stage 113 in the Z-axis direction (S109). This positions the focal point of visible light of the observation light source 117 at the surface 3. At this position of Z-axis stage 113, the light-converging point P of pulse laser light L is positioned at the surface 3. According to imaging data, the imaging data processor 125 calculates enlarged image data of the surface of object 1 including the line 5 along which the object is intended to be cut. This enlarged image data is sent to the monitor 129 by way of the overall controller 127, whereby an enlarged image near the line 5 along which the object is intended to be cut is displayed on the monitor 127.

Data of the relative movement amount determined by step S103 has already been inputted to the overall controller 127, and is sent to the stage controller 115. According to this data of movement amount, the stage controller 115 causes the Z-axis stage 113 to move the object 1 in the Z-axis direction at a position where the light-converging point P of laser light is located within the object 1 (S111).

Steps S113 and S115 are similar to steps S113 and S115 shown in FIG. 15. The foregoing divides the object 1 into silicon chips.

Effects of the tenth embodiment of the present invention will be explained. The tenth embodiment irradiates the object to be processed 1 with pulse laser light L while adjusting the position of light-converging point P in the thickness direction of object 1, thereby forming a modified region. This can control the position of a modified region in the thickness direction of object 1. Therefore, changing the position of a modified region in the thickness direction of object 1 according to the material and thickness of object 1, effects of processing, and the like enables cutting in conformity to the object 1.

Eleventh Embodiment

A Eleventh embodiment of the present invention will now be explained. The laser processing method in accordance with the eleventh embodiment comprises a modified region forming step (first step) of forming a modified region caused by multiphoton absorption within an object to be processed, and a stress step (second step) of generating a stress at a part where the object is cut. In the eleventh embodiment, the same laser light irradiation is carried out in the modified region forming step and stress step. Therefore, a laser processing apparatus, which was explained above, emits laser light twice under the same condition in the modified region forming step and stress step, respectively.

Figure 101:
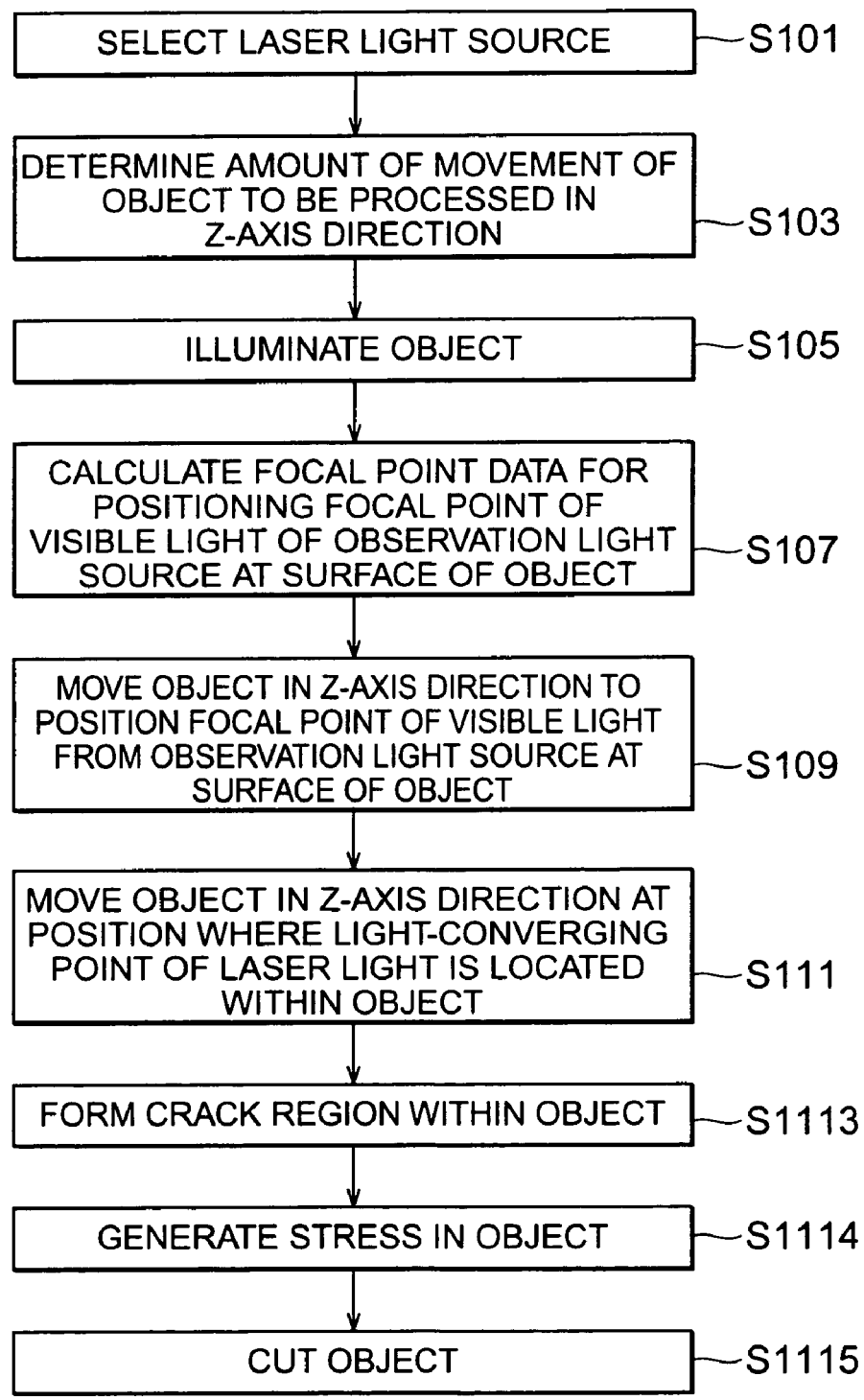
FIG. 101 is a flowchart for explaining the laser processing method in accordance with the eleventh embodiment of the present invention.

With reference to FIGS. 14 and 101, the laser processing method in accordance with the eleventh embodiment will now be explained. FIG. 101 is a flowchart for explaining the laser processing method.

Steps S101, S103, S105, S107, S109 and S111 shown in FIG. 101, are the same as theses shown in FIG. 15, and therefore, the detailed explanations of the Steps S101, S103, S105, S107, S109 and S111 are omitted.

Figure 102:
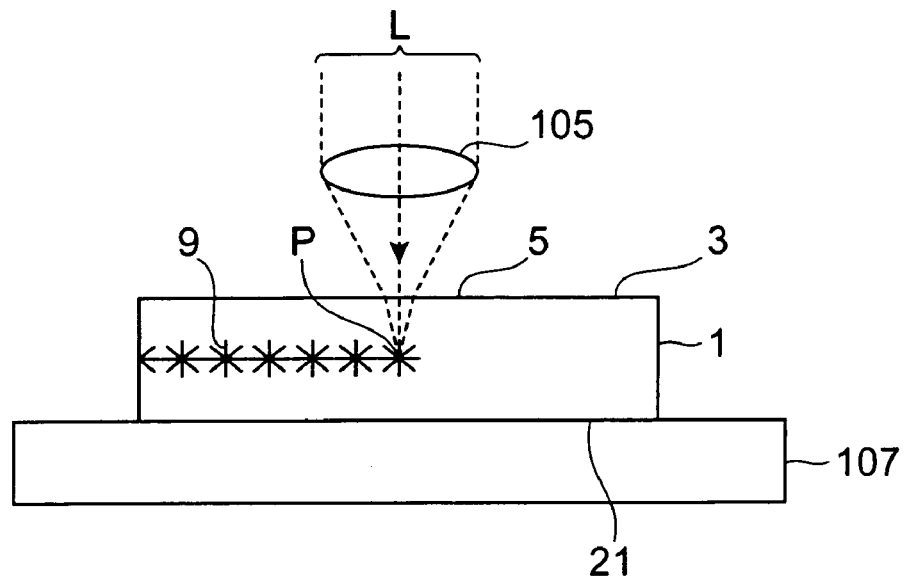
FIG. 102 is a sectional view of the object including a crack region during laser processing in the modified region forming step in accordance with the eleventh and twelfth embodiments.

After Step S111, laser light L is generated from the laser light source 101, so as to irradiate the line 5 along which the object is intended to be cut 5 in the surface 3 of the object 1 therewith. FIG. 102 is a sectional view of the object 1 including a crack region 9 during laser processing in the modified region forming step. Since the light-converging point P of laser light L is positioned within the object 1 as depicted, the crack region 9 is formed only within the object 1. Subsequently, the X-axis stage 109 and Y-axis stage 111 are moved along the line to be cut 5, so as to form the crack region 9 within the object 1 along the line 5 along which the object is intended to be cut (S1113).

Figure 103:
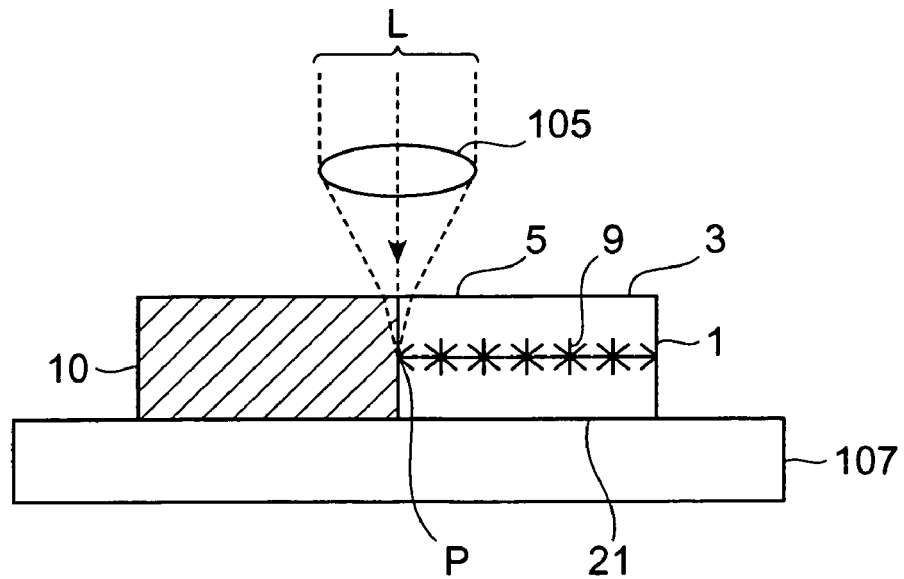
FIG. 103 is a sectional view of the object including a crack region during laser processing in the stress step in accordance with the eleventh embodiment.

After the modified region is formed, the crack region 9 is irradiated with the laser light L having for example, wavelength of 1064 nm (YAG laser) along the line 5 along which the object is intended to be cut in the surface 3 of the object 1 again under the same condition (i.e., the light-converging point P is located in the crack region 9 that is a modified region). The laser light L has a transparent characteristics to non-molten processed region of the object, that is, except for the molten processed region of the object, and a high absorption characteristics to the molten processed region comparing with the non-molten processed region. As a consequence, the absorption of laser light L due to scattering by the crack region 9 or the like or the generation of multiphoton absorption in the crack region 9 heats the object 1 along the crack region 9, thereby generating a stress such as a thermal stress due to a temperature difference (S1114). FIG. 103 is a sectional view of the object 1 including the crack region 9 during laser processing in the stress step. As depicted, the crack is further grown by the stress step while using the crack region 9 as a start point, so as to reach the surface 3 and rear face 21 of the object 1, thus forming a cut section 10 in the object 1, whereby the object 1 is cut (S1115). As a consequence, the object 1 is divided into chips.

Though the eleventh embodiment carries out the same laser light irradiation as that of the modified region forming step in the stress step, it will be sufficient if laser light transmittable through an unmodified region which is a region not formed with a crack region in the object to be processed but more absorbable by the crack region than by the unmodified region is emitted. This is because of the fact that the laser light is hardly absorbed at the surface of the object, whereas the object is heated along the crack region, whereby a stress such as a thermal stress due to a temperature difference occurs in this case as well.

Though the eleventh embodiment relates to a case where a crack region is formed as the modified region, the same applies to cases where the above-mentioned molten processed region and refractive index change region are formed as the modified region, whereby a stress can occur upon irradiation with laser light in the stress step, so as to generate and grow a crack while using the molten processed region and refractive index change region as a start point and thereby cut the object.

Even when the crack grown by the stress step while using the modified region as a start point fails to reach the surface and rear face of the object in the case where the object has a large thickness or the like, the object can be broken and cut by applying an artificial force such as a bending stress or shearing stress thereto. This artificial force can be kept smaller, whereby unnecessary fractures deviating from the line to be cut can be prevented from occurring in the surface of the object.

Effects of the eleventh embodiment will now be explained. In the modified region forming step of this embodiment, the line 5 along which the object is intended to be cut is irradiated with pulse laser light L while locating the light-converging point P within the object to be processed 1 under a condition causing multiphoton absorption. Also, the X-axis stage 109 and Y-axis stage 111 are moved, so as to shift the light-converging point P along the line 5 along which the object is intended to be cut. This forms a modified region (e.g., crack region, molten processed region, or refractive index change region) within the object 1 along the line 5 along which the object is intended to be cut. When an object to be processed has a start point in a part to be cut, the object can be broken and cut with a relatively small force. In the stress step of the eleventh embodiment, the same laser light irradiation as that of the modified region forming step is carried out in the stress step, so as to generate a stress such as a thermal stress due to a temperature difference. As a consequence, the object 1 can be cut by a relatively small force, e.g., a stress such as a thermal stress due to a temperature difference. Therefore, the object 1 can be cut without generating unnecessary fractures deviating from the line 5 along which the object is intended to be cut in the surface 3 of the object 1.

Since the object 1 is irradiated with the pulse laser light L while locating the light-converging point P within the object 1 under a condition causing multiphoton absorption in the modified region forming step, the pulse laser light L is transmitted there through and is hardly absorbed at the surface 3 of the object 1 in the eleventh embodiment. In the stress step, the same laser light irradiation as that of the modified region forming step is carried out. Therefore, the surface 3 does not incur damages such as melt caused by irradiation with laser light.

As explained in the foregoing, the eleventh embodiment can cut the object 1 without generating unnecessary fractures deviating from the line 5 along which the object is intended to be cut or melt in the surface 3 of the object 1. Therefore, in the case where the object 1 is a semiconductor wafer, for embodiment, semiconductor chips can be cut out from the semiconductor wafer without generating unnecessary fractures deviating from lines along which the object is intended to be cut or melt in the semiconductor chips. The same holds in objects to be processed having a surface formed with electrode patterns, and those having a surface formed with electronic devices such as piezoelectric device wafers and glass substrates formed with display devices such as liquid crystals. Hence, this embodiment can improve the yield of products (e.g., semiconductor chips, piezoelectric device chips, display devices such as liquid crystals) made by cutting objects to be processed.

Also, in the eleventh embodiment, the line 5 along which the object is intended to be cut in the surface 3 of the object 1 does not melt, whereby the width of the line 5 along which the object is intended to be cut (which is the gap between regions to become semiconductor chips in the case of a semiconductor wafer, for embodiment) can be reduced. This can increase the number of products prepared from a single object to be processed 1, and improve the productivity of products.

Since laser light is used for cutting and processing the object 1, the eleventh embodiment enables processing more complicated than that in dicing with a diamond cutter. For the eleventh embodiment, cutting and processing can be carried out even when lines 5 along which the object 1 is intended to be cut 5 have a complex form as shown in FIG. 16 also.

The laser processing method in accordance with the eleventh embodiment according to the present invention can cut an object to be processed without generating melt or unnecessary fractures deviating from the line to be cut in the surface of the object. Therefore, the yield and productivity of products (e.g., semiconductor chips, piezoelectric device chips, and display devices such as liquid crystals) manufactured by cutting objects to be processed can be improved.

Besides, in the above eleventh embodiments, the crack which is grown from the crack region 9 in the stress step reaches the surface 3 and rear face 21 of the object 1, but the crack which is grown from the crack region 9 in the stress step the laser light L may be grown so as not to reach the surface 3 and rear face 21 of the object.

Twelfth Embodiment

The twelve embodiment according to the present invention will now be explained. The laser processing method in accordance with the twelfth embodiment comprises a modified region forming step of forming a modified region caused by multiphoton absorption within an object to be processed, and a stress step of generating a stress at a part where the object is cut, as similar to the eleventh embodiment.

A laser processing apparatus for the twelfth embodiment is the same as that of the first embodiment as shown in FIG. 14, and the detailed explanation of the laser processing apparatus is omitted.

An absorbable laser irradiating apparatus used in the stress step of the twelfth embodiment employs the same configuration as that of the above-mentioned laser processing apparatus 100 as shown in FIG. 14 except for the laser light source and diachronic mirror. The laser light source in the absorbable laser irradiating apparatus uses $CO_2$ laser with a wavelength of 10.6 μm for generating continuous wave laser light. This is because of the fact that it is absorbable by the object 1 to be processed, which is a Pyrex glass wafer. Alternatively, the laser diode may be used as a light source for generating the absorbable laser light with a wavelength of 808 nm, 14 W as output power and beam size of about 200 μm. The laser light generated by such laser light source has a absorption characteristics to the object 1 and will herein after be referred to as "absorbable laser light". Here, its beam quality is $TEM_{00}$, whereas its polarization characteristic is that of linear polarization. This laser light source has an output of 10 W or less in order to attain such an intensity that the object to be processed 1 is heated but not melted thereby. The diachronic mirror of the absorbable laser irradiating apparatus has a function of reflecting the absorbable laser light, and is arranged so as to change the orientation of the optical axis of absorbable laser light by 90°.

Figure 104:
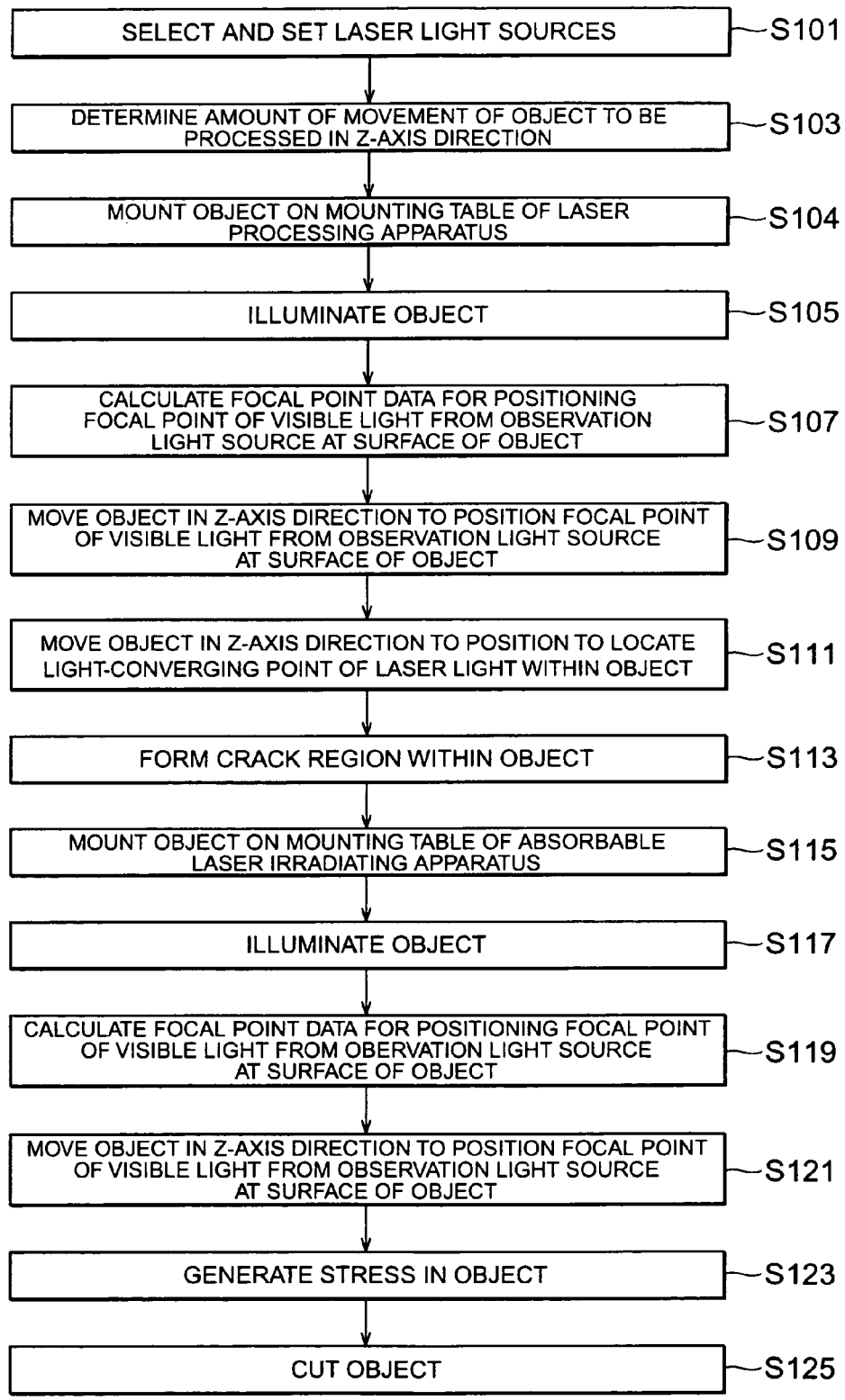
FIG. 104 is a flowchart for explaining the laser processing method in accordance with the twelfth embodiment of the present invention.

With reference to FIGS. 14 and 104, the laser processing method in accordance with the twelfth embodiment will now be explained. FIG. 104 is a flowchart for explaining the laser processing method.

Steps S101, S103, S105, S107, S109 and S111 shown in FIG. 104, are the same as theses shown in FIG. 15, and therefore, the detailed explanations of the Steps S101, S103, S105, S107, S109 and S111 are omitted.

Firstly, as shown in FIG. 104, steps S101 and S103 are executed and next step S104 is executed. In the step S104, the object 1 is mounted on the mounting table 107 of the laser processing apparatus 100 (S104). Next steps S105, S107, S109, and S111 are executed. After Step 111 of FIG. 104, laser light L is generated from the laser light source 101, so as to irradiate the line 5 along which the object is intended to be cut in the surface 3 of the object 1 therewith. FIG. 102 is a sectional view of the object 1 including a crack region 9 during laser processing in the modified region forming step. Since the light-converging point P of laser light L is positioned within the object 1 as depicted, the crack region 9 is formed only within the object 1. Subsequently, the X-axis stage 109 and Y-axis stage 111 are moved along the line 5 along which the object is intended to be cut, so as to form the crack region 9 within the object 1 along the line 5 along which the object is intended to be cut (S1213).

After the modified region is formed by the laser processing apparatus 100, the object 1 is transferred to the mounting table 107 of the absorbable laser irradiating apparatus, so as to be mounted thereon (S1215). The object 1 does not break into pieces, since the crack region 9 in the modified region forming step is formed only therewithin, and thus can easily be transferred.

The object 1 is illuminated in step 1217, focal point data for positioning the focal point of visible light from the observation light source at the surface 3 of the object 1 is calculated in step 1219, and the object 1 is moved in the Z-axis direction so as to position the focal point at the surface 3 of the object 1 in step 1221, thereby locating the light-converging point of absorbable laser light L2 at the surface 3 of the object. Here, details of operations in the steps 1217, 1219, and 1221 are similar to those of steps 105, 107, and 109 in the above-mentioned laser processing apparatus 100.

Next, absorbable laser light L2 is generated from the laser light source of the absorbable laser irradiating apparatus, so as to irradiate the line 5 along which the object is intended to be cut in the surface 3 of the object 1 therewith. Here, the vicinity of the line 5 along which the object is intended to be cut may be irradiated as well. Then, the X-axis stage and Y-axis stage of the absorbable laser irradiating apparatus are moved along the line 5 along which the object is intended to be cut, so as to heat the object 1 along the line 5 along which the object is intended to be cut, thereby generating a stress such as thermal stress caused by a temperature difference at a part where the object 1 is cut along the line 5 along which the object is intended to be cut (S1223). Here, since the absorbable laser has such an intensity that the object 1 is heated but not melted thereby, the surface of the object does not melt.

Figure 105:
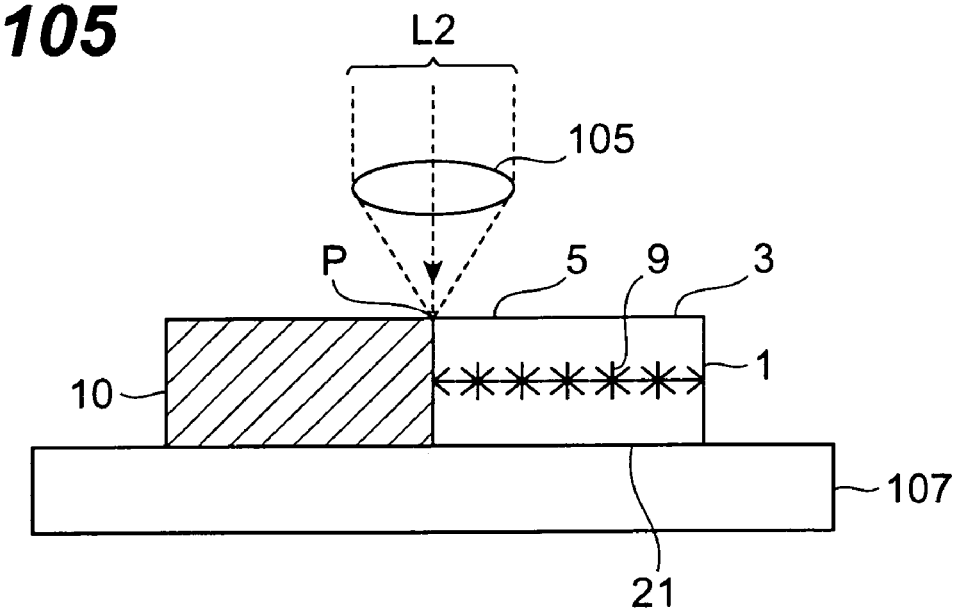
FIG. 105 is a sectional view of the object including a crack region during laser processing in the stress step in accordance with the twelfth embodiment.

FIG. 105 is a sectional view of the object 1 including the crack region 9 during laser processing in the stress step. As depicted, upon irradiation with absorbable laser light, the crack further grows while using the crack region 9 as a start point, so as to reach the surface 3 and rear face 21 of the object 1, thus forming a cut section 10 in the object 1, whereby the object 1 is cut (S1225). As a consequence, the object 1 is divided into silicon chips.

Though the twelfth embodiment relates to a case where a crack region is formed as the modified region, the same applies to cases where the above-mentioned molten processed region and refractive index change region are formed as the modified region, whereby a stress can occur upon irradiation with absorbable laser light, so as to generate and grow a crack while using the molten processed region and refractive index change region as a start point and thereby cut the object.

Even when the crack grown by the stress step while using the modified region as a start point fails to reach the surface and rear face of the object in the case where the object has a large thickness or the like, the object can be broken and cut by applying an artificial force such as a bending stress or shearing stress thereto. This artificial force can be kept smaller, whereby unnecessary fractures deviating from the line to be cut can be prevented from occurring in the surface of the object.

Effects of the twelfth embodiment will now be explained. In the modified region forming step of this embodiment, the line 5 along which the object is intended to be cut is irradiated with pulse laser light L while locating the light-converging point P within the object to be processed 1 under a condition causing multiphoton absorption. Also, the X-axis stage 109 and Y-axis stage 111 are moved, so as to shift the light-converging point P along the line 5 along which the object is intended to be cut. This forms a modified region (e.g., crack region, molten processed region, or refractive index change region) within the object 1 along the line 5 along which the object is intended to be cut. When an object to be processed has a start point in a part to be cut, the object can be broken and cut with a relatively small force. In the stress step of this embodiment, the object 1 is irradiated with absorbable laser light along the line 5 along which the object is intended to be cut, so as to generate a stress such as a thermal stress due to a temperature difference. As a consequence, the object 1 can be cut by a relatively small force, e.g., a stress such as a thermal stress due to a temperature difference. Therefore, the object 1 can be cut without generating unnecessary fractures deviating from the line 5 along which the object is intended to be cut in the surface 3 of the object 1.

Since the object 1 is irradiated with the pulse laser light L while locating the light-converging point P within the object 1 under a condition causing multiphoton absorption in the modified region forming step, the pulse laser light L is transmitted there through and is hardly absorbed at the surface 3 of the object 1 in this embodiment. In the stress step, the absorbable laser light has such an intensity that the object 1 is heated but not melted thereby. Therefore, the surface 3 does not incur damages such as melt caused by irradiation with laser light.

As explained in the foregoing, this embodiment can cut the object 1 without generating unnecessary fractures deviating from the line 5 along which the object is intended to be cut or melt in the surface 3 of the object 1. Therefore, in the case where the object 1 is a semiconductor wafer, for embodiment, semiconductor chips can be cut out from the semiconductor wafer without generating unnecessary fractures deviating from lines along which the object is intended to be cut or melt in the semiconductor chips. The same holds in objects to be processed having a surface formed with electrode patterns, and those having a surface formed with electronic devices such as piezoelectric device wafers and glass substrates formed with display devices such as liquid crystals. Hence, this embodiment can improve the yield of products (e.g., semiconductor chips, piezoelectric device chips, display devices such as liquid crystals) made by cutting objects to be processed.

Also, in this embodiment, the line 5 along which the object is intended to be cut in the surface 3 of the object 1 does not melt, whereby the width of the line 5 along which the object is intended to be cut (which is the gap between regions to become semiconductor chips in the case of a semiconductor wafer, for embodiment) can be reduced. This can increase the number of products prepared from a single object to be processed 1, and improve the productivity of products.

Since laser light is used for cutting and processing the object 1, this embodiment enables processing more complicated than that in dicing with a diamond cutter. For embodiment, cutting and processing can be carried out even when line 5 along which the object is intended to be cut have a complex form as shown in FIG. 16.

The laser processing method of the twelfth embodiment according to the present invention can cut an object to be processed without generating melt or unnecessary fractures deviating from the line to be cut in the surface of the object. Therefore, the yield and productivity of products (e.g., semiconductor chips, piezoelectric device chips, and display devices such as liquid crystals) manufactured by cutting objects to be processed can be improved.

Besides, in the above eleventh embodiments, the crack which is grown from the crack region 9 in the stress step reaches the surface 3 and rear face 21 of the object 1, but the crack which is grown from the crack region 9 in the stress step the laser light L may be grown so as not to reach the surface 3 and rear face 21 of the object.

Thirteenth Embodiment

The thirteenth embodiment according to the present invention will now be explained. The laser processing method in accordance with the thirteenth embodiment comprises attaching step of adhesively attaching an object to be processed to an adhesive and expansive sheet, a modified region forming step of forming a modified region in the object, and cutting/separation step of cutting the object at the modified region thereof and separating the cut parts of the object so as to make the space there between.

The above modified region forming step of the thirteenth embodiments may be any one of the first to twelfth embodiments stated above. Further, in the modified region forming step, the object may be cut at the modified region. In this case that the object is cut at the modified region in the modified region forming step, in the separation step, the cut parts of the object are spaced to each other by a predetermined distance by expansion of the adhesive and expansion sheet. Alternatively, when in the modified region forming step, although the modified region is formed in the body as a molten processed region, the object is not cut, in the separation step, the object is cut and the cut parts of the object are separated to each other with a predetermined space therebetween.

Figure 106:
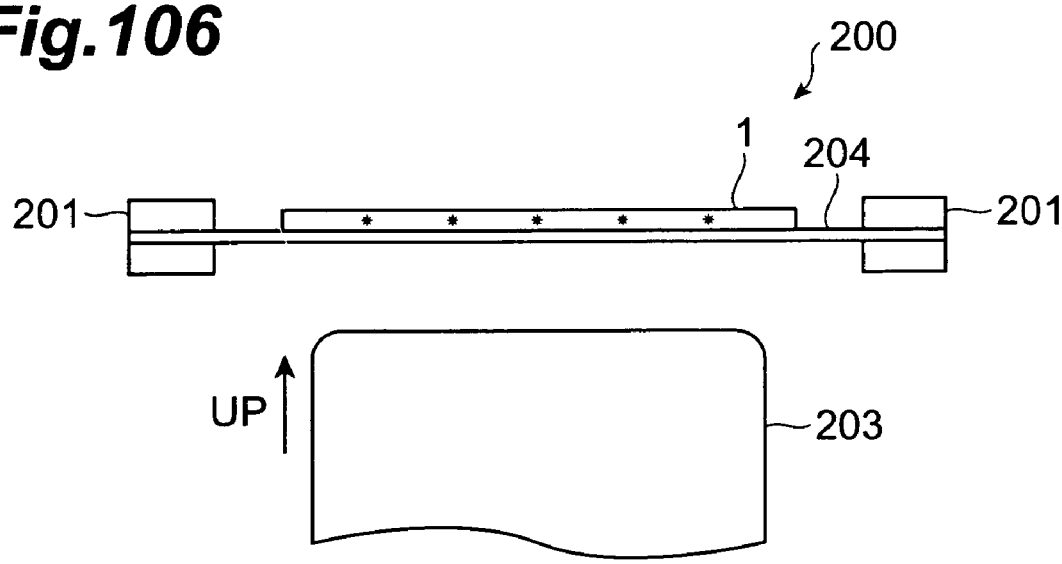
FIG. 106 shows an film expansion apparatus used in the thirteenth embodiments.
Figure 107:
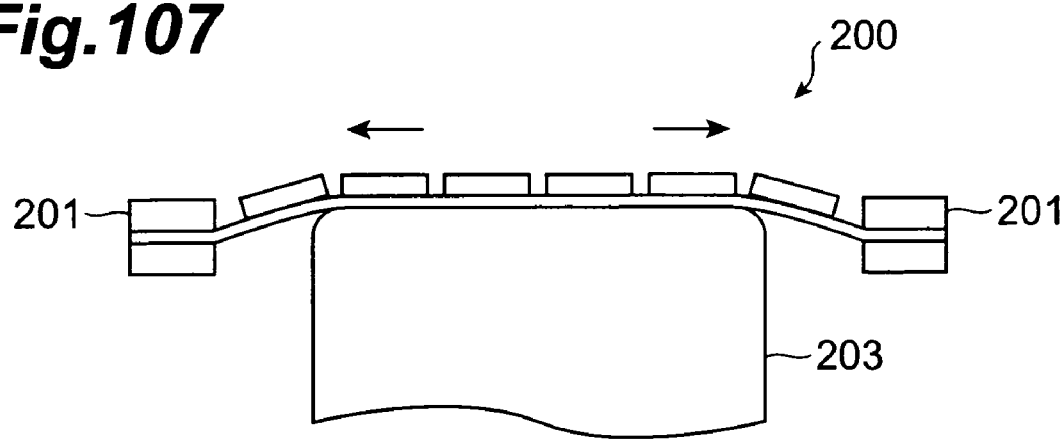
FIG. 107 is for explanation of the expansion status of the adhesive and expansive sheet in the thirteenth embodiment.

FIG. 106 shows a film expansion apparatus 200 and the apparatus 200 has a ring shape holder 201 and a column like expander 203. The adhesive and expansive sheet on which the object to be cut is attached is set to the ring shape holder 201. After setting of the adhesive and expansive sheet 204 on the ring shape holder 201 at peripheral edge of the sheet, the modified region is formed in the object along a line along which the object is intended to be cut. After the formation of the modified region in the object, the column like expander 203 is moved up against the adhesive and expansive sheet 204 so that a part of the sheet is pushed upward as shown in FIG. 107. The movement of the part of the sheet 204 causes the expansion of the sheet along a lateral direction thereof so that the sheet 204 is expanded as shown in FIG. 107. As the result of the expansion of the sheet 204, the parts of the object which is cut in the modified region forming step are separated to each other with a predetermined space therebetween. So, the pick up of the parts of the object from the adhesive and expansive sheet 204 is performed easily and surely.

When the object is not cut in the modified region formation step, the expansion of the sheet 204 caused by the upward movement of the expander 203 causes the separation of the object into parts of the object in the modified region and thereafter the cut parts of the object are separated to each other with a predetermined space therebetween.

The laser processing method and apparatus in accordance with the present invention can cut an object to be processed without generating melt or fractures deviating from lines along which the object is intended to be cut on a surface of the object. Therefore, the yield and productivity of products (e.g., semiconductor chips, piezoelectric device chips, and display devices such as liquid crystal) prepared by cutting objects to be processed can be improved.

The basic Japanese Application No. 2000-278306 filed on Sep. 13, 2000 and No. 2001-278768 filed on Sep. 13, 2001 and PCT Application No. PCT/JP01/07954 filed on Sep. 13, 2001 are hereby incorporated by reference.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A laser processing method comprising:

a first step of irradiating an object to be processed with laser light while locating a light converging point of the laser light therewithin, and pulsing the laser light such that each pulse of the laser light forms a modified spot, and the pulsing of the laser light forms a plurality of modified spots which form a modified region caused by multiphoton absorption within said object along a predetermined line in said object without intentionally exposing the modified region in at least a laser light entrance surface of the object to which the laser light is irradiated and without forming grooves in the laser light entrance surface, the formed modified regions having a maximum length in a thickness direction of the object and a length of the modified regions formed in a direction along the predetermined line being larger than any length of the modified region in a direction perpendicular to the direction extending along the predetermined line, and a modified spot formed by a pulse of the laser light has a maximum length in the thickness direction, and a length of said modified spot formed in the direction along the predetermined line is larger than a length of the modified spot in a direction parallel to the surface of the object and perpendicular to the direction extending along the predetermined line; and a second step of irradiating said object with laser light which is transparent through an unmodified region of said object but is more absorbable by said modified region than by said unmodified region to change the modified region formed in the first step and having a function as a cutting start point, into a modified region which easily causes a crack in comparison with the modified region formed in the first step so as to generate a stress at a part where said object is cut along said predetermined line after said first step.

2. The method according to claim 1, wherein the laser light is irradiated under a condition with a peak power density of at least $1 \times 10^8$ (W/cm$^2$) at the light-converging point.

3. A laser processing method comprising:

a first step of irradiating an object to be processed with laser light while locating a light-converging point of the laser light therewithin, and pulsing the laser light such that each pulse of the laser light forms a modified spot, and the pulsing of the laser light forms a plurality of modified spots which form a modified region caused by multiphoton absorption within said object along a predetermined line in said object without intentionally exposing the modified region in at least a laser light entrance surface of the object to which the laser light is irradiated and without forming grooves in the laser light entrance surface, the formed modified regions having a maximum length in a thickness direction of the object, and a length of the modified regions formed in a direction along the predetermined line being larger than any length of the modified region in a direction perpendicular to the direction extending along the predetermined line, and a modified spot formed by a pulse of the laser light has a maximum length in the thickness direction, and a length of said modified spot formed in the direction along the predetermined line is larger than a length of the modified spot in a direction parallel to the surface of the object and perpendicular to the direction extending along the predetermined line; and a second step of irradiating said object with laser light absorbable by said object along said predetermined line to change the modified region formed in the first step and having a function as a cutting start point, into a modified region which easily causes a crack in comparison with the modified region formed in the first step so as to generate a stress at a part where said object is cut along said predetermined line after said modified region forming step.

4. The method according to claim 3, wherein the laser light is irradiated under a condition with a peak power density of at least $1 \times 10^8$ (W/cm$^2$) at the light-converging point.

5. A laser processing method comprising:

a first step of irradiating an object to be processed which is fixed on an expansible holder member, with laser light with a light-converging point of the laser light located within the object, and pulsing the laser light such that each pulse of the laser light forms a modified spot, and the pulsing of the laser light forms a plurality of modified spots which form a modified region, to form a starting point, from which cutting of the object starts, without intentionally exposing the modified region in at least a laser light entrance surface of the object to which the laser light is irradiated and without forming grooves in the laser light entrance surface, the modified region being formed in a region separated from a surface of said object which is a laser light entrance face side, toward inside, by a predetermined distance along a line along which the object is intended to be cut, the formed modified regions having a maximum length in a thickness direction of the object, and a modified spot formed by a pulse of the laser light has a maximum length in the thickness direction, and a length of said modified spot formed in the direction along the line is larger than a length of the modified spot in a direction parallel to the surface of the object and perpendicular to the direction extending along the line;

a second step of further irradiating said object with laser light which is transparent through an unmodified region of said object but more absorbable by said modified region than by said unmodified region, along the modified region formed in the line along which the object is intended to be cut, to change the modified region formed in the first step and having a function as a cutting start point, into a modified region which easily causes a crack in comparison with the modified region formed in the first step, along the line along which the object is intended to be cut, after said first step; and a third step of expanding the expansible holder member, to cut the object and separate the cut parts of the object from each other.

6. The method according to claim 5, wherein the laser light is irradiated under a condition with a peak power density of at least $1 \times 10^8$ (W/cm$^2$) at the light-converging point.

7. A laser processing method comprising:

a first step of irradiating an object to be processed which is fixed on a expansible holder member, with laser light with a light-converging point of the laser light located within the object, and pulsing the laser light such that each pulse of the laser light forms a modified spot, and the pulsing of the laser light forms a plurality of modified spots which form a modified region, to form a starting point, from which cutting of the object starts, without intentionally exposing the modified region in at least a laser light entrance surface of the object to which the laser light is irradiated and without forming grooves in the laser light entrance surface, the formed modified regions having a maximum length in a thickness direction of the object and a length of the modified regions formed in a direction along a line along which the object is intended to be cut is larger than any length of the modified region in a direction perpendicular to the direction extending along the line along which the object is intended to be cut, and a modified spot formed by a pulse of the laser light has a maximum length in the thickness direction, and a length of said modified spot formed in the direction along the line is larger than a length of the modified spot in a direction parallel to the surface of the object and perpendicular to the direction extending along the line;

a second step of further irradiating the modified region of said object which has been formed along the line which the object is intended to be cut in the first step, with laser light which is transparent through an unmodified region of said object but is more absorbable by said modified region than by said unmodified region to cut the object along the line along which the object is intended to be cut, to change the modified region formed in the first step and having a function as a cutting start point, into a modified region which easily causes a crack in comparison with the modified region formed in the first step, to cut the object, along the line along which the object is intended to be cut, after said first step; and a third step of expanding the expansible holder member to separate the cut parts of the object from each other, after said second step.

8. The method according to claim 7, wherein the laser light is irradiated under a condition with a peak power density of at least $1 \times 10^8$ (W/cm$^2$) at the light-converging point.

9. A laser processing method comprising:

a first step of irradiating an object to be processed which is fixed on an expansible holder member, with laser light with a light-converging point of the laser light located within the object, and pulsing the laser light such that each pulse of the laser light forms a modified spot, and the pulsing of the laser light forms a plurality of modified spots which form a modified region, to form a starting point, from which cutting of the object starts without intentionally exposing the modified region in at least a laser light entrance surface of the object to which the laser light is irradiated and without forming grooves in the laser light entrance surface, the modified region being formed in a region separated from a surface of said object which is a laser light entrance face side, toward inside, by a predetermined distance along a line along which the object is intended to be cut, and the formed modified regions having a maximum length in a thickness direction of the object, and a length of the modified regions formed in a direction along the line along which the object is intended to be cut is larger than any length of the modified region in a direction perpendicular to the direction extending along the line along which the object is intended to be cut, and a modified spot formed by a pulse of the laser light has a maximum length in the thickness direction, and a length of said modified spot formed in the direction along the line is larger than a length of the modified spot in a direction parallel to the surface of the object and perpendicular to the direction extending along the line;

a second step of further irradiating said object with laser light which is absorbable by said object along the modified region formed in the first step along the line along which the object is intended to be cut, to change the modified region formed in the first step and having a function as a cutting start point, into a modified region which easily causes a crack in comparison with the modified region formed in the first step, after said first step; and a third step of expanding the expansible holder member to cut the object and separate the cut parts of the object from each other.

10. The method according to claim 9, wherein the laser light is irradiated under a condition with a peak power density of at least $1\times10^8$ (W/cm$^2$) at the light-converging point.

11. A laser processing method comprising:

a first step of irradiating an object to be processed which is fixed on an expansible holder member, with laser light with a light-converging point of the laser light located within the object, and pulsing the laser light such that each pulse of the laser light forms a modified spot, and the pulsing of the laser light forms a plurality of modified spots which form a modified region, to form a starting point, from which cutting of the object starts, without intentionally exposing the modified region in at least a laser light entrance surface of the object to which the laser light is irradiated and without forming grooves in the laser light entrance surface, the modified region being formed in a region separated from a surface of said object which is a laser light entrance face side, toward inside, by a predetermined distance along a line along which the object is intended to be cut, and the formed modified regions having a maximum length in a thickness direction of the object, and a length of the modified regions formed in a direction along the line along which the object is intended to be cut is larger than any length of the modified region in a direction perpendicular to the direction extending along the line along which the object is intended to be cut, and a modified spot formed by a pulse of the laser light has a maximum length in the thickness direction, and a length of said modified spot formed in the direction along the line is larger than a length of the modified spot in a direction parallel to the surface of the object and perpendicular to the direction extending along the line;

a second step of further irradiating said object with laser light which is absorbable by said object along the modified region formed in the first step along the line along which the object is intended to be cut, to change the modified region formed in the first step and having a function as a cutting start point, into a modified region which easily causes a crack in comparison with the modified region formed in the first step, to cut the object, along the line along which the object is intended to be cut, after said first step; and a third step of expanding the expansible holder member to separate the cut parts of the object from each other.

12. The method according to claim 11, wherein the laser light is irradiated under a condition with a peak power density of at least $1\times10^8$ (W/cm$^2$) at the light-converging point.

* * * * *